US012751199B2

(12) United States Patent
Han et al.
(10) Patent No.: US 12,751,199 B2
(45) Date of Patent: Sep. 29, 2026

(54) ORGANOMETALLIC COMPOUND, LIGHT-EMITTING DEVICE INCLUDING THE SAME, AND ELECTRONIC APPARATUS INCLUDING THE LIGHT-EMITTING DEVICE

(71) Applicant: Samsung Display Co., Ltd., Yongin-si (KR)

(72) Inventors: Junghoon Han, Yongin-si (KR); Soobyung Ko, Yongin-si (KR); Sungbum Kim, Yongin-si (KR); Eunsoo Ahn, Yongin-si (KR); Jaesung Lee, Yongin-si (KR); Hyunjung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 904 days.

(21) Appl. No.: 18/107,609

(22) Filed: Feb. 9, 2023

(65) Prior Publication Data

US 2023/0301170 A1 Sep. 21, 2023

(30) Foreign Application Priority Data

Mar. 18, 2022 (KR) ........................ 10-2022-0034176

(51) Int. Cl.
*H10K 50/12* (2023.01)
*C07F 15/00* (2006.01)
*H10K 85/30* (2023.01)
*H10K 102/00* (2023.01)

(52) U.S. Cl.
CPC ....... *H10K 85/346* (2023.02); *C07F 15/0086* (2013.01); *H10K 50/12* (2023.02); *C07B 2200/05* (2013.01); *H10K 2102/301* (2023.02)

(58) Field of Classification Search
None
See application file for complete search history.

(56) References Cited

U.S. PATENT DOCUMENTS 7,381,479 B2 6/2008 Lamansky et al.
7,393,599 B2 7/2008 Thompson et al.
7,585,573 B2 9/2009 Lee et al.
7,776,458 B2 8/2010 Ragini et al.
8,106,199 B2 1/2012 Jabbour et al.
8,389,725 B2 3/2013 Li et al.
8,669,364 B2 3/2014 Li et al.
8,680,760 B2 3/2014 Cheng et al.
8,816,080 B2 8/2014 Li et al.
8,846,940 B2 9/2014 Li et al.
8,883,322 B2 11/2014 Wu et al.
8,946,417 B2 2/2015 Jian et al.
9,051,344 B2 6/2015 Lin et al.
9,076,974 B2 7/2015 Li et al.
9,203,039 B2 12/2015 Li et al.
9,221,857 B2 12/2015 Li et al.
9,224,963 B2 12/2015 Li et al.
9,231,218 B2 1/2016 Lin et al.
9,238,668 B2 1/2016 Li et al.
9,312,502 B2 4/2016 Li et al.
9,324,957 B2 4/2016 Li et al.
9,382,273 B2 7/2016 Li et al.
(Continued)

FOREIGN PATENT DOCUMENTS

CN 101831685 A 9/2010
CN 104370974 2/2015
(Continued)

OTHER PUBLICATIONS

US Notice of Allowance dated Mar. 31, 2026, issued in U.S. Appl. No. 18/045,766 (6 pages).
Akkurt, Methmet et al., "Chlorido[1-phenyl-3-(2,3,5,6-tetramethylbenzyl)benzimidazol-2-ylidene]-silver(I)", Acta Cryst., May 15, 2012, (10 pages).
Feiye Sun et al., "4a,8a-Azaboranaphthalene-4-yl Phosphine Ligands: Synthesis and Electronic Modulation in Suzuki-Miyaura Coupling Reactions", RSC Advances, (2015), 7 pages.
(Continued)

*Primary Examiner* — Robert S Loewe
(74) *Attorney, Agent, or Firm* — Womble Bond Dickinson (US) LLP

(57) ABSTRACT

Embodiments provide an organometallic compound, a light-emitting device including the organometallic compound, and an electronic apparatus including the light-emitting device. The light-emitting device includes a first electrode, a second electrode facing the first electrode, an interlayer between the first electrode and the second electrode and including an emission layer, and the organometallic compound, which is represented by Formula 1, as defined in the specification:

[Formula 1]

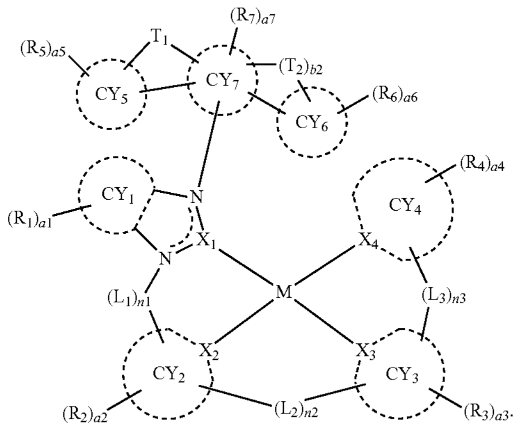

20 Claims, 8 Drawing Sheets

(56) References Cited

U.S. PATENT DOCUMENTS

| | | | | |
|---|---|---|---|---|
| 9,425,415 | B2 | 8/2016 | Li et al. | |
| 9,461,254 | B2 | 10/2016 | Tsai et al. | |
| 9,673,406 | B2 | 6/2017 | Kwong et al. | |
| 9,698,359 | B2 | 7/2017 | Li et al. | |
| 9,748,502 | B2 | 8/2017 | Anémian et al. | |
| 9,871,212 | B2 | 1/2018 | Kwong et al. | |
| 9,899,614 | B2 | 2/2018 | Li et al. | |
| 10,873,038 | B2 | 12/2020 | Wu et al. | |
| 10,916,715 | B2 | 2/2021 | Ko et al. | |
| 11,084,838 | B2 | 8/2021 | Chen et al. | |
| 11,101,435 | B2 | 8/2021 | Li et al. | |
| 11,527,730 | B2 | 12/2022 | Shin et al. | |
| 12,082,487 | B2 * | 9/2024 | Lee | H10K 85/346 |
| 12,250,874 | B2 * | 3/2025 | Ahn | C09K 11/06 |
| 12,520,717 | B2 * | 1/2026 | Ko | H10K 85/636 |
| 2004/0238371 | A1 | 12/2004 | Franz | |
| 2005/0287394 | A1 | 12/2005 | Yang et al. | |
| 2008/0018221 | A1 | 1/2008 | Egen et al. | |
| 2012/0031765 | A1 | 2/2012 | Curran et al. | |
| 2012/0121936 | A1 | 5/2012 | Baek et al. | |
| 2014/0309428 | A1 | 10/2014 | Egen et al. | |
| 2016/0285015 | A1 | 9/2016 | Li et al. | |
| 2017/0058421 | A1 | 3/2017 | Moravek et al. | |
| 2017/0317298 | A1 * | 11/2017 | Anémian | H05B 33/14 |
| 2018/0230173 | A1 | 8/2018 | Ji et al. | |
| 2018/0261781 | A1 | 9/2018 | Lee et al. | |
| 2018/0305385 | A1 | 10/2018 | Chen et al. | |
| 2018/0375036 | A1 | 12/2018 | Chen et al. | |
| 2019/0036038 | A1 | 1/2019 | Ko et al. | |
| 2019/0119312 | A1 | 4/2019 | Chen et al. | |
| 2020/0119289 | A1 | 4/2020 | Lin et al. | |
| 2020/0140471 | A1 | 5/2020 | Chen et al. | |
| 2020/0216481 | A1 | 7/2020 | Chen et al. | |
| 2020/0251670 | A1 | 8/2020 | Thompson et al. | |
| 2020/0321537 | A1 | 10/2020 | Jeon et al. | |
| 2020/0343526 | A1 | 10/2020 | Oakes et al. | |
| 2020/0373504 | A1 | 11/2020 | Shin et al. | |
| 2020/0395560 | A1 | 12/2020 | Bae et al. | |
| 2020/0411775 | A1 | 12/2020 | Chen et al. | |
| 2021/0024561 | A1 | 1/2021 | Chen et al. | |
| 2021/0050532 | A1 | 2/2021 | Chen et al. | |
| 2021/0151696 | A1 | 5/2021 | Lee et al. | |
| 2021/0171548 | A1 | 6/2021 | Min et al. | |
| 2021/0175443 | A1 | 6/2021 | Thompson et al. | |
| 2021/0284672 | A1 | 9/2021 | Chen et al. | |
| 2021/0305520 | A1 | 9/2021 | Thompson et al. | |
| 2021/0388013 | A1 | 12/2021 | Tsai et al. | |
| 2022/0069237 | A1 | 3/2022 | Kwon et al. | |
| 2022/0106345 | A1 | 4/2022 | Bae et al. | |
| 2022/0112232 | A1 | 4/2022 | Macinnis et al. | |
| 2022/0162246 | A1 * | 5/2022 | Chen | H10K 85/346 |
| 2022/0173338 | A1 | 6/2022 | Ko et al. | |
| 2022/0199918 | A1 * | 6/2022 | Ahn | C09K 11/06 |
| 2022/0209142 | A1 | 6/2022 | Kim et al. | |
| 2022/0271236 | A1 | 8/2022 | Brooks et al. | |
| 2022/0271241 | A1 * | 8/2022 | Horwitz | C09K 11/06 |
| 2022/0332740 | A1 | 10/2022 | Lee et al. | |
| 2022/0393117 | A1 | 12/2022 | Chen et al. | |
| 2022/0403528 | A1 | 12/2022 | Wu et al. | |
| 2023/0101854 | A1 | 3/2023 | Bae et al. | |
| 2023/0115552 | A1 * | 4/2023 | Thompson | C09K 11/06 257/40 |
| 2023/0167145 | A1 * | 6/2023 | Thompson | H10K 85/658 257/40 |
| 2023/0371360 | A1 * | 11/2023 | Chen | C07F 15/0086 |
| 2024/0298518 | A1 * | 9/2024 | Hamze | C07F 15/0086 |
| 2025/0113725 | A1 | 4/2025 | Wu et al. | |
| 2025/0143169 | A1 * | 5/2025 | Jeon | H10K 85/6574 |
| 2026/0013321 | A1 * | 1/2026 | Sheina | H10K 50/121 |
| 2026/0022294 | A1 * | 1/2026 | Lee | C09K 11/06 |
| 2026/0026189 | A1 * | 1/2026 | Lee | H10K 50/131 |

FOREIGN PATENT DOCUMENTS

| | | | |
|---|---|---|---|
| CN | 105473670 | A | 4/2016 |
| CN | 114644660 | A | 6/2022 |
| EP | 2711999 | A2 | 3/2014 |
| EP | 3508491 | A1 | 7/2019 |
| JP | 2007-045742 | | 2/2007 |
| KR | 10-0730115 | | 6/2007 |
| KR | 10-2014-0117546 | A | 10/2014 |
| KR | 10-2017-0024162 | A | 3/2017 |
| KR | 10-2018-0043886 | A | 5/2018 |
| KR | 10-2019-0011866 | A | 2/2019 |
| KR | 10-2020-0115134 | A | 10/2020 |
| KR | 10-2020-0133872 | A | 12/2020 |
| KR | 10-2021-0059126 | A | 5/2021 |
| KR | 10-2021-0065868 | A | 6/2021 |
| KR | 10-2021-0073469 | A | 6/2021 |
| KR | 10-2021-0150303 | A | 12/2021 |
| KR | 10-2022-0028945 | A | 3/2022 |
| KR | 10-2022-0138500 | A | 10/2022 |
| WO | 2012-121936 | | 9/2012 |

OTHER PUBLICATIONS

Yun et al. ""Triplet Exciton Upconverting Blue Exciplex Host for Deep Blue Phosphors."" Chemistry—A European Journal., (2021) 7 pages.

Taiwanese Office Action and Search Report corresponding to TW Application No. 110143149, dated May 19, 2022 (8 pages).

US Office Action dated Jul. 1, 2024, issued in U.S. Appl. No. 17/746,662 (5 pages).

US Office Action dated Jul. 25, 2024, issued in U.S. Appl. No. 17/443,933 (6 pages).

US Notice of Allowance dated Oct. 22, 2024, issued in U.S. Appl. No. 17/746,662 (7 pages).

US Notice of Allowance dated Dec. 18, 2024, issued in U.S. Appl. No. 17/443,933 (5 pages).

US Office Action dated Nov. 12, 2025, issued in U.S. Appl. No. 18/045,766 (12 pages).

US Office Action dated Feb. 3, 2026, issued in U.S. Appl. No. 17/992,764 (21 pages).

* cited by examiner

ORGANOMETALLIC COMPOUND, LIGHT-EMITTING DEVICE INCLUDING THE SAME, AND ELECTRONIC APPARATUS INCLUDING THE LIGHT-EMITTING DEVICE

CROSS-REFERENCE TO RELATED APPLICATION(S)

This application claims priority to and benefits of Korean Patent Application No. 10-2022-0034176 under 35 U.S.C. § 119, filed on Mar. 18, 2022, in the Korean Intellectual Property Office, the entire contents of which are incorporated herein by reference.

BACKGROUND

1. Technical Field

Embodiments relate to an organometallic compound, a light-emitting device including the organometallic compound, and an electronic apparatus including the light-emitting device.

2. Description of the Related Art

Among light-emitting devices, organic light-emitting devices are self-emissive devices that have wide viewing angles, high contrast ratios, short response times, and excellent characteristics in terms of luminance, driving voltage, and response speed, compared to devices in the art.

In an example, an organic light-emitting device may have a structure in which a first electrode is arranged on a substrate and a hole transport region, an emission layer, an electron transport region, and a second electrode are sequentially formed on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. The excitons may transition from an excited state to a ground state, thus generating light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include an organometallic compound having low driving voltage, excellent luminescence efficiency, long lifespan, and excellent color purity, a light-emitting device using the organometallic compound, and an electronic apparatus including the light-emitting device.

Additional aspects will be set forth in part in the description which follows and, in part, will be apparent from the description, or may be learned by practice of the embodiments of the disclosure.

According to an aspect, provided is a light-emitting device which may include a first electrode, a second electrode facing the first electrode, an interlayer between the first electrode and the second electrode and including an emission layer, and an organometallic compound which may be represented by Formula 1:

[Formula 1]

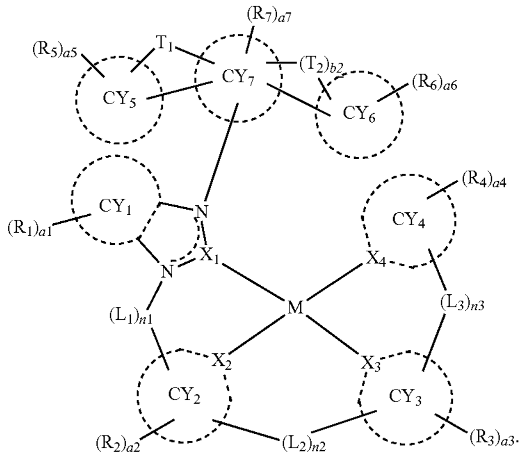

In Formula 1,

M may be platinum (Pt), palladium (Pd), copper (Cu), silver (Ag), gold (Au), rhodium (Rh), ruthenium (Ru), iridium (Ir), or osmium (Os), $X_1$ to $X_4$ may each independently be C or N, a bond between $X_1$ and M may be a coordinate bond, any one of a bond between $X_2$ and M, a bond between $X_3$ and M, and a bond between $X_4$ and M may be a coordinate bond, the remainder of a bond between $X_2$ and M, a bond between $X_3$ and M, and a bond between $X_4$ and M may each be a covalent bond, ring $CY_1$ to ring $CY_7$ may each independently be a $C_3$-$C_{60}$ carbocyclic group or a $C_1$-$C_{60}$ heterocyclic group, $L_1$ to $L_3$ may each independently be a single bond, *—C($R_8$)($R_9$)—*', *—C($R_8$)=*', *=C($R_8$)—*', *—C($R_8$)=C($R_9$)—*', *—C(=O)—*', *—C(=S)*', *—C≡C—*', *—B($R_8$)—*', *—N($R_8$)—*', *—O—*', *—P($R_8$)—*', *—Si($R_8$)($R_9$)—*', *—P(=O)($R_8$)—*', *—S—*', *—S(=O)—*', *—S(=O)$_2$—*', or *—Ge($R_8$)($R_9$)—*', n1 to n3 may each independently be an integer from 1 to 3, $T_1$ may be *—C($Z_{11}$)($Z_{12}$)—*' or *—Si($Z_{11}$)($Z_{12}$)—*', $T_2$ may be *—N($Z_{13}$)—*', *—O—*', *—S*—', *—C($Z_{13}$)($Z_{14}$)—*', or *—Si($Z_{13}$)($Z_{14}$)—*', b2 may be 0, 1, or 2, wherein $T_2$ is not present when b2 is 0,

* and *' each indicate a binding site to a neighboring atom, $R_1$ to $R_9$ and $Z_{11}$ to $Z_{14}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —P($Q_1$)($Q_2$), —C(=O)($Q_1$), —S(=O)($Q_1$), —S(=O)$_2$ ($Q_1$), —P(=O)($Q_1$)($Q_2$), or —P(=S)($Q_1$)($Q_2$), a1 to a7 may each independently be an integer from 0 to 20, each of two or more of $R_1$ in the number of a1; two or more of $R_2$ in the number of a2; two or more of $R_3$ in the number of a3; two or more of $R_4$ in the number of a4; two or more of $R_5$ in the number of a5; two or more of $R_6$ in the number of a6; two or more of $R_7$ in the number of a7; $R_8$ and $R_9$; $Z_{11}$ and $Z_{12}$; and $Z_{13}$ and $Z_{14}$, may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_1$ to $R_4$, $R_8$, and $R_9$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(=O)($Q_{11}$), —S(=O)($Q_{11}$), —S(=O)$_2$($Q_{11}$), —P(=O)($Q_{11}$)($Q_{12}$), —P(=S)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(=O)($Q_{21}$), —S(=O)($Q_{21}$), —S(=O)$_2$($Q_{21}$), —P(=O)($Q_{21}$)($Q_{22}$), —P(=S)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)($Q_{31}$), —S(=O)$_2$($Q_{31}$), —P(=O)($Q_{31}$)($Q_{32}$), or —P(=S)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the interlayer may further include a hole transport region between the first electrode and the emission layer, and an electron transport region between the emission layer and the second electrode; the hole transport region may include a hole injection layer, a hole transport layer, an emission auxiliary layer, an electron blocking layer, or any combination thereof; and the electron transport region may include a buffer layer, a hole blocking layer, an electron control layer, an electron transport layer, an electron injection layer, or any combination thereof.

In an embodiment, the emission layer may include the organometallic compound represented by Formula 1.

In an embodiment, the emission layer may emit blue light having a maximum emission wavelength in a range of about 410 nm to about 500 nm.

In an embodiment, the interlayer may include: a first compound which is the organometallic compound represented by Formula 1; and a second compound including a group represented by Formula 2, a third compound represented by Formula 3, a fourth compound including a group represented by Formula 4, or any combination thereof, wherein Formulae 2, 3, and 4 are explained below. The first compound, the second compound, and the third compound may be different from one another; the first compound, the second compound, and the fourth compound may be different from one another; and the third compound and the fourth compound may be identical to or different from each other.

In an embodiment, the emission layer may include a dopant and a host; the dopant may include the first compound; and the host may include the second compound, the third compound, the fourth compound, or any combination thereof.

According to embodiments, provided is an electronic apparatus which may include the light-emitting device, and a thin-film transistor, wherein the thin-film transistor may include a source electrode and a drain electrode, and the first electrode of the light-emitting device may be electrically connected to at least one of the source electrode and the drain electrode.

In an embodiment, the electronic apparatus may further include a color filter, a color conversion layer, a touch screen layer, a polarizing layer, or any combination thereof.

According to embodiments, provided is an electronic equipment which may include the light-emitting device, wherein the electronic equipment may be a flat panel display, a curved display, a computer monitor, a medical monitor, a television, an advertisement board, an indoor lighting, an outdoor lighting, a signaling light, a head-up display, a fully transparent display, a partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a microdisplay, a 3D display, a virtual-reality display, an augmented-reality display, a vehicle, a video wall including multiple displays tiled together, a theater screen, a stadium screen, a phototherapy device, or a sign.

According to another aspect, provided is the organometallic compound which may be represented by Formula 1.

In an embodiment, each of $X_1$ to $X_3$ may be C.

In an embodiment, ring $CY_1$ to ring $CY_7$ may each independently be a benzene group, a naphthalene group, a fluorene group, a benzofluorene group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno-dibenzothiophene group, a pyrazole group, an imidazole group, a triazole group, an oxazole group, an isooxazole group, an oxadiazole group, a thiazole group, an isothiazole group, a thiadiazole group, a benzopyrazole group, a benzimidazole group, a benzooxazole group, a benzoisooxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, an azanaphthobenzofuran group, an azanaphthobenzothiophene group, an azabenzocarbazole group, an azabenzofluorene group, an azanaphthobenzosilole group, an azadinaphthofuran group, an azadinaphthothiophene group, an azadibenzocarbazole group, an azadibenzofluorene group, an azadinaphthosilole group, a pyrido[2,3-b]indole group, a pyrido[3,4-b]indole group, a pyrido[4,3-b]indole group, a pyrido[3,2-b]indole group, or a pyrrolo[2,3-b]pyridine group In an embodiment, ring $CY_1$ may be a benzene group, a pyridine group, a pyridazine group, a pyrimidine group, a pyrazine group, a naphthalene group, a quinoline group, or an isoquinoline group; and ring $CY_2$ and ring $CY_3$ may each independently be a benzene group, a pyridine group, a pyrimidine group, a naphthalene group, a quinoline group, an isoquinoline group, a dibenzofuran group, a dibenzothiophene group, a carbazole group, an azacarbazole group, a fluorene group, or a dibenzosilole group. Ring $CY_4$ may be: an $X_4$-containing 5-membered ring; or an $X_4$-containing 6-membered ring; or an $X_4$-containing 5-membered ring in which at least one 6-membered ring is condensed, wherein the $X_4$-containing 5-membered ring may be a pyrrole group, a pyrazole group, an imidazole group, a triazole group, an oxazole group, an isooxazole group, a thiazole group, an isothiazole group, an oxadiazole group, or a thiadiazole group; and the $X_4$-containing 6-membered ring and the at least one 6-membered ring that is optionally condensed with the $X_4$-containing 5-membered ring may each independently be a benzene group, a pyridine group, or a pyrimidine group.

In an embodiment, at least one of Condition 1 to Condition 4 may be satisfied, wherein Condition 1 to Condition 4 are explained below.

In an embodiment, ring $CY_5$ to ring $CY_7$ may each independently be a benzene group, a naphthalene group, a pyridine group, a pyridazine group, a pyrimidine group, a pyrazine group, a triazine group, a fluorene group, a carbazole group, a dibenzofuran group, a dibenzothiophene group, an azacarbazole group, an azadibenzofuran group, or an azadibenzothiophene group.

In an embodiment, $L_1$ may be a single bond; or $L_2$ may be *—$C(R_8)(R_9)$—*', *—$B(R_8)$—*', *—$N(R_8)$—*', *—O—*', *—$P(R_8)$—*', *—$Si(R_8)(R_9)$—*', or *—S—*'; or $L_3$ may be a single bond, *—$N(R_8)$—*', or *—O—*'; or any combination thereof.

In an embodiment, the organometallic compound may satisfy Condition L-1 or Condition L-2, which are explained below.

In an embodiment, a moiety represented by

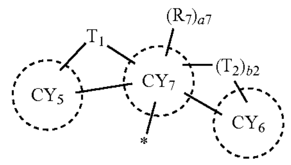

in Formula 1 may be a moiety represented by one of Formulae B1-1 to B1-12, which are explained below.

In an embodiment, $Z_{11}$ to $Z_{14}$ may each independently be:

hydrogen, deuterium, —F, or a cyano group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a phenyl group, a naphthyl group, a pyridinyl group, a pyrimidinyl group, or any combination thereof; or a cyclopentyl group, a cyclohexyl group, a cycloheptyl group, a cyclooctyl group, an adamantanyl group, a norbornanyl group, a phenyl group, a naphthyl group, a pyridinyl group, a pyrazinyl group, a pyrimidinyl group, a pyridazinyl group, a carbazolyl group, a triazinyl group, a dibenzofuranyl group, a dibenzothiophenyl group, a dibenzocarbazolyl group, an imidazopyridinyl group, or an imidazopyrim idinyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, a pyridinyl group, a pyrazinyl group, a pyrimidinyl group, a pyridazinyl group, a carbazolyl group, a triazinyl group, a dibenzofuranyl group, a dibenzothiophenyl group, a dibenzocarbazolyl group, an imidazopyridinyl group, an imidazopyrim idinyl group, or any combination thereof.

In an embodiment, the organometallic compound may be selected from Compounds 1 to 100, which are explained below.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects and features of the disclosure will be more apparent by describing in detail embodiments thereof with reference to the accompanying drawings, in which.

DETAILED DESCRIPTION OF THE EMBODIMENTS

Figure 1:
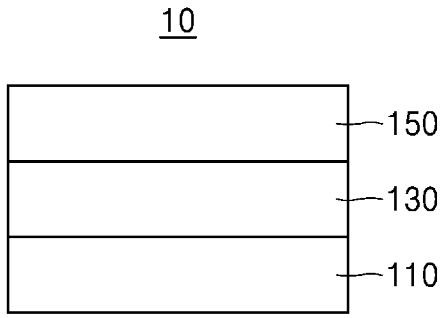
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the specification, the x-axis, y-axis, and z-axis are not limited to three axes in an orthogonal coordinate system, and may be interpreted in a broad sense including these axes. For example, the x-axis, y-axis, and z-axis may refer to axes which are orthogonal to each other, or may refer to axes which are in different directions that are not orthogonal to each other.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

An aspect of the disclosure provides an organometallic compound which may be represented by Formula 1:

[Formula 1]

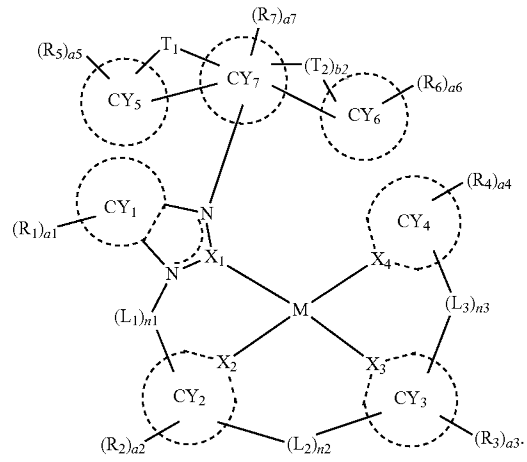

In Formula 1, M may be platinum (Pt), palladium (Pd), copper (Cu), silver (Ag), gold (Au), rhodium (Rh), iridium (Ir), ruthenium (Ru), or osmium (Os).

In an embodiment, M may be Pt.

In Formula 1, $X_1$ to $X_4$ may each independently be C or N.

In an embodiment, each of $X_1$ to $X_3$ may be C.

In an embodiment, $X_4$ may be N.

In Formula 1, a bond between $X_1$ and M may be a coordinate bond; any one of a bond between $X_2$ and M, a bond between $X_3$ and M, and a bond between $X_4$ and M may be a coordinate bond; and the remainder of a bond between $X_2$ and M, a bond between $X_3$ and M, and a bond between $X_4$ and M may each be a covalent bond.

In an embodiment, a bond between $X_1$ and M may be a coordinate bond, a bond between $X_2$ and M may be a covalent bond, a bond between $X_3$ and M may be a covalent bond, and a bond between $X_4$ and M may be a coordinate bond.

In Formula 1, ring $CY_1$ to ring $CY_7$ may each independently be a $C_3$-$C_{60}$ carbocyclic group or a $C_1$-$C_{60}$ heterocyclic group.

In an embodiment, ring $CY_1$ to ring $CY_7$ may each independently be a benzene group, a naphthalene group, a fluorene group, a benzofluorene group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isooxazole group, an oxadiazole group, a thiazole group, an isothiazole group, a thiadiazole group, a benzopyrazole group, a benzimidazole group, a benzooxazole group, a benzoisooxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, an azanaphthobenzofuran group, an azanaphthobenzothiophene group, an azabenzocarbazole group, an azabenzofluorene group, an azanaphthobenzosilole group, an azadinaphthofuran group, an azadinaphthothiophene group, an azadibenzocarbazole group, an azadibenzofluorene group, an azadinaphthosilole group, a pyrido[2,3-b]indole group, a pyrido[3,4-b]indole group, a pyrido[4,3-b]indole group, a pyrido[3,2-b]indole group, or a pyrrolo[2,3-b]pyridine group.

In an embodiment, ring $CY_1$ may be a benzene group, a pyridine group, a pyridazine group, a pyrimidine group, a pyrazine group, a naphthalene group, a quinoline group, or an isoquinoline group, ring $CY_2$ and ring $CY_3$ may each independently be a benzene group, a pyridine group, a pyrimidine group, a naphthalene group, a quinoline group, an isoquinoline group, a dibenzofuran group, a dibenzothiophene group, a carbazole group, an azacarbazole group, a fluorene group, or a dibenzosilole group, ring $CY_4$ may be: an $X_4$-containing 5-membered ring; or an $X_4$-containing 6-membered ring; or an $X_4$-containing 5-membered ring in which at least one 6-membered ring is condensed, the $X_4$-containing 5-membered ring may be a pyrrole group, a pyrazole group, an imidazole group, a triazole group, an oxazole group, an isooxazole group, a thiazole group, an isothiazole group, an oxadiazole group, or a thiadiazole group, and the $X_4$-containing 6-membered ring and the at least one 6-membered ring that is optionally condensed with the $X_4$-containing 5-membered ring may each independently be a benzene group, a pyridine group, or a pyrimidine group.

For example, ring $CY_1$ may be a benzene group, a pyridine group, a pyridazine group, a pyrimidine group, or a pyrazine group.

For example, ring $CY_2$ and ring $CY_3$ may each independently be a benzene group, a pyridine group, a pyrimidine group, a dibenzofuran group, a dibenzothiophene group, a carbazole group, or an azacarbazole group.

For example, ring $CY_4$ may be a $C_1$-$C_{60}$ nitrogen-containing heterocyclic group.

In embodiments, ring $CY_4$ may be an $X_4$-containing 5-membered ring, and the $X_4$-containing 5-membered ring may be a pyrazole group or an imidazole group.

In embodiments, ring $CY_4$ may be an $X_4$-containing 6-membered ring, and the $X_4$-containing 6-membered ring may be a pyridine group or a pyrimidine group.

In embodiments, ring $CY_4$ may be an $X_4$-containing 5-membered ring in which at least one 6-membered ring is condensed, and the $X_4$-containing 5-membered ring in which at least one 6-membered ring is condensed may be a benzimidazole group or an imidazopyridine group.

In embodiments, ring $CY_4$ may be a pyrazole group, an imidazole group, a pyridine group, a pyrimidine group, a benzimidazole group, or an imidazopyridine group.

In embodiments, ring $CY_5$ to ring $CY_7$ may each independently be a $C_6$-$C_{10}$ arene group or a $C_1$-$C_{10}$ heteroarene group.

In embodiments, ring $CY_5$ to ring $CY_7$ may each independently be a benzene group, a naphthalene group, a pyridine group, a pyridazine group, a pyrimidine group, a pyrazine group, a triazine group, a fluorene group, a carbazole group, a dibenzofuran group, a dibenzothiophene group, an azacarbazole group, an azadibenzofuran group, or an azadibenzothiophene group.

For example, ring $CY_5$ and ring $CY_6$ may each independently be a benzene group, a pyridine group, a pyrimidine group, a triazine group, a dibenzofuran group, or a dibenzothiophene group.

For example, ring $CY_7$ may be a benzene group.
In an embodiment, the organometallic compound may satisfy at least one of Condition 1 to Condition 4:
[Condition 1]
A moiety represented by
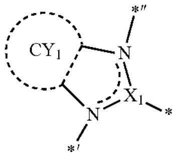
in Formula 1 may be a moiety represented by one of Formulae CY1-1 to CY1-25:
CY1-1
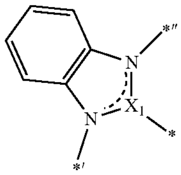
CY1-2
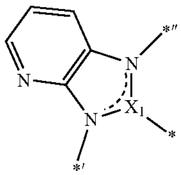
CY1-3
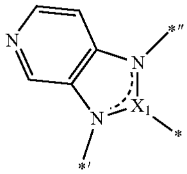
CY1-4
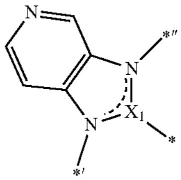
CY1-5
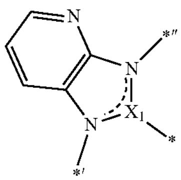
CY1-6
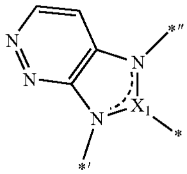
-continued
CY1-7
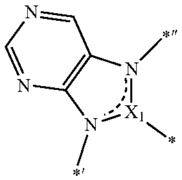
CY1-8
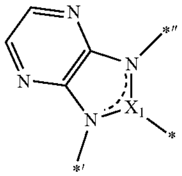
CY1-9
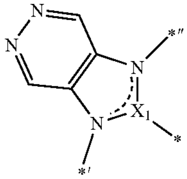
CY1-10
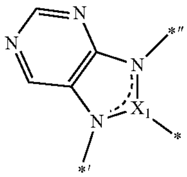
CY1-11
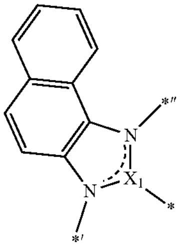
CY1-12
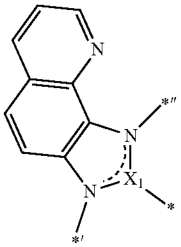
CY1-13
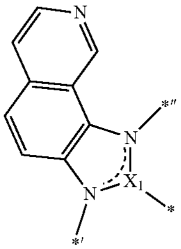

-continued
CY1-14
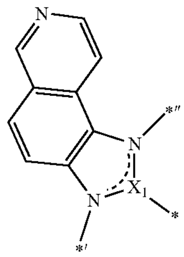
CY1-15
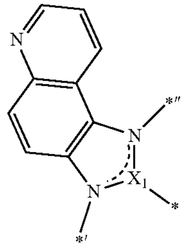
CY1-16
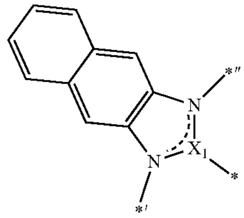
CY1-17
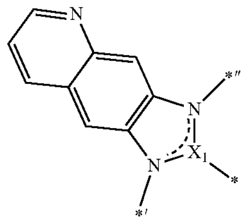
CY1-18
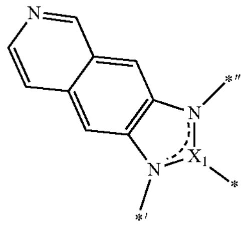
CY1-19
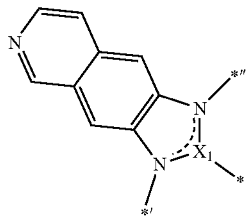
-continued
CY1-20
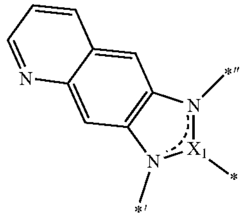
CY1-21
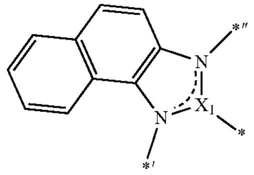
CY1-22
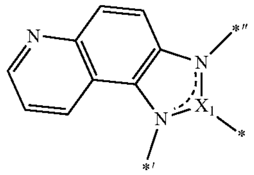
CY1-23
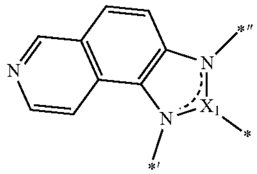
CY1-24
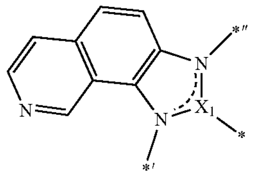
CY1-25
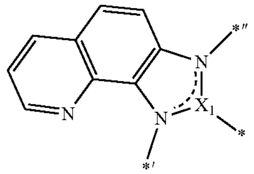
In Formulae CY1-1 to CY1-25,
$X_1$ is the same as described herein,
* indicates a binding site to M in Formula 1,
*' indicates a binding site to $(L_1)_{n1}$ in Formula 1, and
*" indicates a binding site to ring $CY_7$ in Formula 1.
[Condition 2]
A moiety represented by
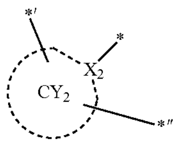

in Formula 1 may be a moiety represented by one of Formulae CY2-1 to CY2-11:

CY2-1

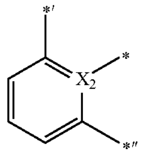

CY2-2

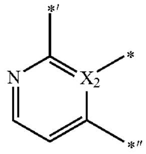

CY2-3

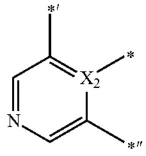

CY2-4

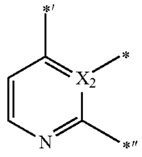

CY2-5

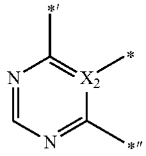

CY2-6

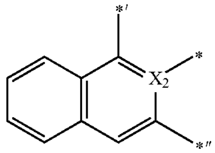

CY2-7

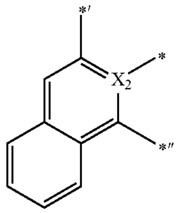

CY2-8

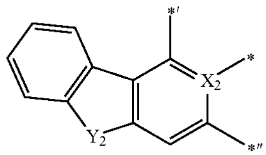

-continued

CY2-9

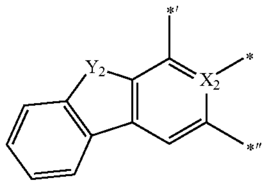

CY2-10

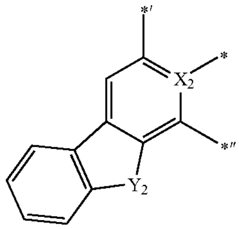

CY2-11

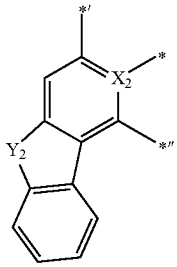

In Formulae CY2-1 to CY2-11, $X_2$ is the same as described herein, $Y_2$ may include O, S, N, C, or Si,

* indicates a binding site to M in Formula 1,

*' indicates a binding site to $(L_1)_{n1}$ in Formula 1, and

*" indicates a binding site to $(L_2)_{n2}$ in Formula 1.

[Condition 3]

A moiety represented by

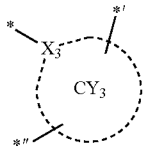

in Formula 1 may be a moiety represented by one of Formulae CY3-1 to CY3-23:

CY3-1

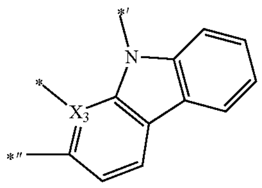

-continued
CY3-2
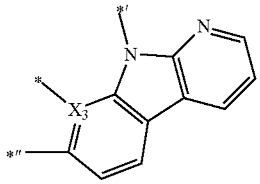
CY3-3
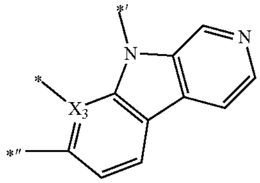
CY3-4
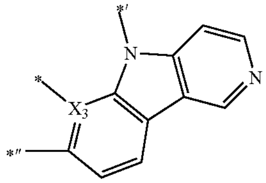
CY3-5
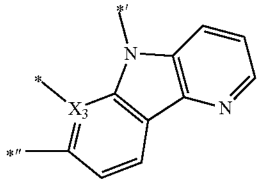
CY3-6
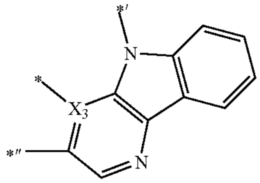
CY3-7
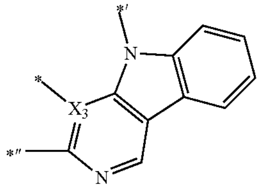
CY3-8
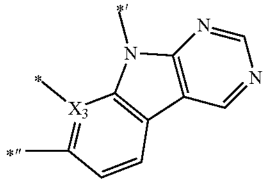
CY3-9
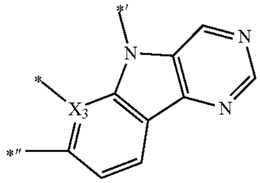
-continued
CY3-10
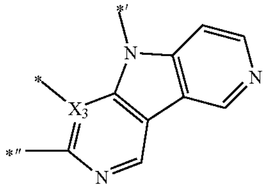
CY3-11
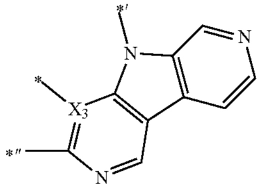
CY3-12
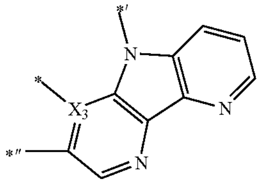
CY3-13
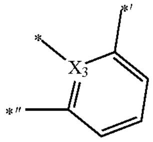
CY3-14
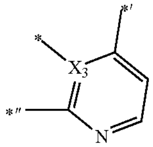
CY3-15
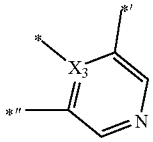
CY3-16
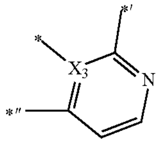
CY3-17
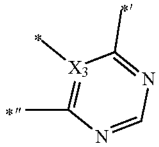
CY3-18
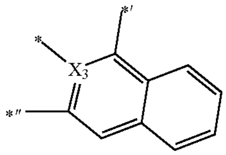

-continued
CY3-19
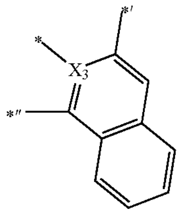
CY3-20
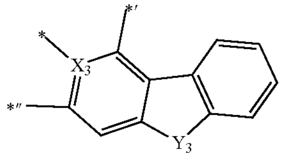
CY3-21
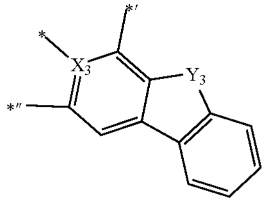
CY3-22
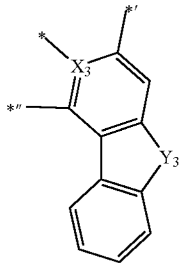
CY3-23
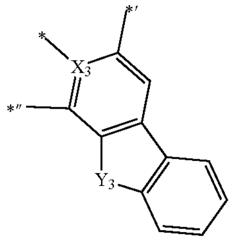
In Formulae CY3-1 to CY3-23,
$X_3$ is the same as described herein,
$Y_3$ may include O, S, N, C, or Si,
* indicates a binding site to M in Formula 1,
*' indicates a binding site to $(L_3)_{n3}$ in Formula 1, and
*" indicates a binding site to $(L_2)_{n2}$ in Formula 1.
[Condition 4]
A moiety represented by
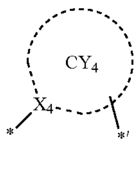
in Formula 1 may be a moiety represented by one of Formulae CY4-1 to CY4-48:
CY4-1
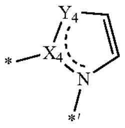
CY4-2
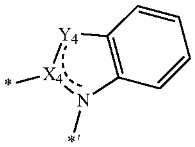
CY4-3
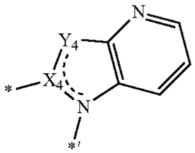
CY4-4
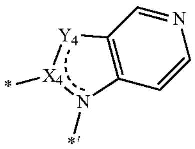
CY4-5
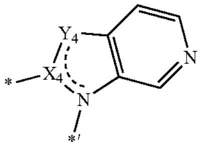
CY4-6
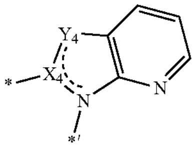
CY4-7
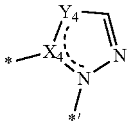
CY4-8
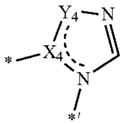
CY4-9
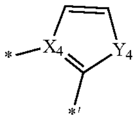
CY4-10
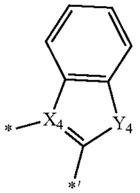

-continued
CY4-11
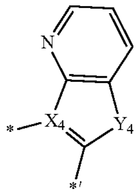
CY4-12
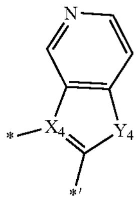
CY4-13
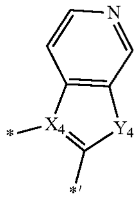
CY4-14
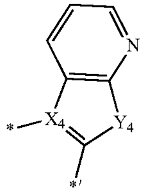
CY4-15
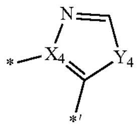
CY4-16
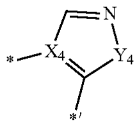
CY4-17
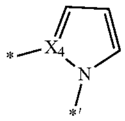
CY4-18
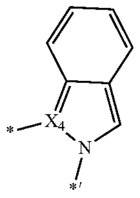
CY4-19
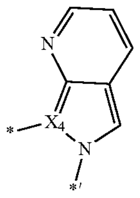
-continued
CY4-20
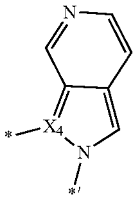
CY4-21
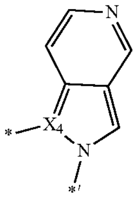
CY4-22
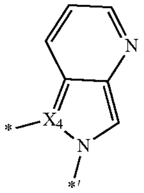
CY4-23
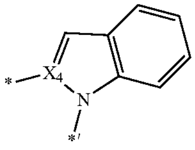
CY4-24
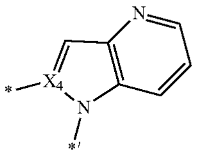
CY4-25
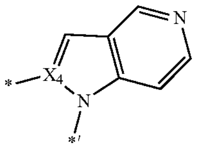
CY4-26
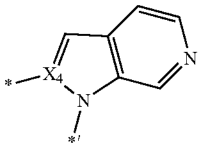
CY4-27
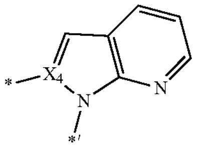
CY4-28
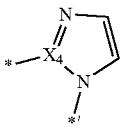

-continued
CY4-29
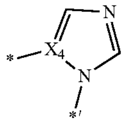
CY4-30
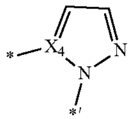
CY4-31
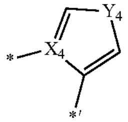
CY4-32
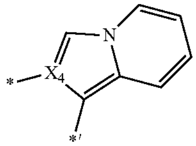
CY4-33
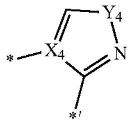
VY4-34
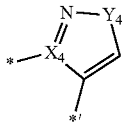
CY4-35
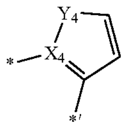
CY4-36
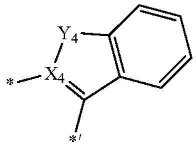
CY4-37
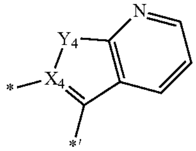
CY4-38
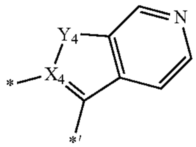
CY4-39
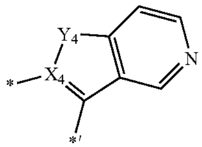
-continued
CY4-40
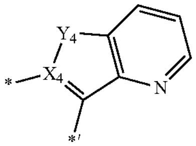
CY4-41
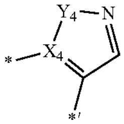
CY4-42
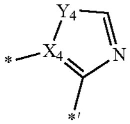
CY4-43
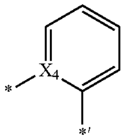
CY4-44
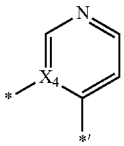
CY4-45
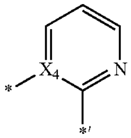
CT4-46
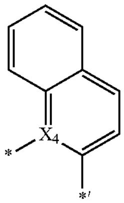
CY4-47
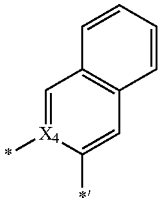
CY4-48
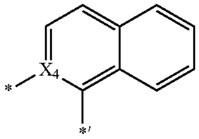
In Formulae CY4-1 to CY4-48,
$X_4$ is the same as described herein,
$Y_4$ may include O, S, N, C, or Si,
* indicates a binding site to M in Formula 1, and
*' indicates a binding site to $(L_3)_{n3}$ in Formula 1.

In Formula 1, $L_1$ to $L_3$ may each independently be a single bond, *—$C(R_8)(R_9)$—*', *—$C(R_8)$═*', *═$C(R_8)$—*', *—$C(R_8)$═$C(R_9)$—*', *—C(═O)—*', *—C(═S)—*', *—C≡C—*', *—$B(R_8)$—*', *—$N(R_8)$—*', *—O—*', *—$P(R_8)$—*', *—$Si(R_8)(R_9)$—*', *—P(═O)$(R_8)$—*', *—S—*', *—S(═O)—*', *—$S(═O)_2$—*', or *—$Ge(R_8)(R_9)$—*', wherein * and *' each indicate a binding site to a neighboring atom, and $R_8$ and $R_9$ may respectively be the same as those described herein. In Formula 1, $L_1$ to $L_3$ may be identical to or different from each other.

In an embodiment, with respect to $L_1$ to $L_3$, $L_1$ may be a single bond; or $L_2$ may be *—$C(R_8)(R_9)$—*', *—$B(R_8)$—*', *—$N(R_8)$—*', *—O—*', *—$P(R_8)$—*', *—$Si(R_8)(R_9)$—*', or *—S—*'; or $L_3$ may be a single bond, *—$N(R_8)$—*', or *—O—*'; or any combination thereof.

In Formula 1, n1 to n3 may each independently be an integer from 1 to 3. In Formula 1, n1 indicates the number of $L_1$(s), wherein two or more of $L_1$ may be identical to or different from each other when n1 is 2 or more. In Formula 1, n2 indicates the number of $L_2$(s), wherein two or more of $L_2$ may be identical to or different from each other when n2 is 2 or more. In Formula 1, n3 indicates the number of $L_3$(s), wherein two or more of $L_3$ may be identical to or different from each other when n3 is 2 or more.

For example, $L_1$ may be a single bond; $L_2$ may be *—$C(R_8)(R_9)$—*', *—$B(R_8)$—*', *—$N(R_8)$—*', *—O—*', *—$P(R_8)$—*', *—$Si(R_8)(R_9)$—*', or *—S—*'; and $L_3$ may be a single bond, *—$N(R_8)$—*', or *—O—*'.

For example, in Formula 1, each of n1 to n3 may be 1.

In an embodiment, the organometallic compound may satisfy Condition L-1 or Condition L-2:

[Condition L-1]

$L_3$ may be a single bond, and ring $CY_3$ may be a benzene group, a carbazole group, or an azacarbazole group;

[Condition L-2]

$L_3$ may be *—O—*', and ring $CY_3$ may be a benzene group, a pyridine group, or a pyrimidine group.

In an embodiment, the organometallic compound may satisfy Condition L-1 or Condition L-2, and additionally in the organometallic compound, ring $CY_4$ may be: an $X_4$-containing 5-membered ring; or an $X_4$-containing 6-membered ring; or an $X_4$-containing 5-membered ring in which at least one 6-membered ring is condensed, wherein the $X_4$-containing 5-membered ring may be a pyrrole group, a pyrazole group, or an imidazole group, and the $X_4$-containing 6-membered ring and the at least one 6-membered ring that is optionally condensed with the $X_4$-containing 5-membered ring may each independently be a benzene group, a pyridine group, or a pyrimidine group.

For example, the organometallic compound may satisfy Condition L-1, and ring $CY_4$ in the organometallic compound may be a pyridine group or a pyrimidine group. However, embodiments are not limited thereto.

In embodiments, the organometallic compound may satisfy Condition L-1, and ring $CY_4$ in the organometallic compound may be a pyrazole group, an imidazole group, or a benzimidazole group. However, embodiments are not limited thereto.

In embodiments, when $L_2$ is *—$C(R_8)(R_9)$—*' or *—$Si(R_8)(R_9)$—*', $R_8$ and $R_9$ may be combined with each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$. For example, in Compound 93 or the like as described herein, $L_2$ may be *—$C(R_8)(R_9)$—*', and $R_8$ and $R_9$ may each independently be a phenyl group and may be connected to each other to form a carbocyclic group. However, embodiments are not limited thereto.

In Formula 1, $T_1$ may be *—$C(Z_{11})(Z_{12})$—*' or *—$Si(Z_{11})(Z_{12})$—*'; and $T_2$ may be *—$N(Z_{13})$—*', *—O—*', *—S—*', *—$C(Z_{13})(Z_{14})$—*', or *—$Si(Z_{13})(Z_{14})$—*', wherein *and *' each indicate a binding site to a neighboring atom, and $Z_{11}$ to $Z_{14}$ may respectively be the same as those described herein.

In Formula 1, b2 may be 0, 1, or 2. In Formula 1, b2 indicates the number of $T_2$(s), and $T_2$ is not present when b2 is 0.

In an embodiment, b2 may be 0 or 1.

In embodiments, b2 may be 1, and $T_2$ may be *—$C(Z_{13})(Z_{14})$—*' or *—$Si(Z_{13})(Z_{14})$—*'. For example: $T_1$ may be *—$C(Z_{11})(Z_{12})$—*', and $T_2$ may be *—$C(Z_{13})(Z_{14})$—*'; or $T_1$ may be *—$Si(Z_{11})(Z_{12})$—*', and $T_2$ may be *—$C(Z_{13})(Z_{14})$—*'; or $T_1$ may be *—$C(Z_{11})(Z_{12})$—*', and $T_2$ may be *—$Si(Z_{13})(Z_{14})$—*'; or $T_1$ may be *—$Si(Z_{11})(Z_{12})$—*', and $T_2$ may be *—$Si(Z_{13})(Z_{14})$—*'.

In an embodiment, a moiety represented by

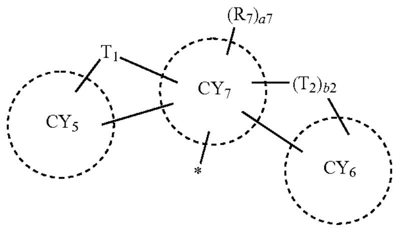

in Formula 1 may be a moiety represented by one of Formulae B1-1 to B1-12:

B1-1

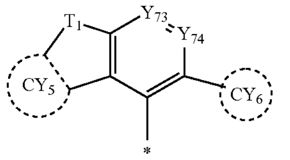

B1-2

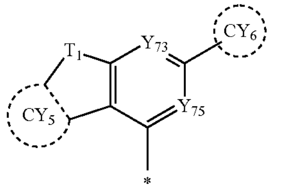

B1-3

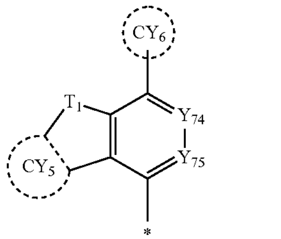

-continued

B1-4

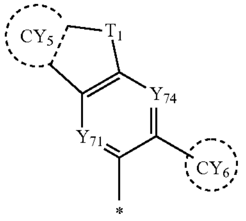

B1-5

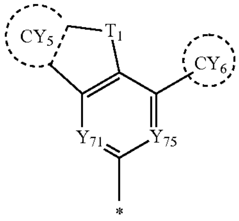

B1-6

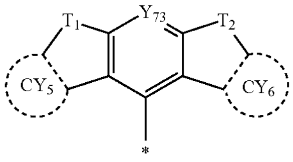

B1-7

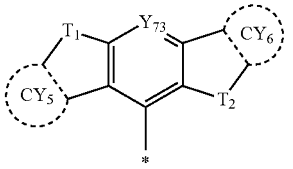

B1-8

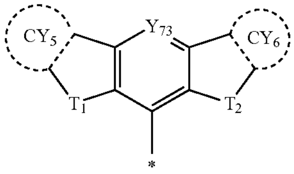

B1-9

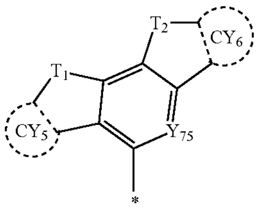

B1-10

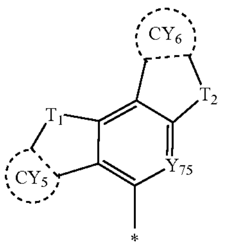

-continued

B1-11

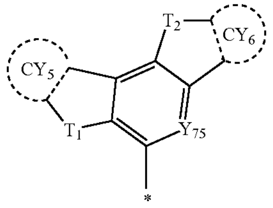

B1-12

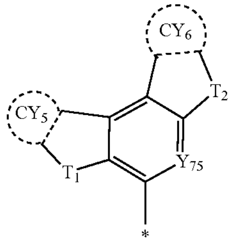

In Formulae B1-1 to B1-12, $T_1$, $T_2$, ring $CY_5$, and ring $CY_6$ may respectively be the same as those described herein, $Y_{71}$ may be N or $C(R_{7a})$, $Y_{73}$ may be N or $C(R_{7c})$, $Y_{74}$ may be N or $C(R_{7d})$, and $Y_{75}$ may be N or $C(R_{7e})$, $R_{7a}$ and $R_{7c}$ to $R_{7e}$ may each independently be the same as described in connection with $R_7$ in Formula 1, and

* indicates a binding site to a nitrogen atom in Formula 1.

For example, a moiety represented by

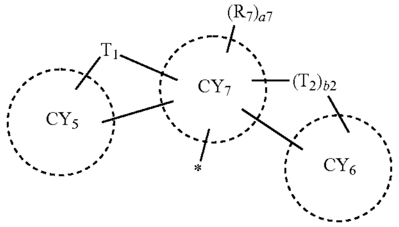

in Formula 1 may be a moiety represented by Formula B1-1 or Formula B1-6.

In an embodiment, in case that b2 is 0, the organometallic compound may satisfy at least one of Condition 6-1 and Condition 6-2:

[Condition 6-1]

$CY_6$ is a benzene group, a naphthalene group, a pyridine group, a pyridazine group, a pyrimidine group, a pyrazine group, a triazine group, a fluorene group, a carbazole group, a dibenzofuran group, a dibenzothiophene group, an azacarbazole group, an azadibenzofuran group, or an azadibenzothiophene group;

[Condition 6-2]

$R_6$ is:

hydrogen, deuterium, —F, or a cyano group;

a $C_1$-$C_{20}$ alkyl group or a $C_3$-$C_{10}$ cycloalkyl group, each unsubstituted or substituted with deuterium, —F, a cyano group, or any combination thereof; or a phenyl group, a pyridinyl group, a pyrimidinyl group, a naphthyl group, a carbazolyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, or any combination thereof.

In embodiments, the organometallic compound may satisfy Condition T-1 or Condition T-2:

[Condition T-1]

b2 is 0, and $Z_{11}$ and $Z_{12}$ are combined with each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$;

[Condition T-2]

b2 is 1, $Z_{11}$ and $Z_{12}$ are combined with each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $T_2$ is *—N($Z_{13}$)—*', *—O—*', or *—S—*'; or $T_2$ is *—C($Z_{13}$)($Z_{14}$)—*' or *—Si($Z_{13}$)($Z_{14}$)—*'.

In embodiments, in case that the organometallic compound satisfies Condition T-2 and $T_2$ is *—C($Z_{13}$)($Z_{14}$)—*' or *—Si($Z_{13}$)($Z_{14}$)—*', $Z_{13}$ and $Z_{14}$ may be combined with each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

For example, Compound 81 or the like as described herein may satisfy Condition T-1 (wherein, in Compound 81, b2 is 0, $T_1$ is *—C($Z_{11}$)($Z_{12}$)—*', and $Z_{11}$ and $Z_{12}$ are each a phenyl group and are combined with each other via a single bond). For example, Compound 84 or the like as described herein may satisfy Condition T-2 (wherein, in Compound 84, b2 is 1, $T_1$ is *—C($Z_{11}$)($Z_{12}$)—*', $T_2$ is *—C($Z_{13}$)($Z_{14}$)—*', $Z_{11}$ to $Z_{14}$ are each a phenyl group, $Z_{11}$ and $Z_{12}$ may be combined with each other via a single bond, and $Z_{13}$ and $Z_{14}$ may be combined with each other via a single bond). However, embodiments are not limited thereto.

In Formula 1, $R_1$ to $R_9$ and $Z_{11}$ to $Z_{14}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si(Q $_1$)($Q_2$)($Q_3$), —N($Q_1$)($Q_2$), —B($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$).

In Formula 1, a1 to a7 may each independently be an integer from 0 to 20.

In Formula 1, each of two or more of $R_1$ in the number of a1; two or more of $R_2$ in the number of a2; two or more of $R_3$ in the number of a3; two or more of $R_4$ in the number of a4; two or more of $R_5$ in the number of a5; two or more of $R_6$ in the number of a6; two or more of $R_7$ in the number of a7; Ra and $R_9$; $Z_{11}$ and $Z_{12}$; and $Z_{13}$ and $Z_{14}$, may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

For example, two or more of $R_1$ in the number of a1 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_2$ in the number of a2 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_3$ in the number of a3 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_4$ in the number of a4 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_5$ in the number of a5 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_6$ in the number of a6 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_7$ in the number of a7 may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_8$ and $R_9$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $Z_{11}$ and $Z_{12}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $Z_{13}$ and $Z_{14}$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In Formula 1, two or more of $R_1$ to $R_4$, $R_8$, and $R_9$ may optionally be bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, a1 to a7 may each independently be an integer from 0 to 10.

In an embodiment, in Formula 1, $R_1$ to $R_9$ and $Z_{11}$ to $Z_{14}$ may each independently be:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof; or —$Si(Q_1)(Q_2)(Q_3)$, —$B(Q_1)(Q_2)$, —$N(Q_1)(Q_2)$, —$P(Q_1)(Q_2)$, or —$C(=O)(Q_1)$, wherein $Q_1$ to $Q_3$ and $Q_{31}$ to $Q_{33}$ may each be the same as described herein.

In embodiments, $R_1$ to $R_9$ and $Z_{11}$ to $Z_{14}$ may each independently be:

hydrogen, deuterium, —F, or a cyano group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a phenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a phenyl group, a naphthyl group, a pyrrolyl group, a thiophenyl group, a furanyl group, a pyridinyl group, a pyrazinyl group, a pyrimidinyl group, a pyridazinyl group, a carbazolyl group, a triazinyl group, a dibenzofuranyl group, a dibenzothiophenyl group, a dibenzocarbazolyl group, an imidazopyridinyl group, or an imidazopyrimidinyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cyclooctyl group, an adamantanyl group, a norbornanyl group, a phenyl group, a naphthyl group, a pyrrolyl group, a thiophenyl group, a furanyl group, a pyridinyl group, a pyrazinyl group, a pyrimidinyl group, a pyridazinyl group, a carbazolyl group, a triazinyl group, a dibenzofuranyl group, a dibenzothiophenyl group, a dibenzocarbazolyl group, an imidazopyridinyl group, an imidazopyrimidinyl group, or any combination thereof; or —$N(Q_1)(Q_2)$, wherein $Q_1$ and $Q_2$ may each be the same as described herein.

In embodiments, $R_5$ to $R_7$ may each independently be:

hydrogen, deuterium, —F, or a cyano group; a $C_1$-$C_{20}$ alkyl group or a $C_3$-$C_{10}$ cycloalkyl group, each unsubstituted or substituted with deuterium, —F, a cyano group, or any combination thereof; or a phenyl group, a pyridinyl group, a pyrimidinyl group, a naphthyl group, a carbazolyl group, a dibenzofuranyl group, or a dibenzothiophenyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, or any combination thereof.

For example, $R_7$ may be hydrogen.

In embodiments, $Z_{11}$ to $Z_{14}$ may each independently be:

hydrogen, deuterium, —F, or a cyano group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a phenyl group, a naphthyl group, a pyridinyl group, a pyrimidinyl group, or any combination thereof; or a cyclopentyl group, a cyclohexyl group, a cycloheptyl group, a cyclooctyl group, an adamantanyl group, a norbornanyl group, a phenyl group, a naphthyl group, a pyridinyl group, a pyrazinyl group, a pyrimidinyl group, a pyridazinyl group, a carbazolyl group, a triazinyl group, a dibenzofuranyl group, a dibenzothiophenyl group, a dibenzocarbazolyl group, an imidazopyridinyl group, or an imidazopyrimidinyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, a pyridinyl group, a pyrazinyl group, a pyrimidinyl group, a pyridazinyl group, a carbazolyl group, a triazinyl group, a dibenzofuranyl group, a dibenzothiophenyl group, a dibenzocarbazolyl group, an imidazopyridinyl group, an imidazopyrim idinyl group, or any combination thereof.

In embodiments, $Z_{11}$ to $Z_{14}$ may each independently be:

hydrogen, deuterium, —F, or a cyano group;

a $C_1$-$C_{20}$ alkyl group, a $C_2$-$C_{20}$ alkenyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a phenyl group, a naphthyl group, a pyridinyl group, a pyrimidinyl group, or any combination thereof; or a cyclopentyl group, a cyclohexyl group, a phenyl group, a naphthyl group, a pyridinyl group, a pyrazinyl group, a pyrimidinyl group, a pyridazinyl group, or a triazinyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a phenyl group, a naphthyl group, a pyridinyl group, a pyrazinyl group, a pyrimidinyl group, a pyridazinyl group, a triazinyl group, or any combination thereof.

In an embodiment, the organometallic compound represented by Formula 1 may be selected from Compounds 1 to 100:

1

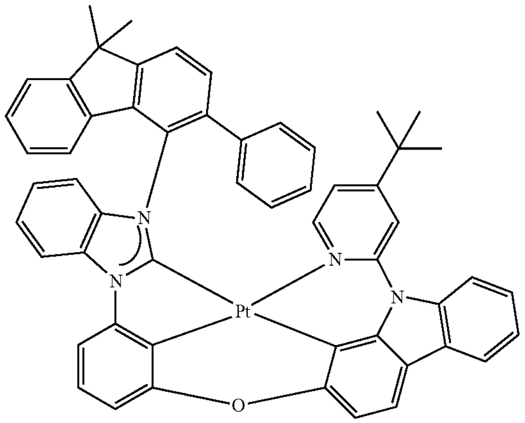

-continued

2

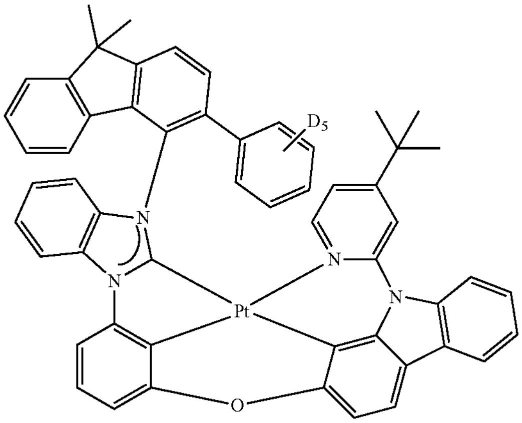

3

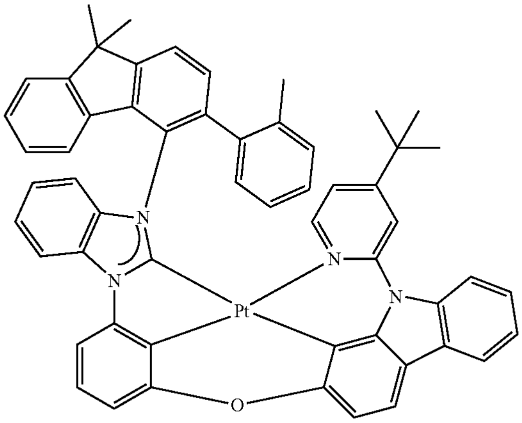

4

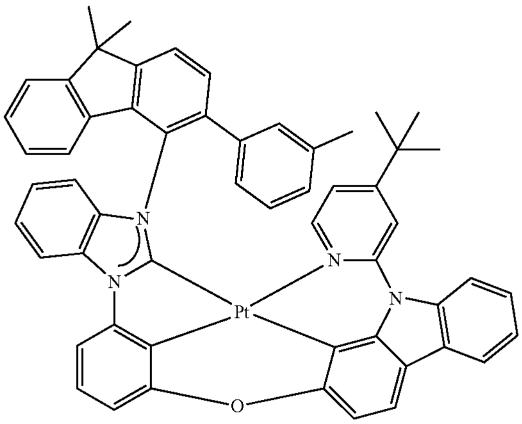

-continued
5
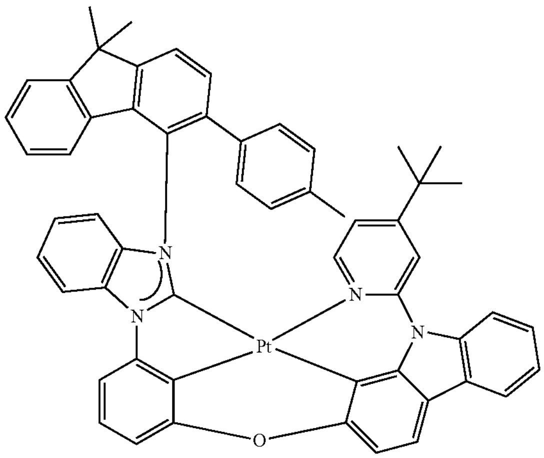
6
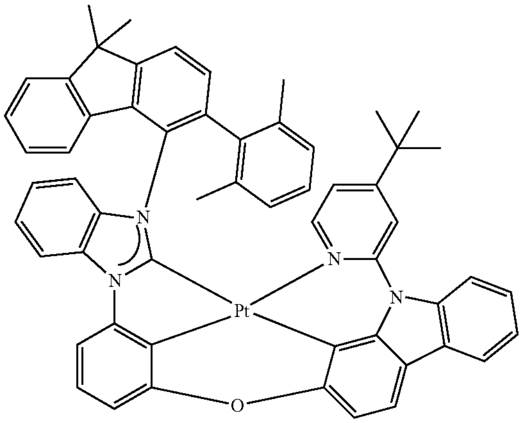
7
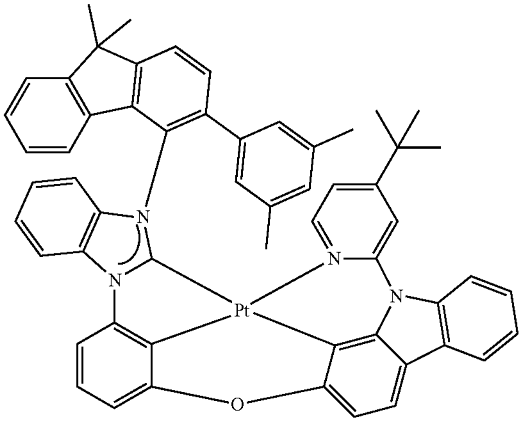
-continued
8
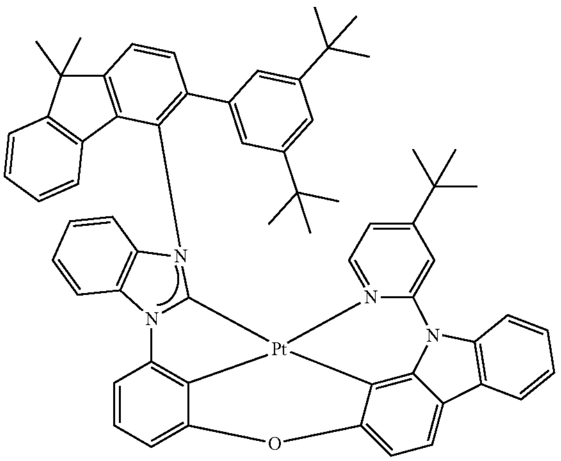
9
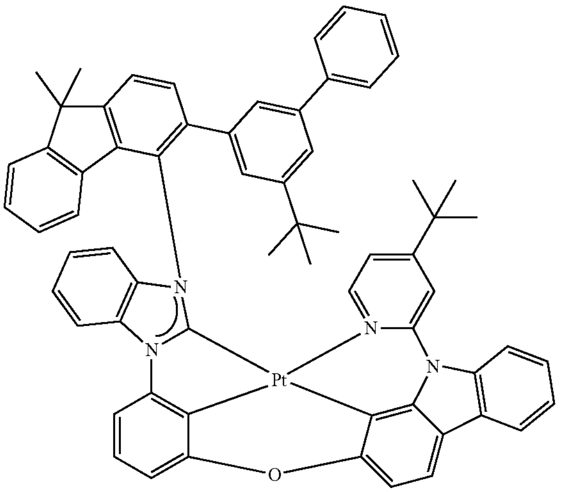
10
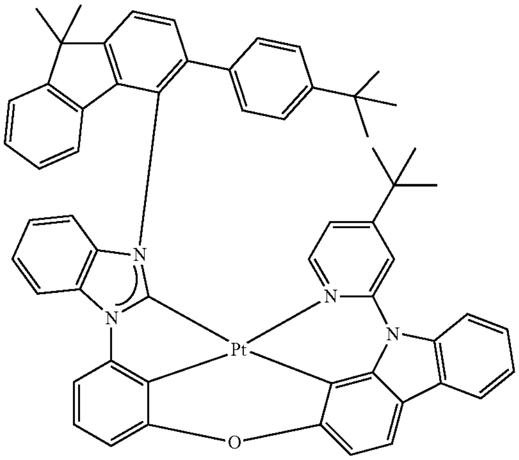

-continued
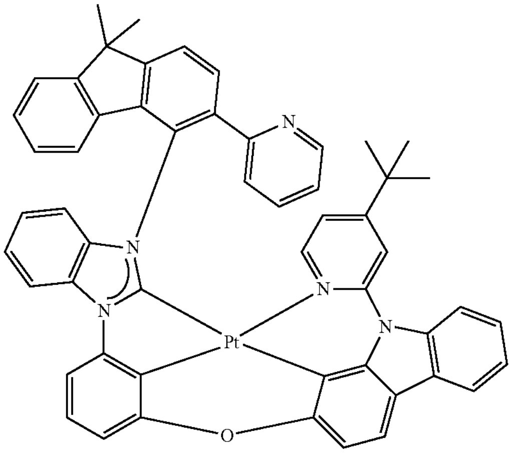
12
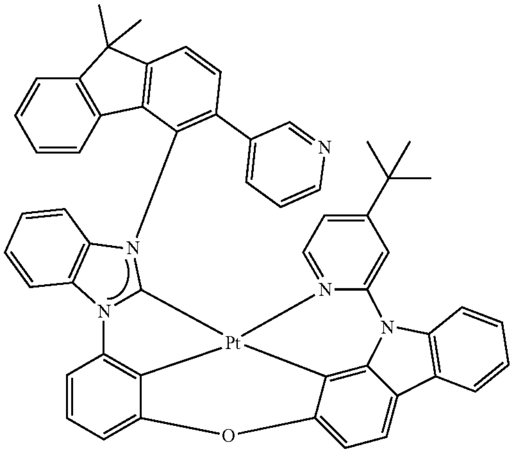
13
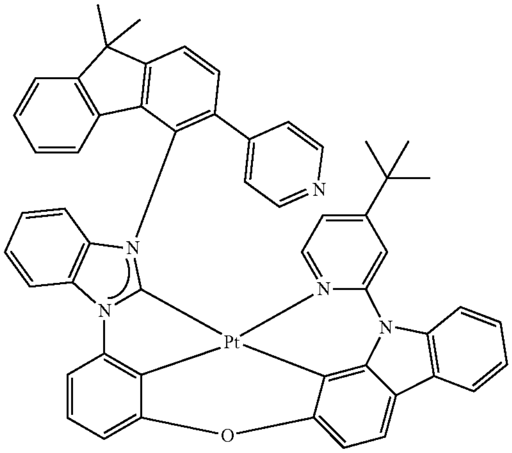
-continued
14
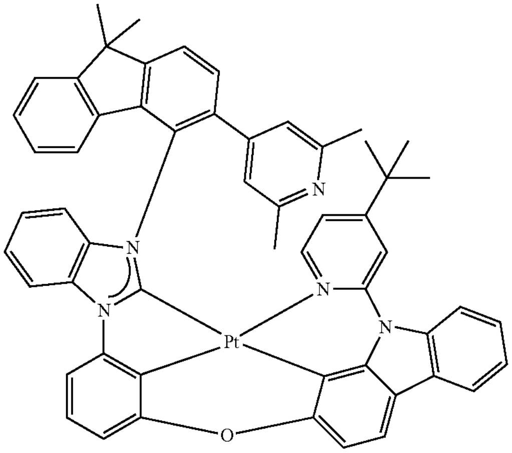
15
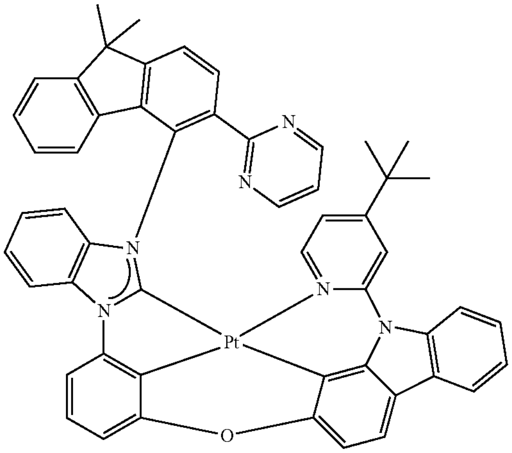
16
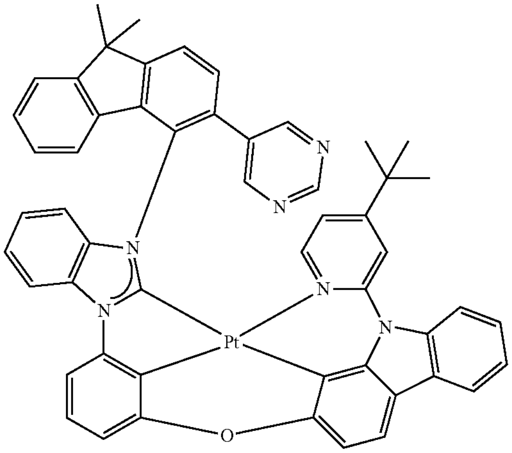

-continued
17
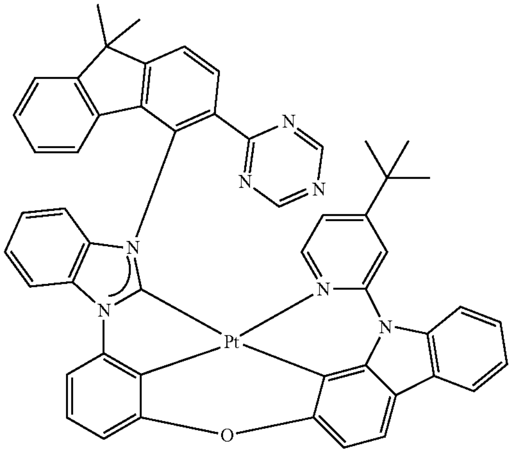
18
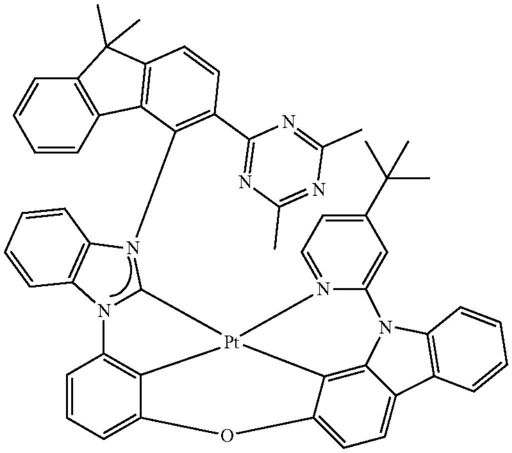
19
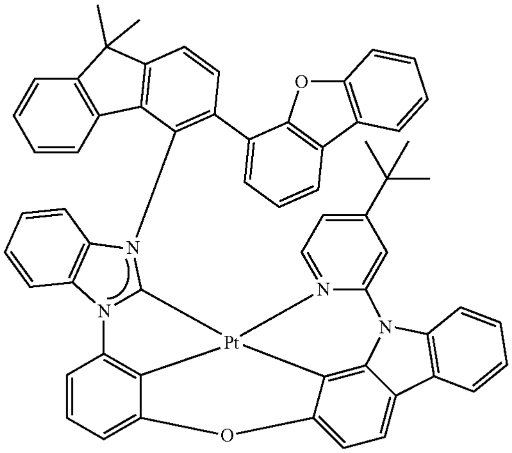
-continued
20
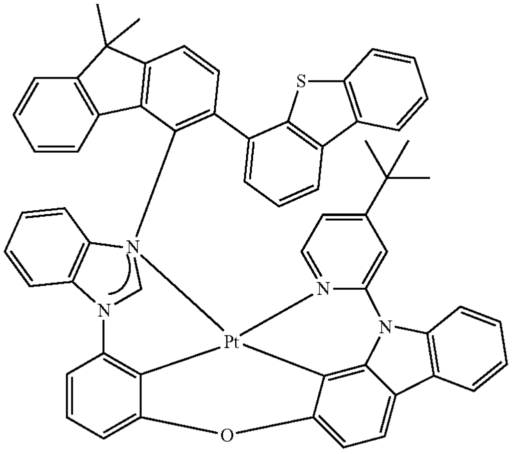
21
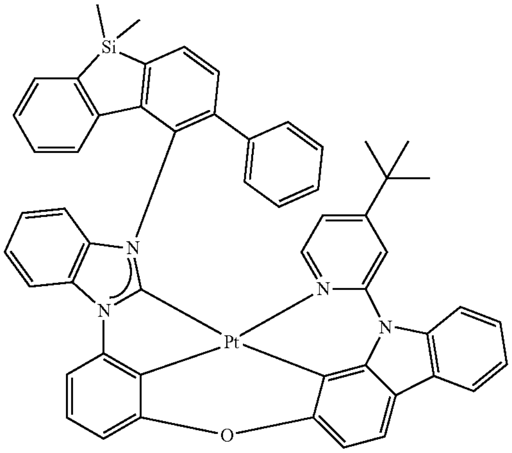
22
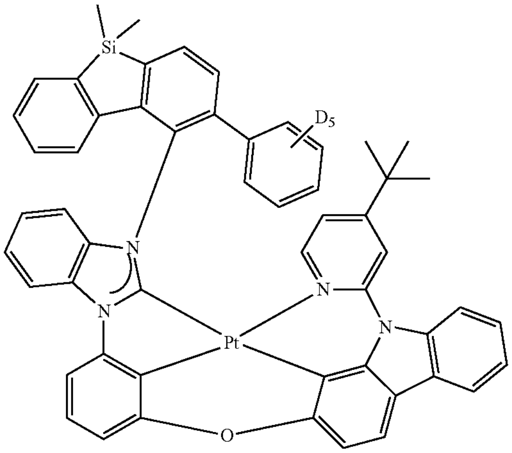

-continued
23
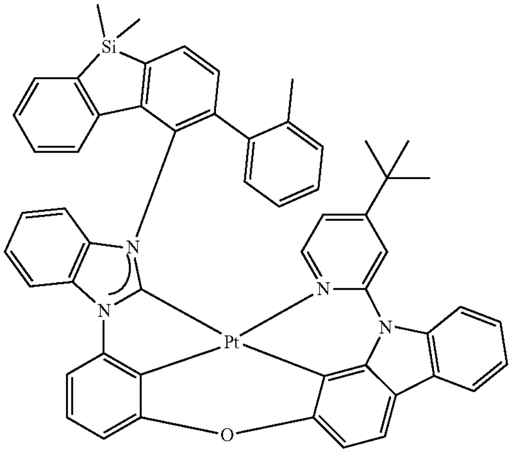
24
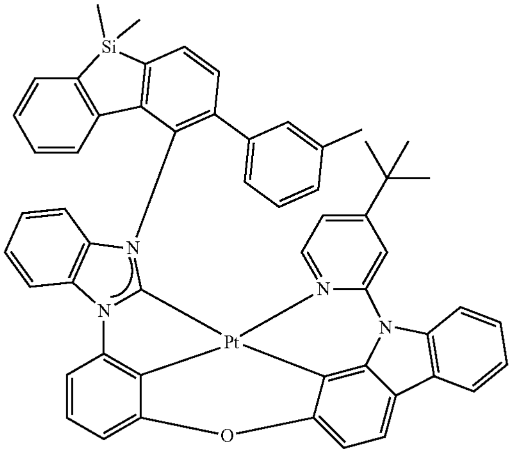
25
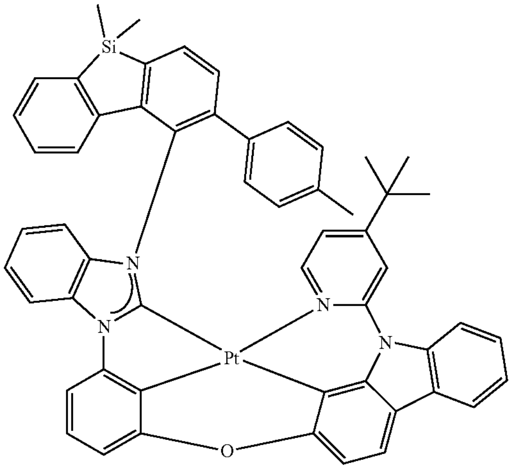
-continued
26
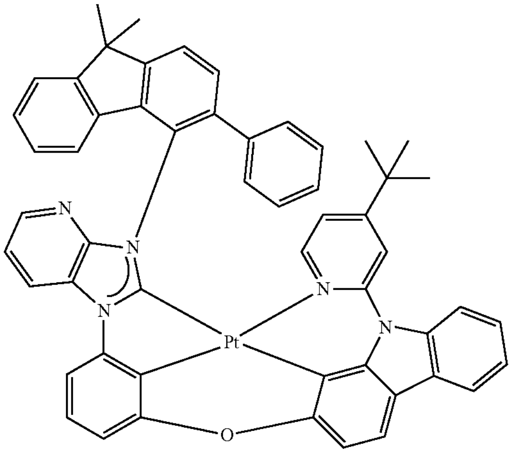
27
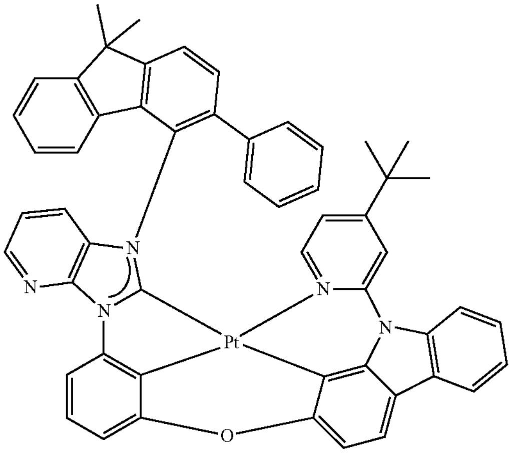
28
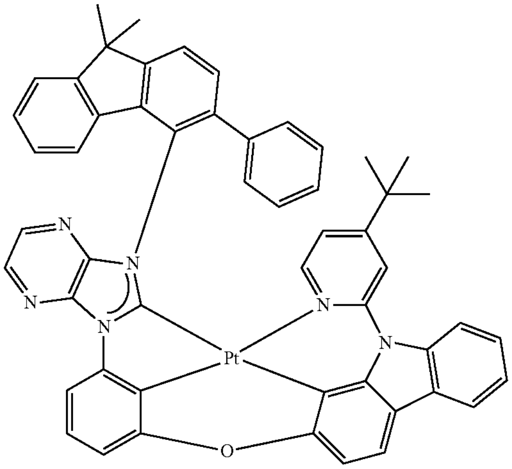

-continued
29
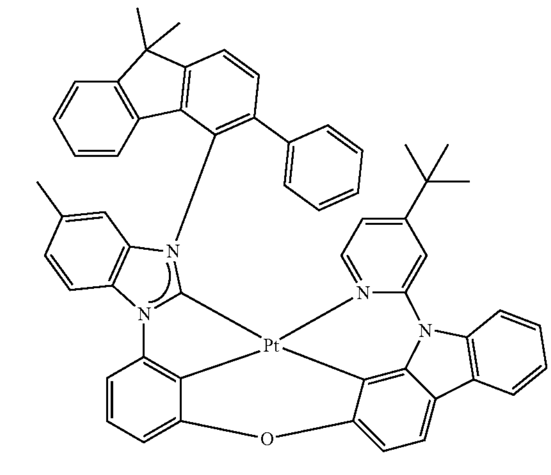
30
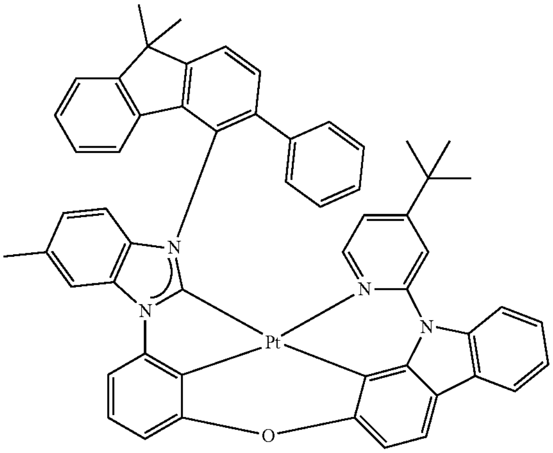
31
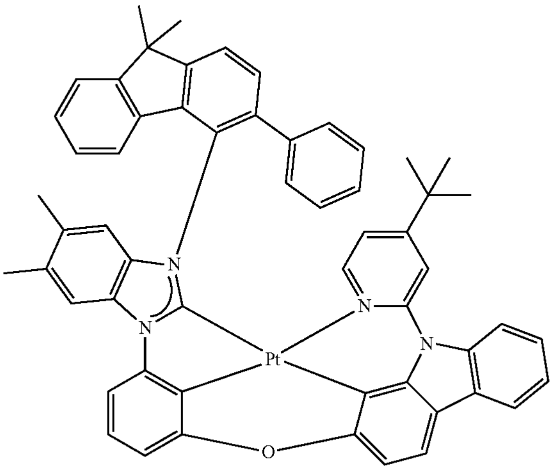
-continued
32
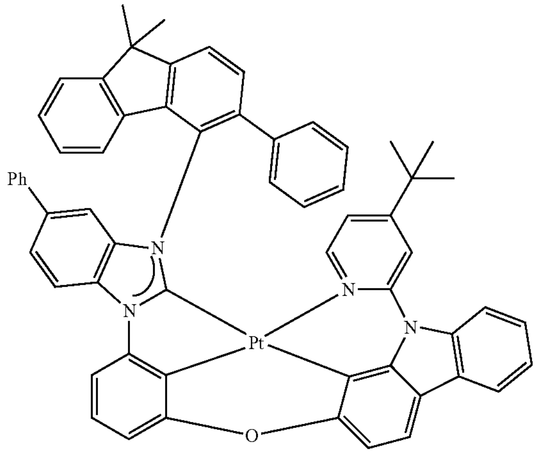
33
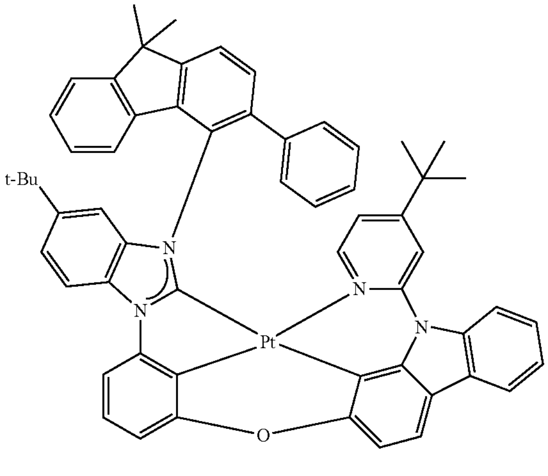
34
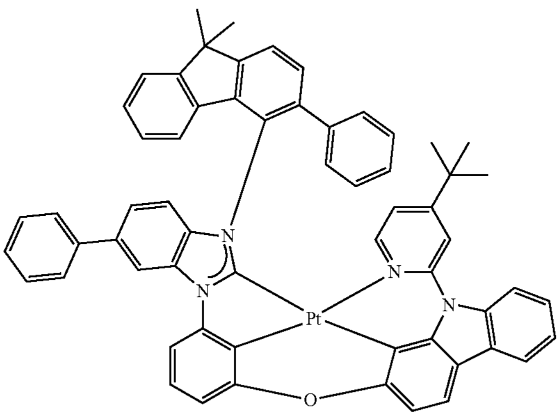

-continued
35
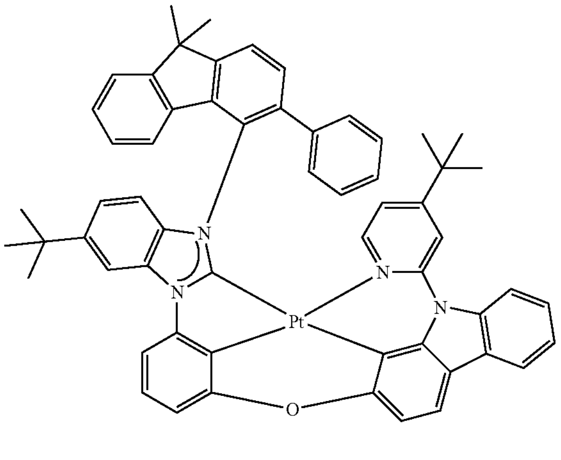
36
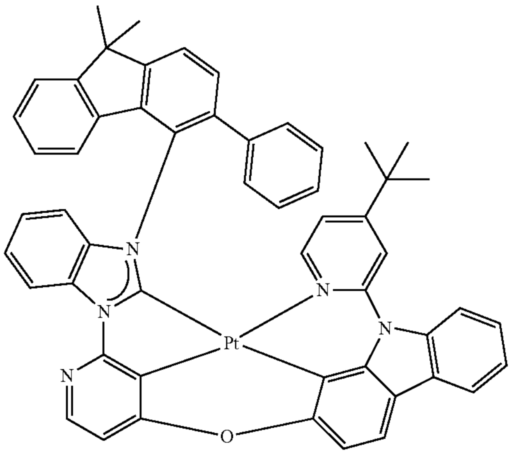
37
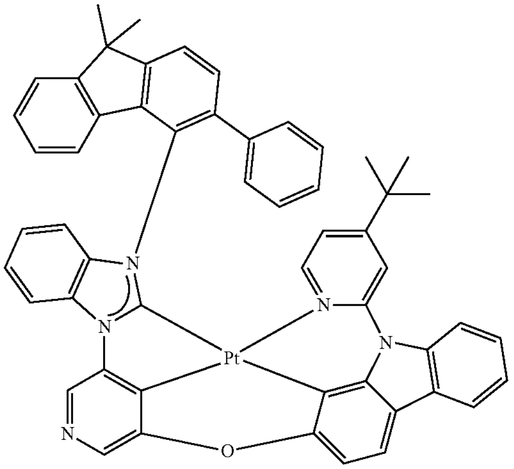
-continued
38
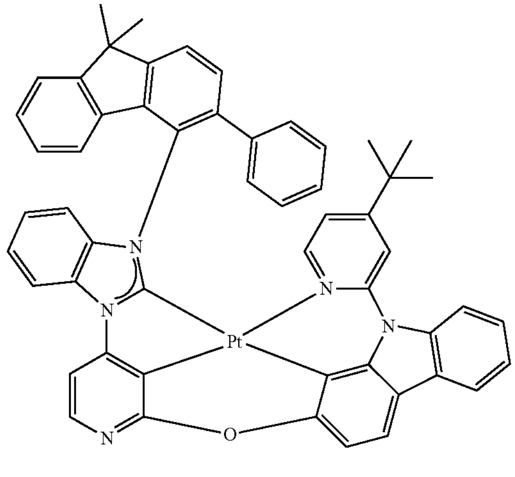
39
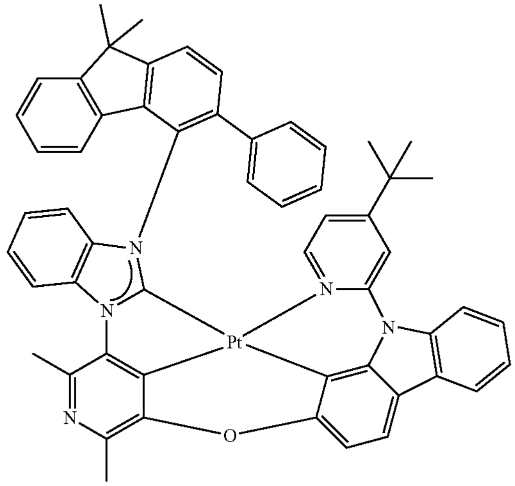
40
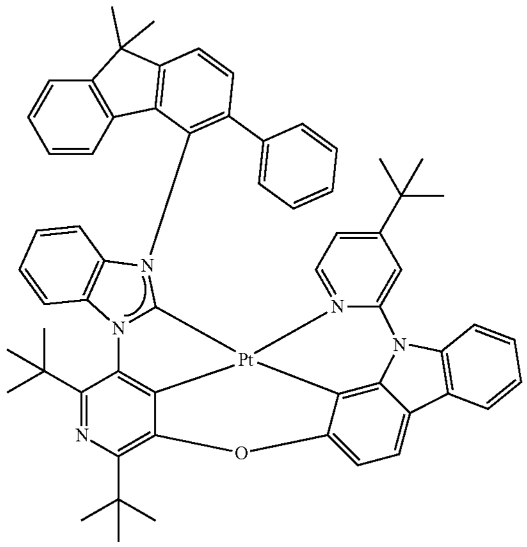

41
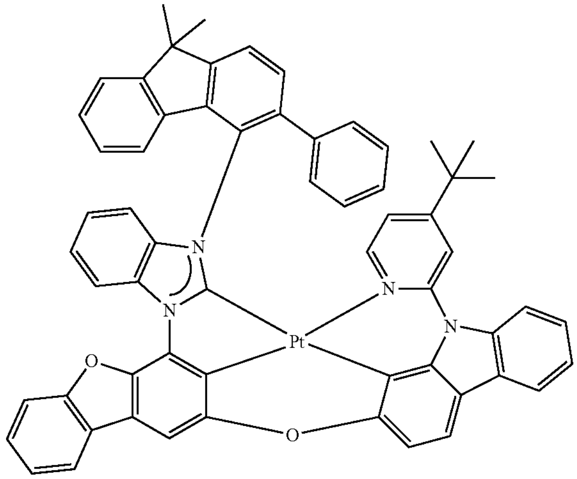
42
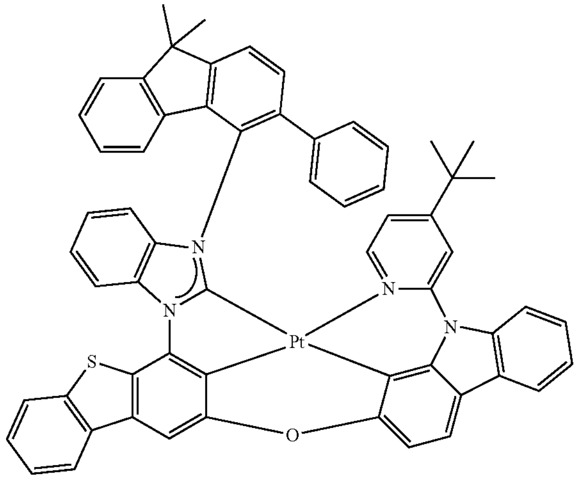
43
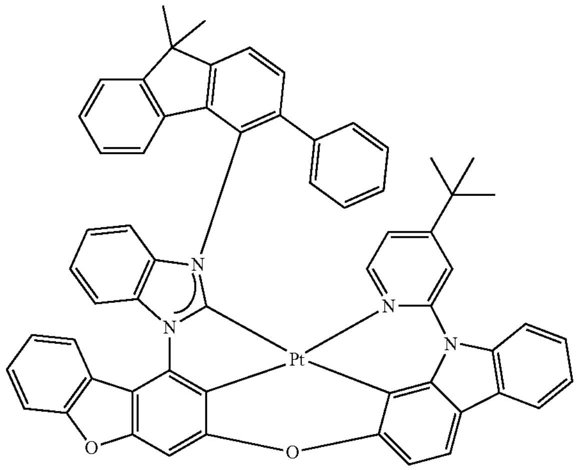
44
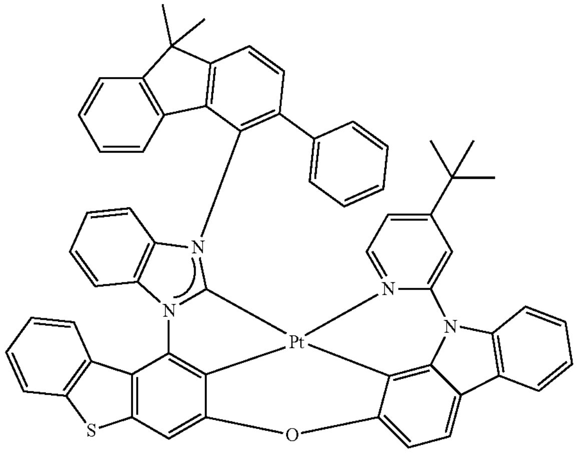
45
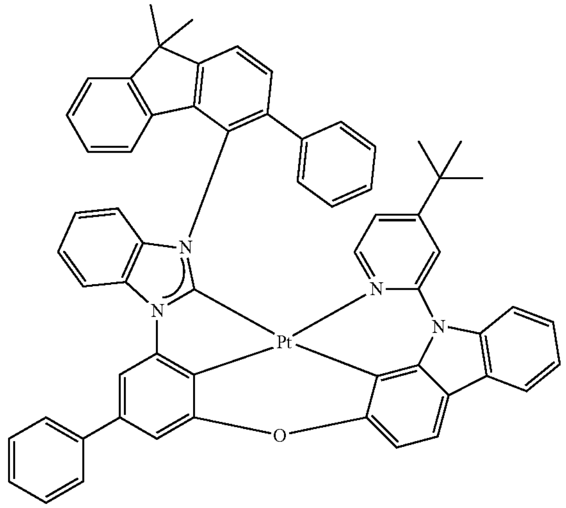
46
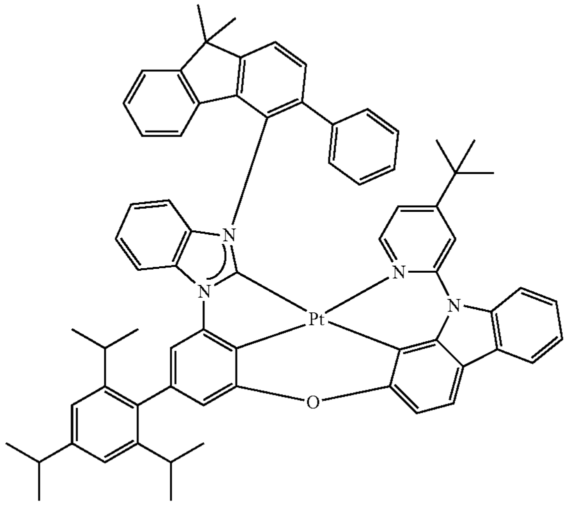

47
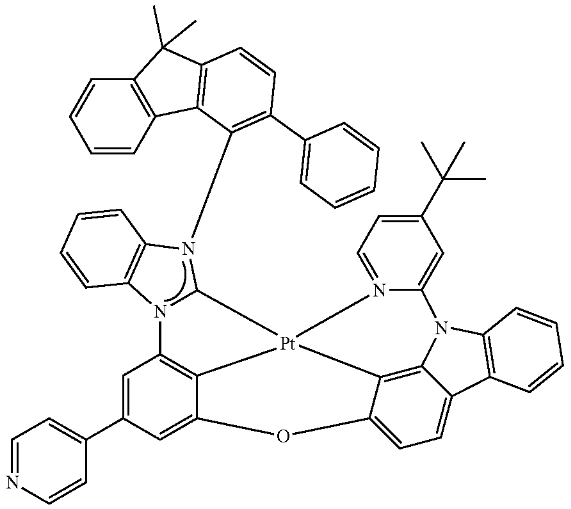
48
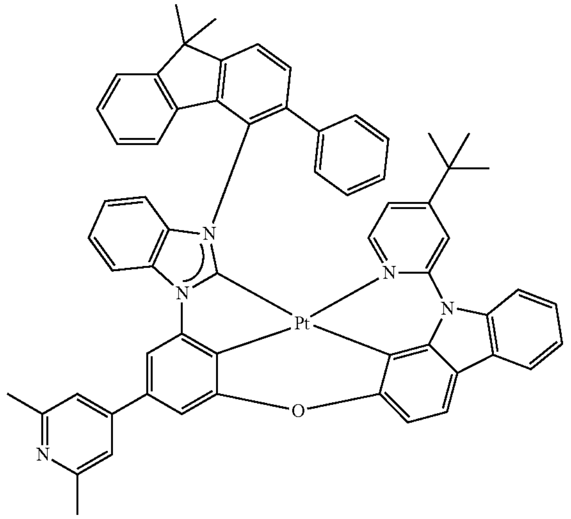
49
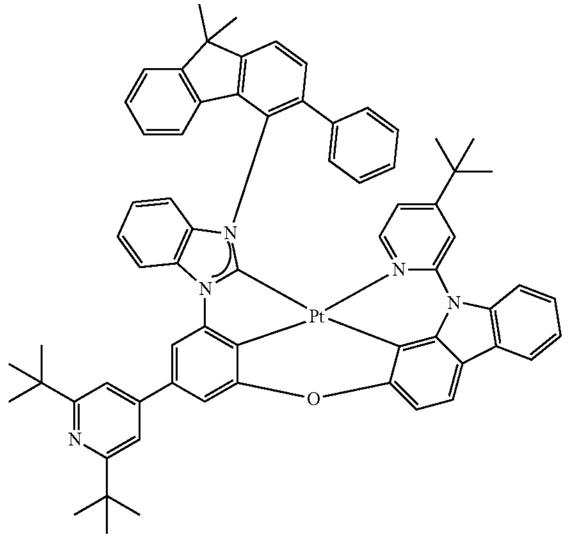
50
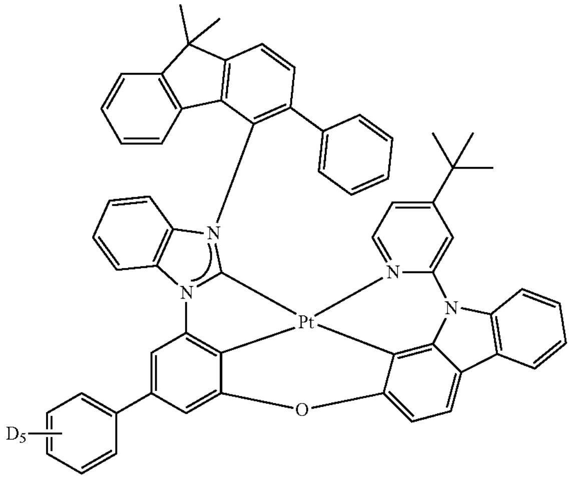
51
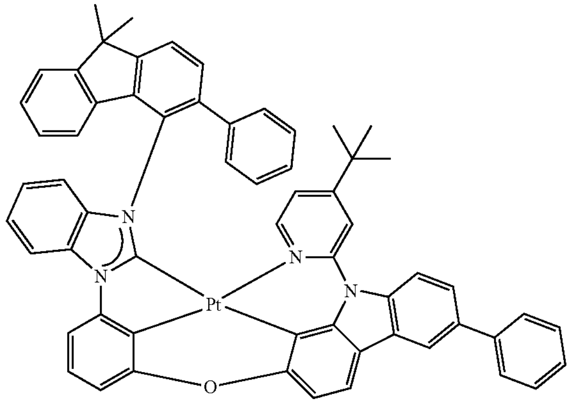
52
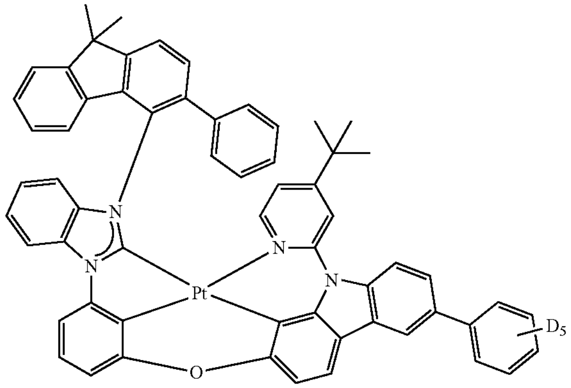

-continued
53
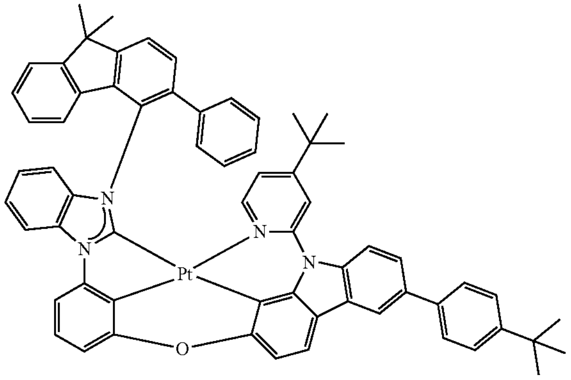
54
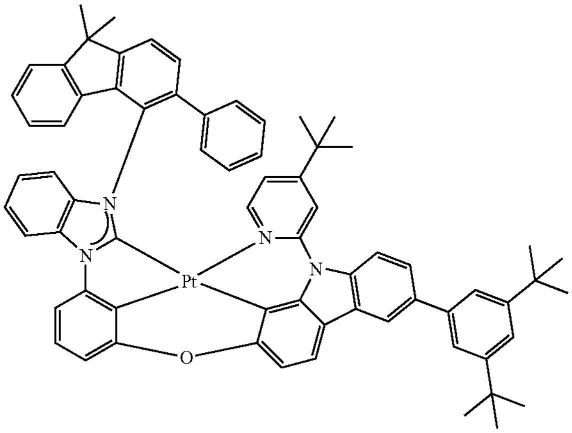
55
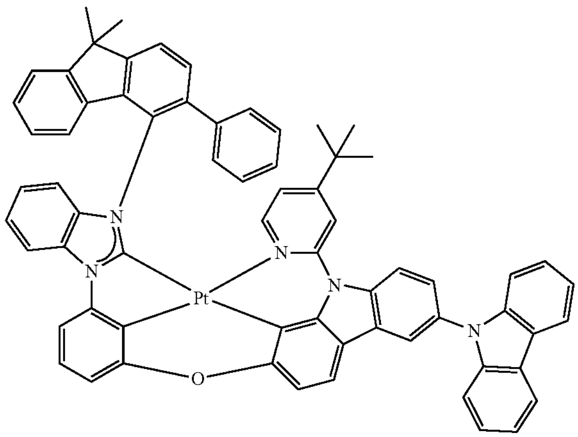
-continued
56
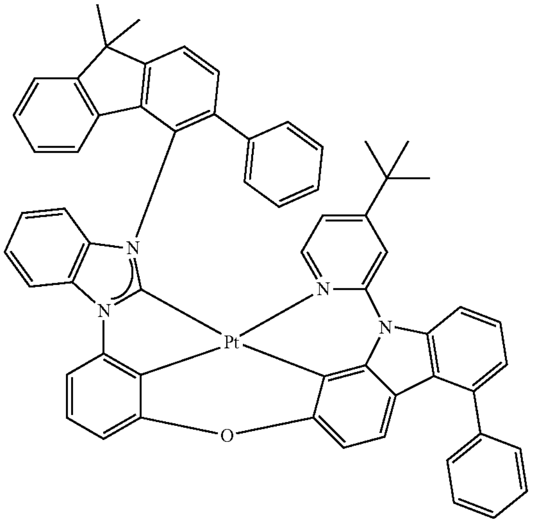
57
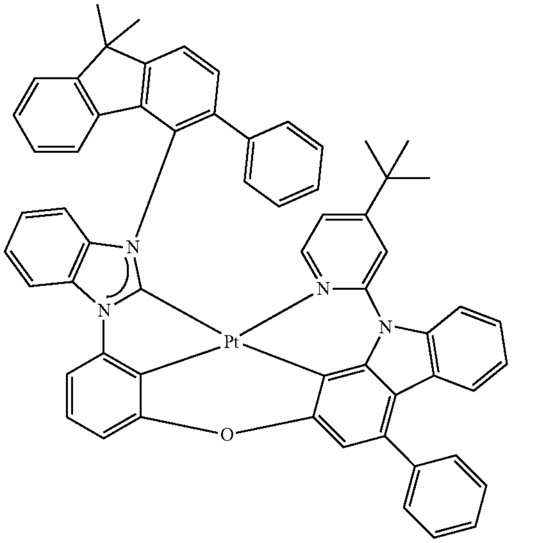

-continued
58
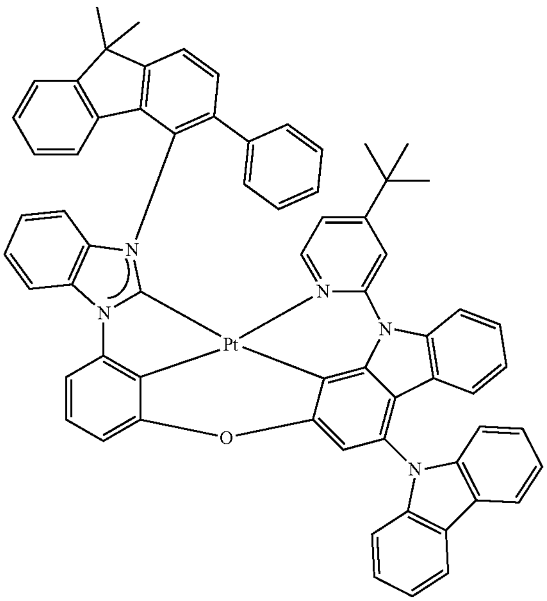
59
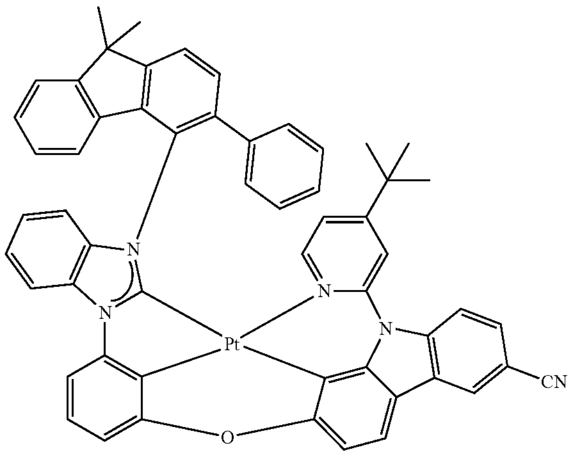
60
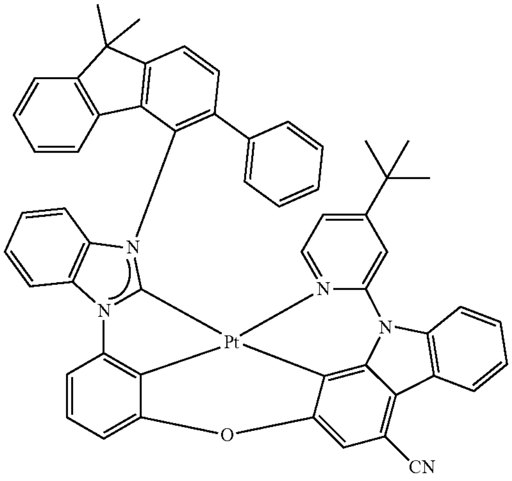
-continued
61
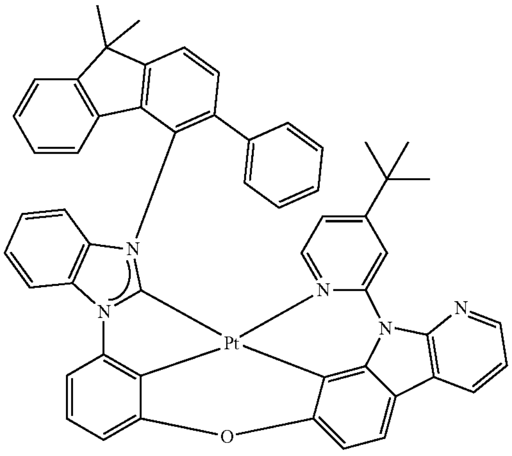
62
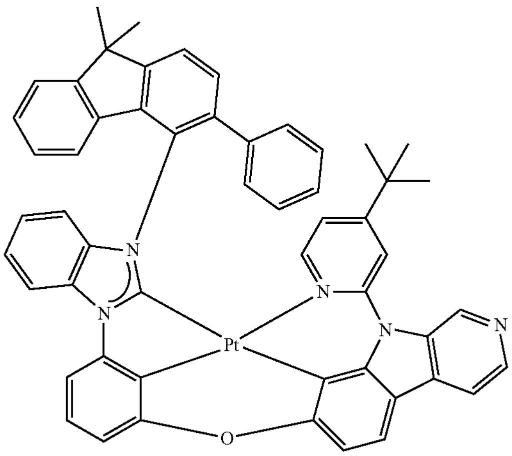
63
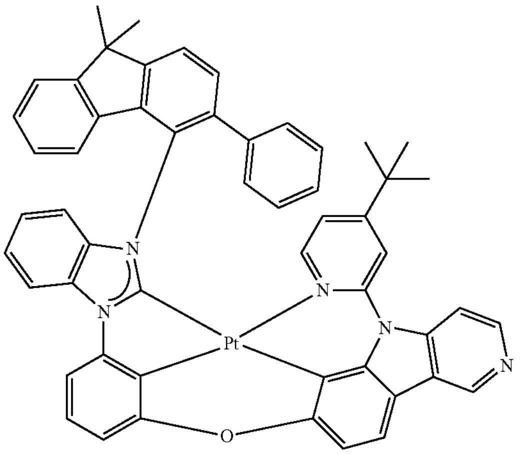

-continued
64
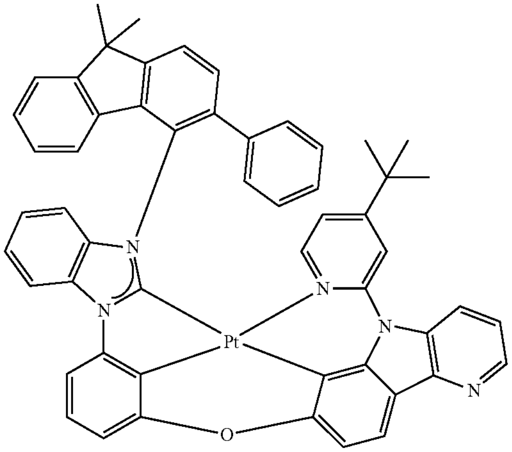
65
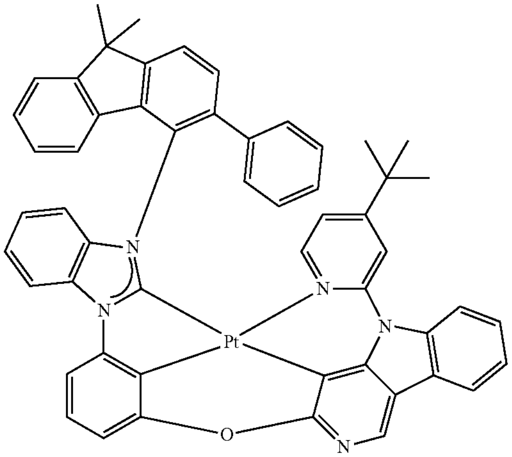
66
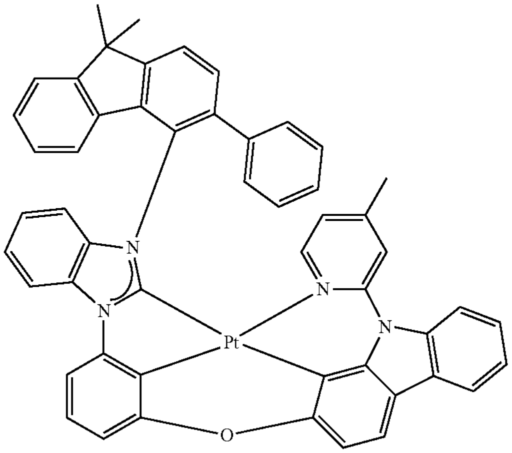
-continued
67
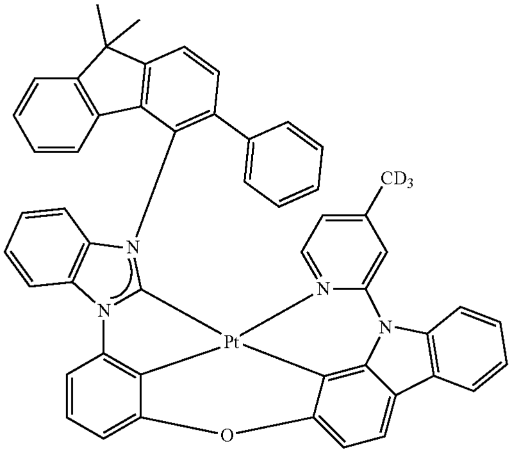
68
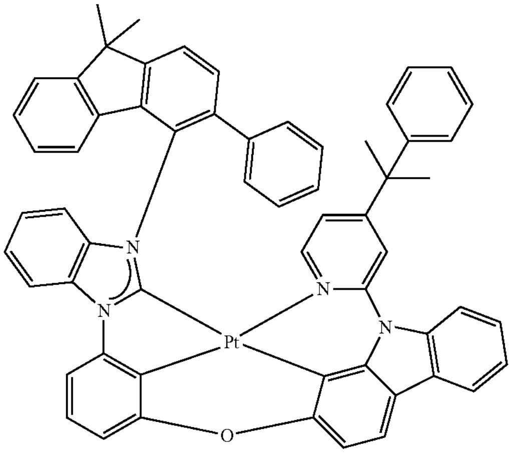
69
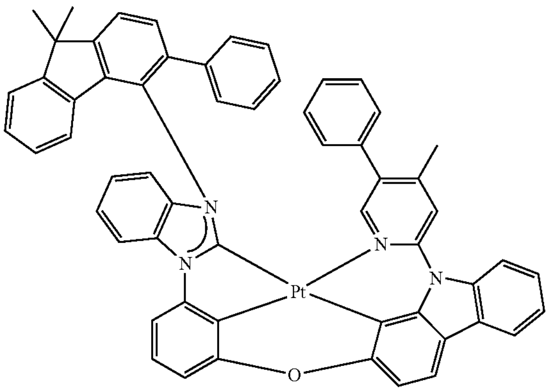

-continued
70
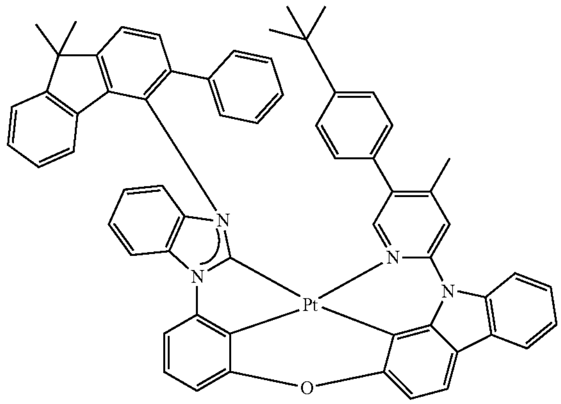
71
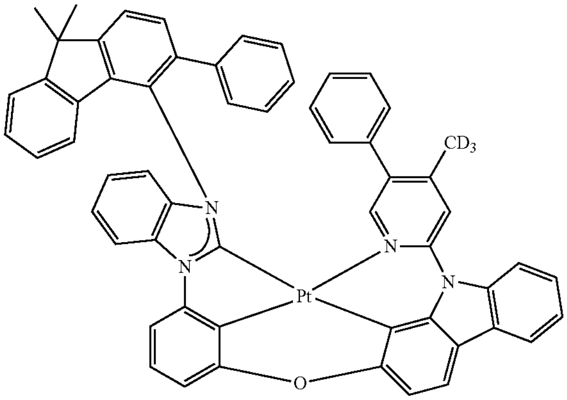
72
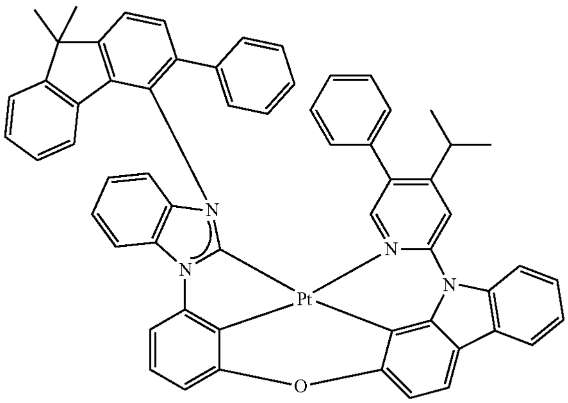
-continued
73
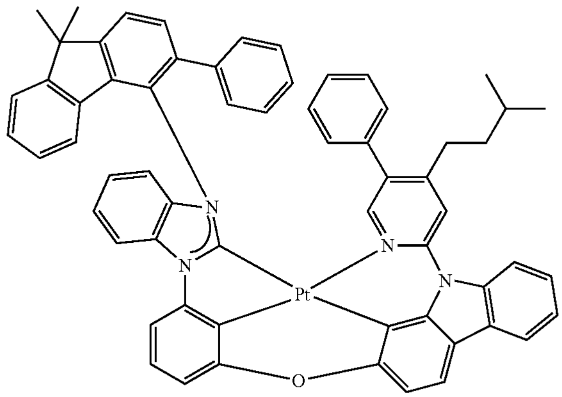
74
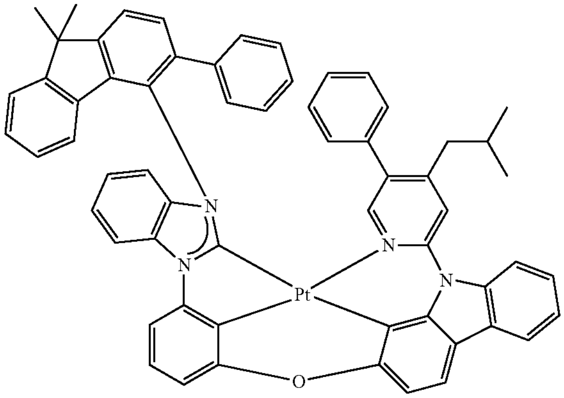
75
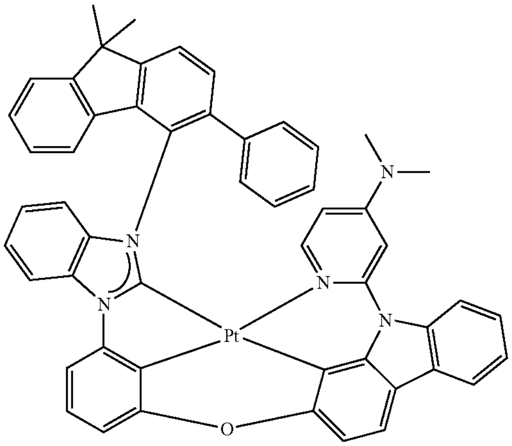

-continued
76
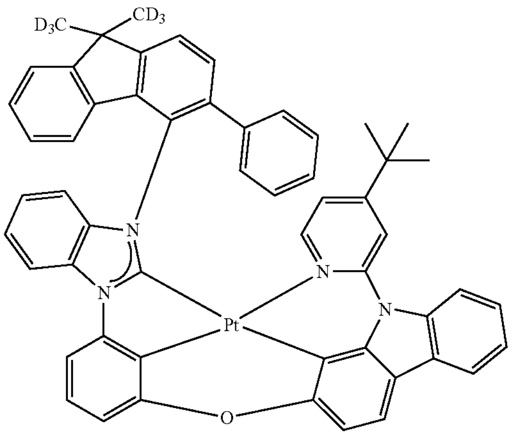
77
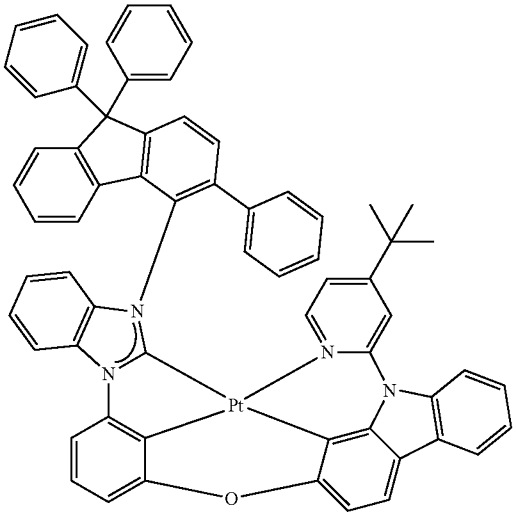
78
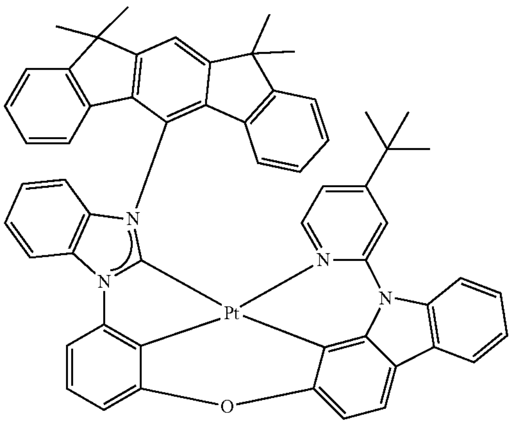
-continued
79
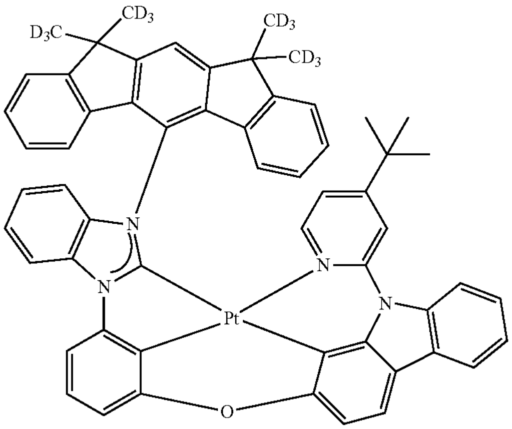
80
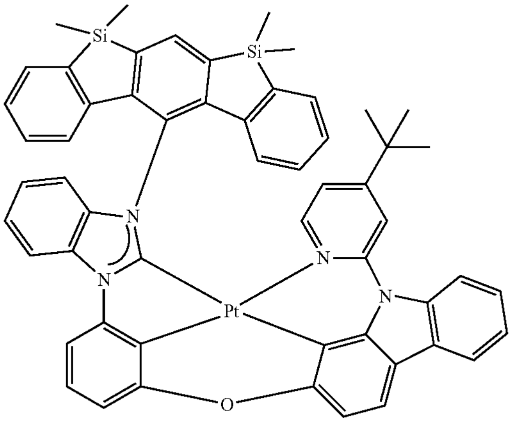
81
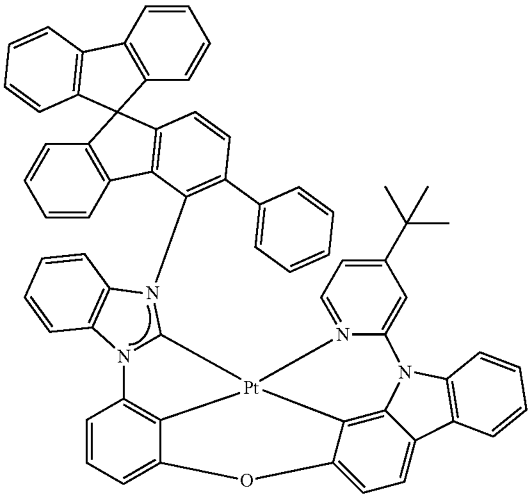

-continued
82
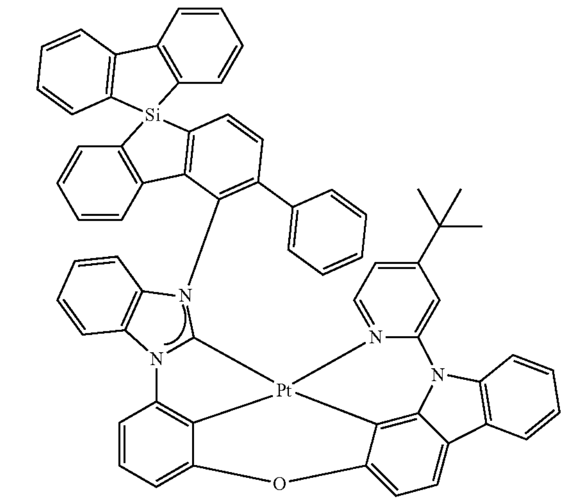
83
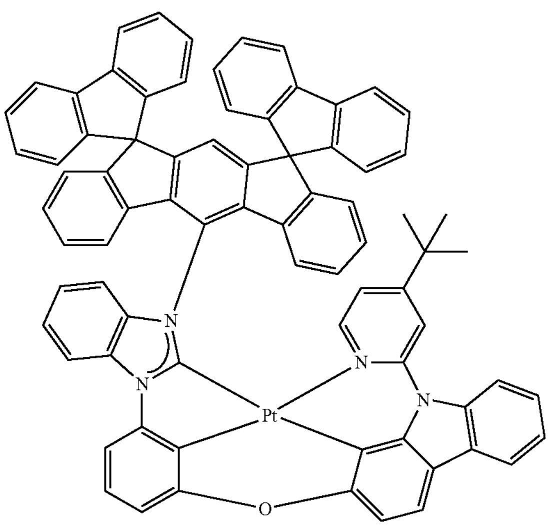
84
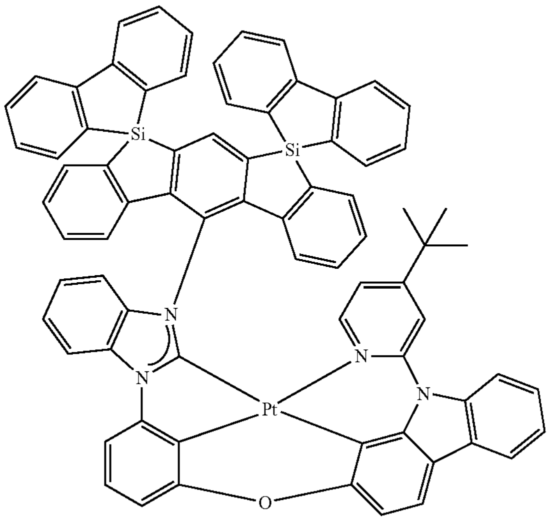
-continued
85
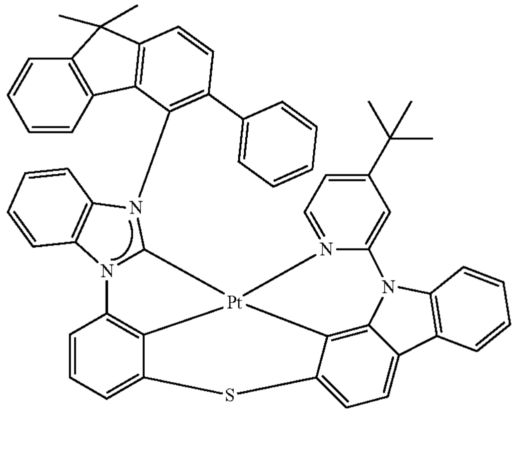
86
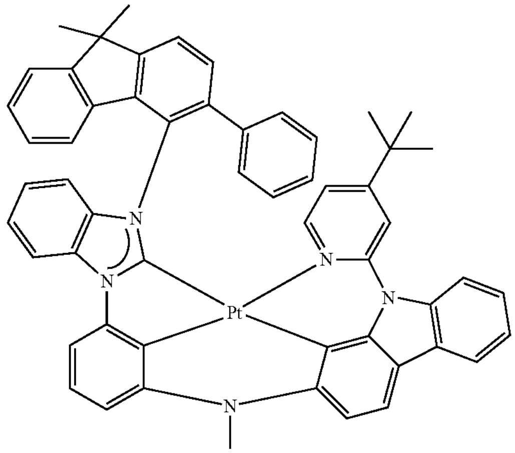
87
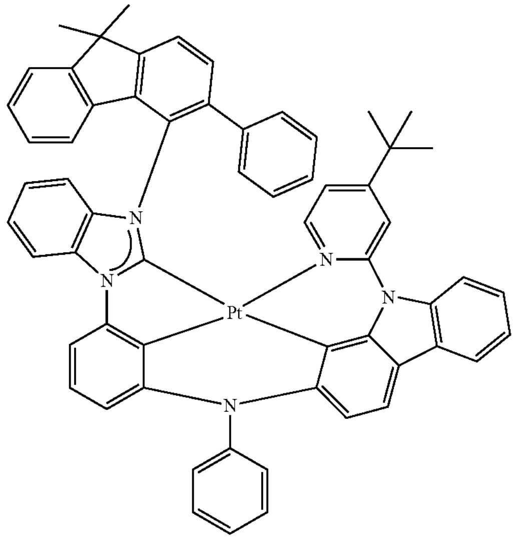

88
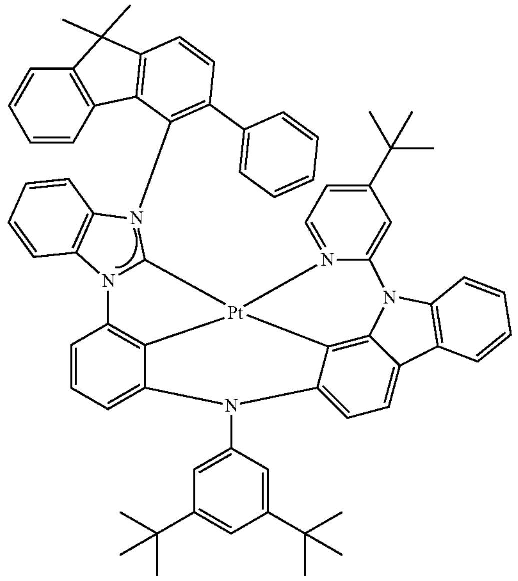
89
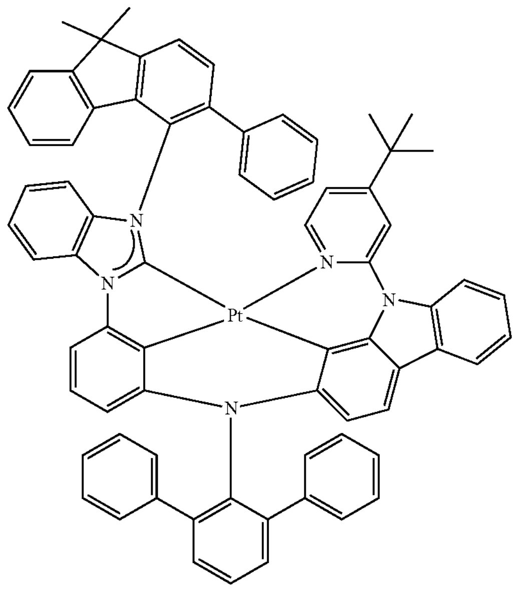
90
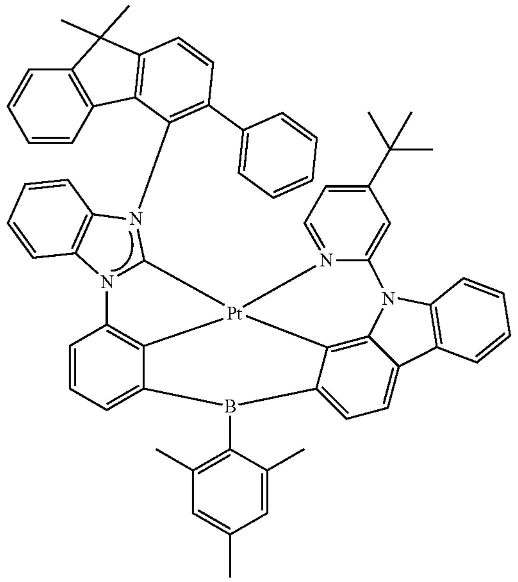
91
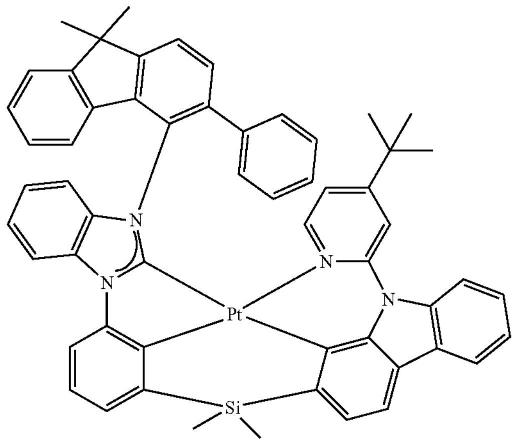
92
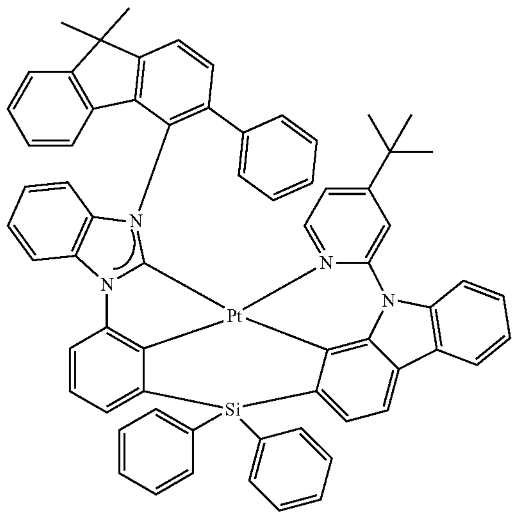

-continued
93
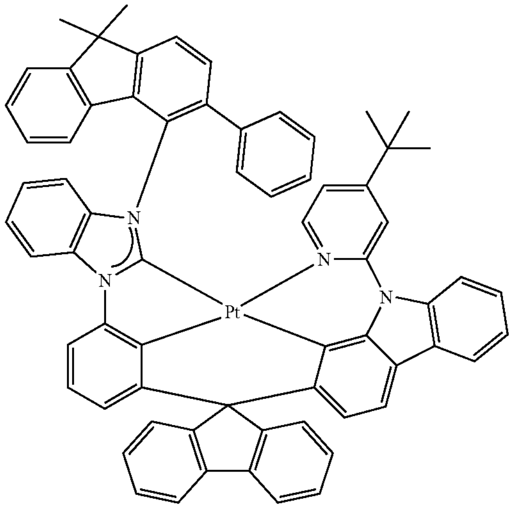
94
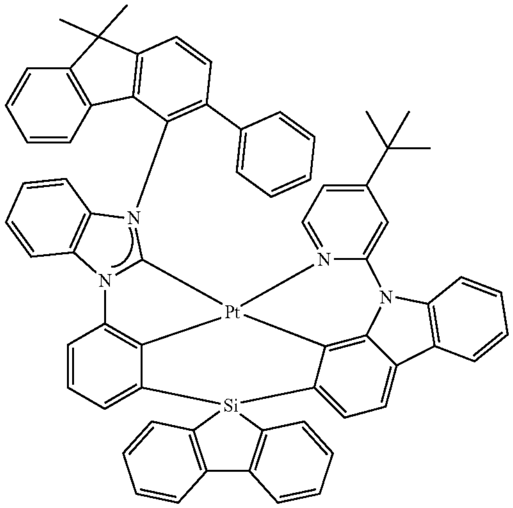
95
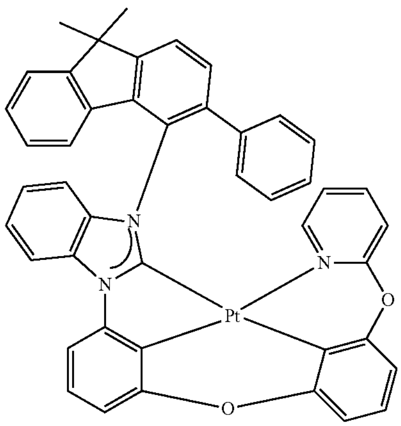
-continued
96
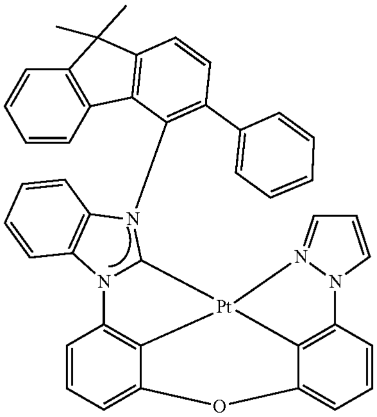
97
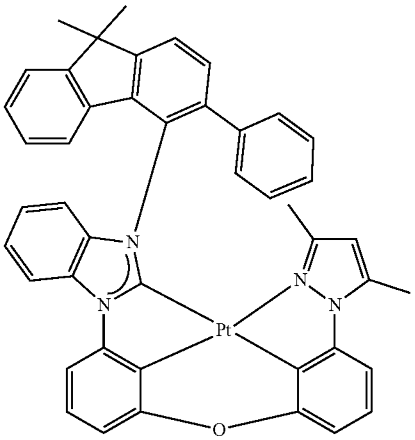
98
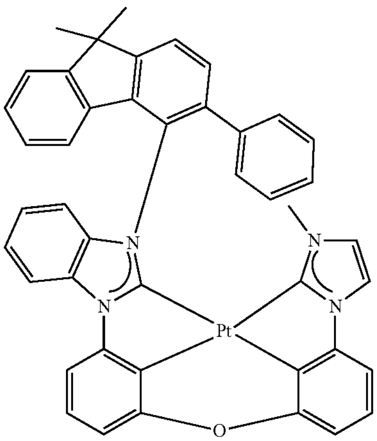

-continued

99

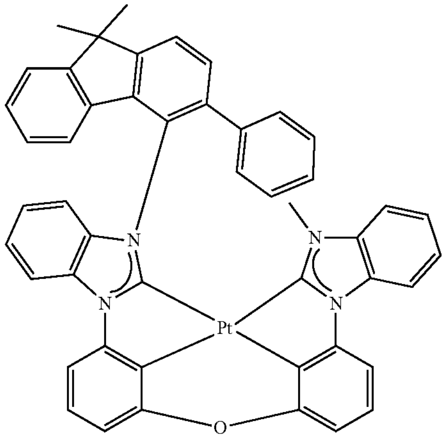

100

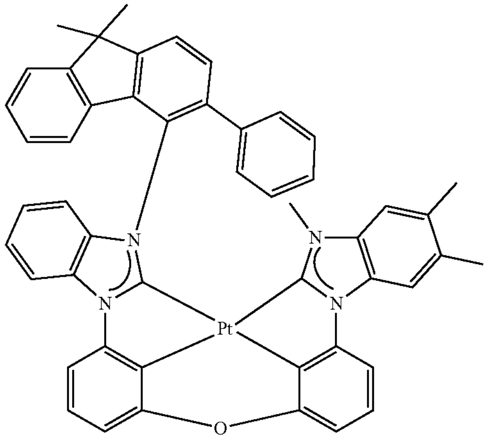

In Compounds 1 to 100, $D_5$ indicates substitution with five deuterium atoms, and Ph indicates a phenyl group. For example, a group represented by

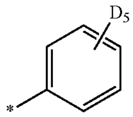

is identical to a group represented by

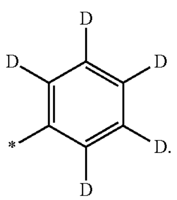

The organometallic compound represented by Formula 1 may include a bulky substituent that is bonded to a nitrogen atom of the $X_1$-containing 5-membered ring that is condensed with ring $CY_1$, wherein the bulky substituent includes a moiety in which rings $CY_5$ to $CY_7$ are connected to each other, and thus the bulky substituent may provide a strong steric shielding effect toward M in Formula 1.

In the organometallic compound represented by Formula 1, an atom bonded to $T_1$ among ring-forming atoms of $CY_5$, an atom bonded to $T_1$ among ring-forming atoms of $CY_7$, $T_1$, and a single bond connecting ring $CY_5$ and $CY_7$, may be connected to one another to form a ring, resulting in low vibration and improved structural stability. Accordingly, the organometallic compound may have high color purity and high stability.

In the organometallic compound, $T_1$ may be $*$—$C(Z_{11})(Z_{12})$—$*'$ or $*$—$Si(Z_{11})(Z_{12})$—$*'$, and due to low electronegativity of a C atom or a Si atom and the strong binding strength between a C atom or a Si atom and a neighboring atom, the structural stability of the organometallic compound may be further improved as compared to a case in which only N, O, and/or S are included (for example, Compound CE3 or the like as described herein). Accordingly, a decrease in luminescence efficiency or the like upon the interaction between the organometallic compound and other compounds may be inhibited.

Therefore, an electronic device, for example, an organic light-emitting device, including the organometallic compound may have low driving voltage, excellent luminescence efficiency, long lifespan, and excellent color purity, and thus, may be used in the manufacture of a high-quality electronic apparatus.

Synthesis methods of the organometallic compound represented by Formula 1 may be recognizable by one of ordinary skill in the art by referring to Synthesis Examples and/or Examples provided below.

At least one organometallic compound represented by Formula 1 may be used in a light-emitting device (for example, an organic light-emitting device). Accordingly, another aspect of the disclosure provides a light-emitting device which may include a first electrode, a second electrode facing the first electrode, an interlayer between the first electrode and the second electrode and including an emission layer, and the organometallic compound represented by Formula 1.

In an embodiment, the interlayer of the light-emitting device may further include a hole transport region between the first electrode and the emission layer, and an electron transport region between the emission layer and the second electrode, wherein the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In an embodiment, the first electrode of the light-emitting device may be an anode, and the second electrode of the light-emitting device may be a cathode.

In an embodiment, the organometallic compound may be included between the first electrode and the second electrode of the light-emitting device. In embodiments, the interlayer of the light-emitting device may include the organometallic compound. For example, in the interlayer, the emission layer may include the organometallic compound.

In an embodiment, the emission layer in the interlayer of the light-emitting device may include a dopant and a host, and the dopant may include the organometallic compound. For example, the organometallic compound may serve as a dopant. The emission layer may emit red light, green light, blue light, and/or white light. For example, the emission layer may emit blue light. In an embodiment, the emission layer may emit blue light having a maximum emission wavelength in a range of, for example, about 410 nm to about 500 nm.

In an embodiment, the interlayer of the light-emitting device may include:

a first compound which is the organometallic compound represented by Formula 1; and a second compound including a group represented by Formula 2, a third compound represented by Formula 3, a fourth compound including a group represented by Formula 4, or any combination thereof, wherein the first compound, the second compound, and the third compound may be different from one another, the first compound, the second compound, and the fourth compound may be different from one another, and the third compound and the fourth compound may be identical to or different from each other:

[Formula 2]

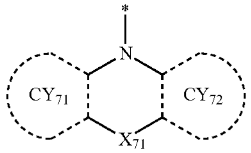

In Formula 2, ring $CY_{71}$ and ring $CY_{72}$ may each independently be a π electron-rich $C_3$-$C_{60}$ cyclic group or a pyridine group, $X_{71}$ may be: a single bond; or a linking group including O, S, N, B, C, Si, or any combination thereof, and

* indicates a binding site to a neighboring atom in the second compound.

[Formula 3]

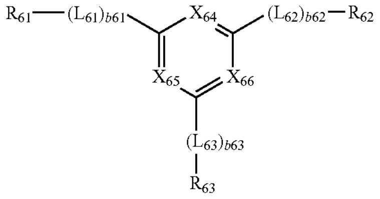

In Formula 3, $L_{61}$ to $L_{63}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b61 to b63 may each independently be an integer from 1 to 5, $X_{64}$ may be N or $C(R_{64})$, $X_{65}$ may be N or $C(R_{65})$, $X_{66}$ may be N or $C(R_{66})$, and at least one of $X_{64}$ to $X_{66}$ may be N, $R_{61}$ to $R_{66}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, and $R_{10a}$ and $Q_1$ to $Q_3$ may respectively be the same as those described herein.

[Formula 4]

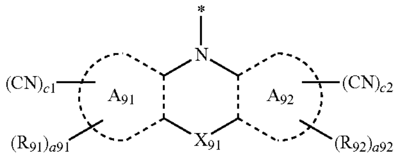

In Formula 4, ring A91 and ring A92 may each independently be a u electron-rich $C_3$-$C_{60}$ cyclic group or a pyridine group, $X_{91}$ may be: a single bond; or a linking group including O, S, N, B, C, Si, or any combination thereof, $R_{91}$ and $R_{92}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{69}$ aryloxy group unsubstituted or substituted with at least one $R_{10a}$, a $C_6$-$C_{69}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, a91 and a92 may each independently be an integer from 0 to 10, c1 and c2 may each independently be an integer from 0 to 10, wherein a sum of c1 and c2 may be 1 or more, $R_{10a}$ and $Q_1$ to $Q_3$ may respectively be the same as those described herein, and

* indicates a binding site to a neighboring atom in the fourth compound.

In embodiments, the second compound may not include CBP or mCBP:

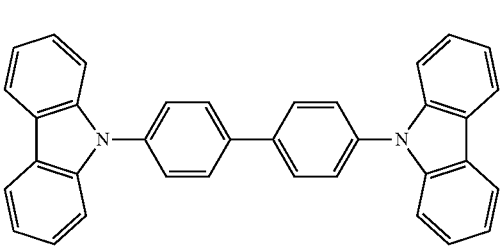

CBP

-continued

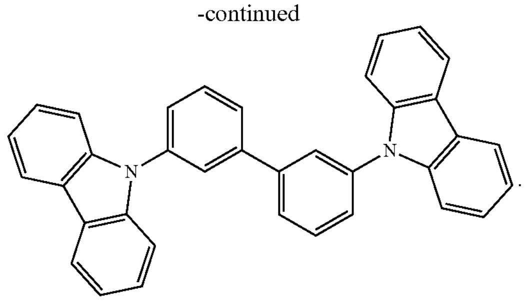

mCBP

In embodiments, the emission layer of the light-emitting device may include a dopant and a host, the dopant may include the first compound, and the host may include the second compound, the third compound, the fourth compound, or any combination thereof.

In embodiments, the emission layer of the light-emitting device may include a dopant and a host, the dopant may include the first compound, and the host may include: the second compound; and at least one of the third compound and the fourth compound.

In an embodiment, the emission layer may emit phosphorescence or fluorescence emitted from the first compound. For example, the phosphorescence or fluorescence emitted from the first compound may be blue light.

In an embodiment, the second compound may include a compound represented by Formula 2-1, a compound represented by Formula 2-2, a compound represented by Formula 2-3, a compound represented by Formula 2-4, a compound represented by Formula 2-5, or any combination thereof:

[Formula 2-1]

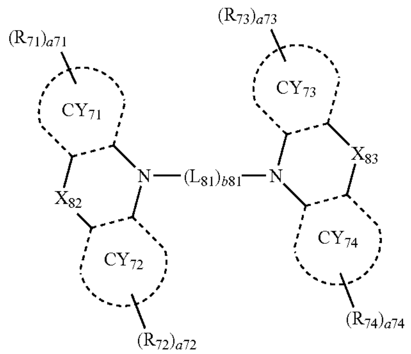

[Formula 2-2]

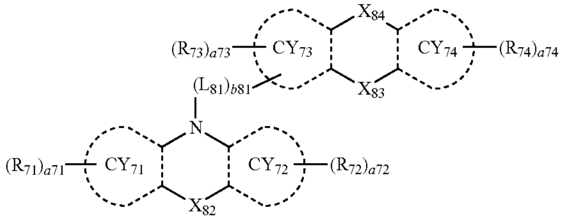

[Formula 2-3]

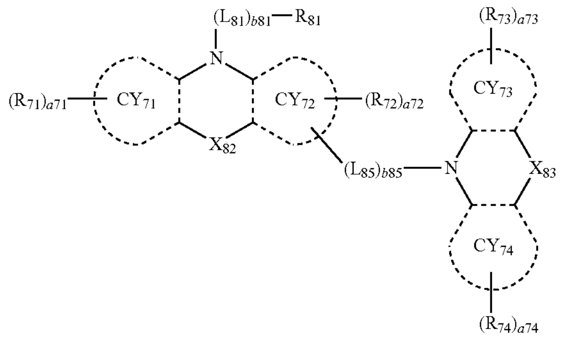

[Formula 2-4]

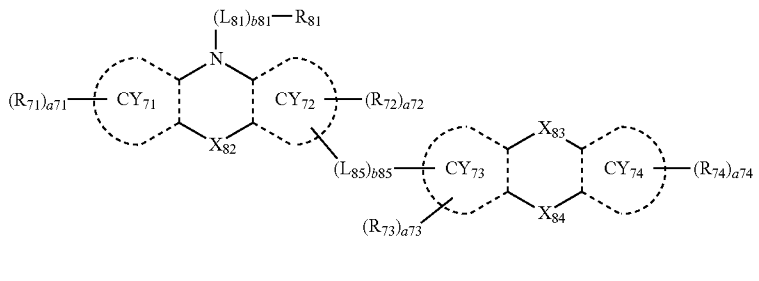

-continued

[Formula 2-5]

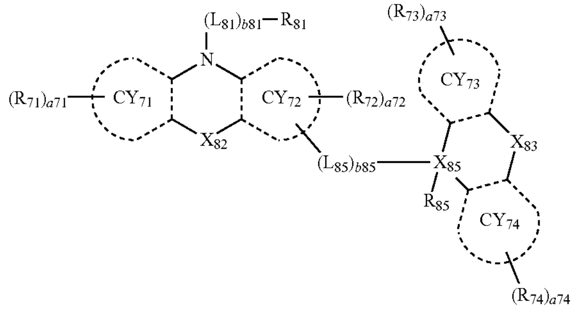

In Formulae 2-1 to 2-5, ring $CY_{71}$ to ring $CY_{74}$ may each independently be a π electron-rich $C_3$-$C_{60}$ cyclic group or a pyridine group, $X_{82}$ may be a single bond, O, S, N-[$(L_{82})_{b82}$-$R_{82}$], C($R_{82a}$)($R_{82b}$), or Si($R_{82a}$)($R_{82b}$), $X_{83}$ may be a single bond, O, S, N-[$(L_{83})_{b83}$-$R_{83}$], C($R_{83a}$)($R_{83b}$), or Si($R_{83a}$)($R_{83b}$), $X_{84}$ may be O, S, N-[$(L_{84})_{b84}$-$R_{84}$], C($R_{84a}$)($R_{84b}$), or Si($R_{84a}$)($R_{84b}$), $X_{85}$ may be C or Si, $L_{81}$ to $L_{85}$ may each independently be a single bond, *—C($Q_4$)($Q_5$)—*', *—Si($Q_4$)($Q_5$)—*', a π electron-rich $C_3$-$C_{60}$ cyclic group unsubstituted or substituted with at least one $R_{10a}$, or a pyridine group unsubstituted or substituted with at least one $R_{10a}$, wherein $Q_4$ and $Q_5$ are each independently the same as described in connection with $Q_1$ in the specification, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a71 to a74 may each independently be an integer from 0 to 20, and $R_{10a}$ and $Q_1$ to $Q_3$ may respectively be the same as those described in connection with Formula 1.

In an embodiment, the second compound may be one of Compounds H1-1 to H1-24:

H1-1

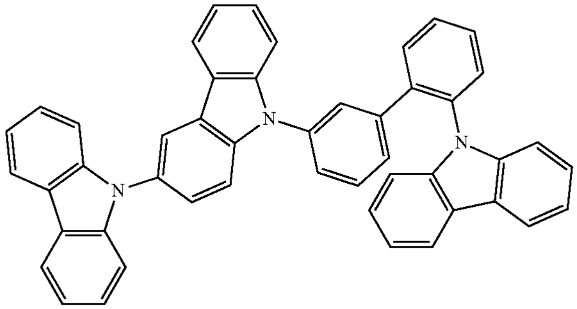

H1-2

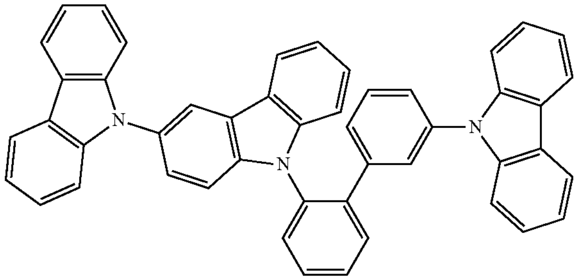

H1-3

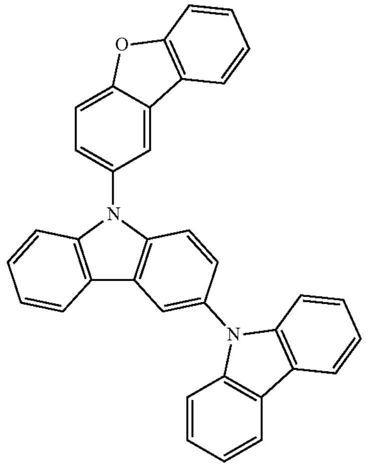

-continued
H1-4
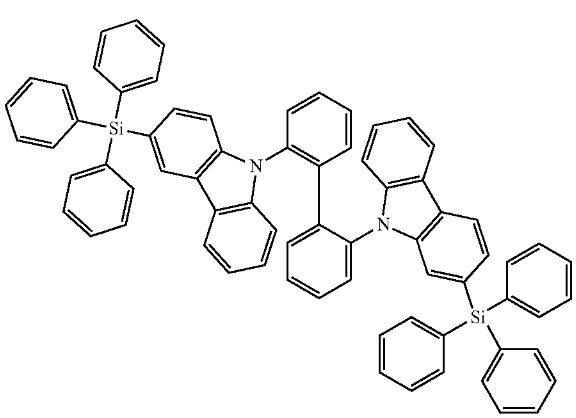
H1-5
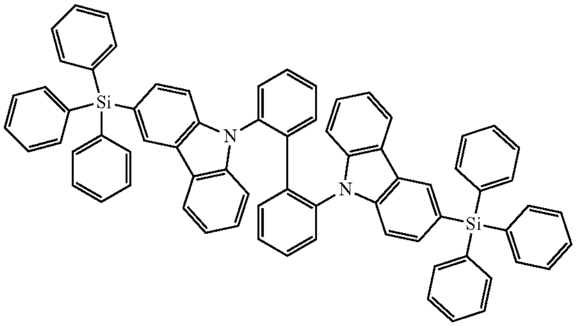
H1-6
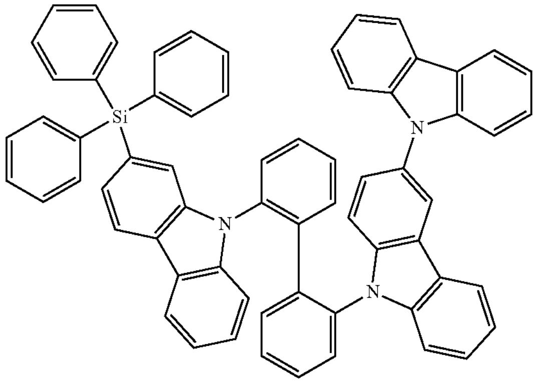
H1-7
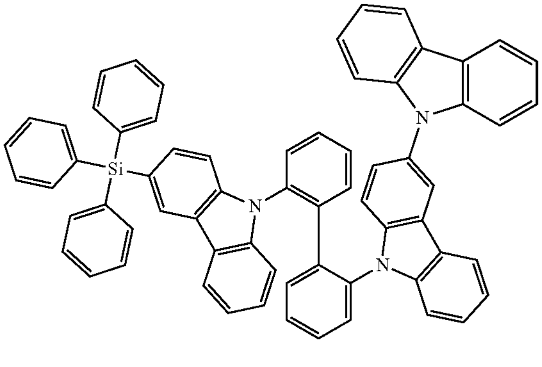
-continued
H1-8
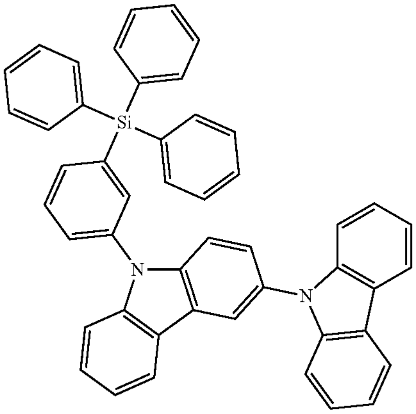
H1-9
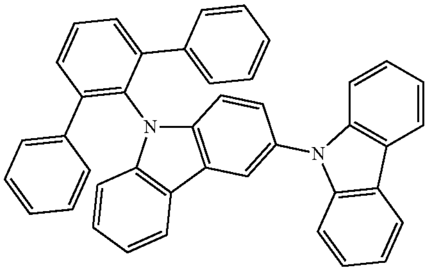
H1-10
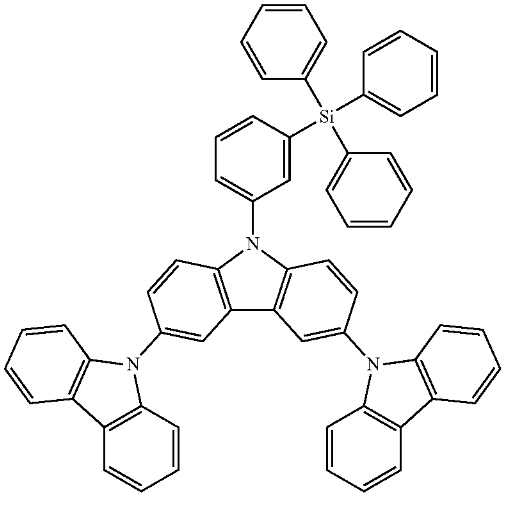

H1-11
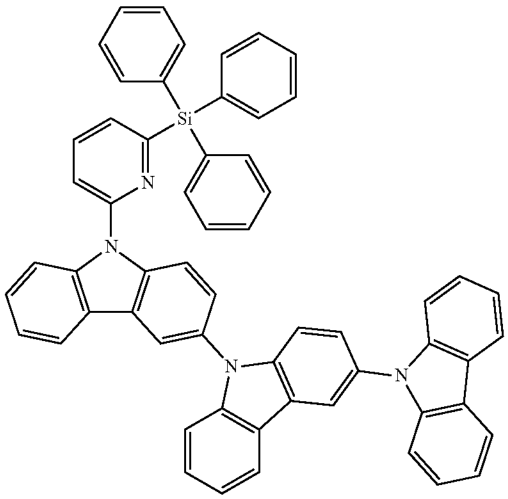
H1-12
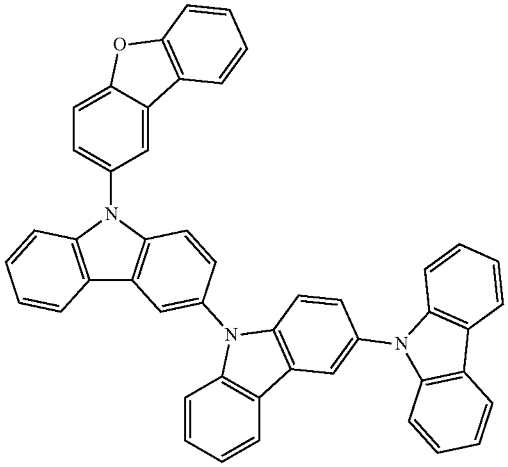
H1-13
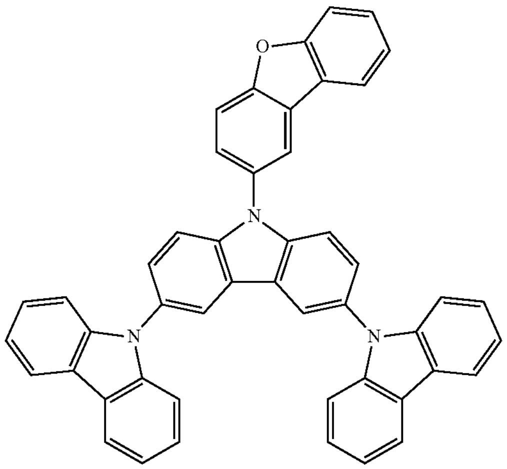
H1-14
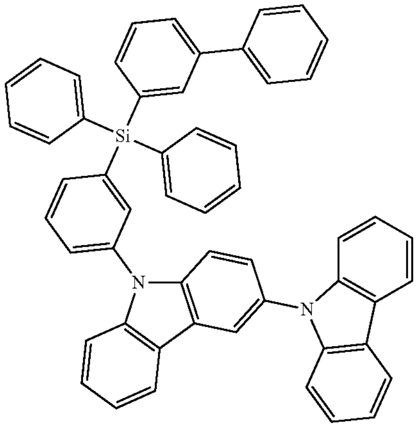
H1-15
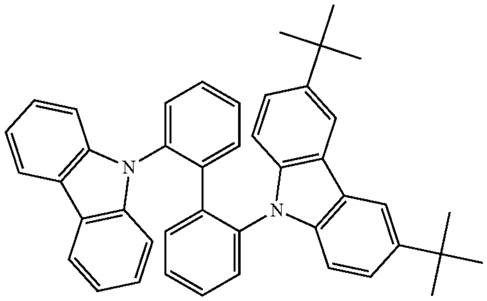
H1-16
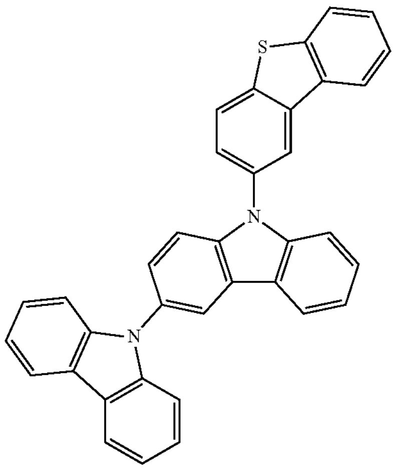

-continued
H1-17
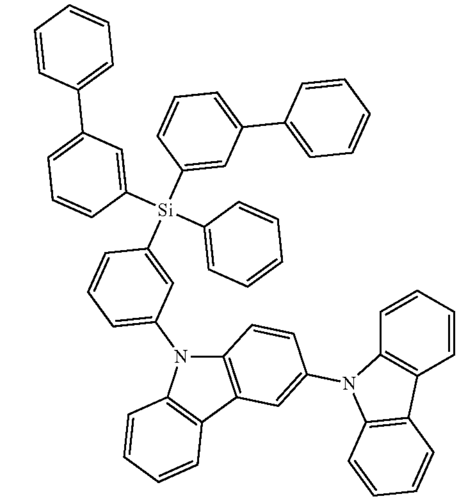
H1-18
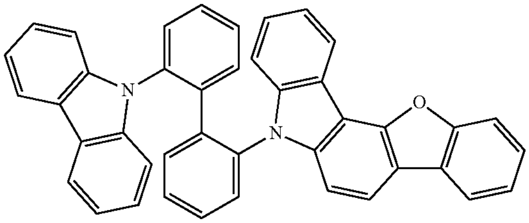
H1-19
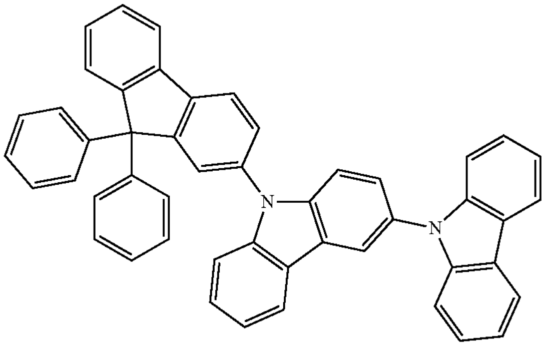
H1-20
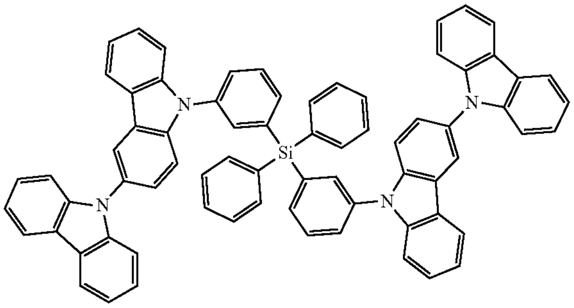
-continued
H1-21
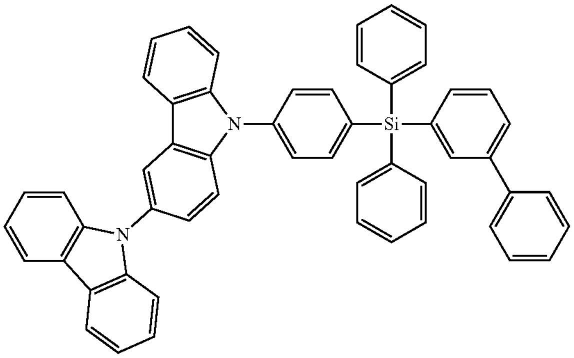
H1-22
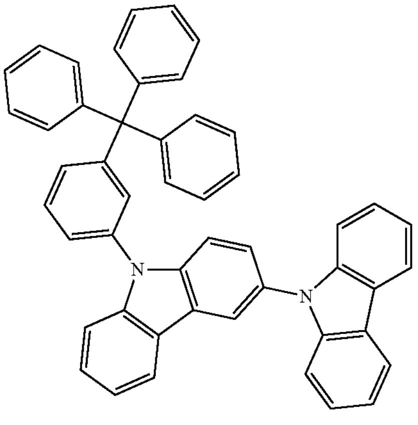
H1-23
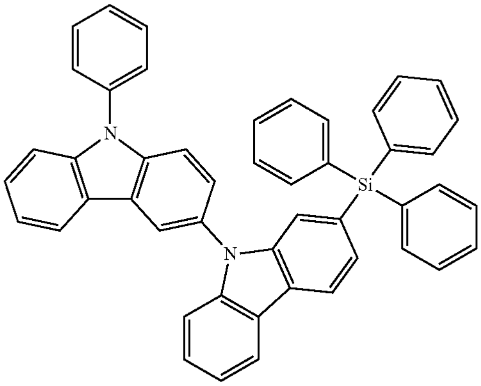

-continued

H1-24

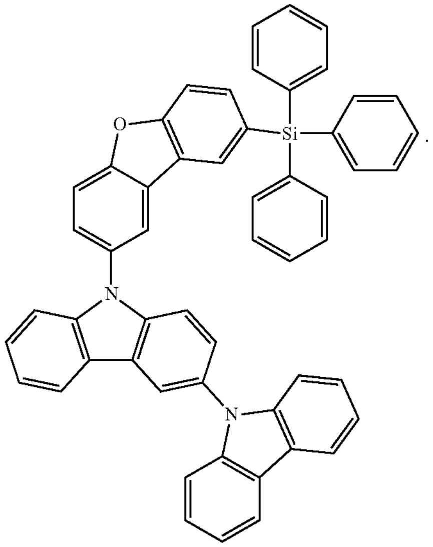

In an embodiment, the fourth compound may include a compound represented by Formula 4-11, a compound represented by Formula 4-12, or any combination thereof:

[Formula 4-11]

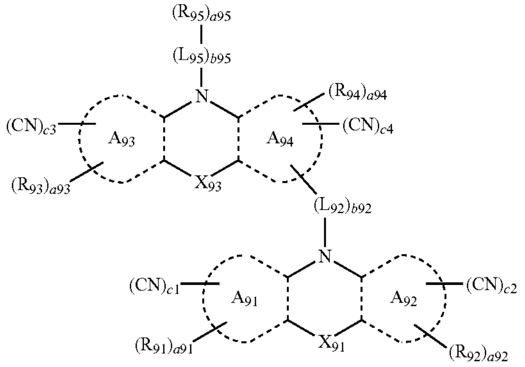

[Formula 4-12]

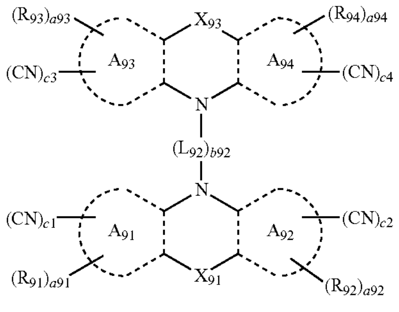

In Formulae 4-11 and 4-12, ring $A_{91}$, ring $A_{92}$, $X_{91}$, $R_{91}$, $R_{92}$, a91, a92, c1, and c2 may respectively be the same as described in Formula 4, ring $A_{93}$ and ring $A_{94}$ may each independently be a π electron-rich $C_3$-$C_{60}$ cyclic group or a pyridine group, $X_{93}$ may be: a single bond; or a linking group including O, S, N, B, C, Si, or any combination thereof, $L_{92}$ and $L_{95}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b92 and b95 may each independently be an integer from 1 to 5, $R_{93}$ to $R_{95}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $-C(Q_1)(Q_2)(Q_3)$, $-Si(Q_1)(Q_2)(Q_3)$, $-N(Q_1)(Q_2)$, $-B(Q_1)(Q_2)$, $-C(=O)(Q_1)$, $-S(=O)_2(Q_1)$, or $-P(=O)(Q_1)(Q_2)$, a93 to a95 may each independently be an integer from 0 to 10, c3 and c4 may each independently be an integer from 0 to 10, and $R_{10a}$ and $Q_1$ to $Q_3$ may respectively be the same as those described herein.

For example, in Formulae 4-11 and 4-12, a sum of c3 and c4 (i.e., c3+c4) may be 1 or more.

In embodiments, the fourth compound may include a group represented by Formula 4-1:

[Formula 4-1]

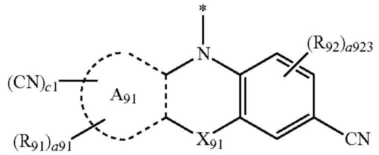

In Formula 4-1, $A_{91}$, $X_{91}$, $R_{91}$, $R_{92}$, a91, and c1 may respectively be the same as those described in connection with Formula 4, a923 may be an integer from 0 to 3, and

* indicates a binding site to a neighboring atom in the fourth compound.

In an embodiment, the third compound and the fourth compound may each independently be one of Compounds E1 to E32:

E1

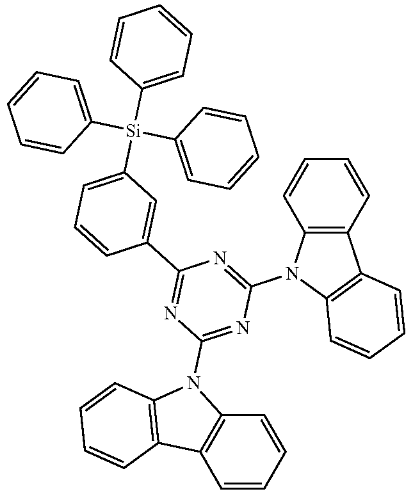

-continued
E2
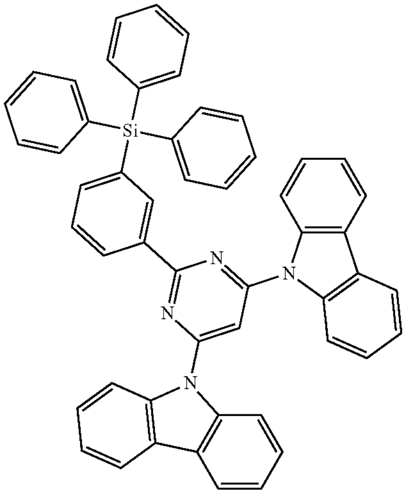
E3
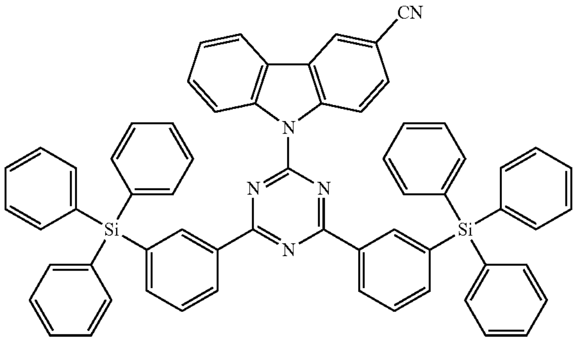
E4
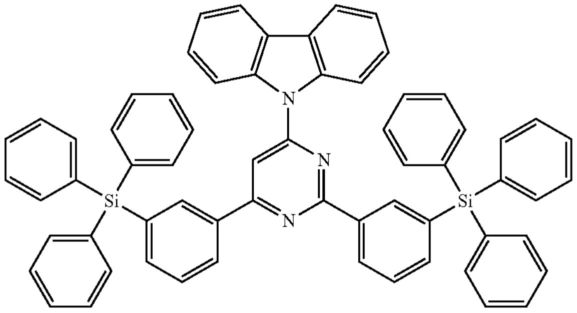
E5
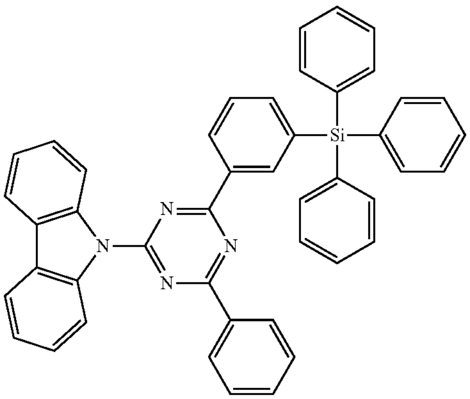
-continued
E6
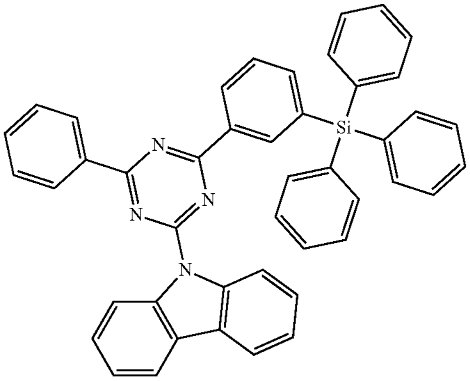
E7
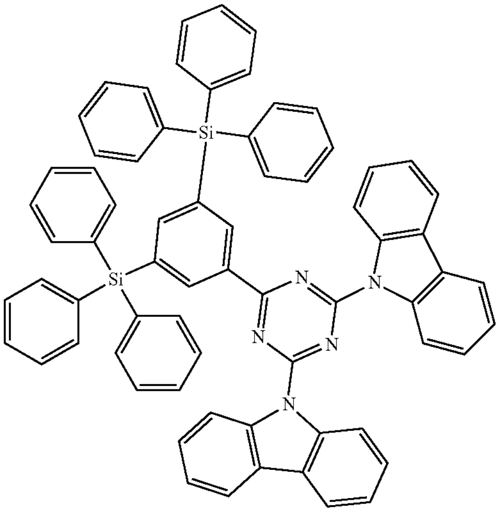
E8
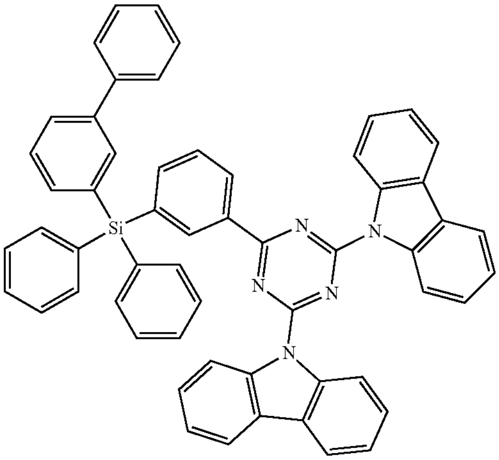

-continued
E9
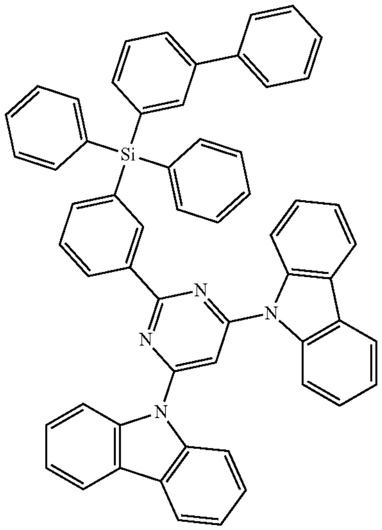
E10
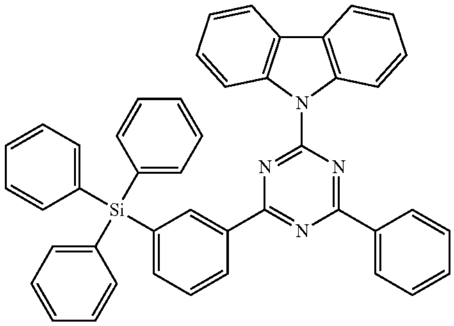
E11
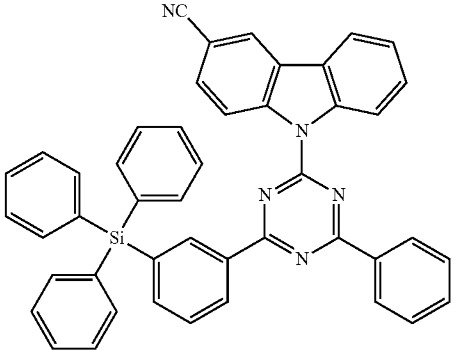
E12
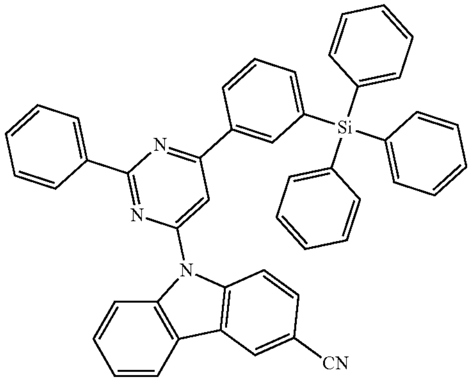
-continued
E13
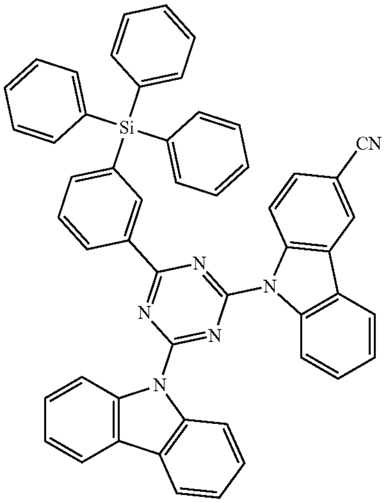
E14
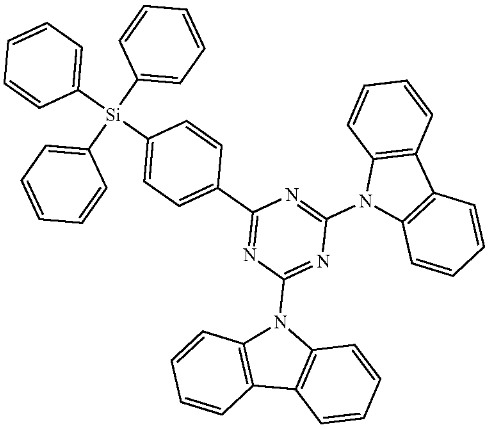
E15
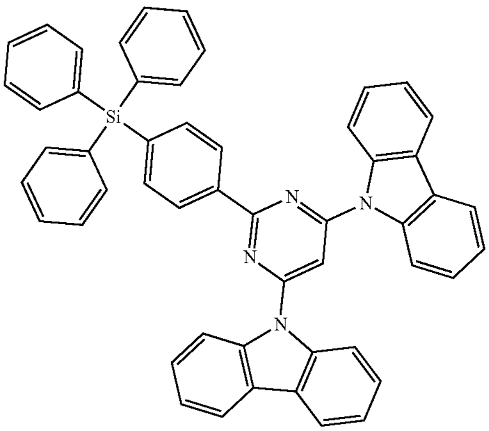

-continued
E16
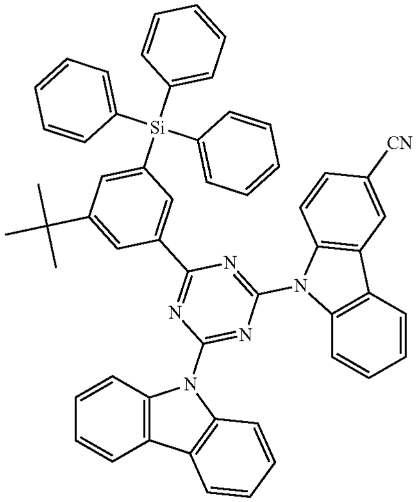
E17
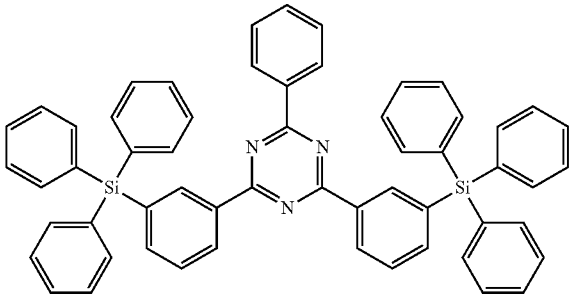
E18
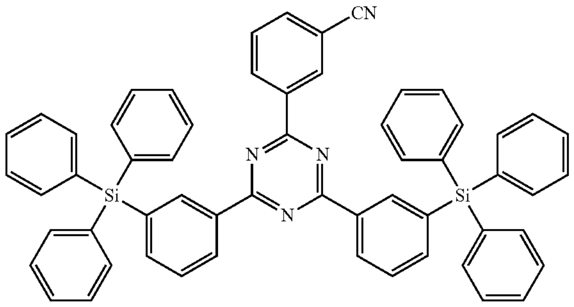
E19
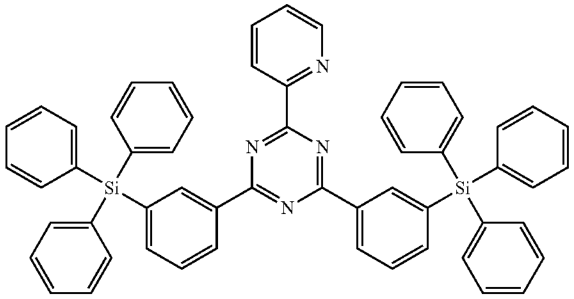
-continued
E20
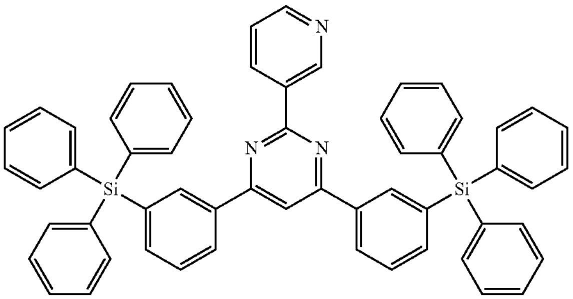
E21
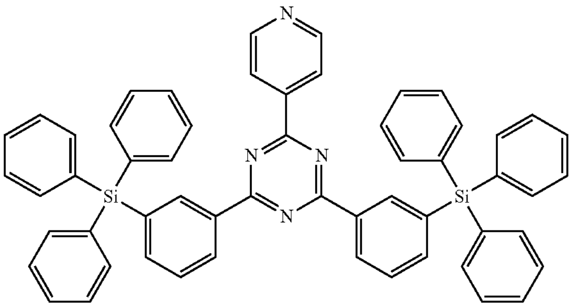
E22
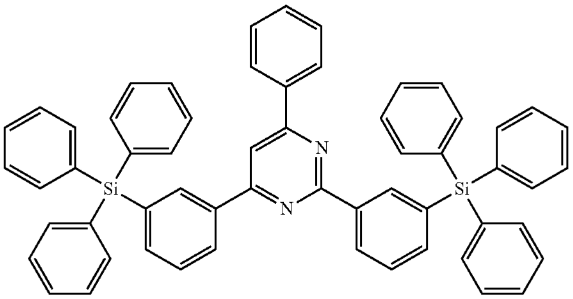
E23
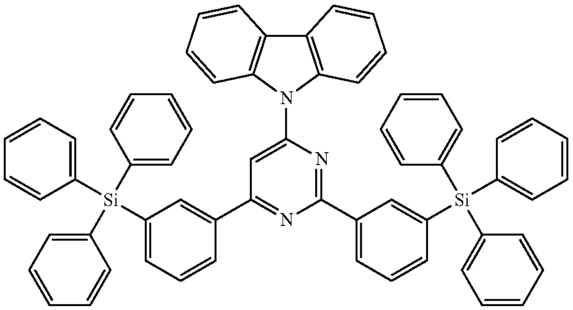
E24
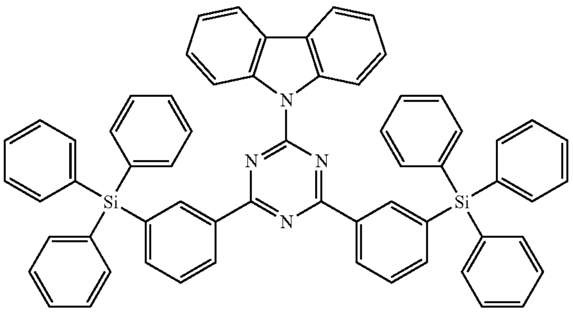

-continued
E25
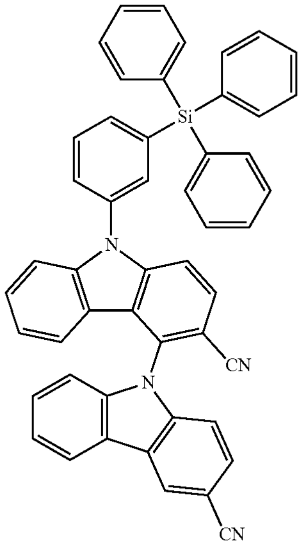
E26
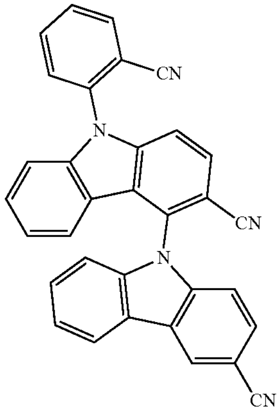
E27
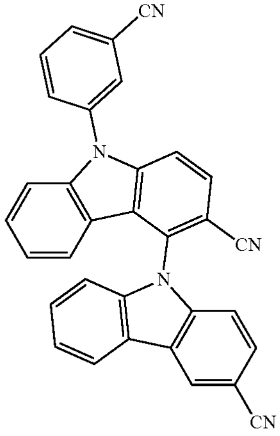
-continued
E28
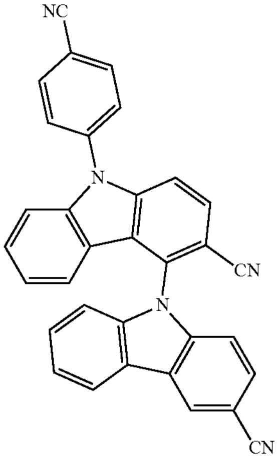
E29
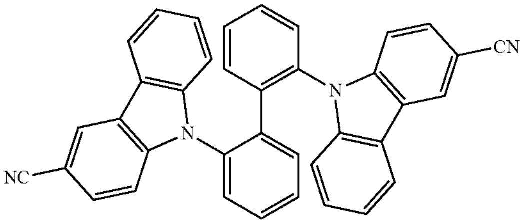
E30
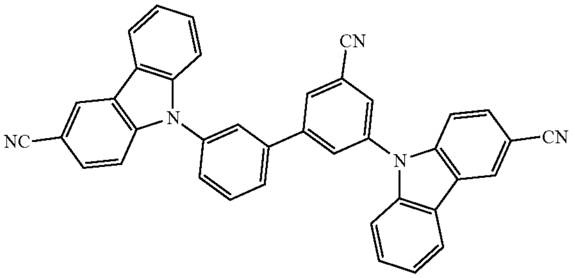
E31
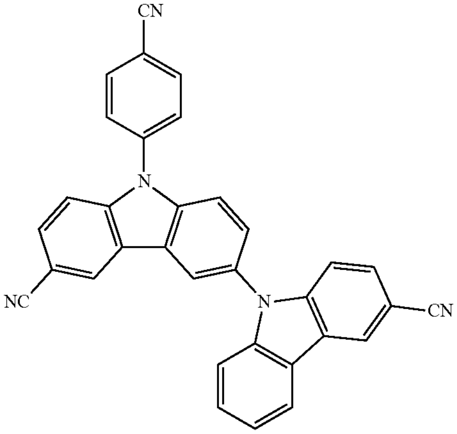

-continued

E32

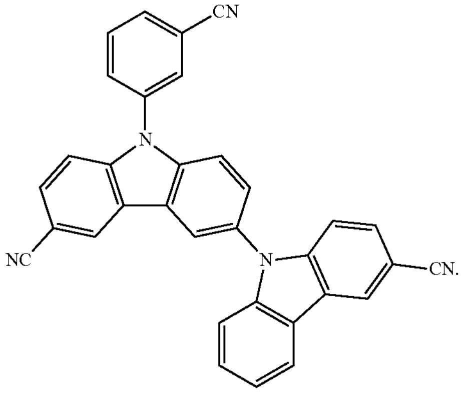

Descriptions of Formulae 2, 2-1 to 2-5, 3, 4, 4-1, 4-11, and 4-12

In Formula 3, b61 to b63 respectively indicate the number of $L_{61}$(s) to the number of $L_{63}$(s), and may each independently be an integer from 1 to 5. When b61 is 2 or greater, two or more of $L_{61}$ may be identical to or different from each other, when b62 is 2 or greater, two or more of $L_{62}$ may be identical to or different from each other, and when b63 is 2 or greater, two or more of $L_{63}$ may be identical to or different from each other. For example, b61 to b63 may each independently be 1 or 2.

In Formulae 4-11 and 4-12, b92 and b95 respectively indicate the number of $L_{92}$(s) and the number of $L_{95}$(s), and may each independently be an integer from 1 to 5. When b92 is 2 or greater, two or more of $L_{92}$ may be identical to or different from each other, and when b95 is 2 or greater, two or more $L_{95}$ may be identical to or different from each other. For example, b92 and b95 may each independently be 1 or 2.

$L_{61}$ to $L_{63}$ in Formula 3 and $L_{92}$ and $L_{95}$ in Formulae 4-11 and 4-12 may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzooxasiline group, a dibenzothiasiline group, a dibenzodihydroazasiline group, a dibenzodihydrodihydrodisiline group, a dibenzodihydrosiline group, a dibenzodioxine group, a dibenzooxathiine group, a dibenzooxazine group, a dibenzopyran group, a dibenzodithiine group, a dibenzothiazine group, a dibenzothiopyran group, a dibenzocyclohexadiene group, a dibenzodihydropyridine group, or a dibenzodihydropyrazine group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In an embodiment, in Formula 3, a bond between $L_{61}$ and $R_{61}$, a bond between $L_{62}$ and $R_{62}$, a bond between $L_{63}$ and $R_{63}$, a bond between two or more $L_{61}$(s), a bond between two or more $L_{62}$(s), a bond between two or more $L_{63}$(s), a bond between $L_{61}$ and a carbon atom between $X_{64}$ and $X_{65}$ in Formula 3, a bond between $L_{62}$ and a carbon atom between $X_{64}$ and $X_{66}$ in Formula 3, and a bond between $L_{63}$ and a carbon atom between $X_{65}$ and $X_{66}$ in Formula 3 may each be a carbon-carbon single bond.

In Formula 3, $X_{64}$ may be N or $C(R_{64})$, $X_{65}$ may be N or $C(R_{65})$, $X_{66}$ may be N or $C(R_{66})$, and at least one of $X_{64}$ to $X_{66}$ may be N, wherein $R_{64}$ to $R_{66}$ may respectively be the same as described herein. For example, two or three of $X_{64}$ to $X_{66}$ may each be N.

In the specification, $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, and $R_{91}$ to $R_{95}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ may each be the same as described herein.

In an embodiment, in Formulae 2, 2-1 to 2-5, 3, 4, 4-1, 4-11, and 4-12, $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{91}$ to $R_{95}$, and $R_{10a}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrim idinyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, and $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

[Formula 91]

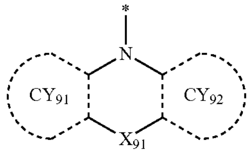

In Formula 91, ring $CY_{91}$ and ring $CY_{92}$ may each independently be a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $X_{91}$ may be a single bond, O, S, $N(Z_{91})$, $B(Z_{91})$, $C(Z_{91a})(Z_{91b})$, or $Si(Z_{91a})(Z_{91b})$, $Z_{91}$, $Z_{91a}$, and $Z_{91b}$ may respectively be the same as described in connection with $R_{82}$, $R_{82a}$, and $R_{82b}$ in the specification, $R_{10a}$ may be the same as described herein, and

* indicates a binding site to a neighboring atom.

In embodiments, in Formula 91, ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$, and $Z_{91}$, $Z_{91a}$, and $Z_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In embodiments, $R_1$ to $R_9$, $Z_{11}$, and $Z_{12}$ in Formula 1; $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, and $R_{91}$ to $R_{95}$ in Formulae 2, 2-1 to 2-5, 3, 4, 4-1, 4-11, and 4-12; and $R_{10a}$ may each independently be hydrogen, deuterium, —F, a cyano group, a nitro group, $—CH_3$, $—CD_3$, $—CD_2H$, $—CDH_2$, $—CF_3$, $—CF_2H$, $—CFH_2$, a group represented by one of Formulae 9-1 to 9-20 in the specification, a group represented by one of Formulae 10-1 to 10-255 in the specification, $—C(Q_1)(Q_2)(Q_3)$, $—Si(Q_1)(Q_2)(Q_3)$, or $—P(=O)(Q_1)(Q_2)$, wherein $Q_1$ to $Q_3$ may respectively be the same as those described herein.

In Formulae 2-1 to 2-5, a71 to a74 respectively indicate the number of $R_{71}$(s) to the number of $R_{74}$(s), and may each independently be an integer from 0 to 20. When a71 is 2 or greater, two or more of $R_{71}$ may be identical to or different from each other, when a72 is 2 or greater, two or more of $R_{72}$ may be identical to or different from each other, when a73 is 2 or greater, two or more of $R_{73}$ may be identical to or different from each other, and when a74 is 2 or greater, two or more of $R_{74}$ may be identical to or different from each other. In an embodiment, a71 to a74 may each independently be an integer from 0 to 8.

In an embodiment, in Formula 3, a group represented by $*-(L_{61})_{b61}-R_{61}$ and a group represented by $*-(L_{62})_{b62}-R_{62}$ may each not be a phenyl group.

In an embodiment, in Formula 3, a group represented by $*-(L_{61})_{b61}-R_{61}$ and a group represented by $*-(L_{62})_{b62}-R_{62}$ may be identical to each other.

In an embodiment, in Formula 3, a group represented by $*-(L_{61})_{b61}-R_{61}$ and a group represented by $*-(L_{62})_{b62}-R_{62}$ may be different from each other.

In an embodiment, in Formula 3, b61 and b62 may each independently be 1, 2, or 3, and $L_{61}$ and $L_{62}$ may each independently be a benzene group, a pyridine group, a pyrimidine group, a pyridazine group, a pyrazine group, or a triazine group, each unsubstituted or substituted with at least one $R_{10a}$.

In an embodiment, in Formula 3, $R_{61}$ and $R_{62}$ may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, or —$Si(Q_1)(Q_2)(Q_3)$, and $Q_1$ to $Q_3$ may each independently be a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, in Formula 3, a group represented by $*-(L_{61})_{b61}-R_{61}$ may be a group represented by one of Formulae CY51-1 to CY51-26, and/or a group represented by $*-(L_{62})_{b62}-R_{62}$ may be a group represented by one of Formulae CY52-1 to CY52-26, and/or a group represented by $*-(L_{63})_{b63}-R_{63}$ may be a group represented by one of Formulae CY53-1 to CY53-27, —$C(Q_1)(Q_2)(Q_3)$, or —$Si(Q_1)(Q_2)(Q_3)$, wherein $Q_1$ to $Q_3$ may respectively be the same as described herein:

CY51-1

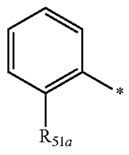

CY51-2

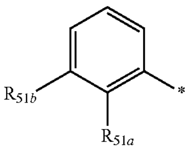

-continued

CY51-3

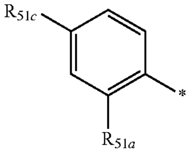

CY51-4

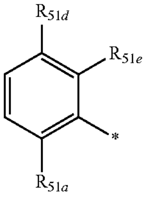

CY51-5

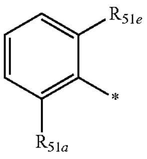

CY51-6

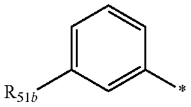

CY51-7

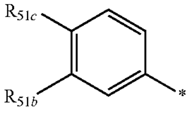

CY51-8

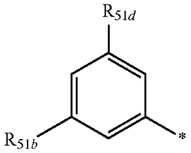

CY51-9

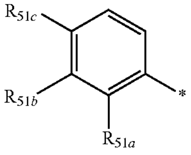

CY51-10

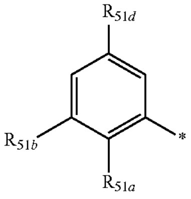

CY51-11

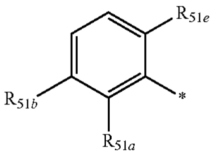

-continued
CY51-12
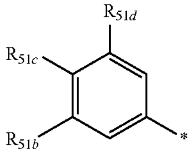
CY51-13
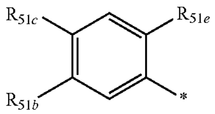
CY51-14
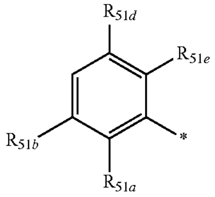
CY51-15
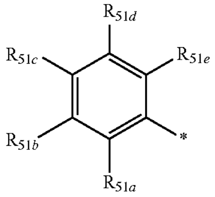
CY51-16
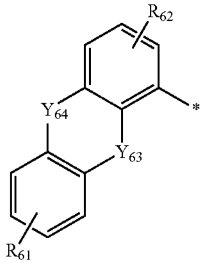
CY51-17
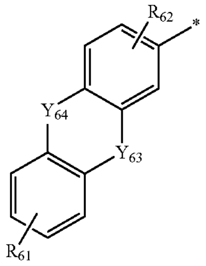
CY51-18
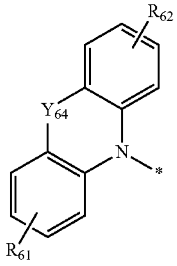
-continued
CY51-19
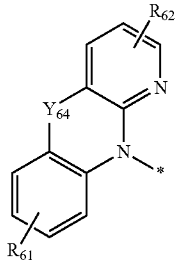
CY51-20
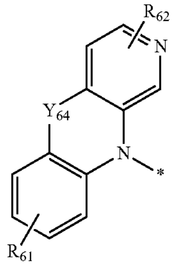
CY51-21
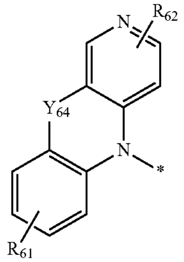
CY51-22
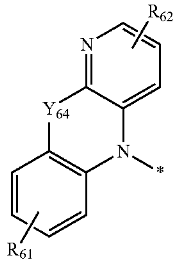
CY51-23
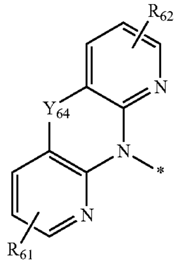
CY51-24
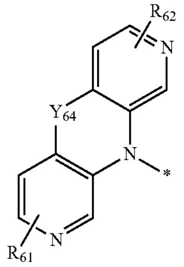

-continued
CY51-25
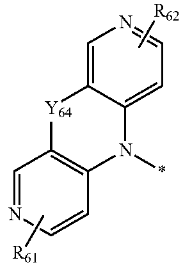
CY51-26
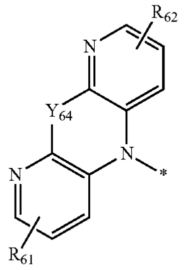
CY52-1
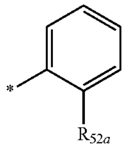
CY52-2
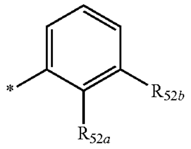
CY52-3
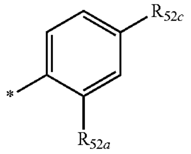
CY52-4
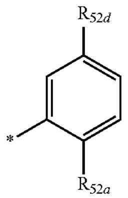
CY52-5
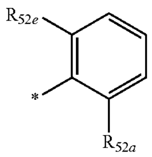
CY52-6
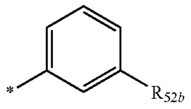
-continued
CY52-7
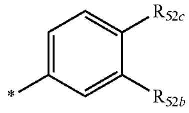
CY52-8
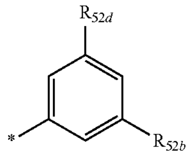
CY52-9
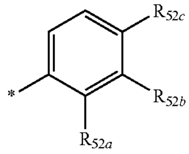
CY52-10
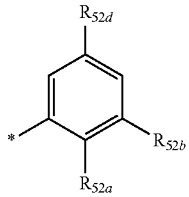
CY52-11
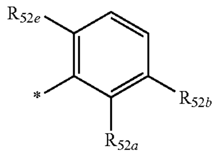
CY52-12
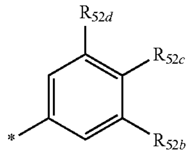
CY52-13
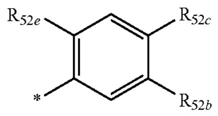
CY52-14
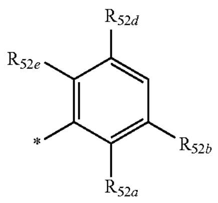
CY52-15
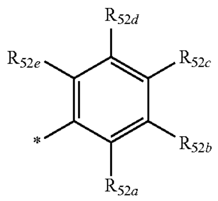

-continued
CY52-16
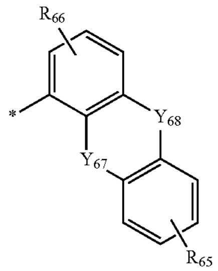
CY52-17
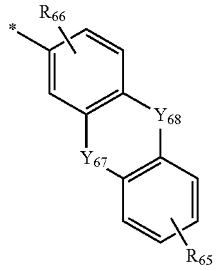
CY52-18
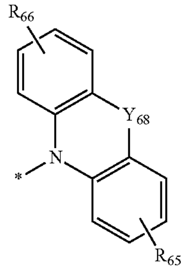
CY52-19
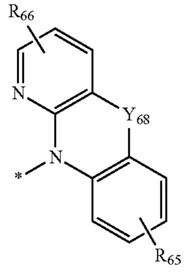
CY52-20
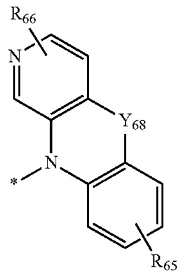
-continued
CY52-21
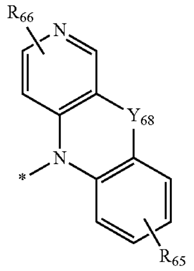
CY52-22
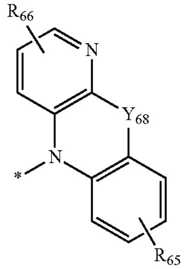
CY52-23
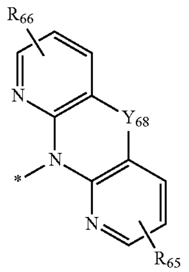
CY52-24
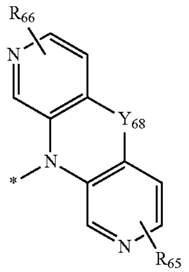
CY52-25
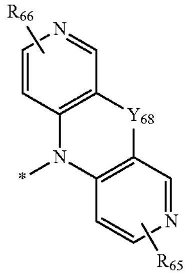

-continued
CY52-26
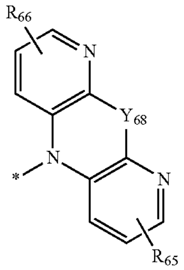
CY53-1
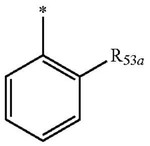
CY53-2
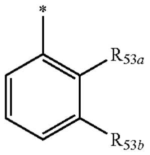
CY53-3
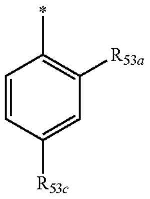
CY53-4
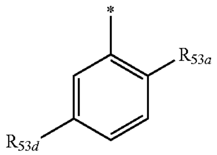
CY53-5
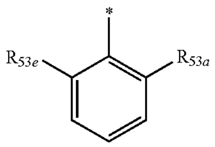
CY53-6
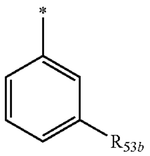
CY53-7
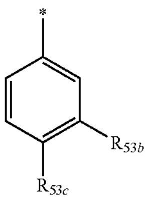
-continued
CY53-8
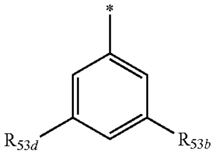
CY53-9
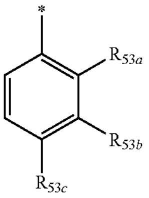
CY53-10
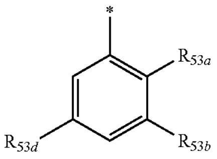
CY53-11
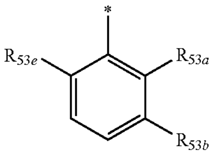
CY53-12
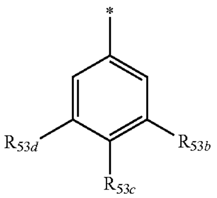
CY53-13
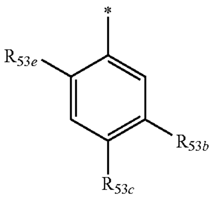
CY53-14
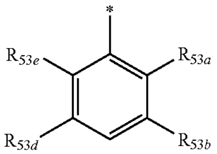
CY53-15
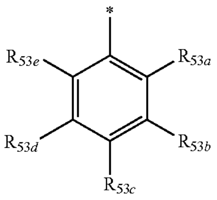

-continued

CY53-16

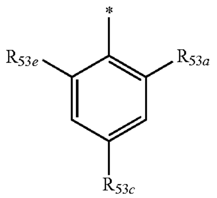

CY53-17

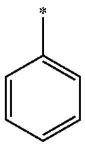

CY53-18

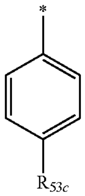

CY53-19

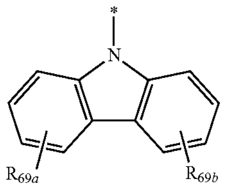

CY53-20

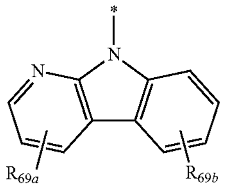

CY53-21

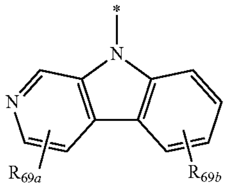

CY53-22

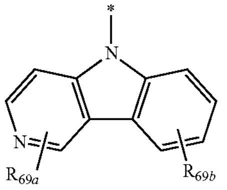

CY53-23

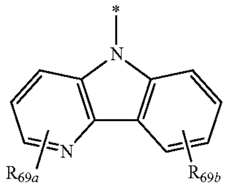

-continued

CY53-24

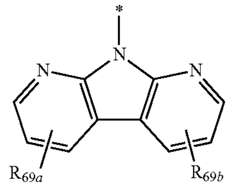

CY53-25

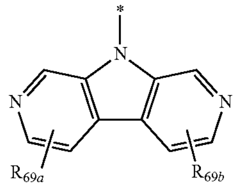

CY53-26

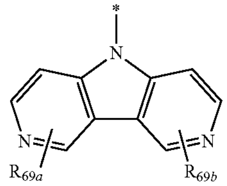

CY53-27

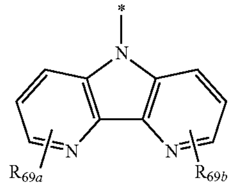

In Formulae CY51-1 to CY51-26, CY52-1 to CY52-26, and CY53-1 to CY53-27, $Y_{63}$ may be a single bond, O, S, $N(R_{63})$, $B(R_{63})$, $C(R_{63a})(R_{63b})$, or $Si(R_{63a})(R_{63b})$, $Y_{64}$ may be a single bond, O, S, $N(R_{64})$, $B(R_{64})$, $C(R_{64a})(R_{64b})$, or $Si(R_{64a})(R_{64b})$, $Y_{67}$ may be a single bond, O, S, $N(R_{67})$, $B(R_{67})$, $C(R_{67a})(R_{67b})$, or $Si(R_{67a})(R_{67b})$, $Y_{68}$ may be a single bond, O, S, $N(R_{68})$, $B(R_{68})$, $C(R_{68a})(R_{68b})$, or $Si(R_{68a})(R_{68b})$, $Y_{63}$ and $Y_{64}$ in Formulae CY51-16 and CY51-17 may not each be a single bond at the same time, $Y_{67}$ and $Y_{68}$ in Formulae CY52-16 and CY52-17 may not each be a single bond at the same time, $R_{51a}$ to $R_{51e}$, $R_{61}$ to $R_{64}$, $R_{63a}$, $R_{63b}$, $R_{64a}$, and $R_{64b}$ may each independently be the same as described in connection with $R_{61}$, wherein $R_{51a}$ to $R_{51e}$ may not each be hydrogen, $R_{52a}$ to $R_{52e}$, $R_{65}$ to $R_{68}$, $R_{67a}$, $R_{67b}$, $R_{68a}$, and $R_{68b}$ may each independently be the same as described in connection with $R_{62}$, wherein $R_{52a}$ to $R_{52e}$ may not each be hydrogen, $R_{53a}$ to $R_{53e}$, $R_{69a}$, and $R_{69b}$ may each independently be the same as described in connection with $R_{63}$, wherein $R_{53a}$ to $R_{53e}$ may not each be hydrogen, and

* indicates a binding site to a neighboring atom.

In embodiments, in Formulae CY51-1 to CY51-26 and Formulae CY52-1 to 52-26, $R_{51a}$ to $R_{51e}$ and $R_{52a}$ to $R_{52e}$ may each independently be:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or $—C(Q_1)(Q_2)(Q_3)$ or $—Si(Q_1)(Q_2)(Q_3)$, wherein $Q_1$ to $Q_3$ may each independently be a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof, and Formula 91 91 is the same as described herein, in Formulae CY51-16 and CY51-17, $Y_{63}$ may be O or S and $Y_{64}$ may be $Si(R_{64a})(R_{64b})$; or $Y_{63}$ may be $Si(R_{63a})(R_{63b})$ and $Y_{64}$ may be O or S, and in Formulae CY52-16 and CY52-17, $Y_{67}$ may be O or S, and $Y_{68}$ may be $Si(R_{68a})(R_{68b})$; or $Y_{67}$ may be $Si(R_{67a})(R_{67b})$, and $Y_{68}$ may be O or S.

In an embodiment, in Formulae 2-1 to 2-5, $L_{81}$ to $L_{85}$ may each independently be:

a single bond; or $*—C(Q_4)(Q_5)-*'$ or $*—Si(Q_4)(Q_5)-*'$; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenylfluorenyl group, a carbazolyl group, a phenylcarbazolyl group, a dibenzofuranyl group, a dibenzothiophenyl group, a dibenzosilolyl group, a dimethyldibenzosilolyl group, a diphenyldibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof, wherein $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In an embodiment, a group represented by

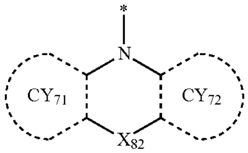

in Formulae 2-1 and 2-2 may be a group represented by one of Formulae CY71-1(1) to CY71-1(8), and/or a group represented by

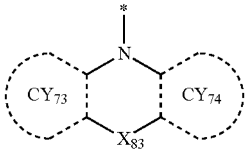

in Formulae 2-1 and 2-3 may be a group represented by one of Formulae CY71-2(1) to CY71-2(8), and/or a group represented by

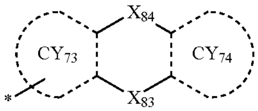

in Formulae 2-2 and 2-4 may be a group represented by one of Formulae CY71-3(1) to CY71-3(32), and/or a group represented by

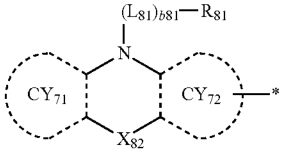

in Formulae 2-3 to 2-5 may be a group represented by one of Formulae CY71-4(1) to CY71-4(32), and/or a group represented by

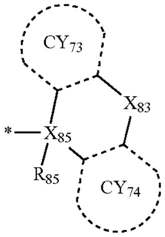

in Formula 2-5 may be a group represented by one of Formulae CY71-5(1) to CY71-5(8):

CY71-1(1)

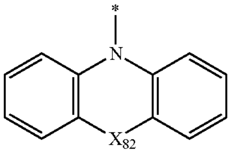

CY71-1(2)

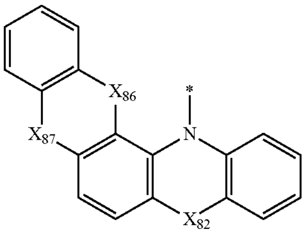

CY71-1(3)

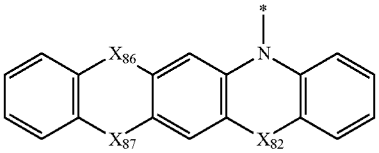

CY71-1(4)

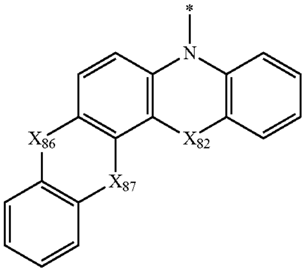

CY71-1(5)

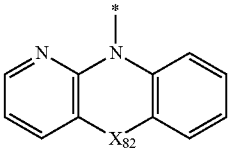

CY71-1(6)

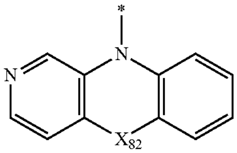

CY71-1(7)

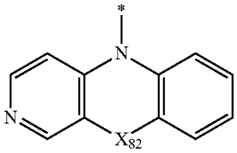

CY71-1(8)

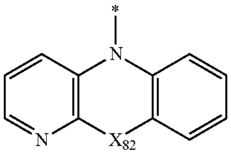

-continued
CY71-2(1)
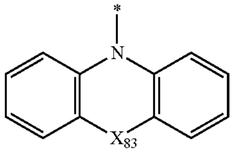
CY71-2(2)
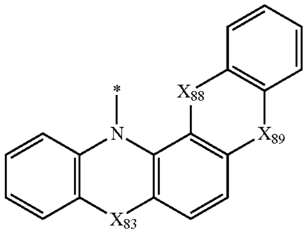
CY71-2(3)
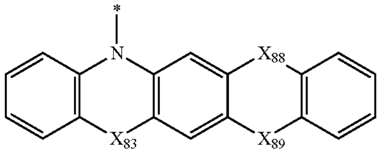
CY71-2(4)
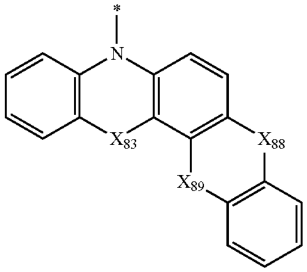
CY71-2(5)
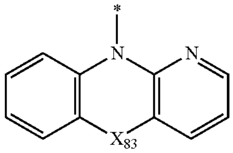
CY71-2(6)
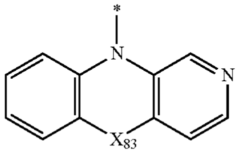
CY71-2(7)
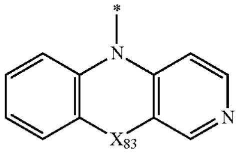
CY71-2(8)
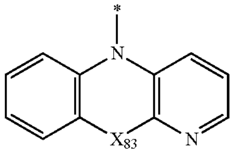
-continued
CY71-3(1)
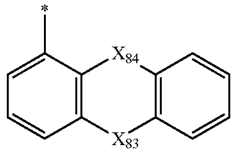
CY71-3(2)
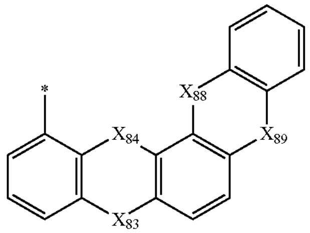
CY71-3(3)
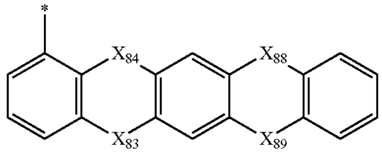
CY71-3(4)
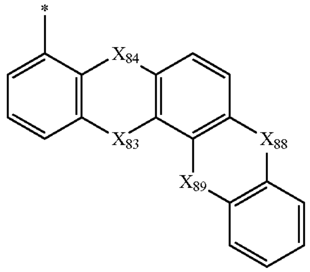
CY71-3(5)
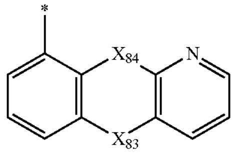
CY71-3(6)
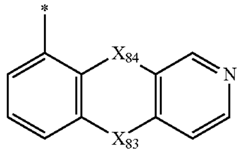
CY71-3(7)
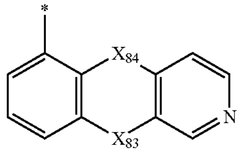
CY71-3(8)
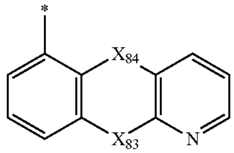
CY71-3(9)
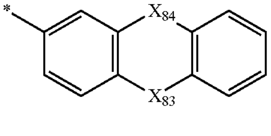

-continued
CY71-3(10)
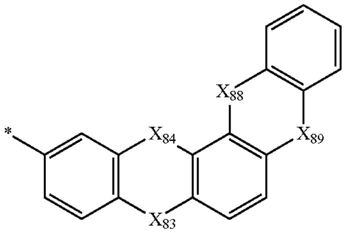
CY71-3(11)
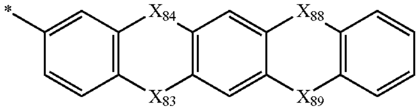
CY71-3(12)
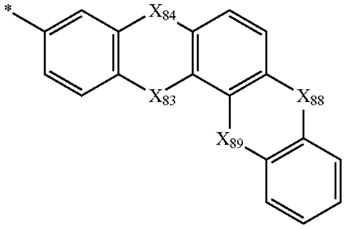
CY71-3(13)
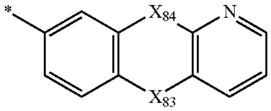
CY71-3(14)
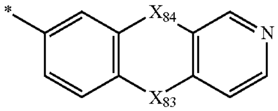
CY71-3(15)
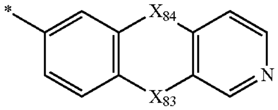
CY71-3(16)
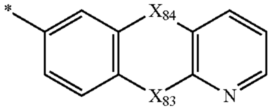
CY71-3(17)
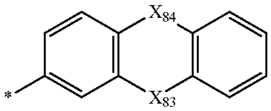
CY71-3(18)
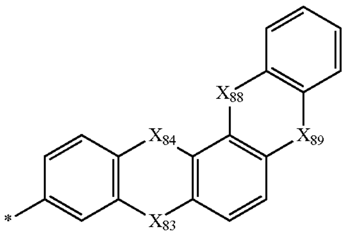
CY71-3(19)
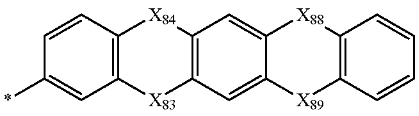
-continued
CY71-3(20)
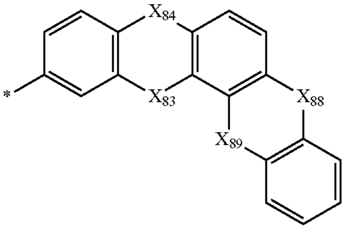
CY71-3(21)
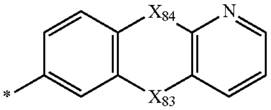
CY71-3(22)
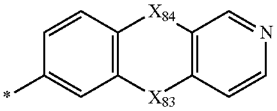
CY71-3(23)
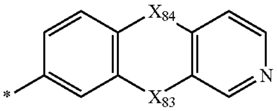
CY71-3(24)
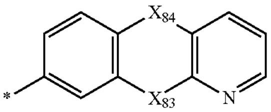
CY71-3(25)
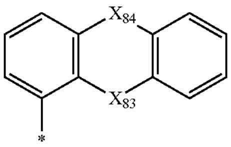
CY71-3(26)
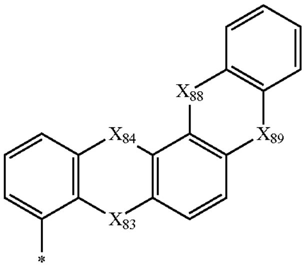
CY71-3(27)
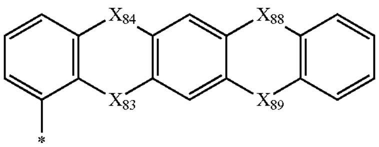
CY71-3(28)
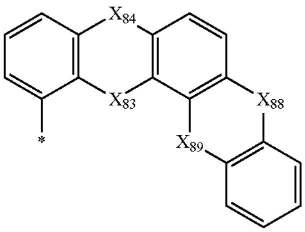

-continued
CY71-3(29)
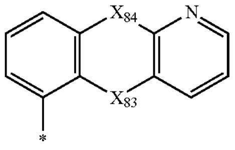
CY71-3(30)
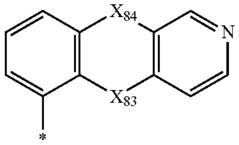
CY71-3(31)
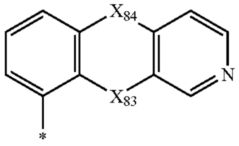
CY71-3(32)
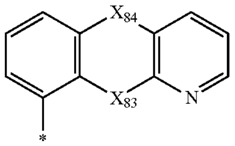
CY71-4(1)
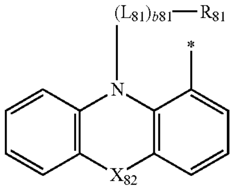
CY71-4(2)
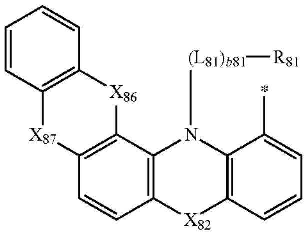
CY71-4(3)
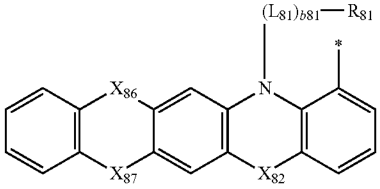
CY71-4(4)
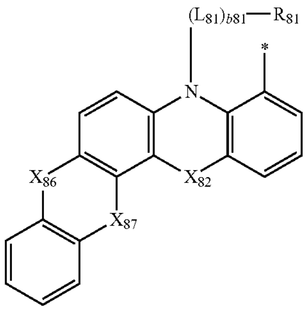
-continued
CY71-4(5)
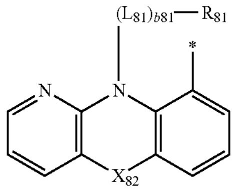
CY71-4(6)
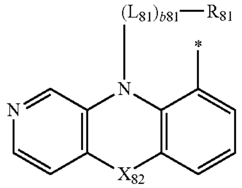
CY71-4(7)
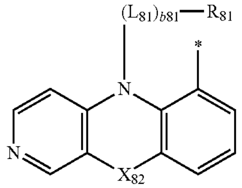
CY71-4(8)
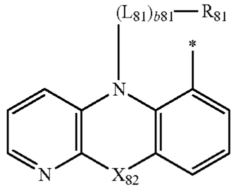
CY71-4(9)
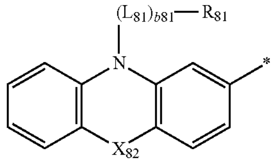
CY71-4(10)
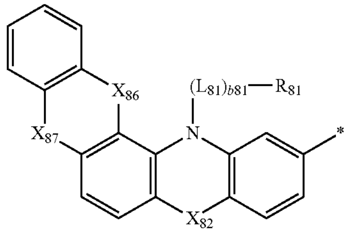
CY71-4(11)
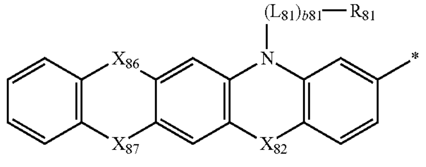

-continued
CY71-4(12)
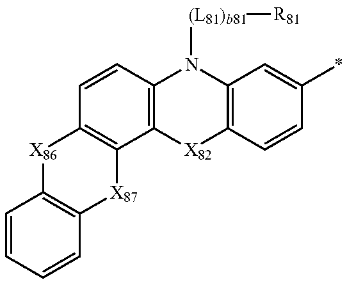
CY71-4(13)
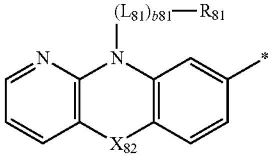
CY71-4(14)
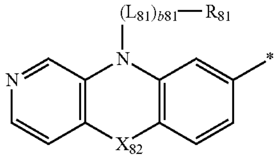
CY71-4(15)
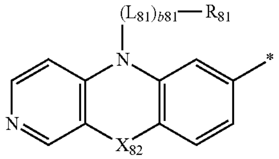
CY71-4(16)
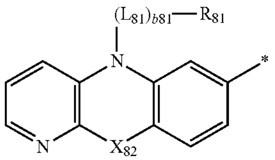
CY71-4(17)
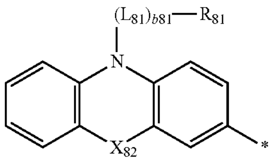
CY71-4(18)
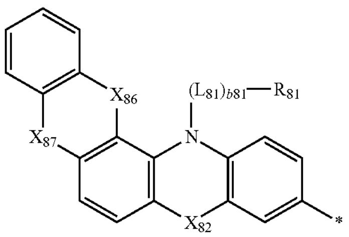
CY71-4(19)
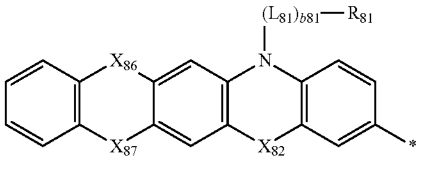
-continued
CY71-4(20)
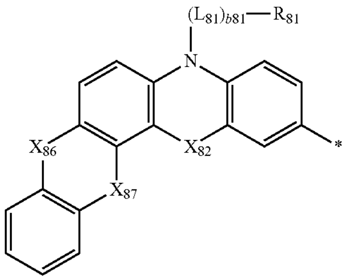
CY71-4(21)
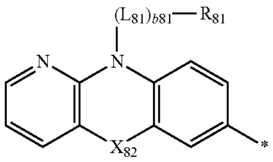
CY71-4(22)
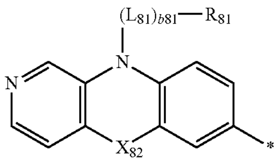
CY71-4(23)
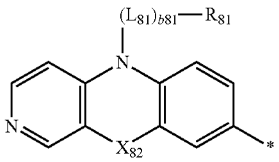
CY71-4(24)
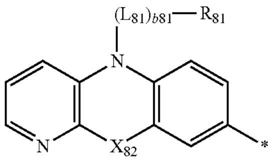
CY71-4(25)
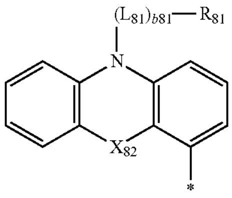
CY71-4(26)
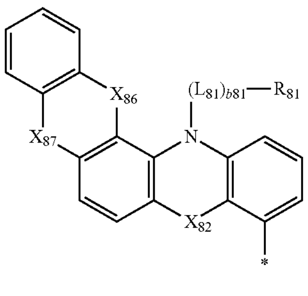

-continued

CY71-4(27)

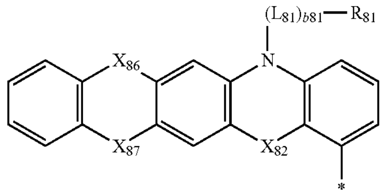

CY71-4(28)

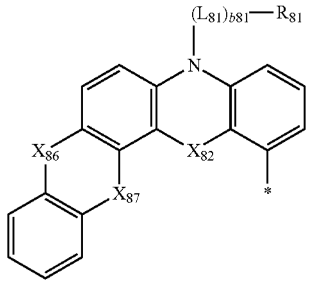

CY71-4(29)

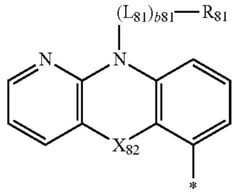

CY71-4(30)

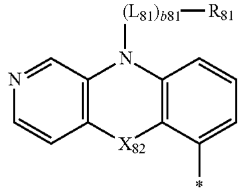

CY71-4(31)

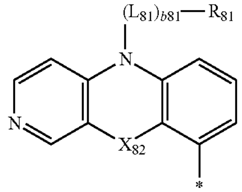

CY71-4(32)

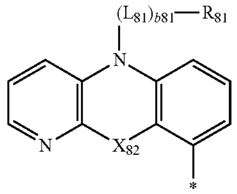

CY71-5(1)

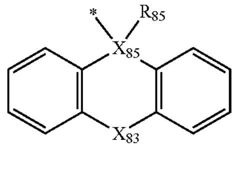

-continued

CY71-5(2)

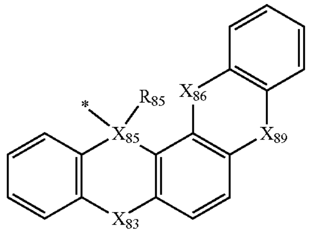

CY71-5(3)

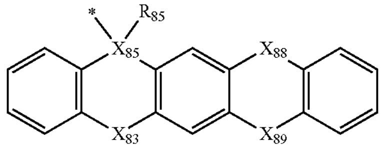

CY71-5(4)

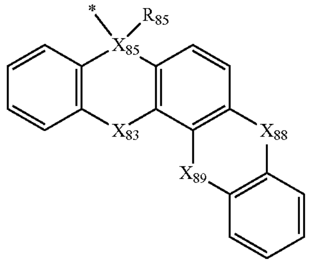

CY71-5(5)

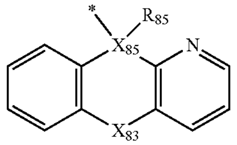

CY71-5(6)

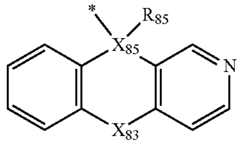

CY71-5(7)

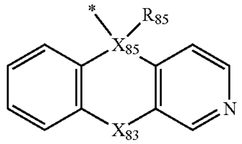

CY71-5(8)

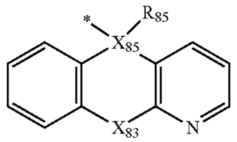

In Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{82}$ to $X_{85}$, $L_{81}$, b81, $R_{81}$, and $R_{85}$ may each be the same as described herein, $X_{86}$ may be a single bond, O, S, $N(R_{86})$, $B(R_{86})$, $C(R_{86a})(R_{86b})$, or $Si(R_{86a})(R_{86b})$, and $X_{87}$ may be a single bond, O, S, $N(R_{87})$, $B(R_{87})$, $C(R_{87a})(R_{87b})$, or $Si(R_{87a})(R_{87b})$, in Formulae CY71-1(1) to CY71-1(8) and CY71-4(1) to CY71-4(32), $X_{86}$ and $X_{87}$ may not each be a single bond at the same time, $X_{88}$ may be a single bond, O, S, $N(R_{88})$, $B(R_{88})$, $C(R_{88a})(R_{88b})$, or $Si(R_{88a})(R_{88b})$, and $X_{89}$ may be a single bond, O, S, $N(R_{89})$, $B(R_{89})$, $C(R_{89a})(R_{89b})$, or $Si(R_{89a})(R_{89b})$, in Formulae CY71-2(1) to CY71-2(8), CY71-3(1) to CY71-3(32), and CY71-5(1) to CY71-5(8), $X_{88}$ and $X_{89}$ may not each be a single bond at the same time, and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ may each independently be the same as described in connection with $R_{81}$.

In embodiments, the light-emitting device may include a capping layer located outside the first electrode or outside the second electrode.

In an embodiment, the light-emitting device may further include at least one of a first capping layer located outside the first electrode and a second capping layer located outside the second electrode, and at least one of the first capping layer and the second capping layer may include the organometallic compound represented by Formula 1. The first capping layer and/or the second capping layer may each be the same as described herein.

In an embodiment, the light-emitting device may further include:

a first capping layer located outside the first electrode and including an organometallic compound represented by Formula 1; or a second capping layer located outside the second electrode and including an organometallic compound represented by Formula 1; or the first capping layer and the second capping layer.

The wording "(interlayer and/or capping layer) includes an organometallic compound" as used herein may be understood as "(interlayer and/or capping layer) may include one kind of organometallic compound represented by Formula 1 or two or more different kinds of organometallic compounds, each independently represented by Formula 1."

For example, the interlayer and/or capping layer may include Compound 1 only as the organometallic compound. In this regard, Compound 1 may be present in the emission layer of the light-emitting device. In embodiments, the interlayer may include, as the organometallic compound, Compound 1 and Compound 2. In this regard, Compound 1 and Compound 2 may be present in a same layer (for example, both Compound 1 and Compound 2 may be present in the emission layer), or may be present in different layers (for example, Compound 1 may be present in the emission layer, and Compound 2 may be present in the electron transport region).

The term "interlayer" as used herein may be a single layer and/or multiple layers between the first electrode and the second electrode of the light-emitting device.

Another aspect of the disclosure provides an electronic apparatus the light-emitting device. The electronic apparatus may further include a thin-film transistor. In an embodiment, the electronic apparatus may include the light-emitting device, and a thin-film transistor, wherein the thin-film transistor may include a source electrode and a drain electrode, and the first electrode of the light-emitting device may be electrically connected to at least one of the source electrode and the drain electrode. In an embodiment, the electronic apparatus may further include a color filter, a color conversion layer, a touch screen layer, a polarizing layer, or any combination thereof. The electronic apparatus may be the same as described herein.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, a structure of the light-emitting device 10 according to an embodiment and a method of manufacturing the light-emitting device 10 will be described with reference to FIG. 1.

[First Electrode 110]

In FIG. 1, a substrate may be further included under the first electrode 110 or on the second electrode 150. In an embodiment, the substrate may be a glass substrate or a plastic substrate. In embodiments, the substrate may be a flexible substrate, and for example, may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In an embodiment, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer or a structure including multiple layers. For example, the first electrode 110 may have a three-layer structure of ITO/Ag/ITO.

[Interlayer 130]

The interlayer 130 is arranged on the first electrode 110. The interlayer 130 may include an emission layer.

The interlayer 130 may further include a hole transport region arranged between the first electrode 110 and the emission layer, and an electron transport region arranged between the emission layer and the second electrode 150.

In an embodiment, the interlayer 130 may further include, in addition to various organic materials, a metal-containing compound such as an organometallic compound, an inorganic material such as quantum dots, and the like.

In embodiments, the interlayer 130 may include two or more emitting units stacked between the first electrode 110 and the second electrode 150, and at least one charge generation layer between the two or more emitting units. When the interlayer 130 includes the two or more emitting units and the at least one charge generation layer, the light-emitting device 10 may be a tandem light-emitting device.

[Hole Transport Region in Interlayer 130]

The hole transport region may have a structure consisting of a layer consisting of a single material, a structure consisting of a layer including different materials, or a structure including multiple layers including different materials.

The hole transport region may include a hole injection layer, a hole transport layer, an emission auxiliary layer, an electron blocking layer, or any combination thereof.

In embodiments, the hole transport region may have a multi-layer structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure may be stacked from the first electrode 110 its respective stated order, but the structure of the hole transport region is not limited thereto.

The hole transport region may include a compound represented by Formula 201, a compound represented by Formula 202, or any combination thereof:

[Formula 201]

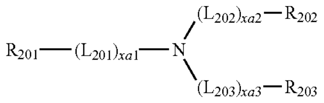

[Formula 202]

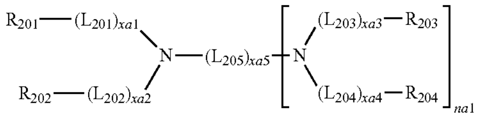

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)—*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group, etc.) unsubstituted or substituted with at least one $R_{10a}$ (for example, Compound HT16, etc.), $R_{203}$ and $R_{204}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In embodiments, Formulae 201 and 202 may each include at least one of groups represented by Formulae CY201 to CY217:

CY201

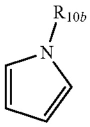

CY202

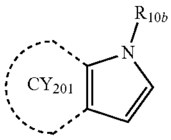

CY203

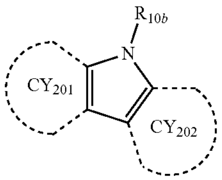

-continued

CY204

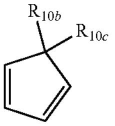

CY205

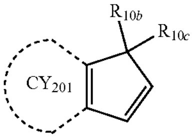

CY206

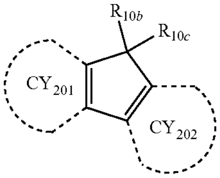

CY207

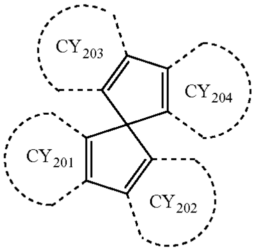

CY208

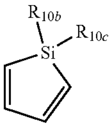

CY209

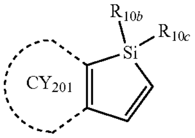

CY210

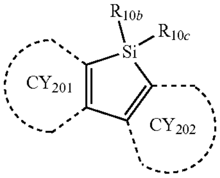

CY211

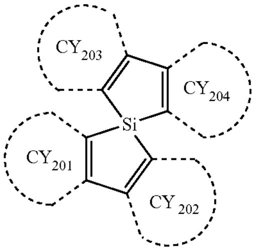

CY212

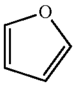

-continued

CY213

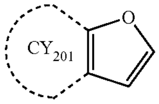

CY214

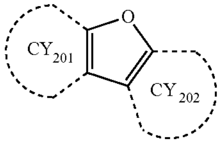

CY215

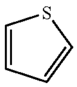

CY216

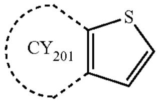

CY217

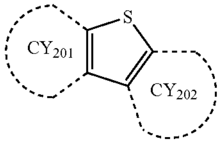

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, in Formulae CY201 to CY217, ring $CY_{201}$ to ring $CY_{204}$ may each independently be a benzene group, a naphthalene group, a phenanthrene group, or an anthracene group.

In embodiments, Formulae 201 and 202 may each include at least one of groups represented by Formulae CY201 to CY203.

In embodiments, a compound represented by Formula 201 may include at least one of groups represented by Formulae CY201 to CY203 and at least one of groups represented by Formulae CY204 to CY217.

In embodiments, in Formula 201, xa1 may be 1, $R_{201}$ may be one of groups represented by Formulae CY201 to CY203, xa2 may be 0, and $R_{202}$ may be one of groups represented by Formulae CY204 to CY207.

In embodiments, Formulae 201 and 202 may each not include groups represented by Formulae CY201 to CY203.

In embodiments, Formulae 201 and 202 may each not include groups represented by Formulae CY201 to CY203, and may each include at least one of groups represented by Formulae CY204 to CY217.

In embodiments, Formulae 201 and 202 may each not include groups represented by Formulae CY201 to CY217.

In embodiments, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

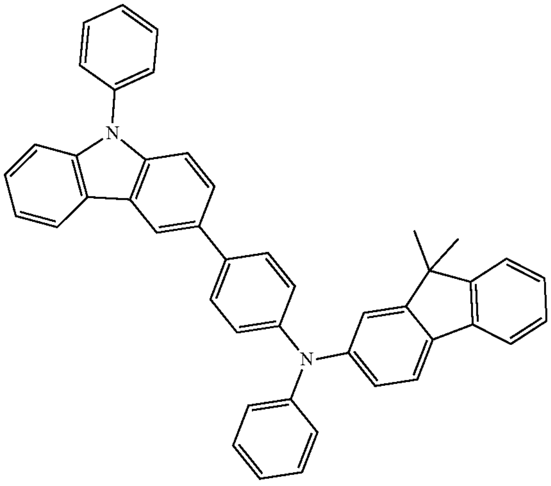

HT2

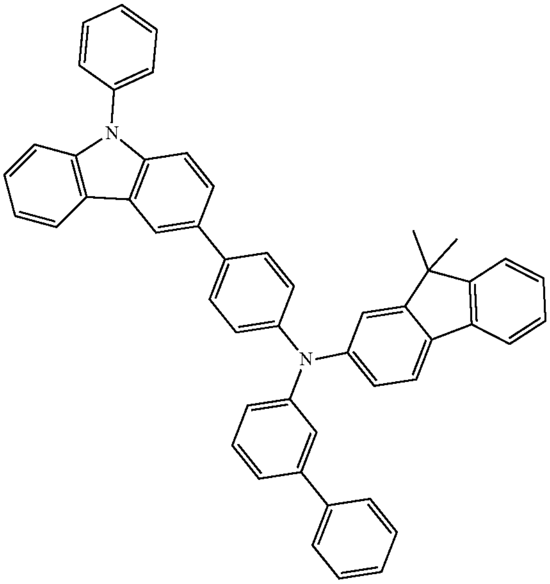

-continued
HT3
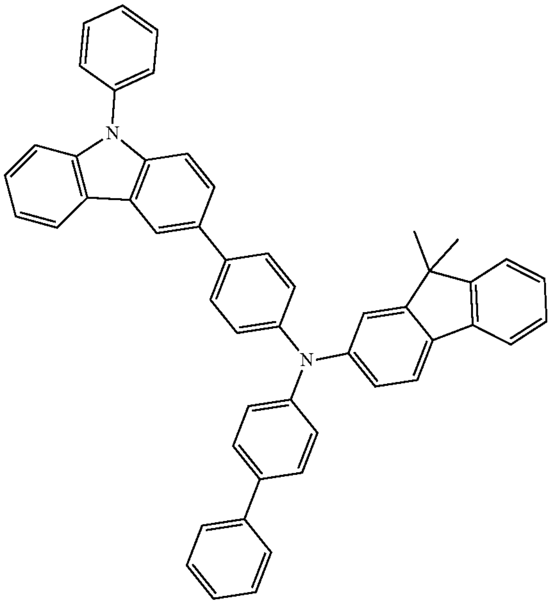
HT4
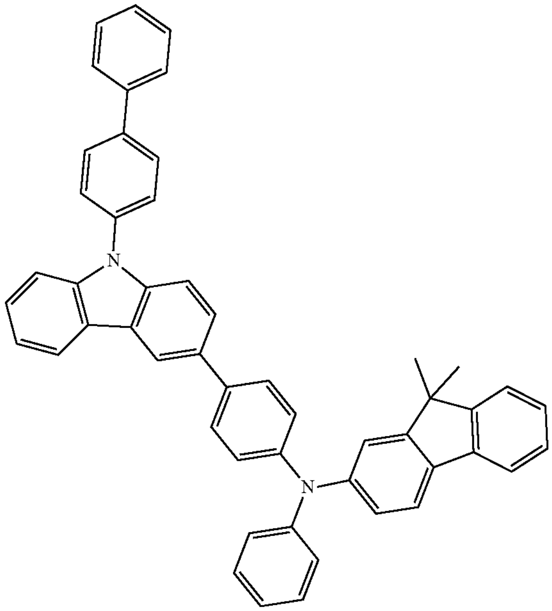
HT5
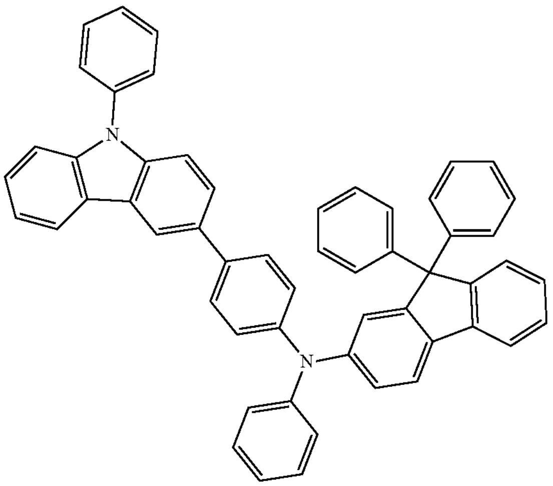
HT6
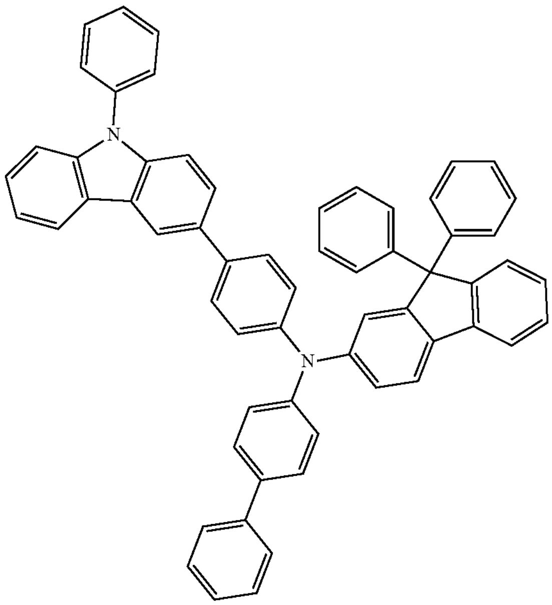

-continued
HT7
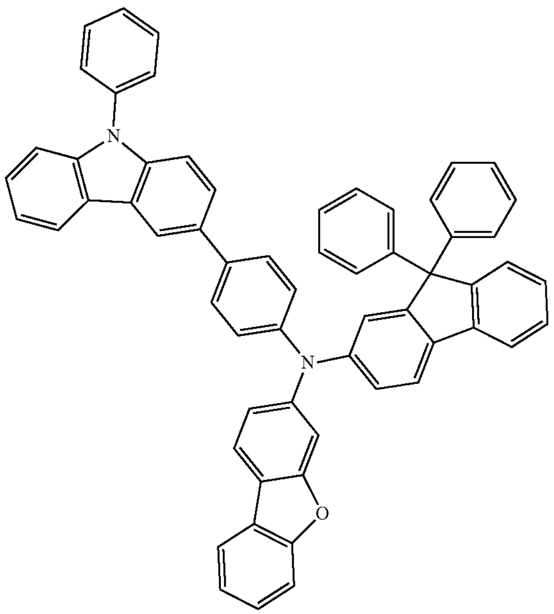
HT8
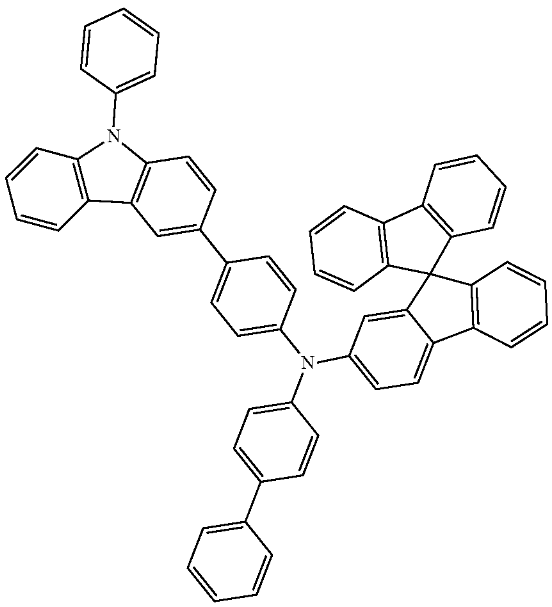
HT9
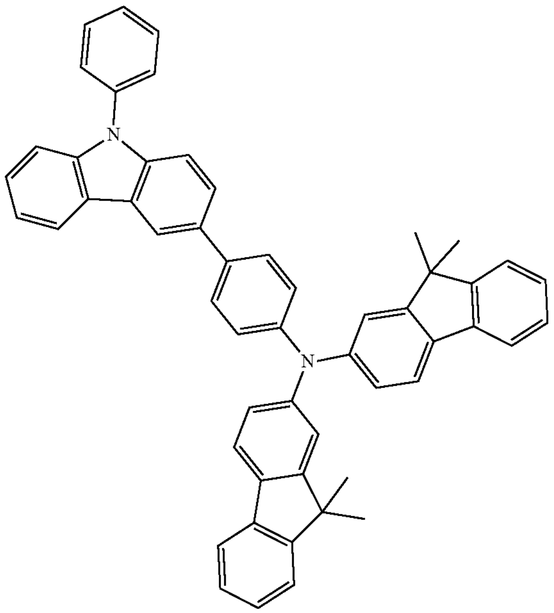
HT10
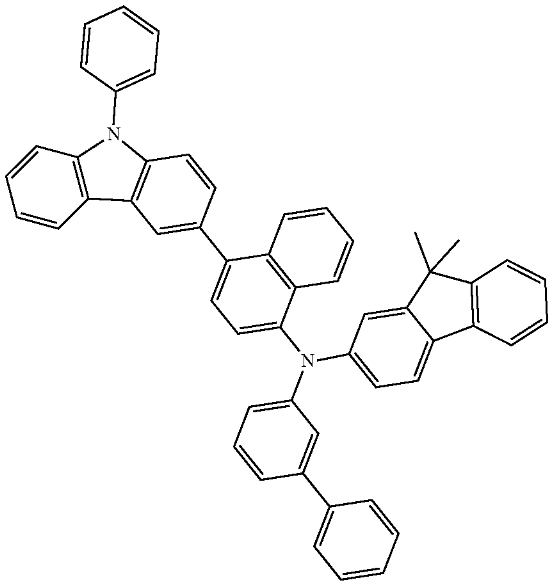

-continued
HT11
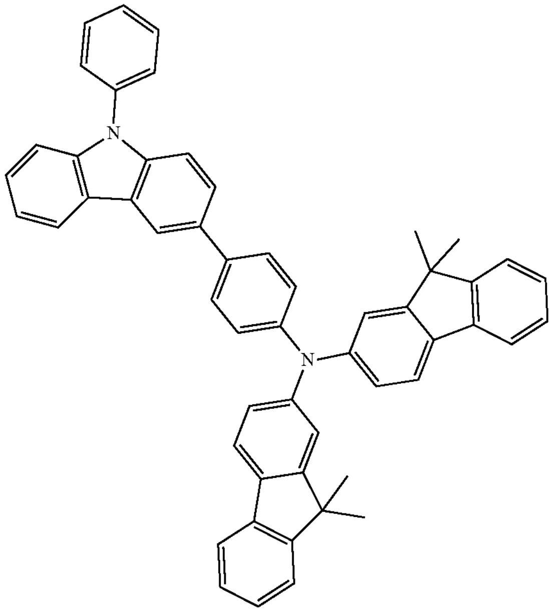
HT12
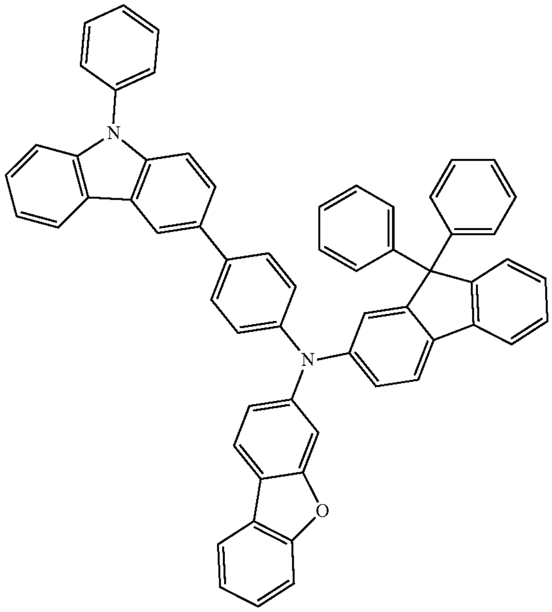
HT13
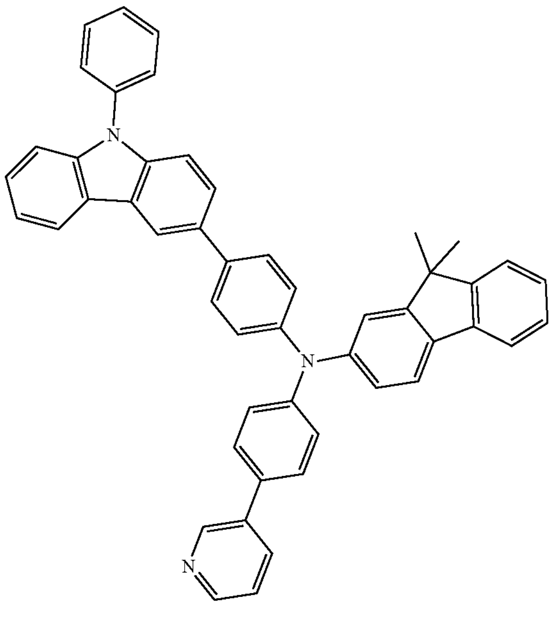
HT14
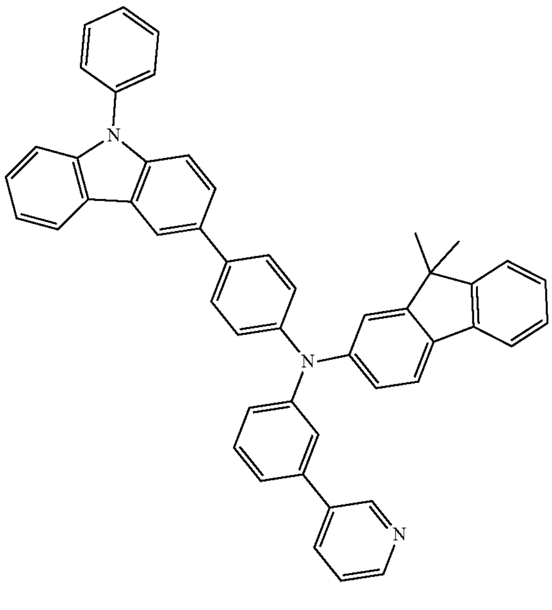

-continued
HT15
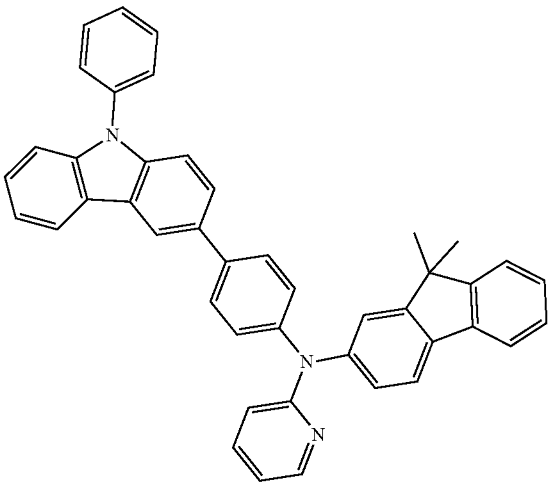
HT16
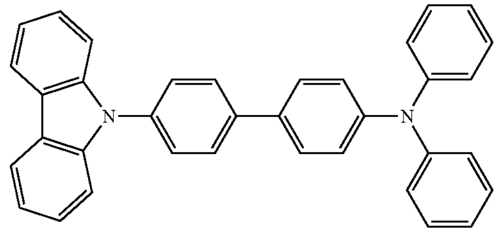
HT17
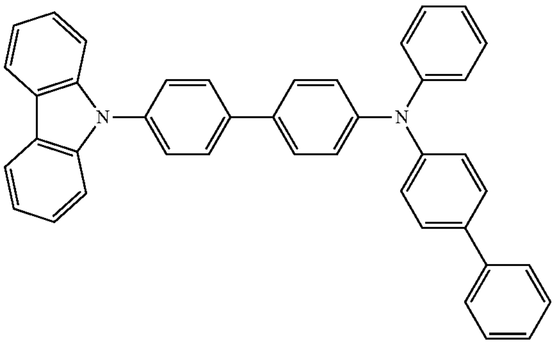
HT18
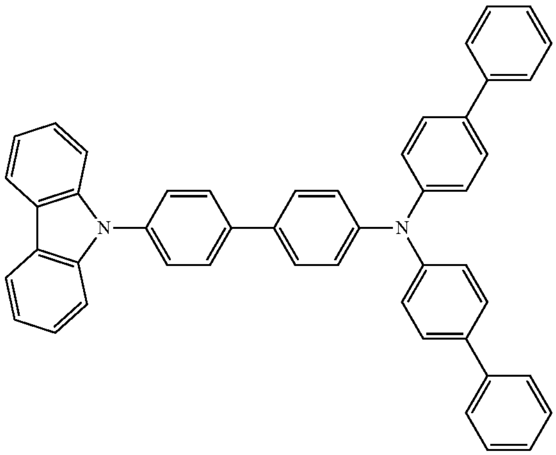
HT19
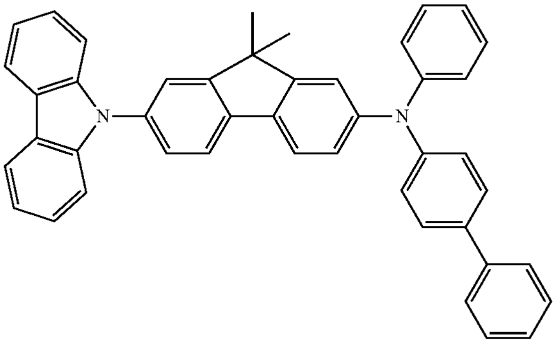
HT20
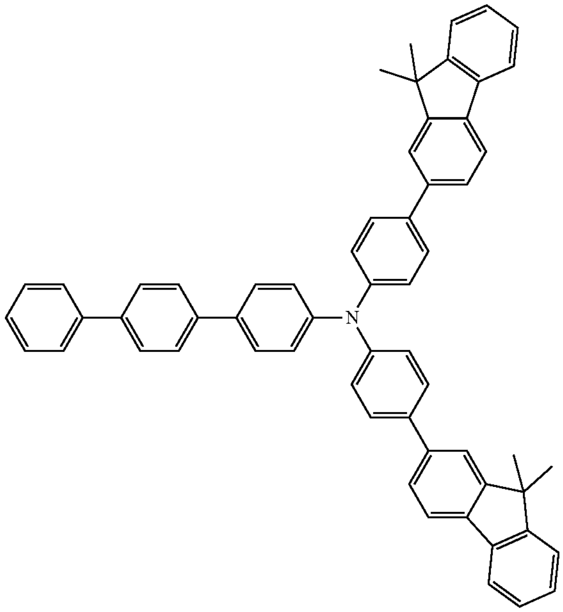

-continued
HT21
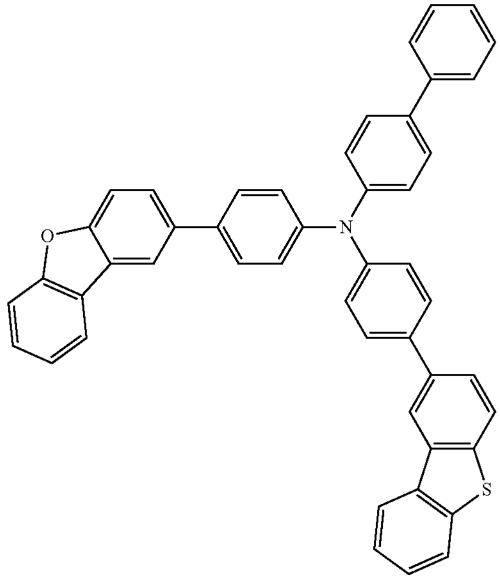
HT22
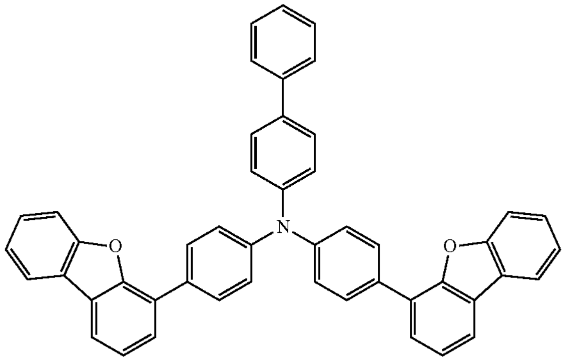
HT23
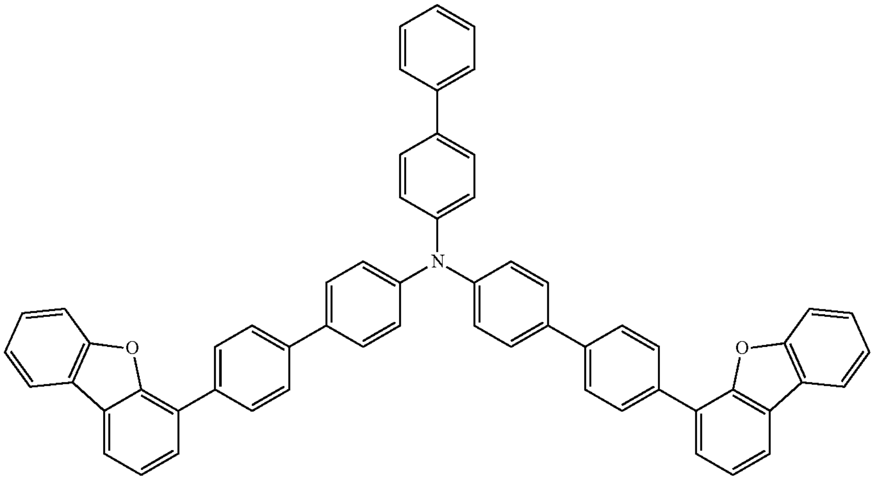
HT24
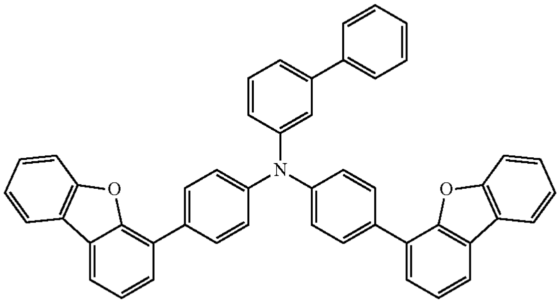
HT25
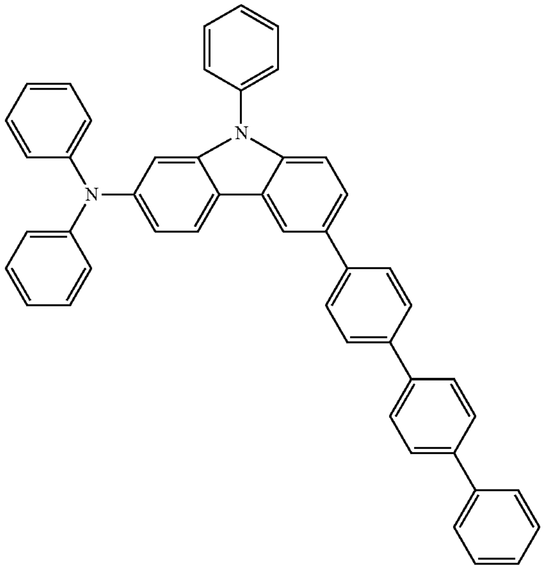

-continued
HT26
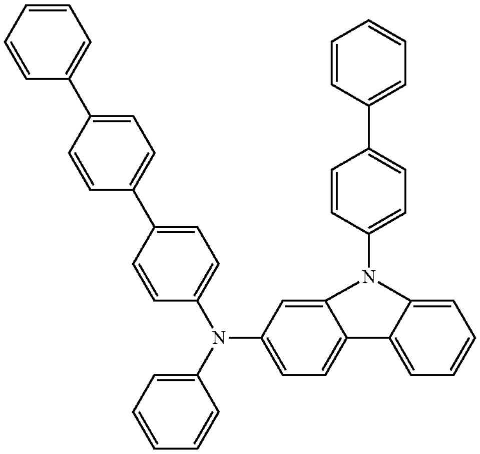
HT27
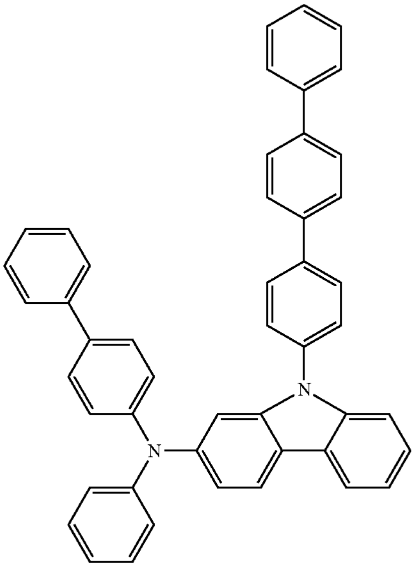
HT28
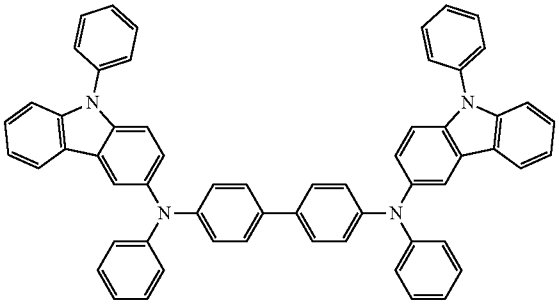
HT29
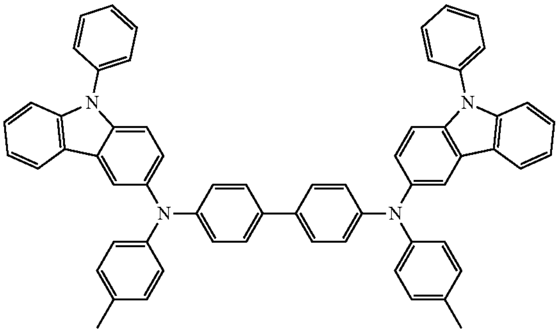
HT30
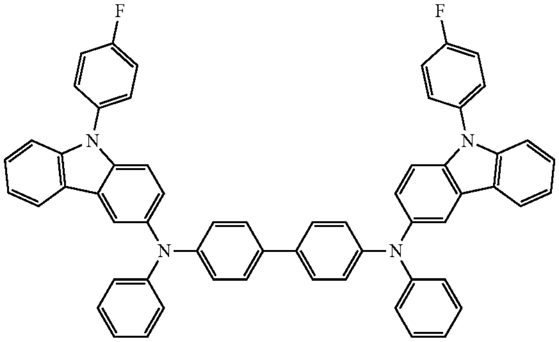
HT31
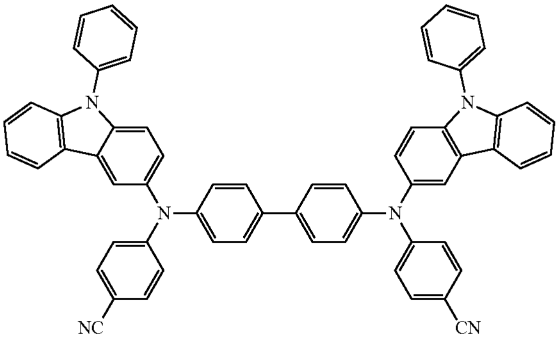

-continued
HT32
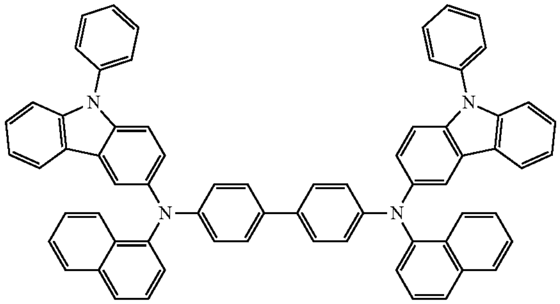
HT33
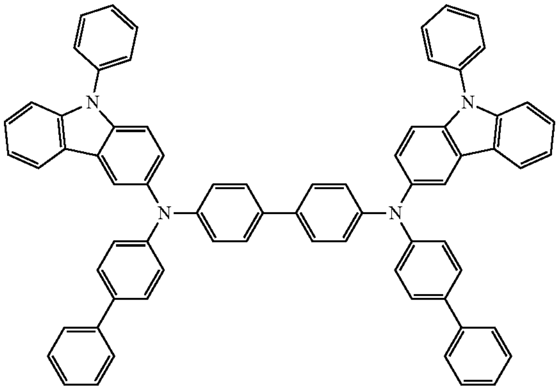
HT34
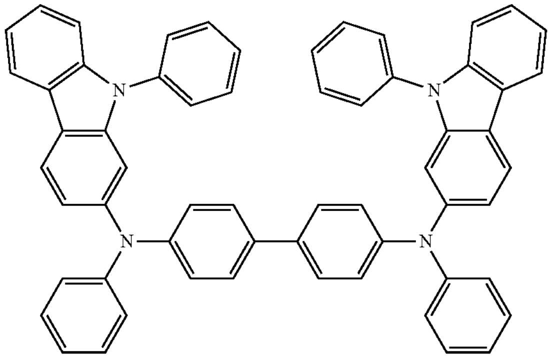
HT35
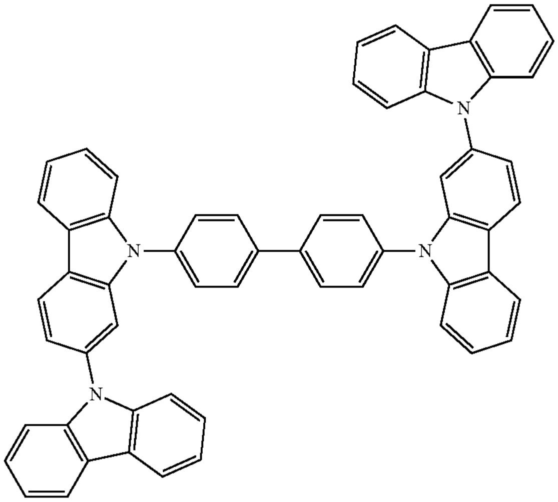
HT36
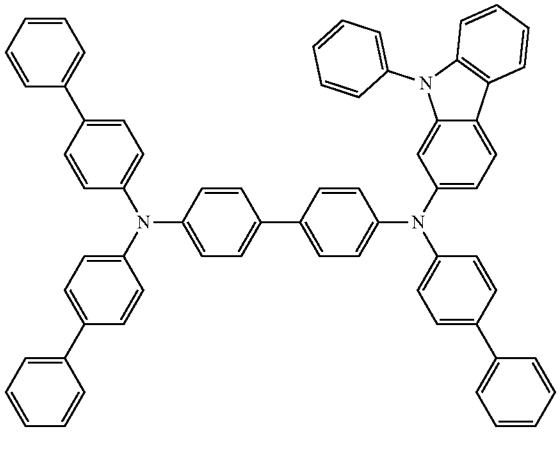
HT37
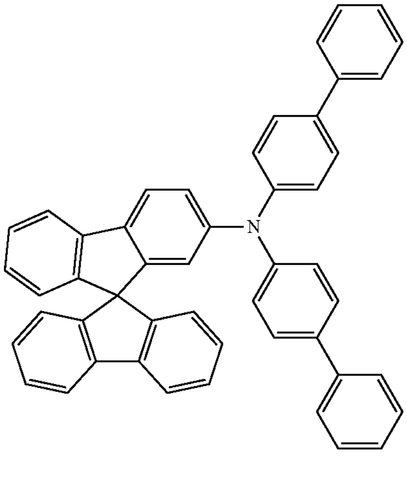

-continued
HT38
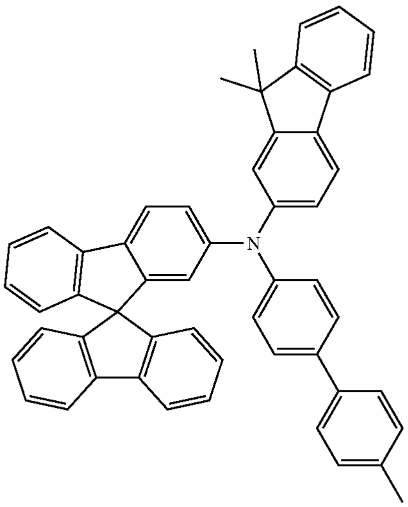
HT39
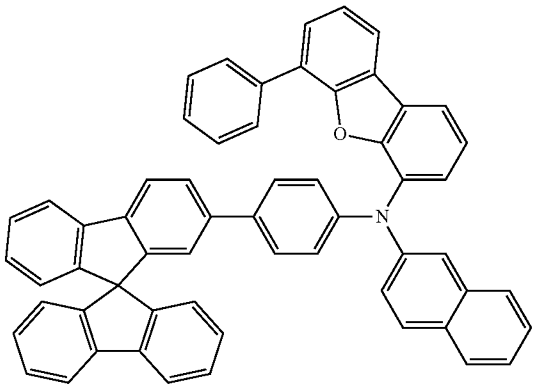
HT40
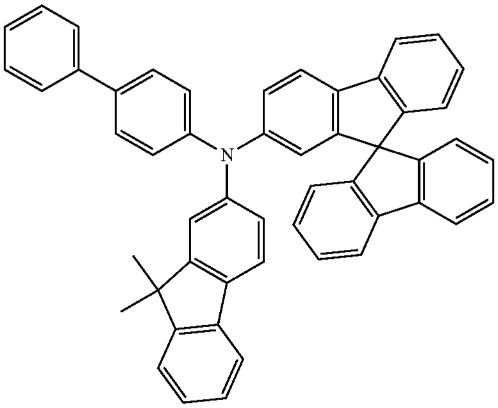
HT41
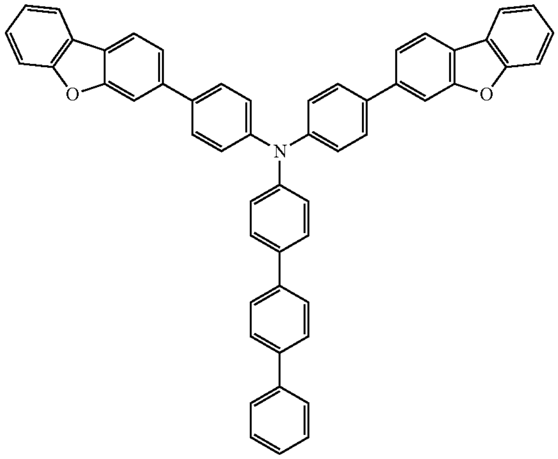
HT42
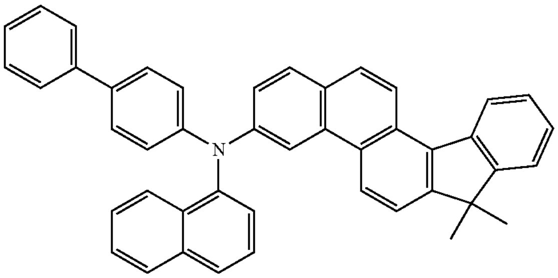
HT43
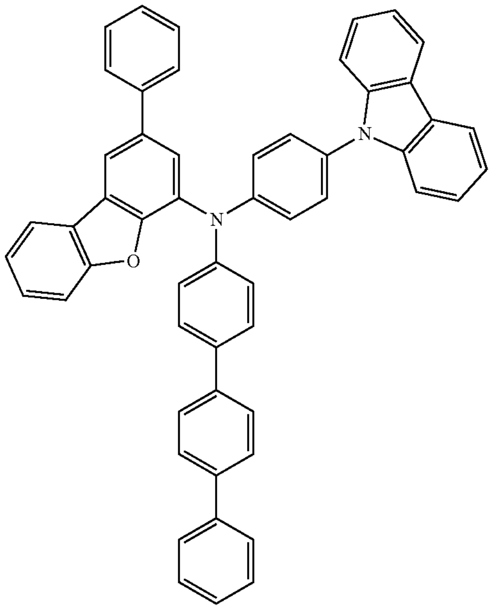

-continued
HT44
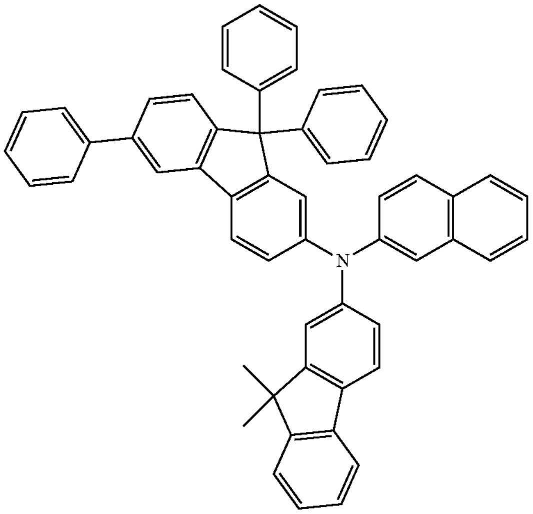
HT45
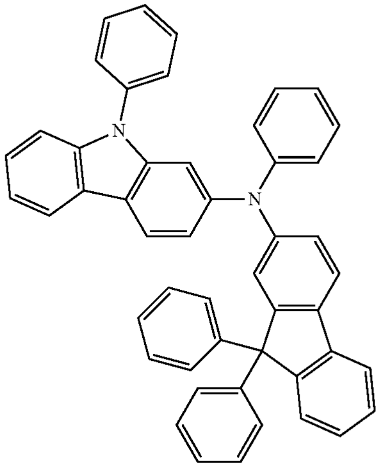
HT46
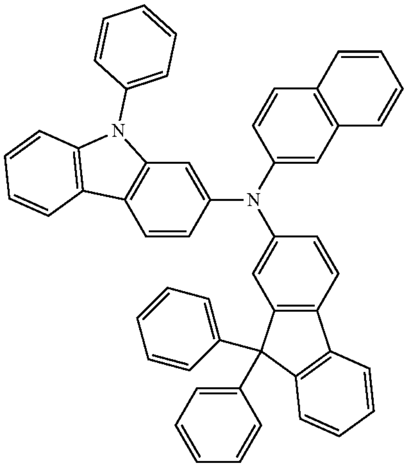
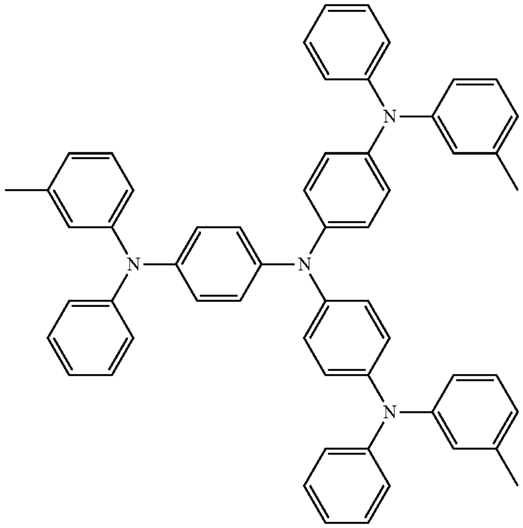
m-MTDATA
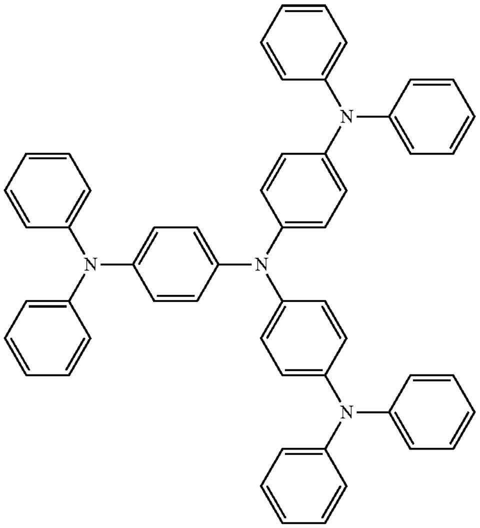
TDATA
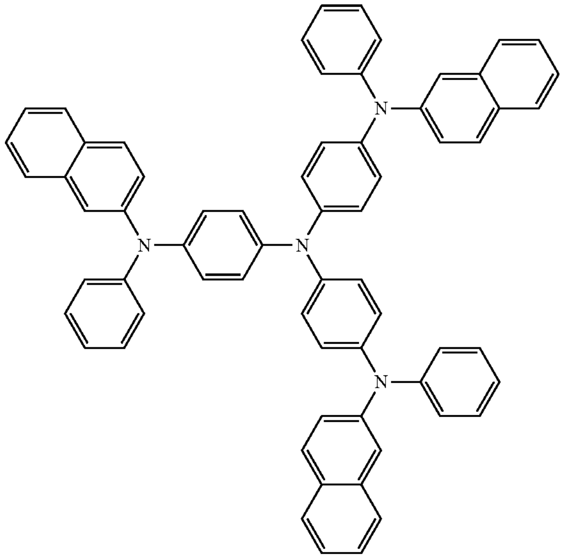
2-TNATA -continued

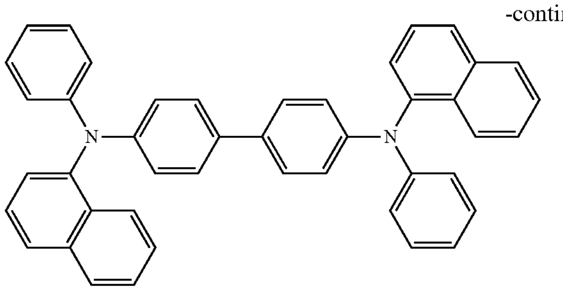

NPB

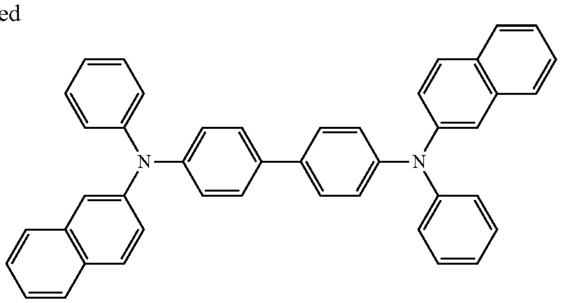

β-NPB

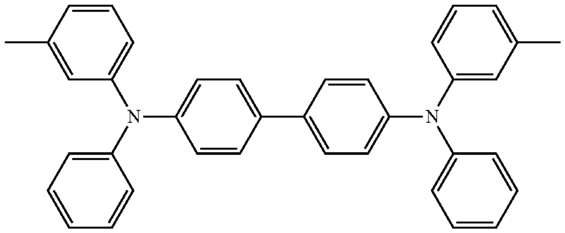

TPD

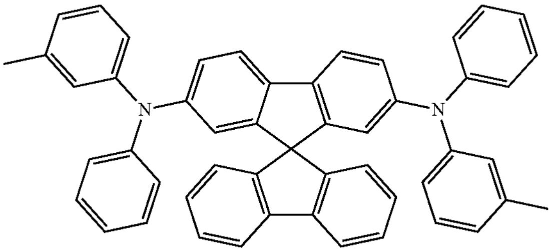

Spiro-TPD

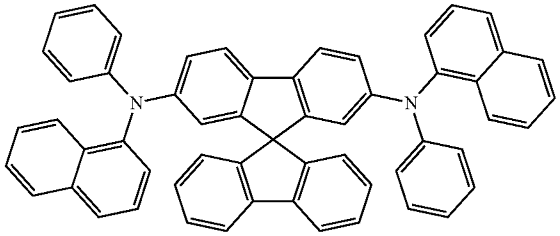

Spiro-NPB

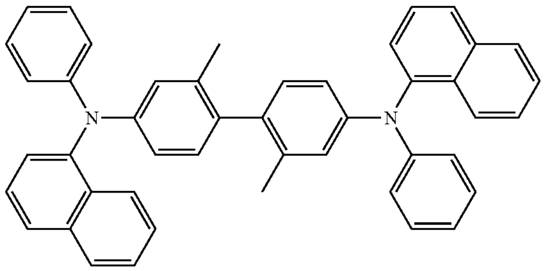

methylated-NPB

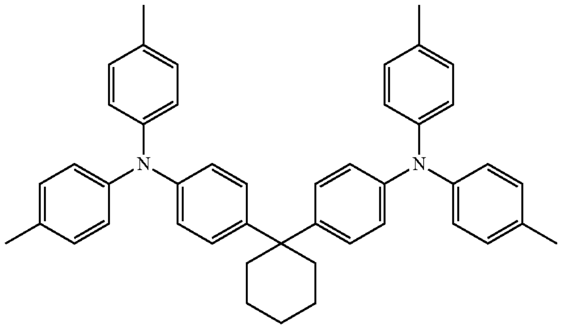

TAPC

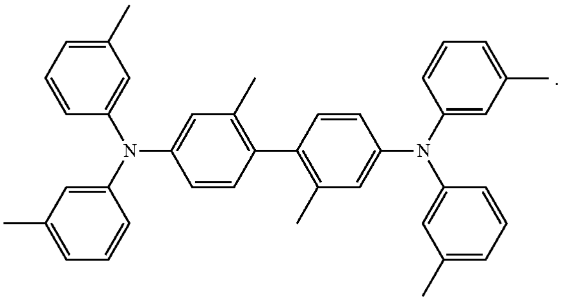

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted by the emission layer, and the electron blocking layer may block the leakage of electrons from the emission layer to the hole transport region. Materials that may be included in the hole transport region may be included in the auxiliary layer and the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In embodiments, the p-dopant may have a lowest unoccupied molecular orbital (LUMO) energy level equal to or less than about −3.5 eV.

In an embodiment, the p-dopant may include a quinone derivative, a cyano group-containing compound, a compound including element EL1 and element EL2, or any combination thereof.

Examples of the quinone derivative may include TCNQ, F4-TCNQ, and the like.

Examples of the cyano group-containing compound may include HAT-CN, a compound represented by Formula 221, and the like:

[Formula 221]

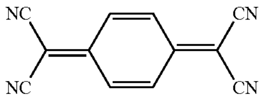

TCNQ

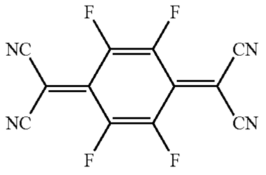

F4-TCNQ

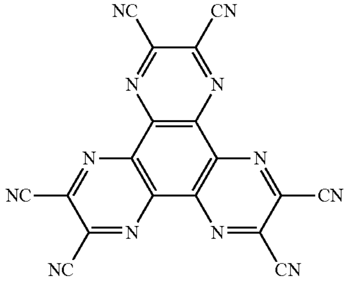

HAT-CN

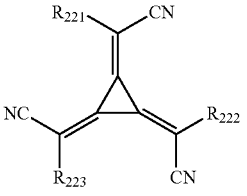

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non metal, a metalloid, or any combination thereof.

Examples of the metal may include: an alkali metal (for example, lithium ($L_1$), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.); and the like.

Examples of the metalloid may include silicon (Si), antimony (Sb), tellurium (Te), and the like.

Examples of the non-metal may include oxygen (O), a halogen (for example, F, Cl, Br, I, etc.), and the like.

Examples of the compound including element EL1 and element EL2 may include a metal oxide, a metal halide (for example, a metal fluoride, a metal chloride, a metal bromide, a metal iodide, etc.), a metalloid halide (for example, a metalloid fluoride, a metalloid chloride, a metalloid bromide, a metalloid iodide, etc.), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), rhenium oxide (for example, $ReO_3$, etc.), and the like.

Examples of the metal halide may include an alkali metal halide, an alkaline earth metal halide, a transition metal halide, a post-transition metal halide, a lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), a gold halide (for example, AuF, AuCl, AuBr, AuI, etc.), and the like.

Examples of the post-transition metal halide may include a zinc halide (for example, $ZnF_2$, $ZnCl_2$, $ZnBr_2$, $ZnI_2$, etc.), an indium halide (for example, $InI_3$, etc.), a tin halide (for example, $SnI_2$, etc.), and the like.

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, $SmI_3$, and the like.

Examples of the metalloid halide may include an antimony halide (for example, $SbCl_5$, etc.) and the like.

Examples of the metal telluride may include an alkali metal telluride (for example, $Li_2Te$, a $na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), a lanthanide metal telluride (for example, LaTe, CeTe, PrTe, NdTe, PmTe, EuTe, GdTe, TbTe, DyTe, HoTe, ErTe, TmTe, YbTe, LuTe, etc.), and the like.

[Emission Layer in Interlayer 130]

When the light-emitting device 10 is a full-color light-emitting device, the emission layer may be patterned into a red emission layer, a green emission layer, and/or a blue emission layer, according to a subpixel. In an embodiment, the emission layer may have a stacked structure of two or more layers of a red emission layer, a green emission layer, and a blue emission layer, in which the two or more layers may contact each other or may be separated from each other to emit white light. In embodiments, the emission layer may include two or more materials of a red light-emitting material, a green light-emitting material, and a blue light-emitting material, in which the two or more materials may be mixed with each other in a single layer to emit white light.

The emission layer may include a host and a dopant. The dopant may include a phosphorescent dopant, a fluorescent dopant, or any combination thereof.

In the emission layer, an amount of the dopant may be in a range of about 0.01 parts by weight to about 15 parts by weight, based on 100 parts by weight of the host.

In embodiments, the emission layer may include a quantum dot.

In embodiments, the emission layer may include a delayed fluorescence material. The delayed fluorescence material may serve as a host or a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within these ranges, excellent luminescence characteristics may be obtained without a substantial increase in driving voltage.

[Host]

The host may include at least one of the second compound to the fourth compound.

The host may further include a compound represented by Formula 301:

$$[Ar_{301}]_{xb11}\text{-}[(L_{301})_{xb1}\text{-}R_{301}]_{xb21} \qquad \text{[Formula 301]}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be an integer from 1 to 5, and $Q_{301}$ to $Q_{303}$ may each independently be the same as described in connection with $Q_1$.

In an embodiment, in Formula 301, when xb11 is 2 or more, two or more of $Ar_{301}$ may be bonded to each other via a single bond.

In embodiments, the host may include a compound represented by Formula 301-1, a compound represented by Formula 301-2, or any combination thereof:

[Formula 301-1]

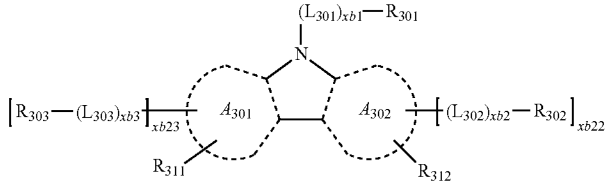

[Formula 301-2]

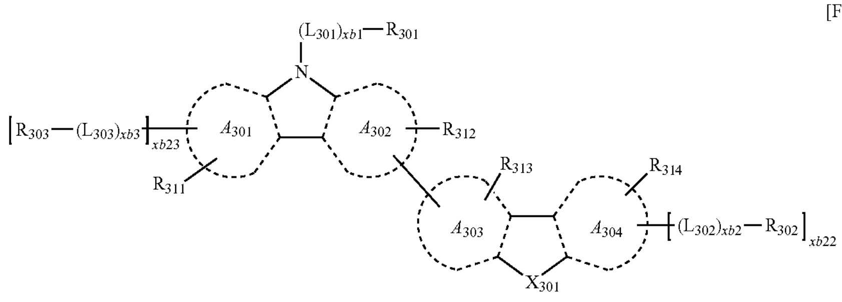

In Formulae 301-1 and 301-2, rings $A_{301}$ to $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ may each be the same as described herein, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each independently be the same as described in connection with $R_{301}$.

In embodiments, the host may include an alkali earth metal complex, a post-transition metal complex, or any combination thereof. For example, the host may include a Be complex (for example, Compound H55), an Mg complex, a Zn complex, or any combination thereof.

In embodiments, the host may include one of Compounds H1 to H128, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof:

H1

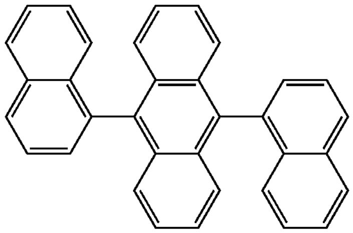

H2

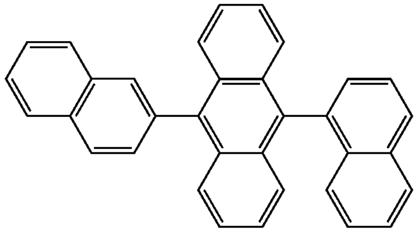

H3

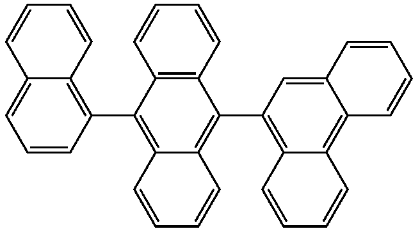

-continued

H4

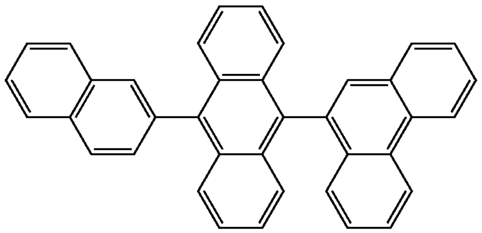

H5

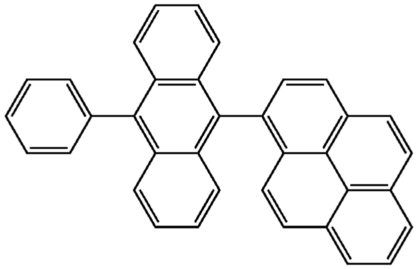

H6

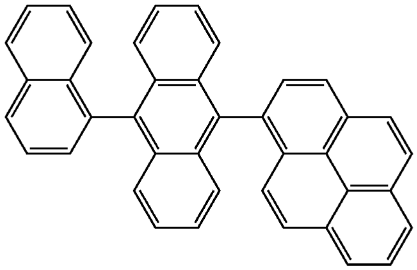

H7

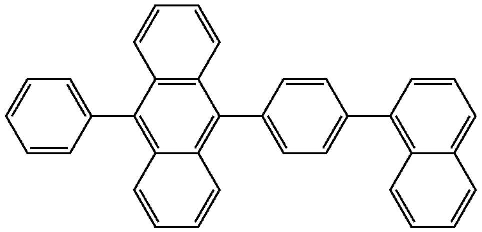

H8

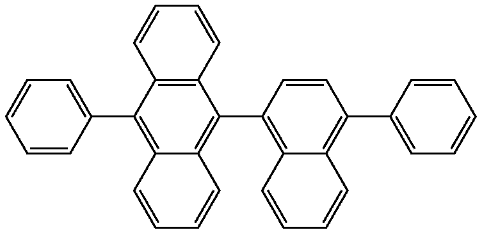

H9

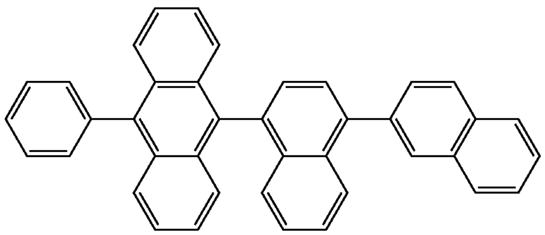

-continued
H10
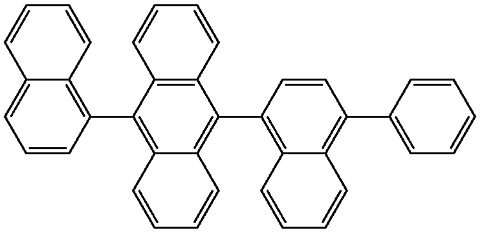
H11
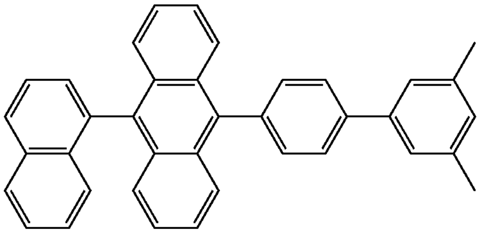
H12
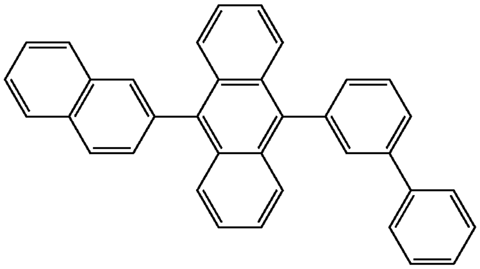
H13
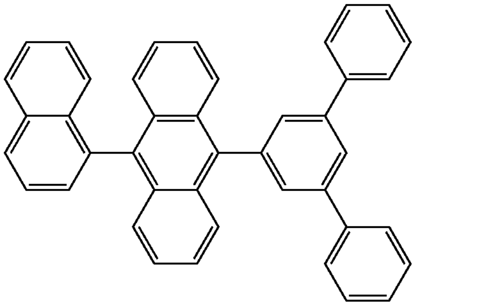
H14
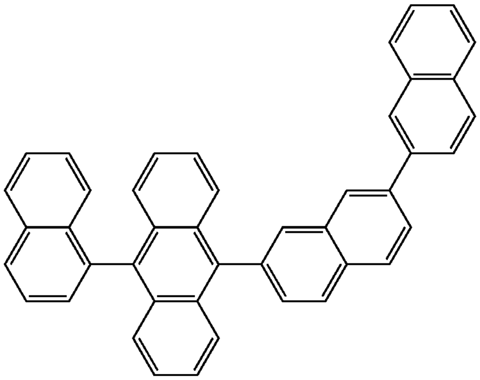
-continued
H15
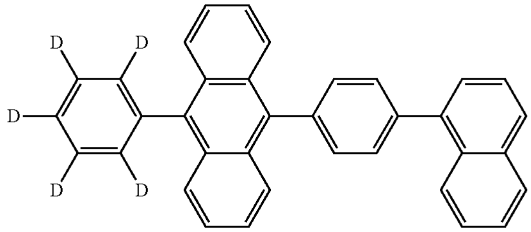
H16
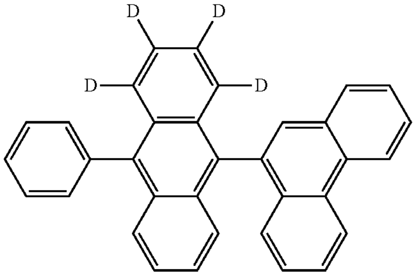
H17
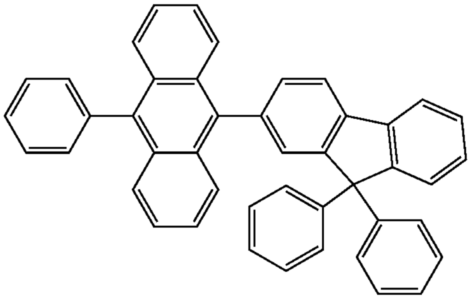
H18
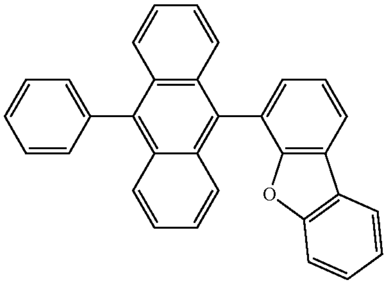
H19
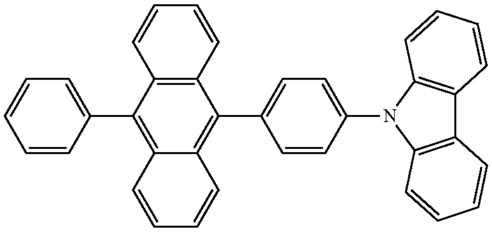
H20
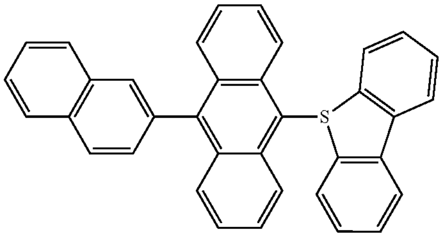

-continued
H21
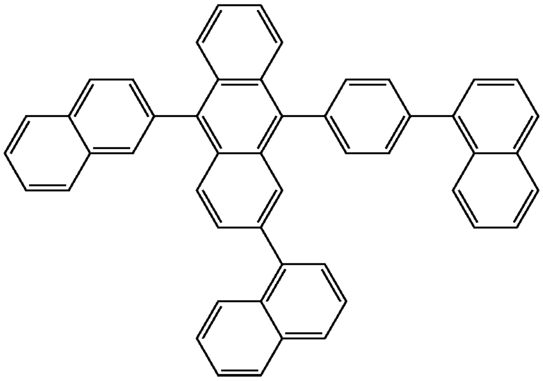
H22
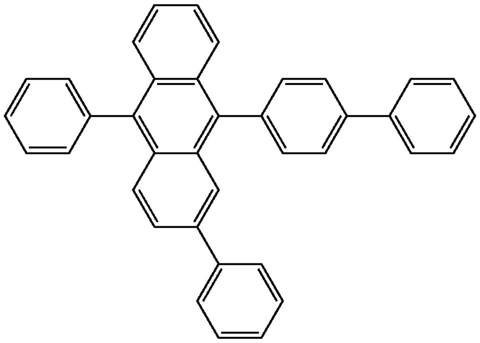
H23
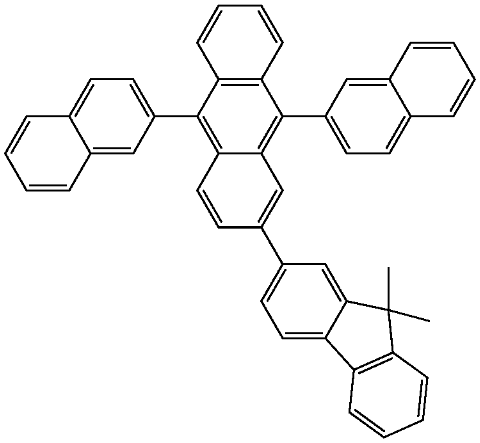
H24
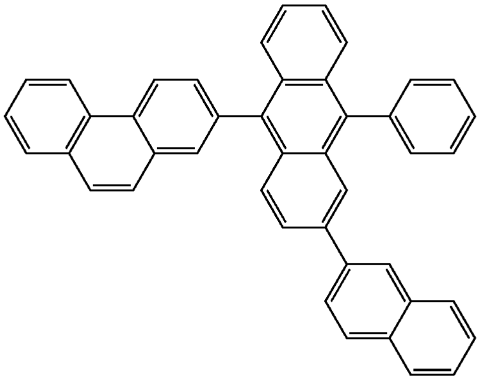
-continued
H25
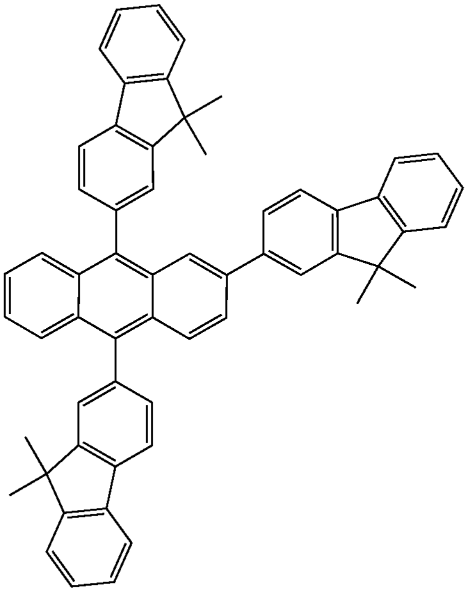
H26
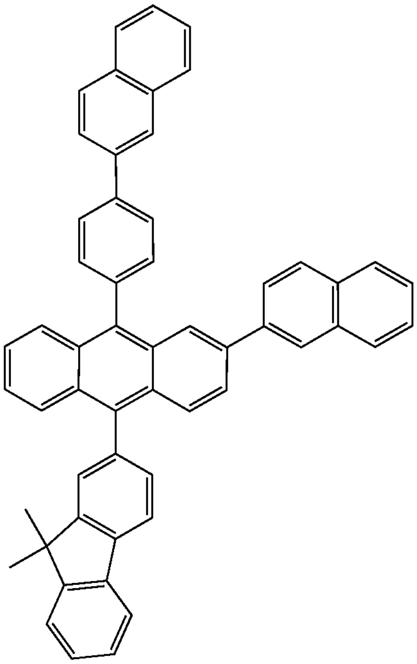

-continued
H27
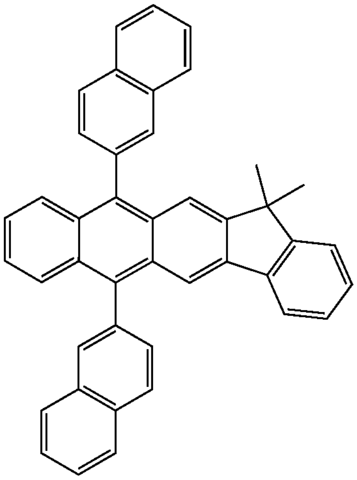
H28
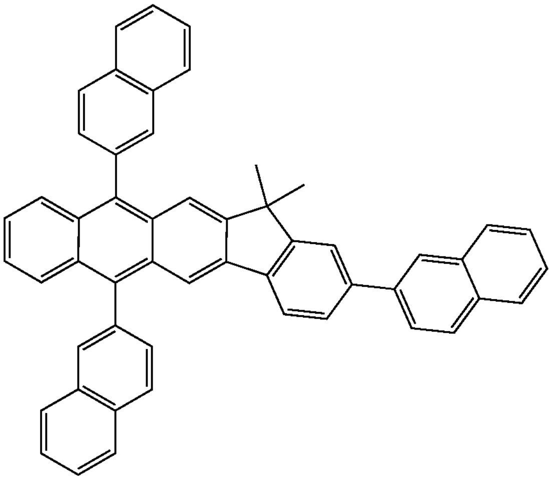
H29
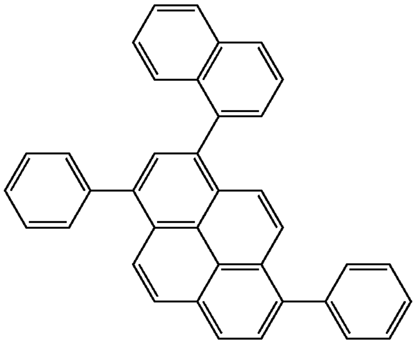
-continued
H30
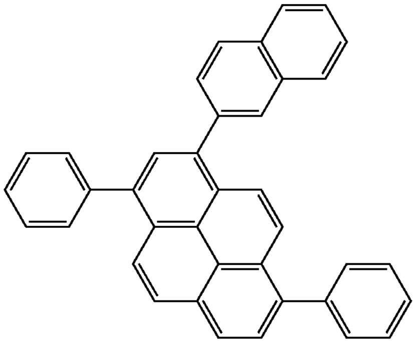
H31
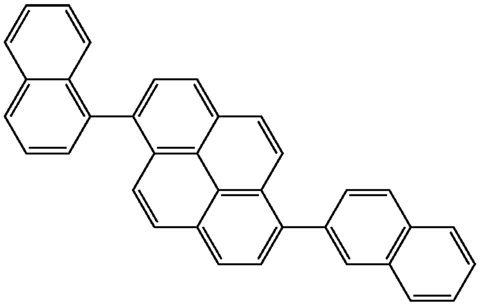
H32
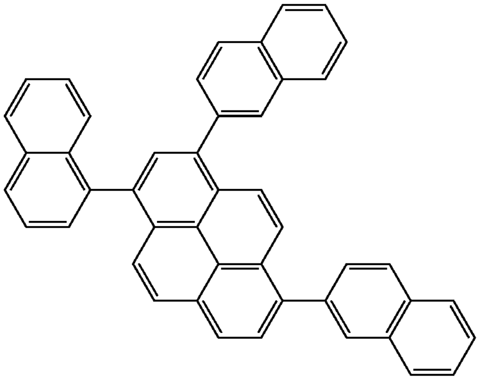
H33
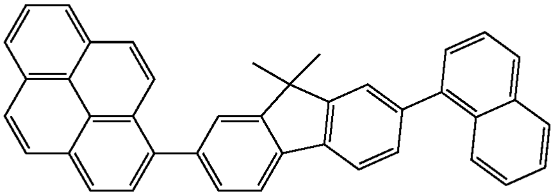
H34
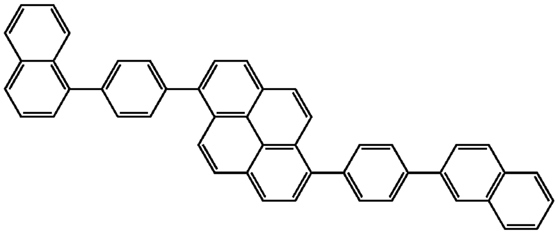

-continued
H35
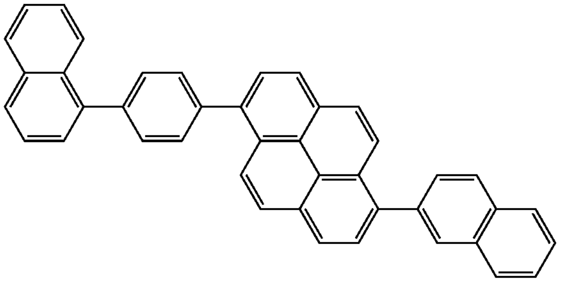
H36
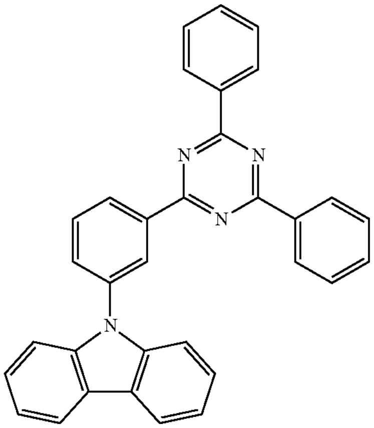
H37
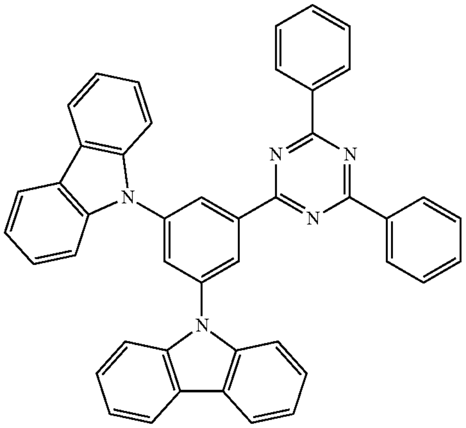
H38
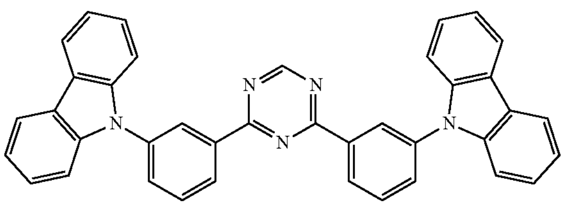
-continued
H39
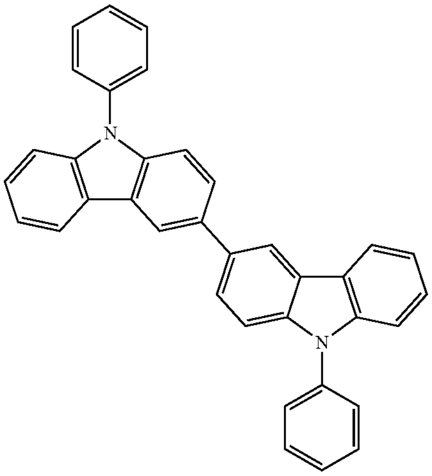
H40
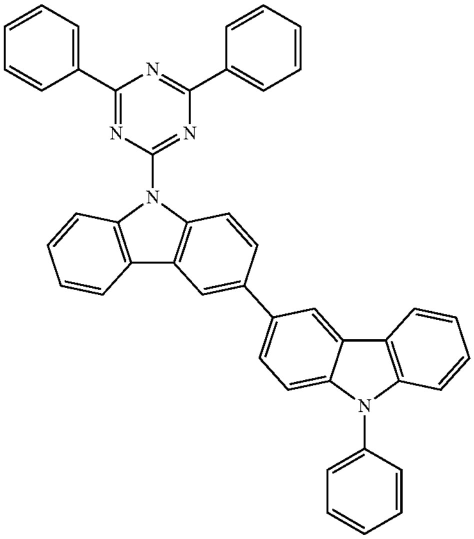
H41
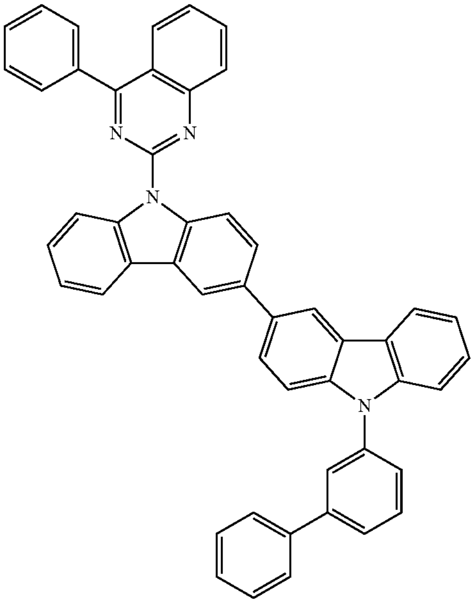

-continued
H42
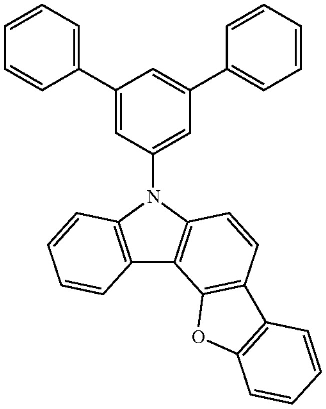
H43
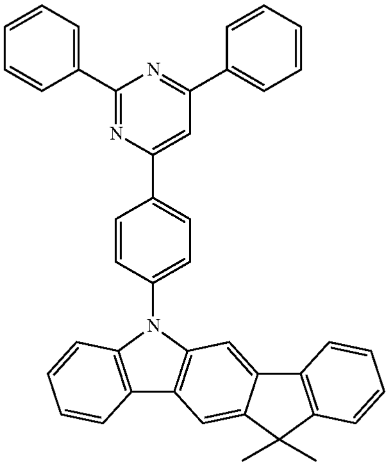
H44
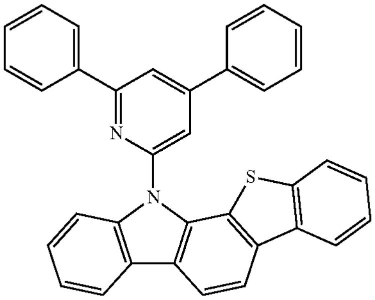
H45
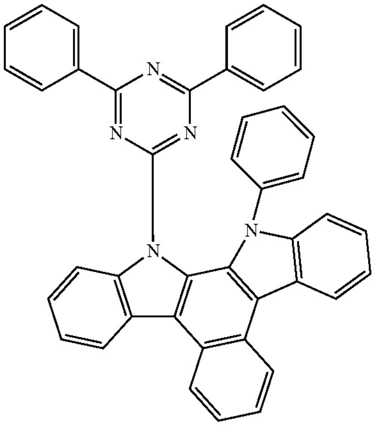
-continued
H46
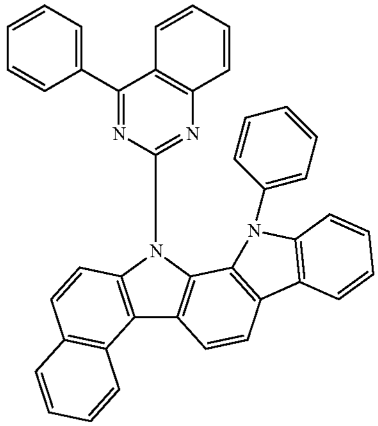
H47
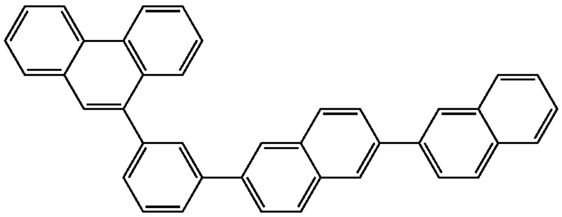
H48
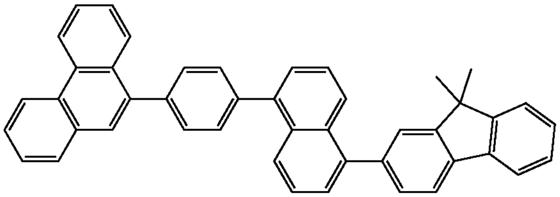
H49
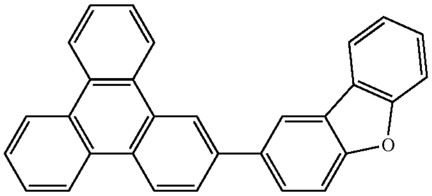
H50
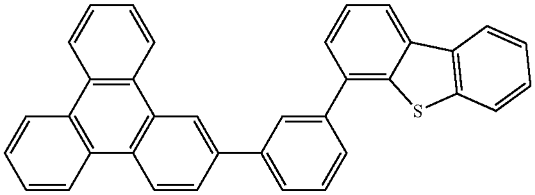
H51
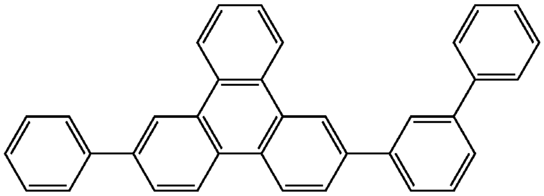

-continued
H52
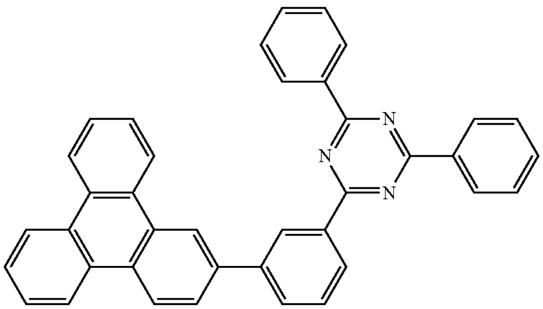
H53
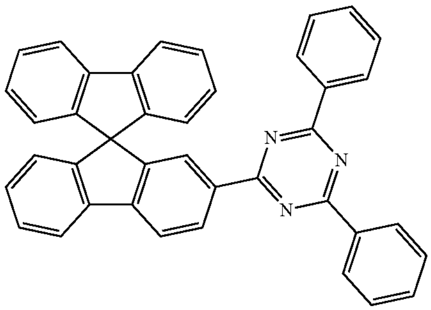
H54
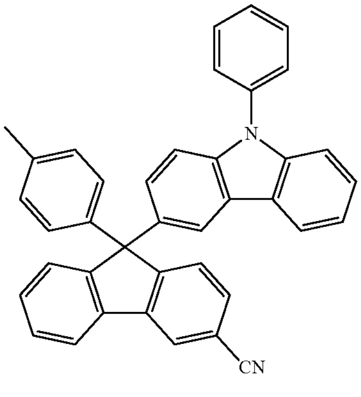
H55
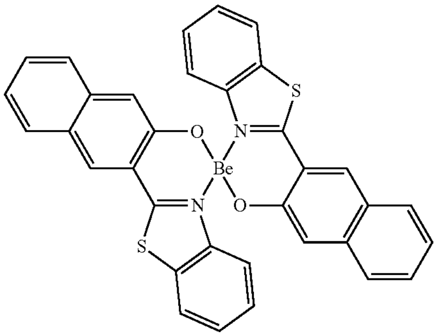
-continued
H56
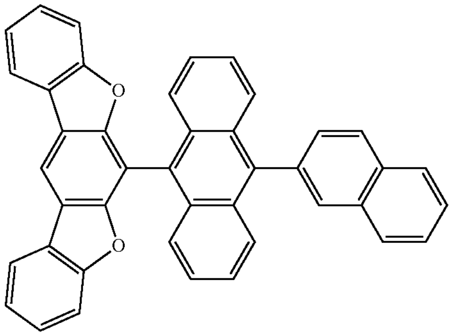
H57
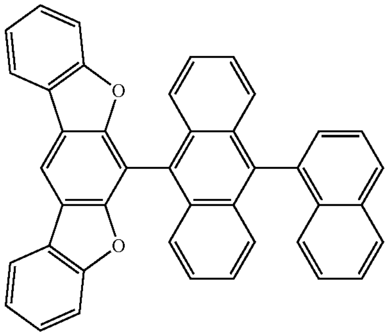
H58
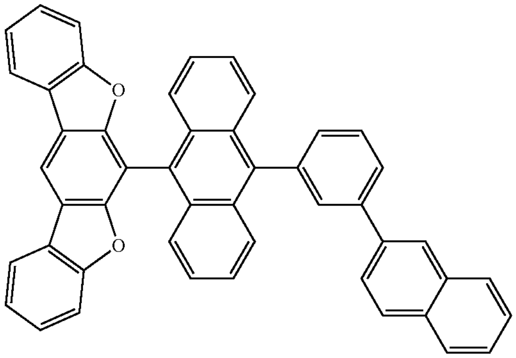
H59
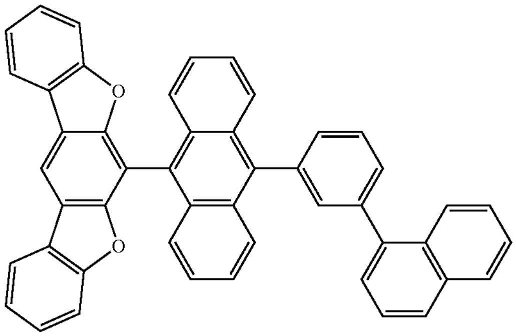

-continued
H60
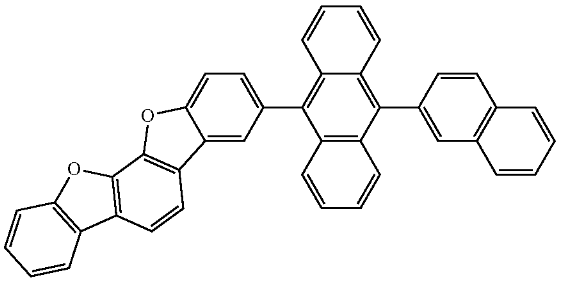
H61
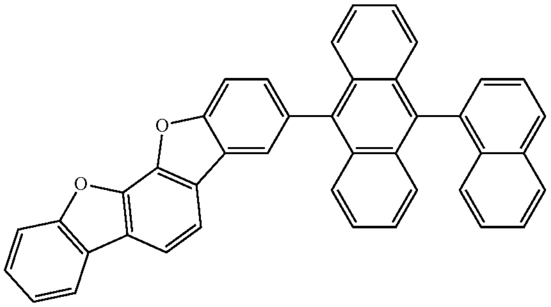
H62
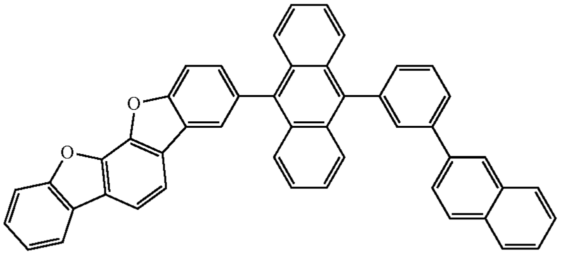
H63
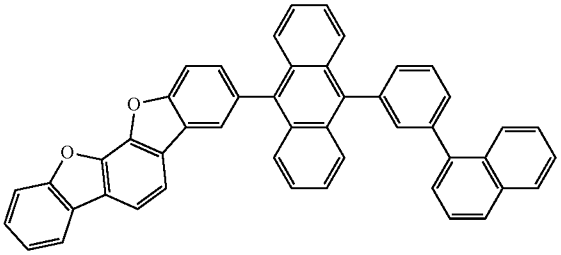
H64
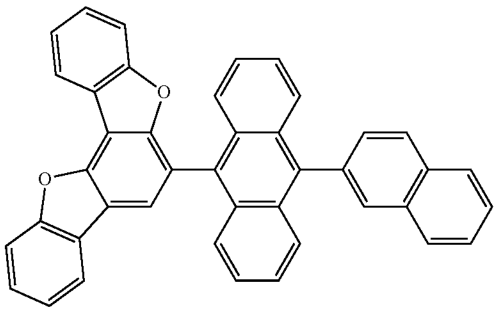
-continued
H65
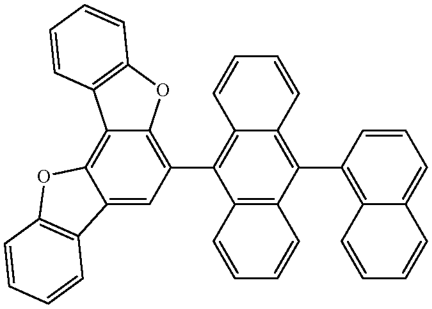
H66
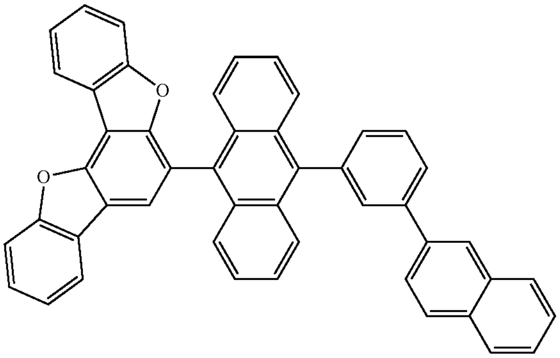
H67
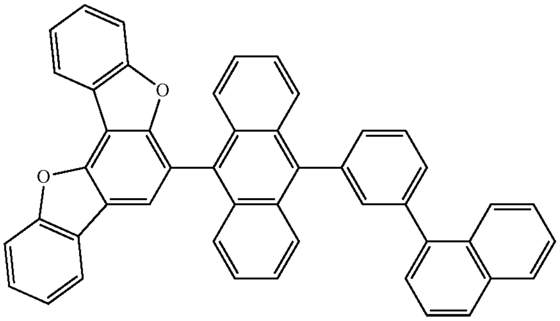
H68
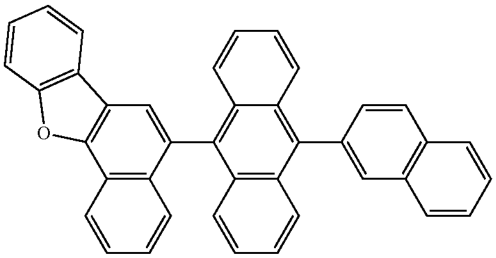
H69
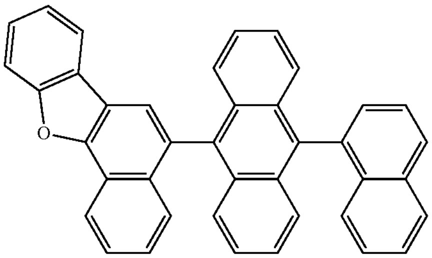

-continued
H70
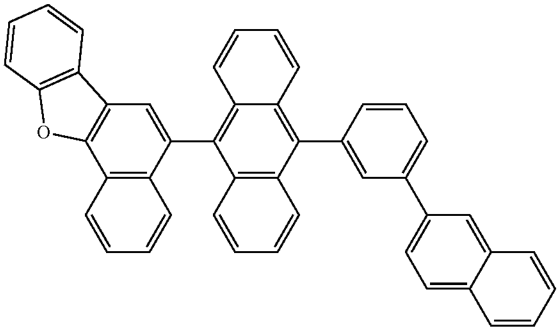
H71
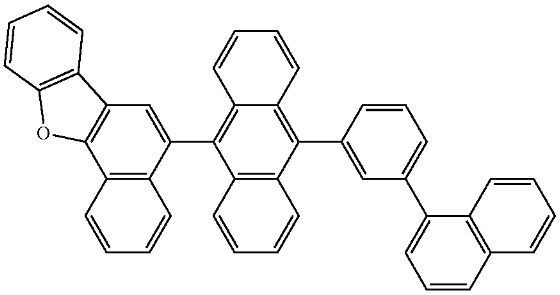
H72
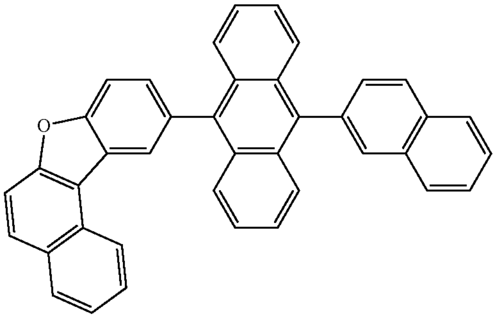
H73
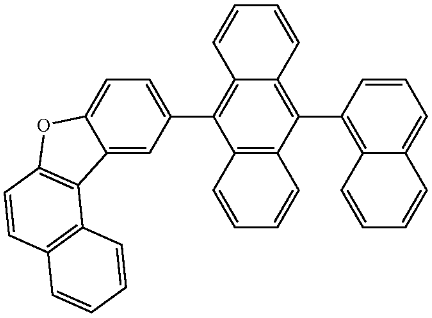
-continued
H74
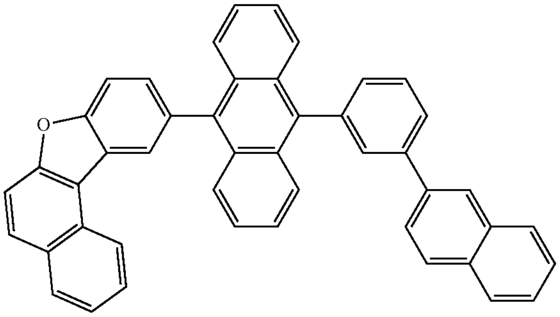
H75
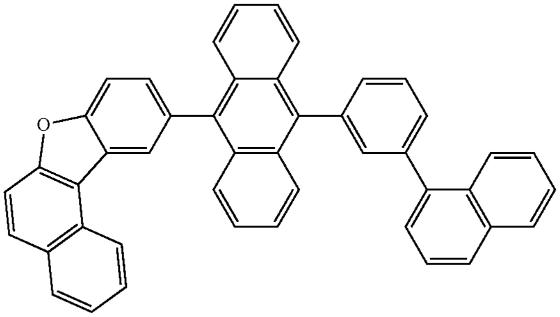
H76
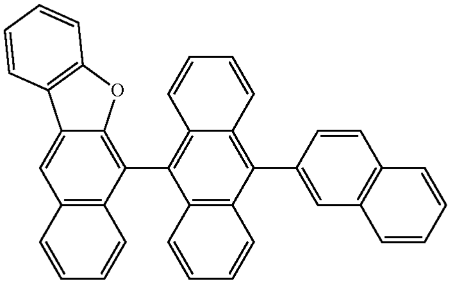
H77
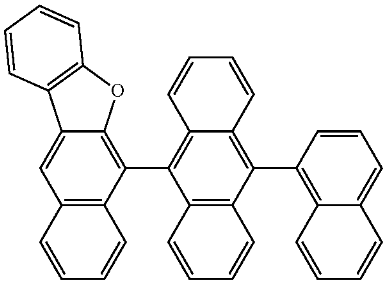
H78
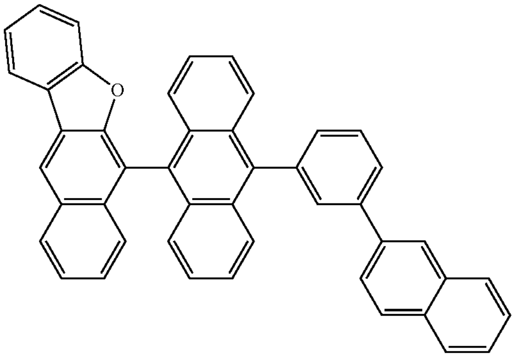

-continued
H79
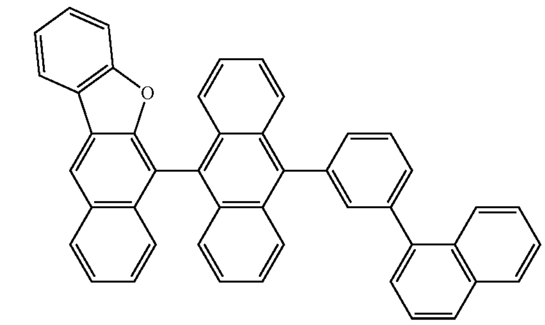
H80
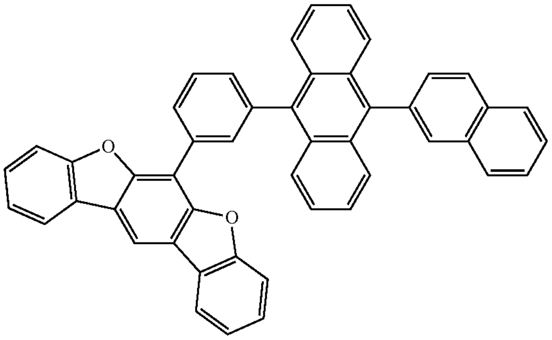
H81
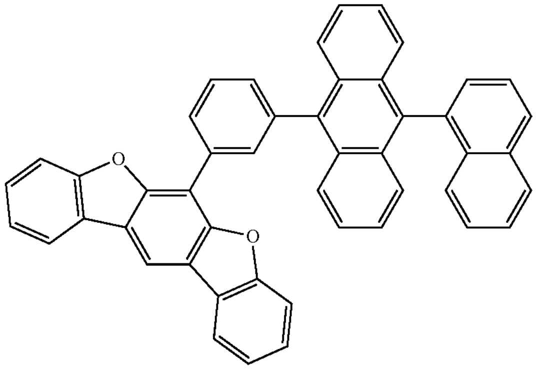
H82
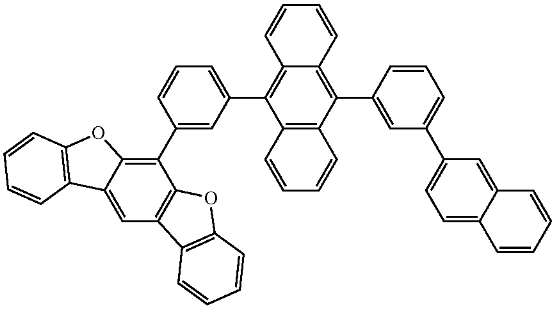
-continued
H83
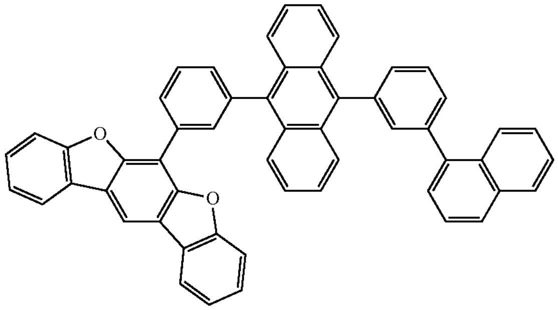
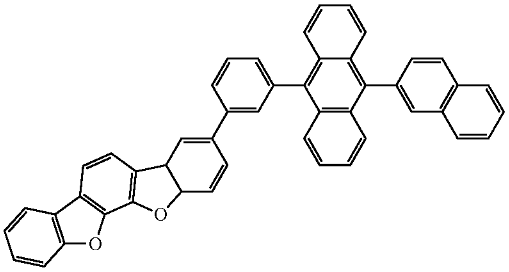
H85
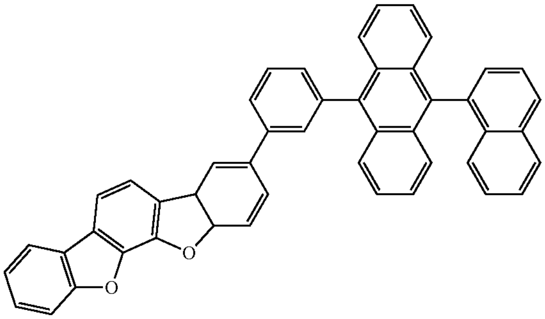
H86
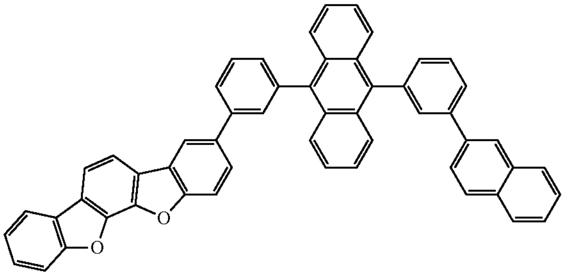
H87
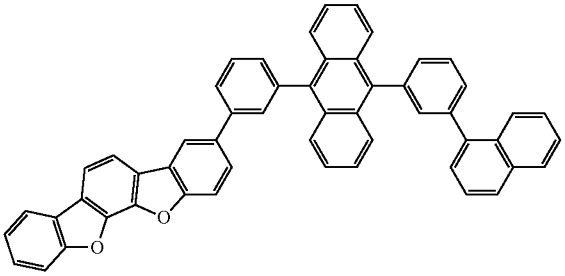

-continued
H88
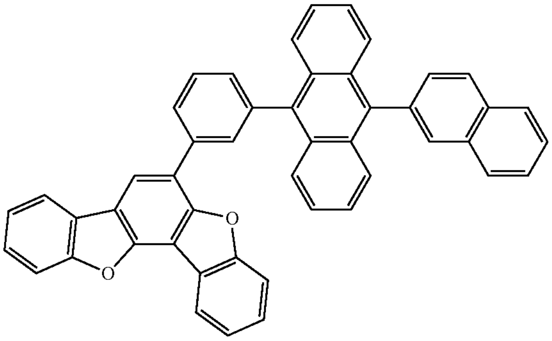
H89
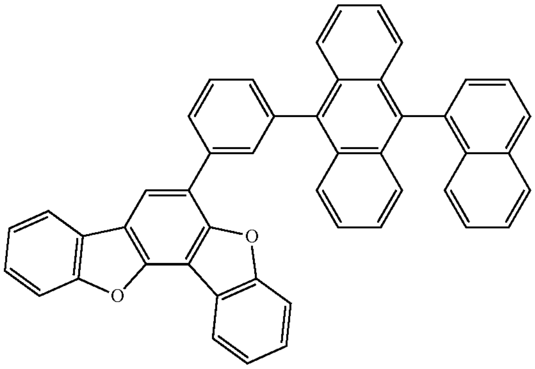
H90
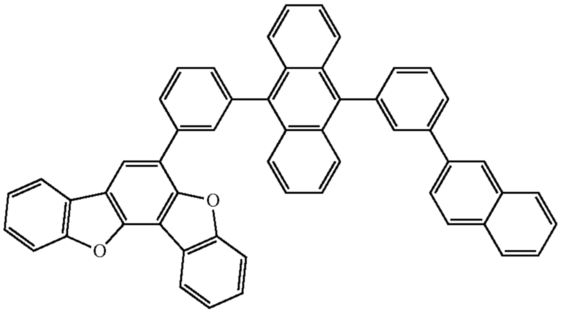
H91
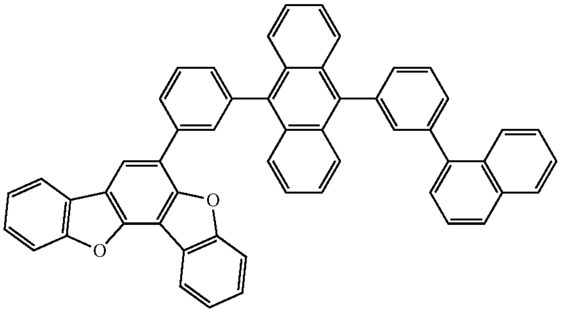
-continued
H92
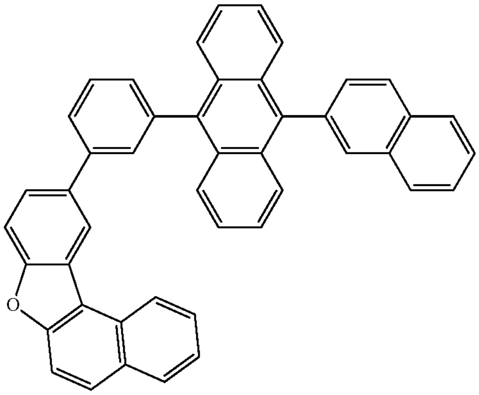
H93
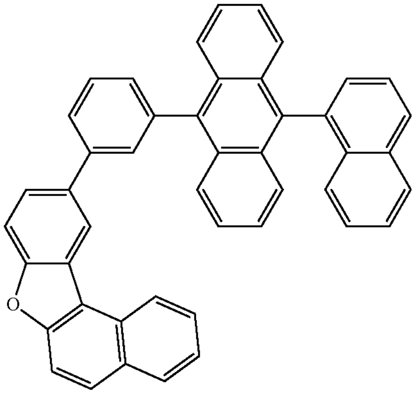
H94
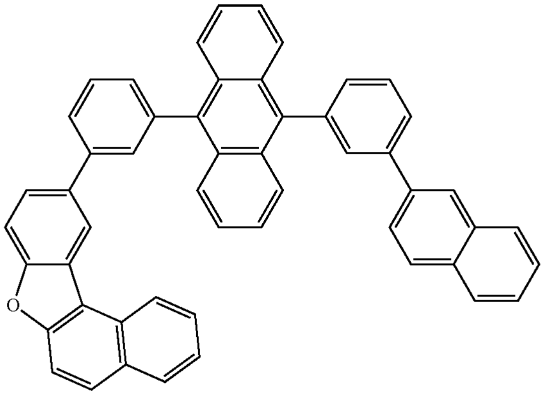
H95
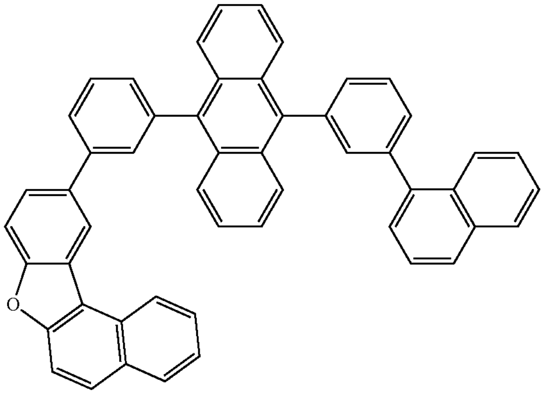

-continued
H96
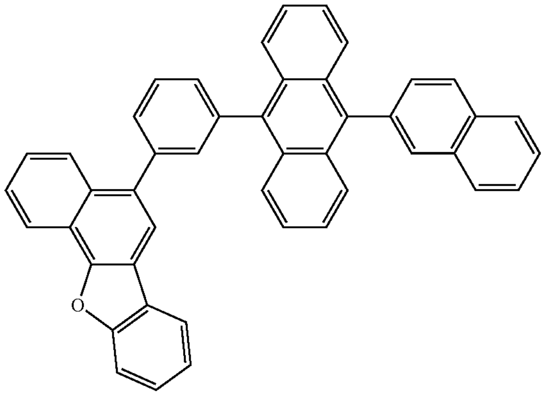
H97
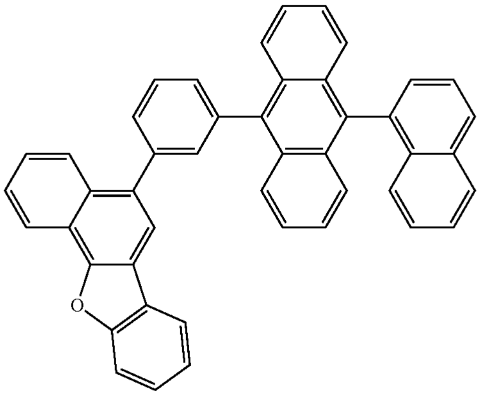
H98
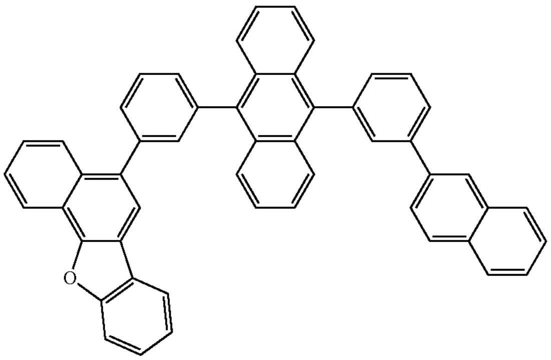
H99
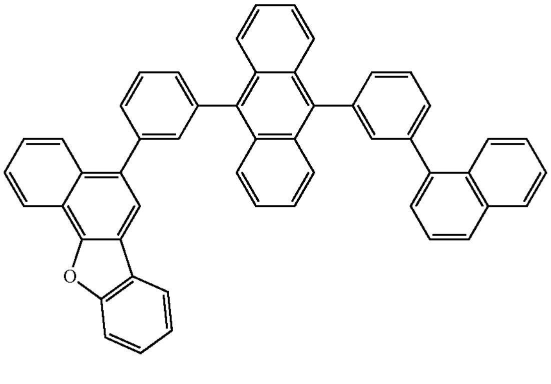
-continued
H100
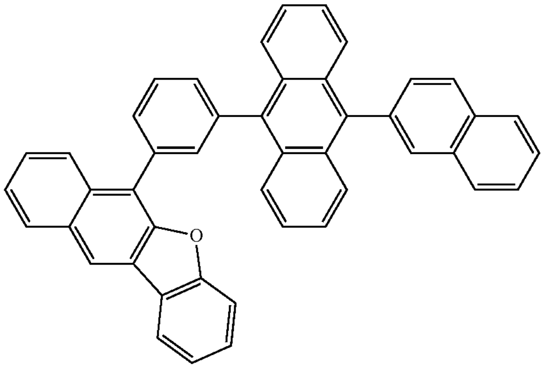
H101
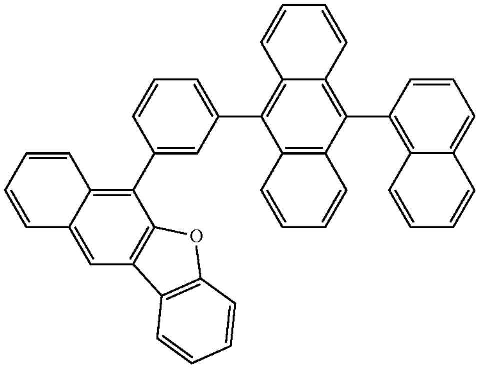
H102
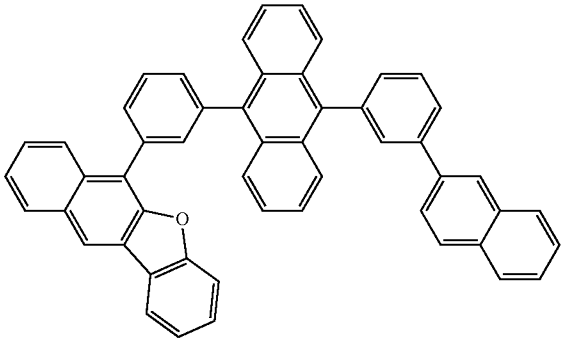
H103
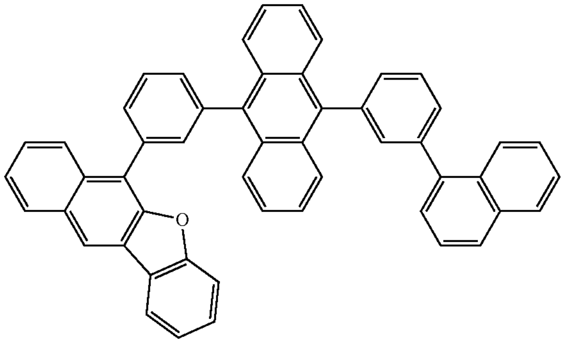

-continued
H104
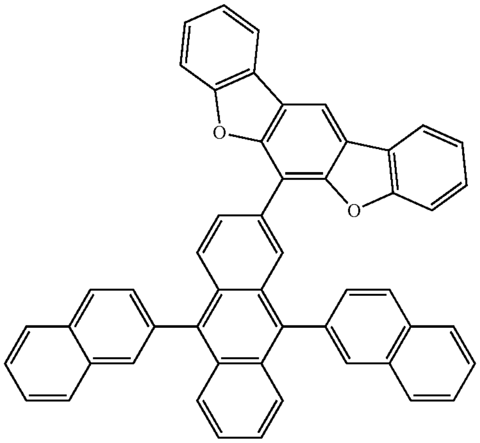
H105
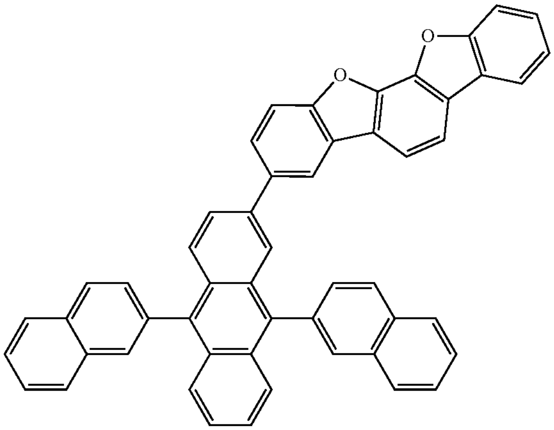
H106
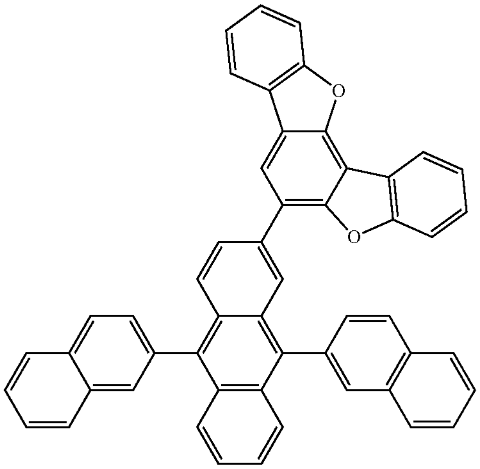
-continued
H107
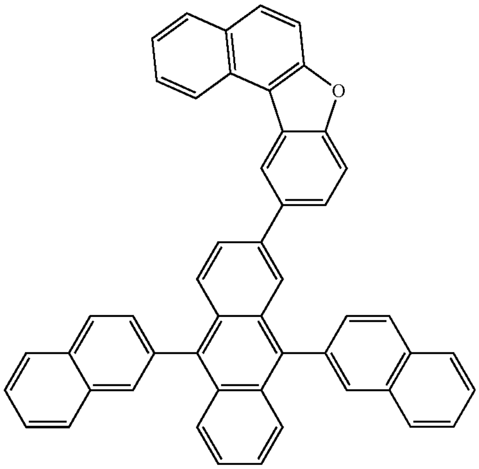
H108
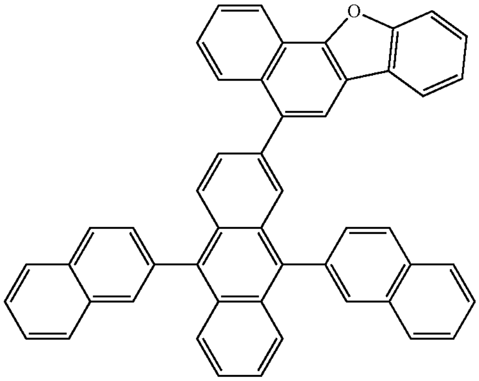
H109
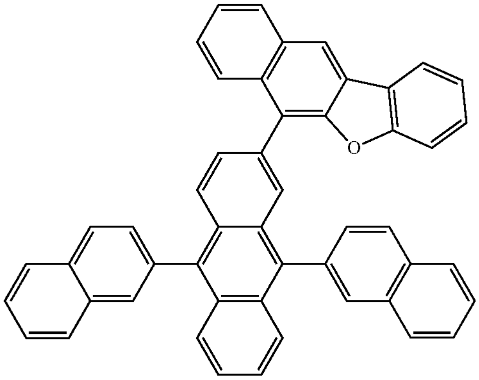
H110
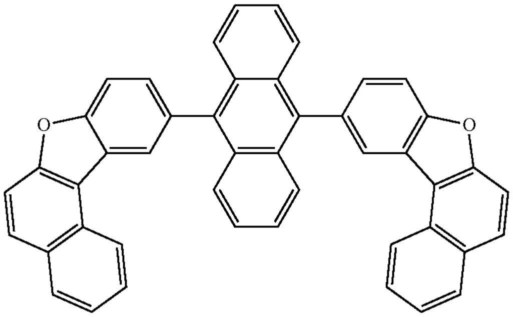

-continued
H111
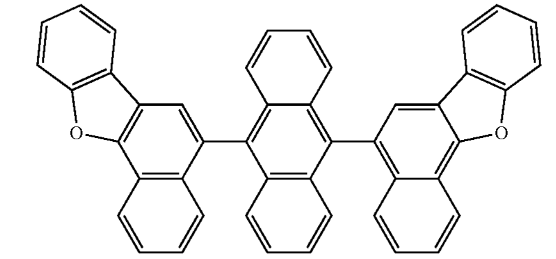
H112
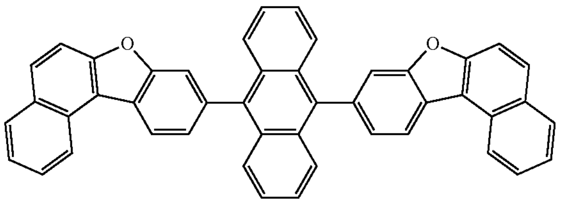
H113
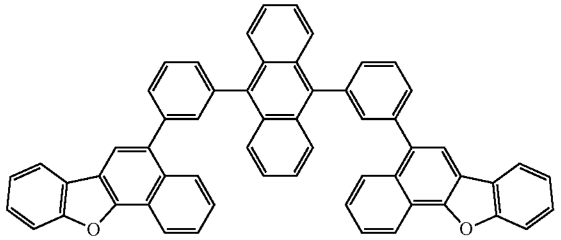
H114
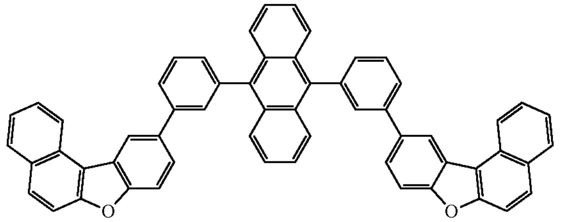
H115
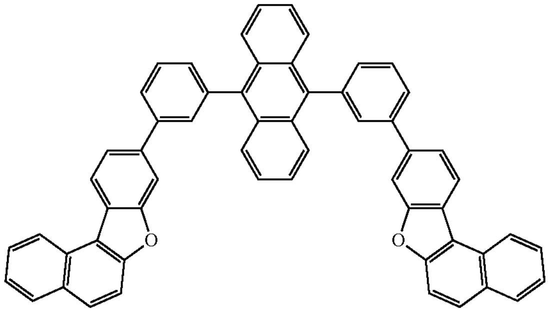
-continued
H116
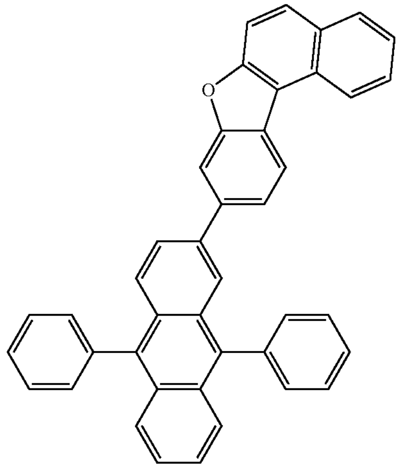
H117
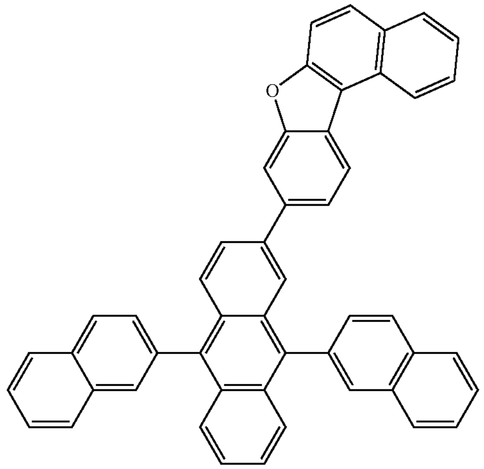
H118
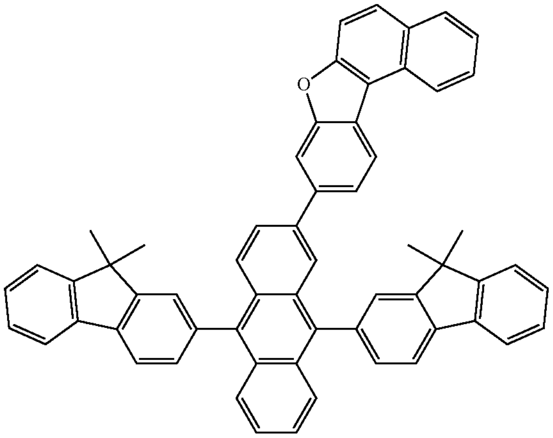

-continued
H119
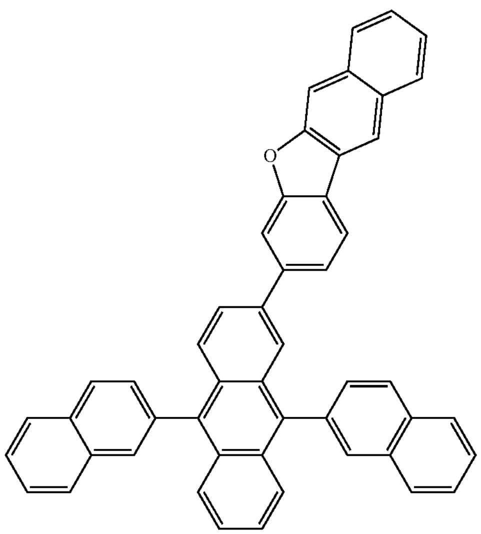
H120
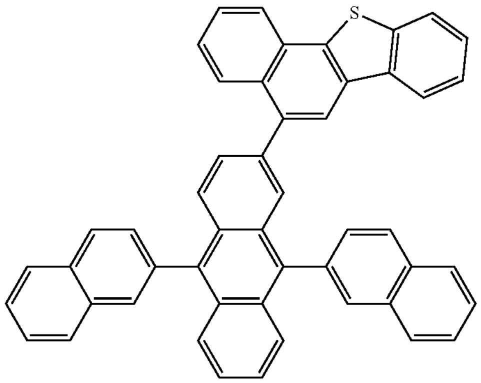
H121
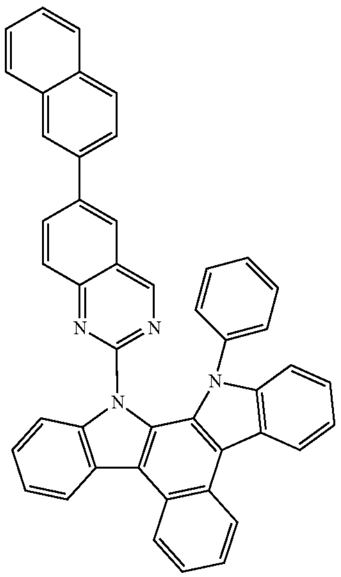
-continued
H122
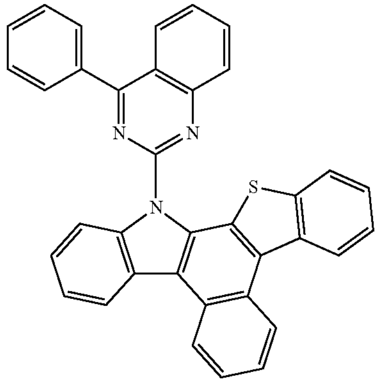
H123
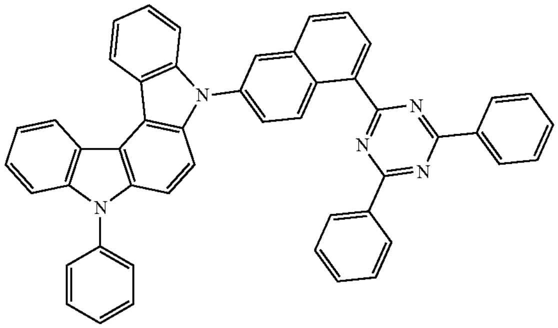
H124
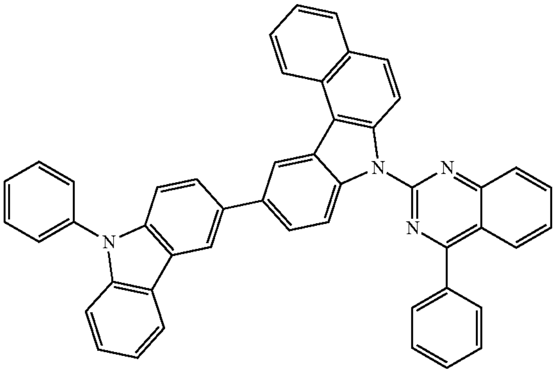
H125
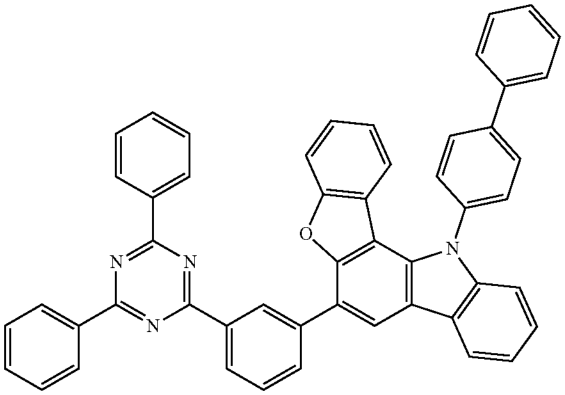

-continued

H126

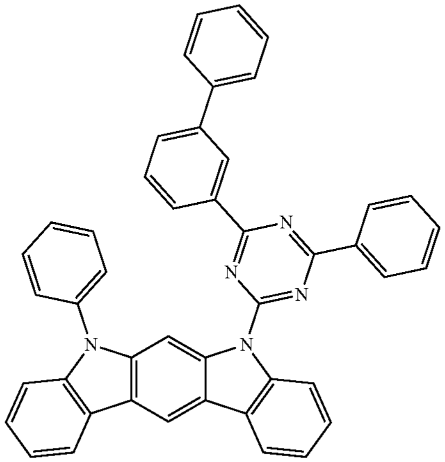

H127

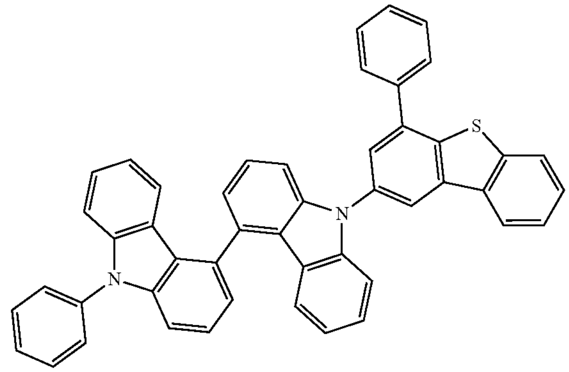

H128

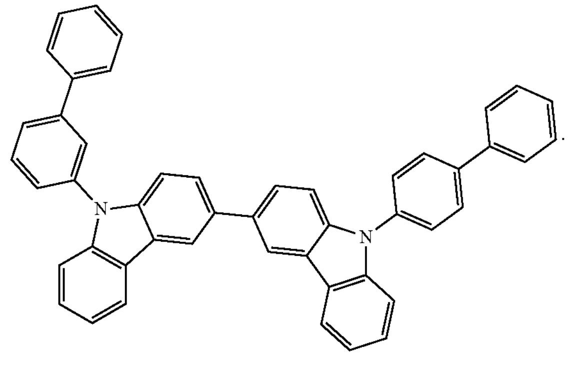

[Phosphorescent Dopant]

The phosphorescent dopant may be the organometallic compound represented by Formula 1.

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In embodiments, the phosphorescent dopant may include an organometallic compound represented by Formula 401:

$M(L_{401})_{xc1}(L_{402})_{xc2}$ [Formula 401]

[Formula 402]

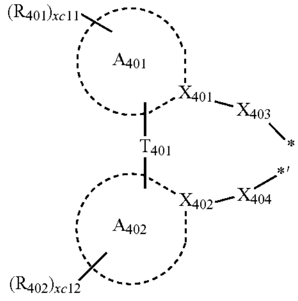

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is 2 or more, two or more of $L_{401}$ may be identical to or different from each other, $L_{402}$ may be an organic ligand, and xc2 may be 0, 1, 2, 3, or 4, wherein when xc2 is 2 or more, two or more of $L_{402}$ may be identical to or different from each other, $X_{401}$ and $X_{402}$ may each independently be nitrogen or carbon, rings $A_{401}$ and $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In an embodiment, in Formula 402, $X_{401}$ may be nitrogen and $X_{402}$ may be carbon; or each of $X_{401}$ and $X_{402}$ may be nitrogen.

In an embodiment, in Formula 401, when xc1 is 2 or more, two ring $A_{401}$(s) in two or more of $L_{401}$ may optionally be bonded to each other via $T_{402}$, which is a linking group, and two ring $A_{402}$(s) may optionally be bonded to each other via $T_{403}$, which is a linking group. $T_{402}$ and $T_{403}$ may each independently be the same as described in connection with $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(═O), an isonitrile group, a —CN group, a phosphorus group (for example, a phosphine group, a phosphite group, etc.), or any combination thereof.

The phosphorescent dopant may include, for example, one of Compounds PD1 to PD39, or any combination thereof:

PD1

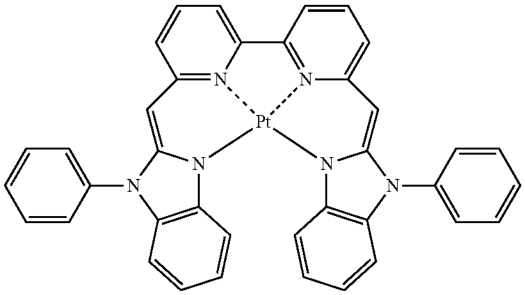

PD2

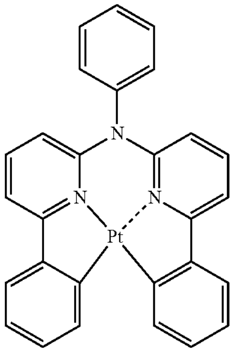

PD3

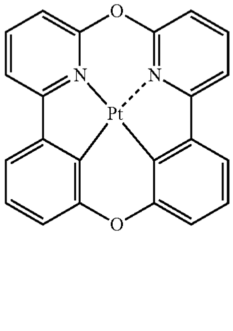

-continued

PD4

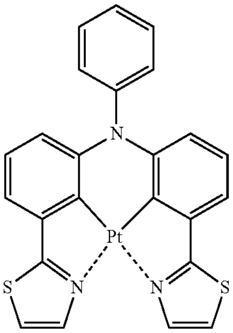

PD5

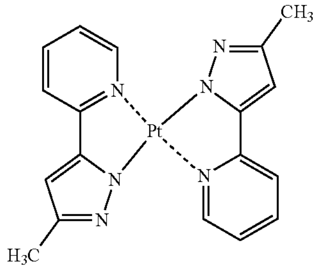

PD6

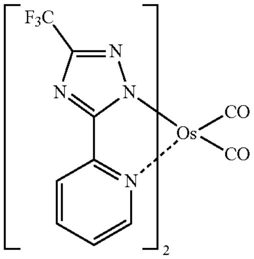

PD7

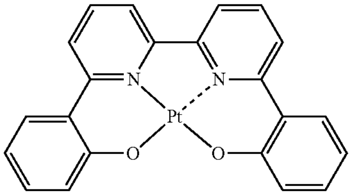

PD8

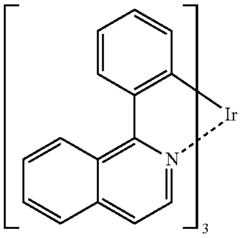

PD9

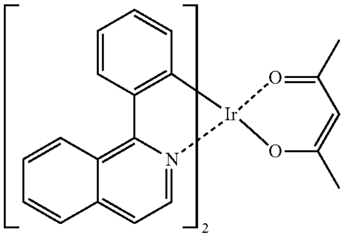

PD10
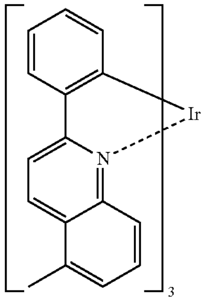
PD11
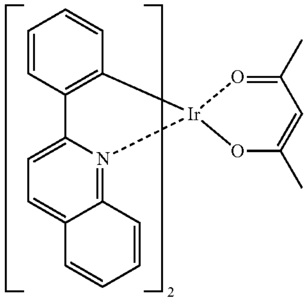
PD12
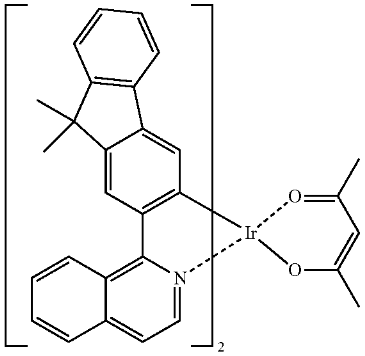
PD13
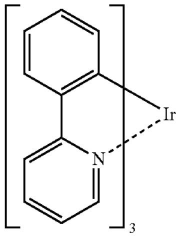
PD14
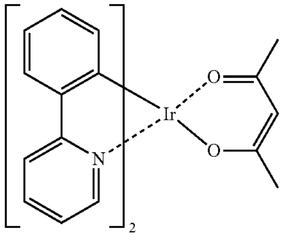
PD15
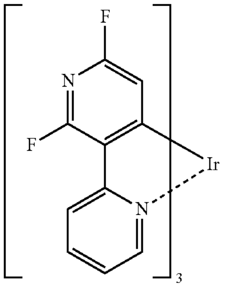
PD16
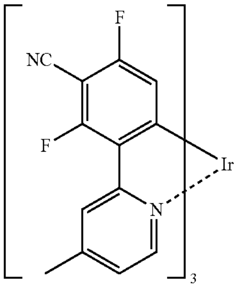
PD17
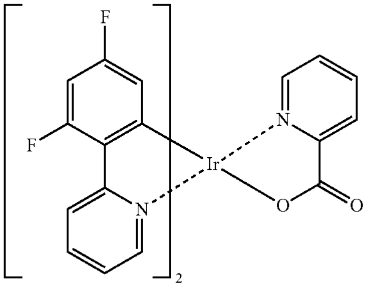
PD18
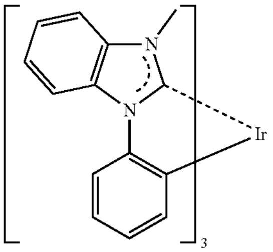
PD19
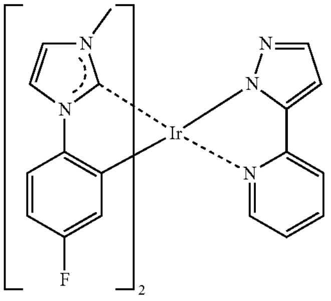

-continued
PD20
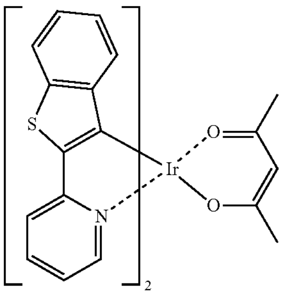
PD21
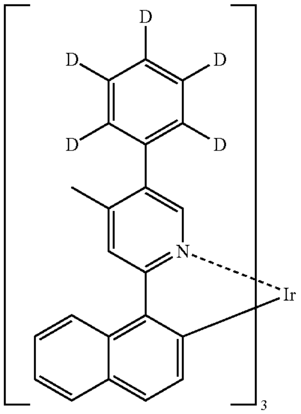
PD22
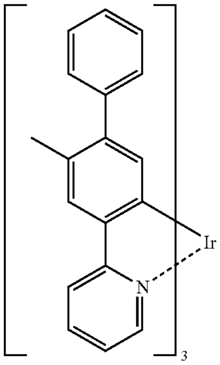
PD23
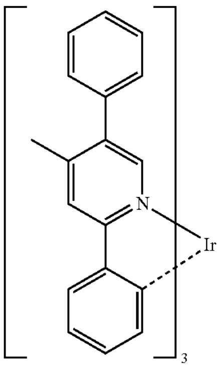
-continued
PD24
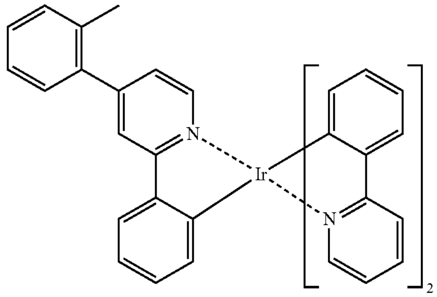
PD25
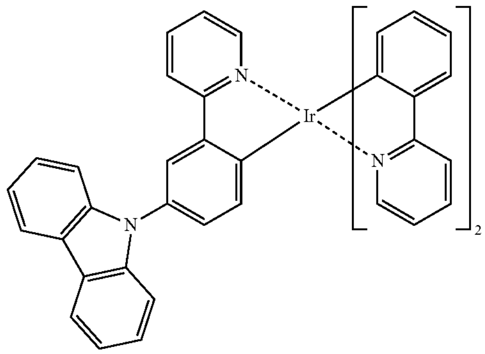
PD26
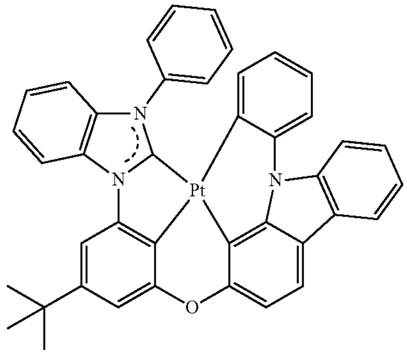
PD27
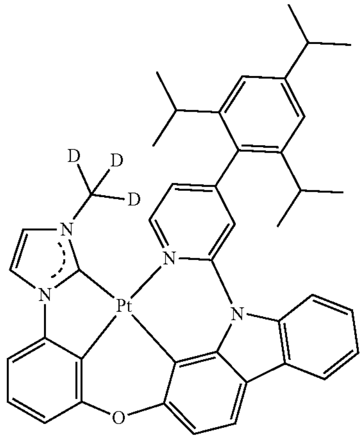

-continued
PD28
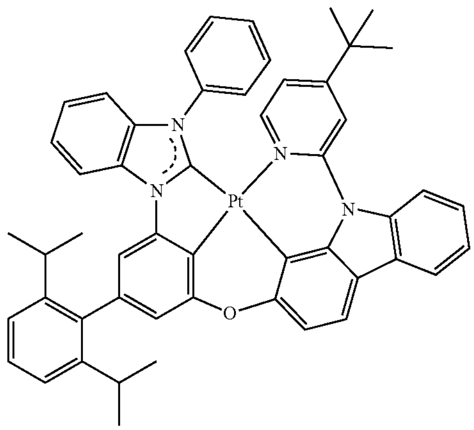
PD29
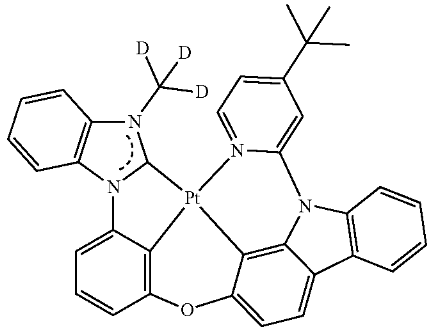
PD30
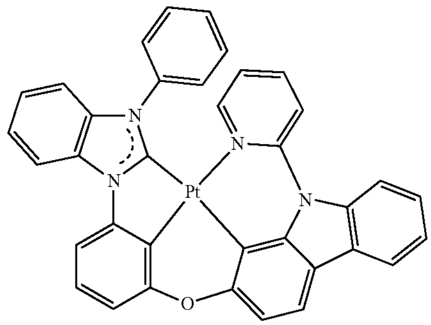
PD31
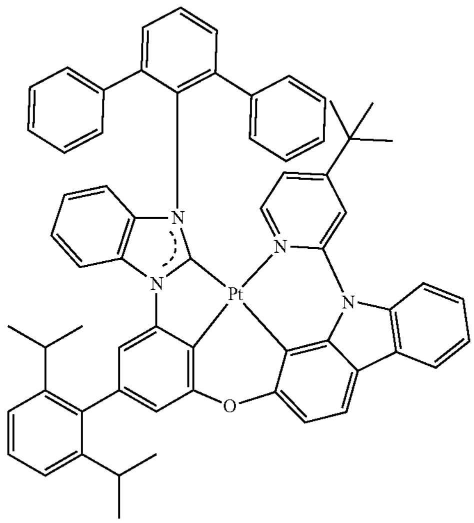
-continued
PD32
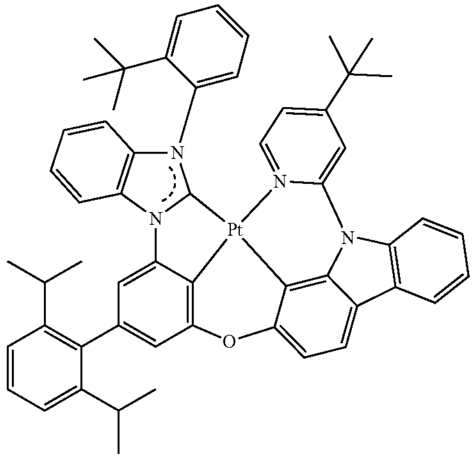
PD33
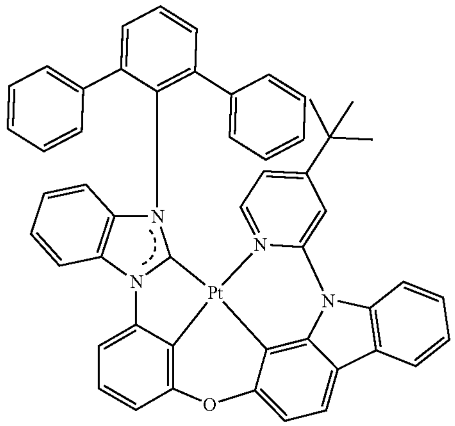
PD34
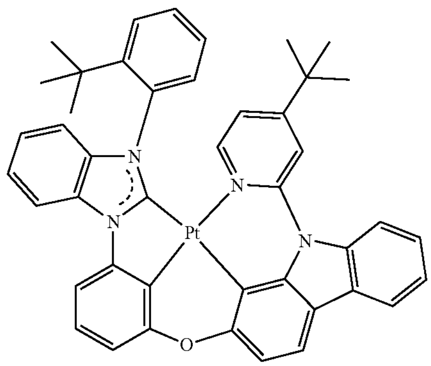

-continued

PD35

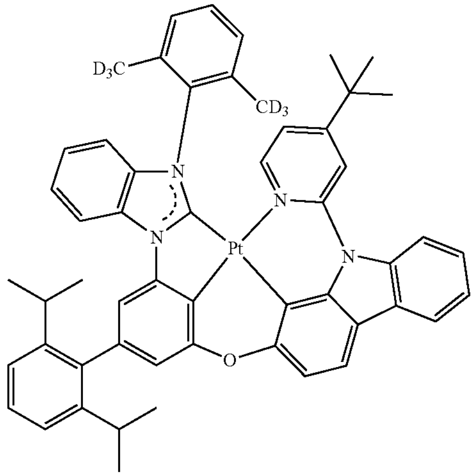

PD36

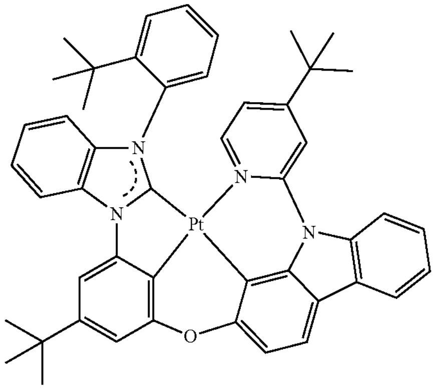

PD37

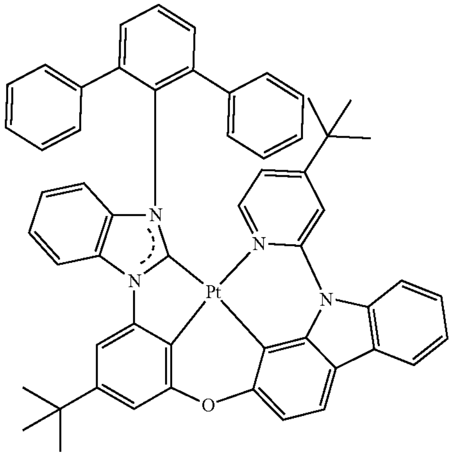

-continued

PD38

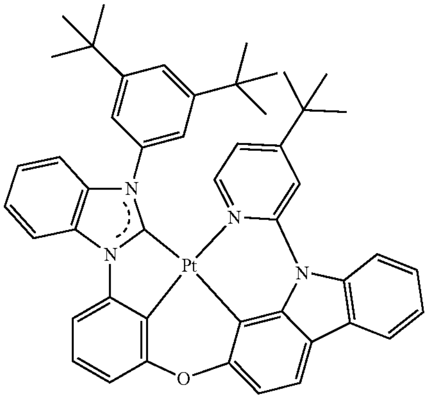

PD39

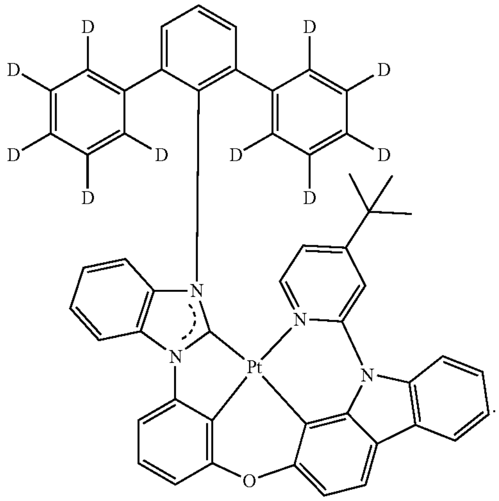

[Fluorescent Dopant]

The fluorescent dopant may include an amine group-containing compound, a styryl group-containing compound, or any combination thereof.

In embodiments, the fluorescent dopant may include a compound represented by Formula 501:

[Formula 501]

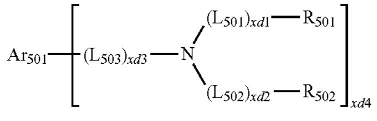

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, in Formula 501, $Ar_{501}$ may be a condensed cyclic group (for example, an anthracene group, a chrysene group, a pyrene group, etc.) in which three or more monocyclic groups are condensed together.

In an embodiment, in Formula 501, xd4 may be 2.

In an embodiment, the fluorescent dopant may include one of Compounds FD1 to FD37, DPVBi, DPAVBi, or any combination thereof:
FD1
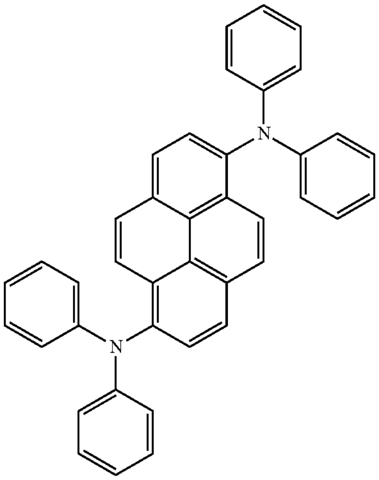
FD2
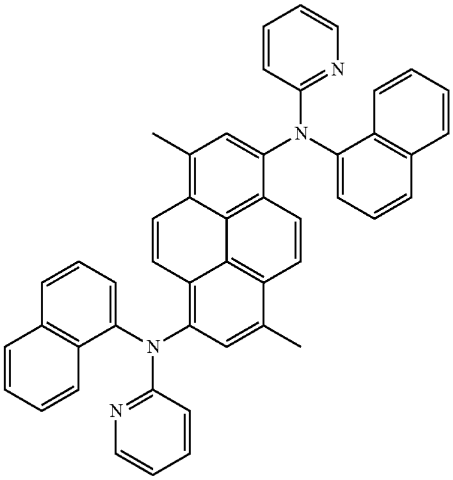
FD3
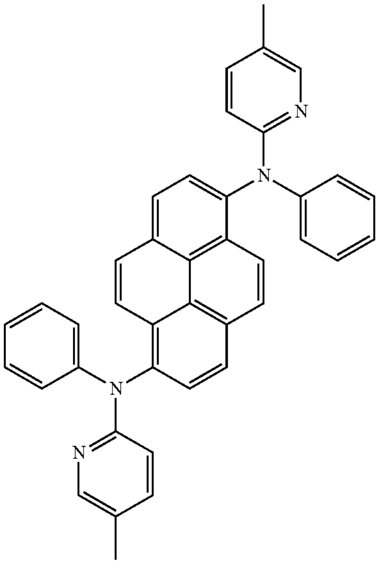
-continued
FD4
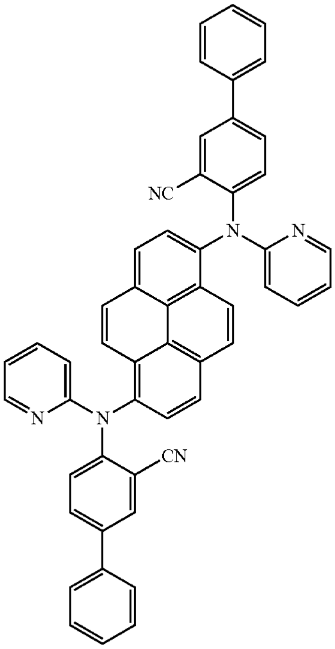
FD5
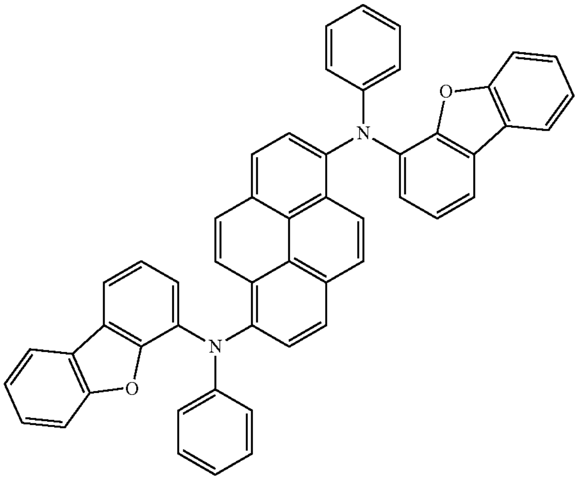
FD6
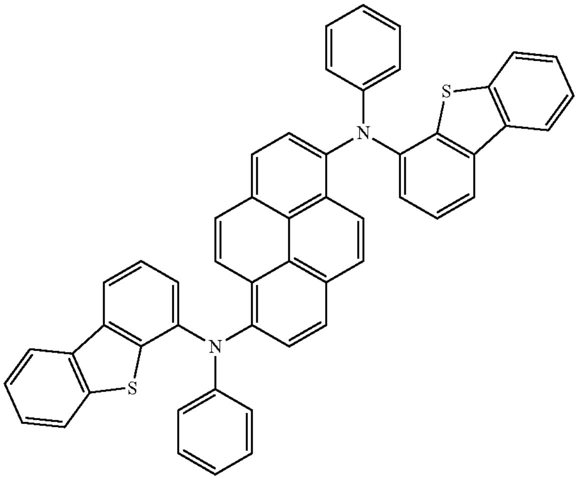

-continued
FD7
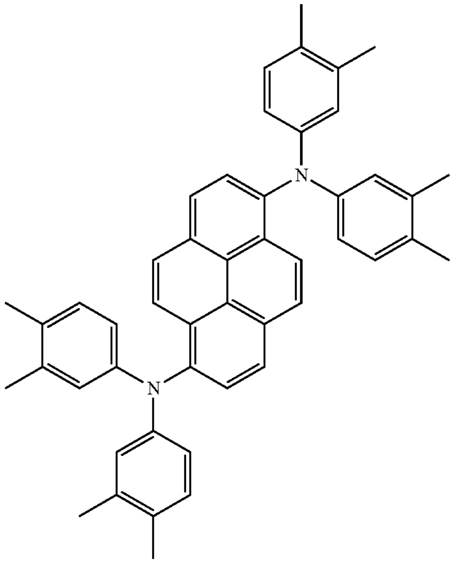
FD8
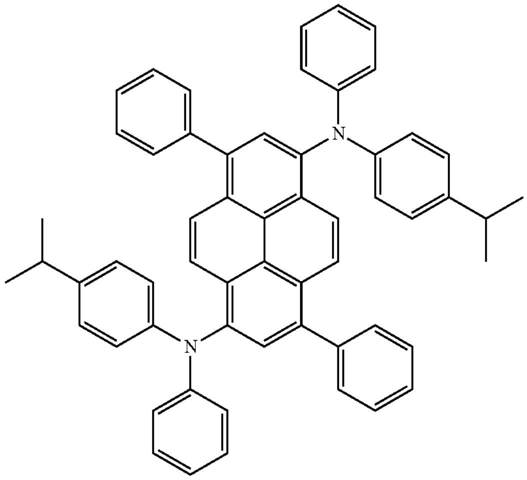
FD9
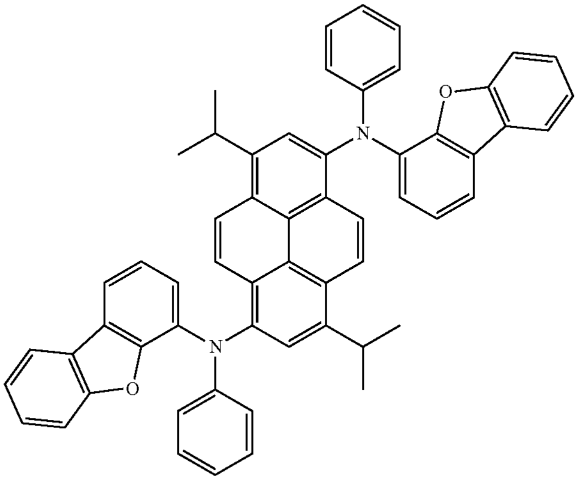
-continued
FD10
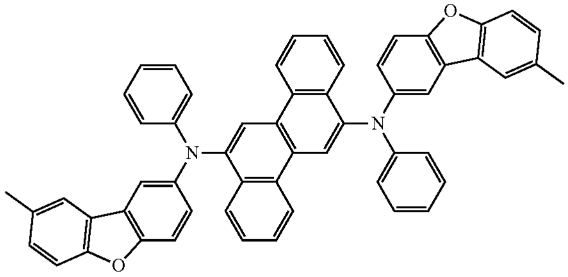
FD11
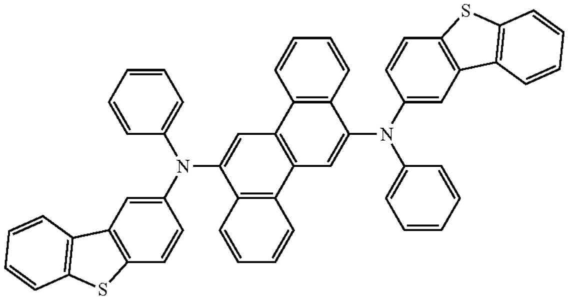
FD12
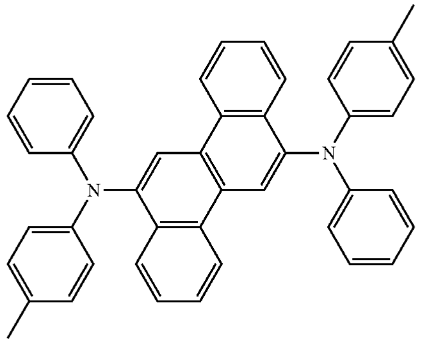
FD13
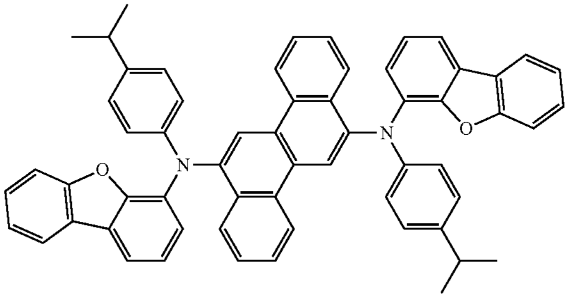
FD14
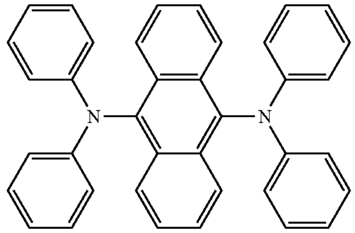

-continued
FD15
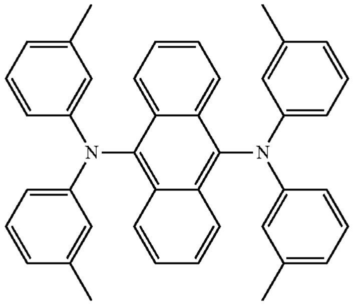
FD16
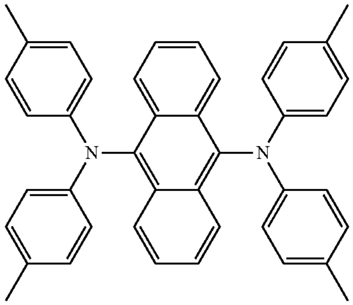
FD17
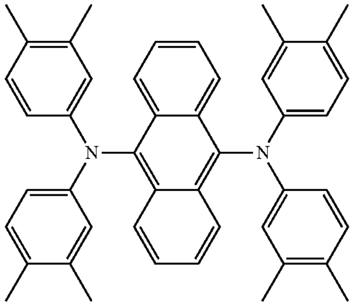
FD18
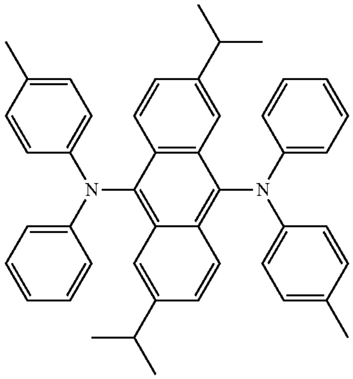
-continued
FD19
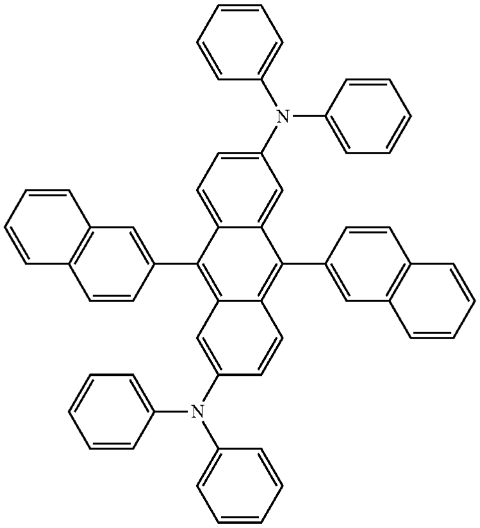
FD20
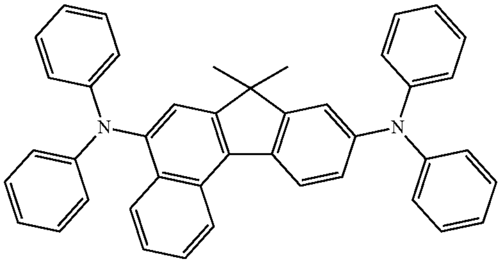
FD21
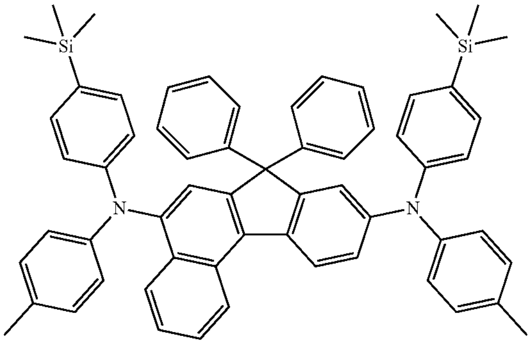
FD22
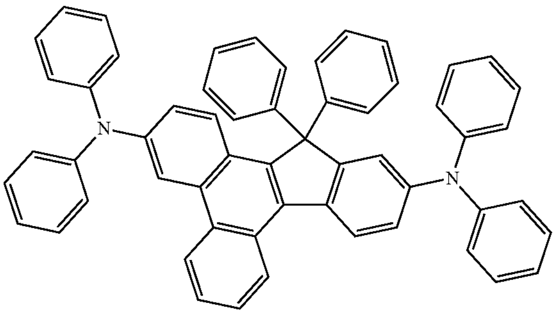

-continued
FD23
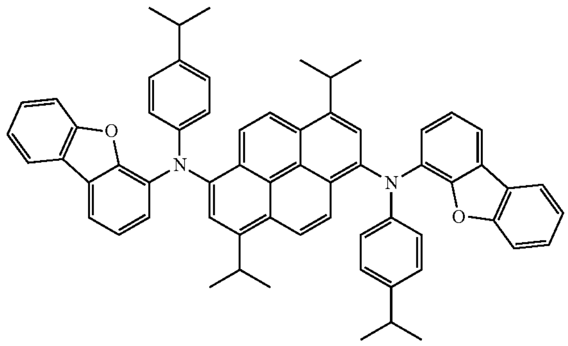
FD24
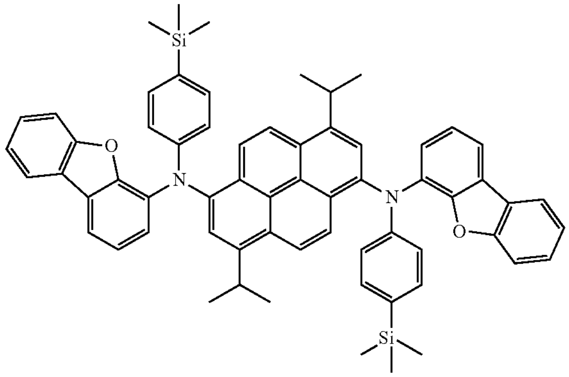
FD25
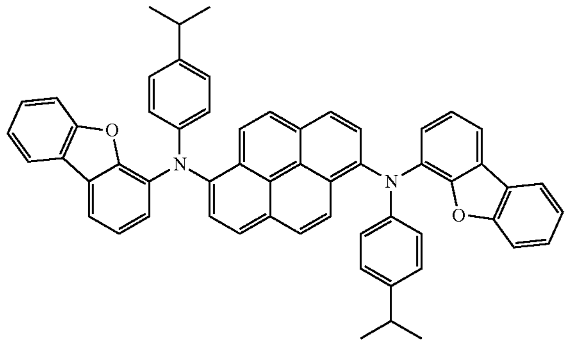
FD26
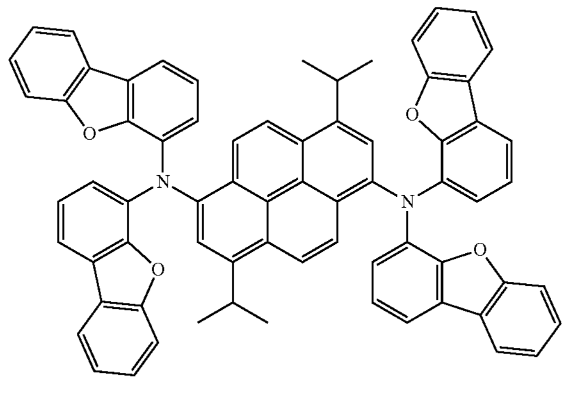
-continued
FD27
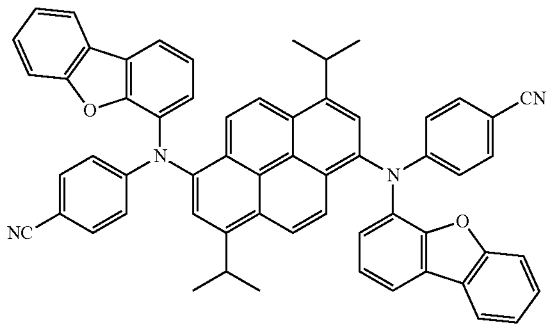
FD28
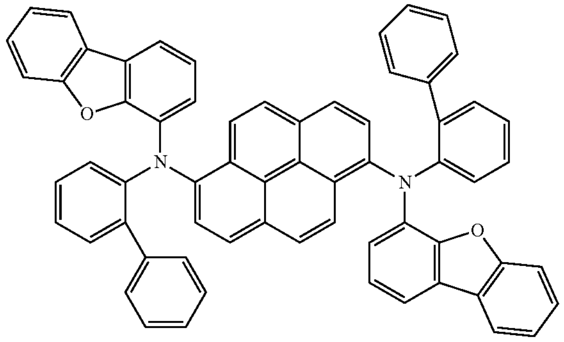
FD29
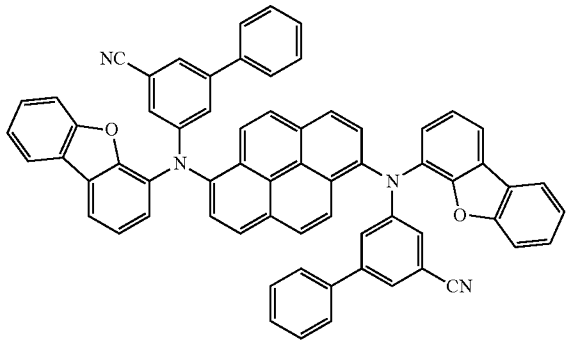
FD30
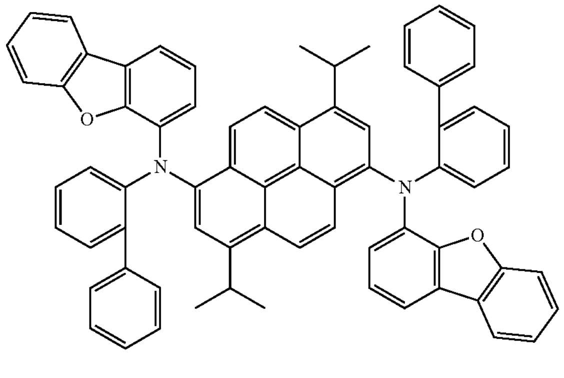

-continued
FD31
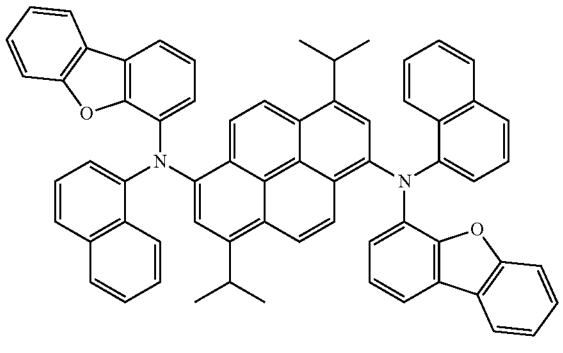
FD32
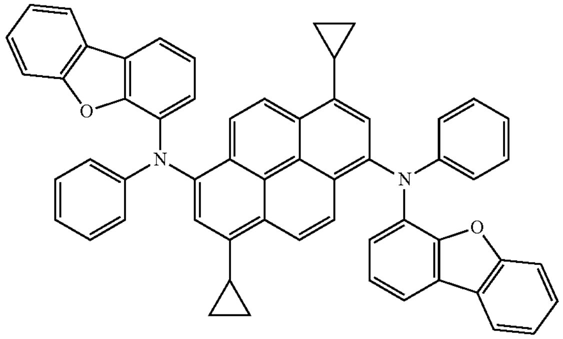
FD33
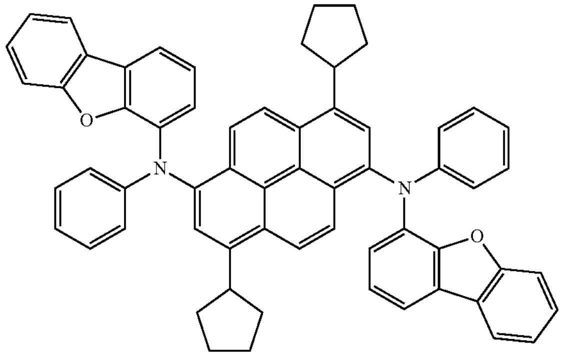
FD34
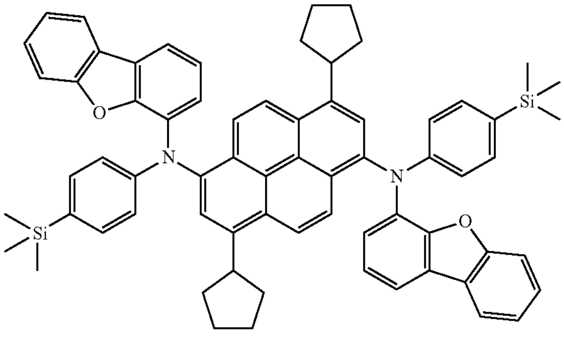
-continued
FD35
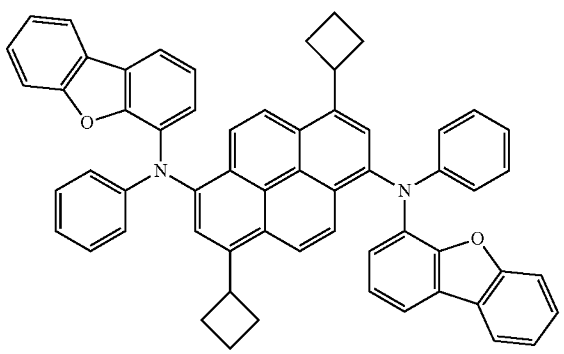
FD36
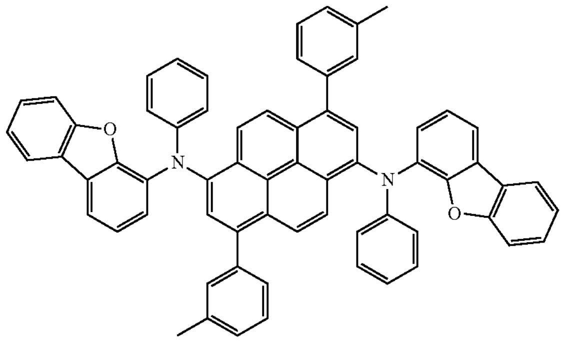
FD37
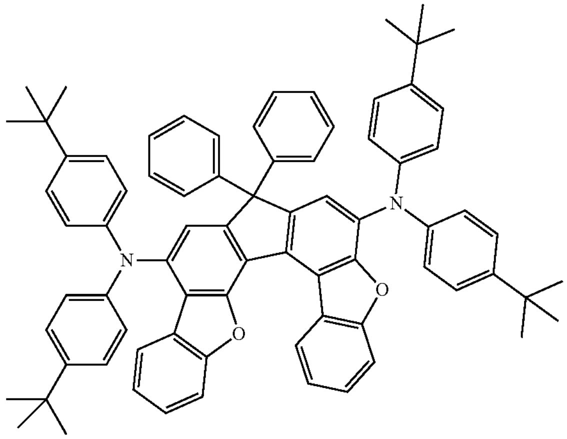
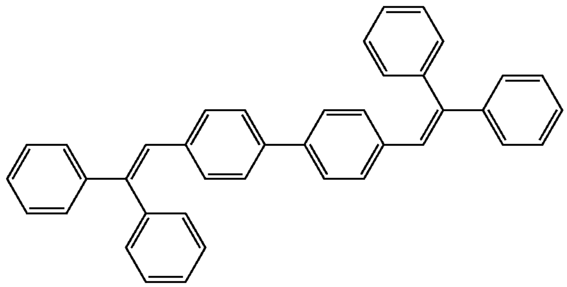
DPVBi -continued

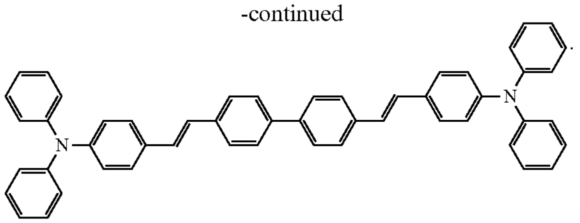

DPAVBi

[Delayed Fluorescence Material]

The emission layer may include a delayed fluorescence material.

In the specification, the delayed fluorescence material may be selected from compounds capable of emitting delayed fluorescence, based on a delayed fluorescence emission mechanism.

The delayed fluorescence material included in the emission layer may serve as a host or as a dopant, depending on the type of other materials included in the emission layer.

In an embodiment, a difference between a triplet energy level (eV) of the delayed fluorescence material and a singlet energy level (eV) of the delayed fluorescence material may be in a range of about 0 eV to about 0.5 eV. When the difference between the triplet energy level (eV) of the delayed fluorescence material and the singlet energy level (eV) of the delayed fluorescence material satisfies the range described above, up-conversion from the triplet state to the singlet state of the delayed fluorescence materials may effectively occur, and thus, the light-emitting device 10 may have improved luminescence efficiency.

In an embodiment, the delayed fluorescence material may include a material including at least one electron donor (for example, a π electron-rich $C_3$-$C_{60}$ cyclic group and the like, such as a carbazole group) and at least one electron acceptor (for example, a sulfoxide group, a cyano group, a π electron-deficient nitrogen-containing $C_1$-$C_{60}$ cyclic group, and the like); or the delayed fluorescence material may include a material including a $C_8$-$C_{60}$ polycyclic group including at least two cyclic groups condensed to each other while sharing boron (B), and the like.

Examples of the delayed fluorescence material may include at least one of Compounds DF1 to DF14:

DF1

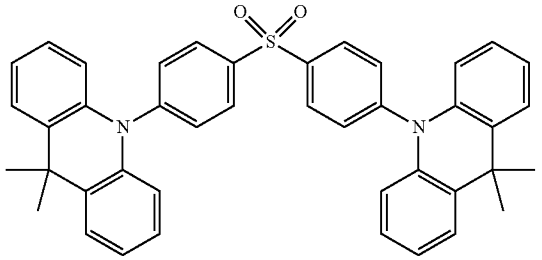

(DMAC-DPS)

-continued

DF2

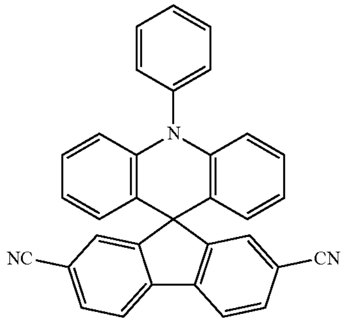

(ACRFLCN)

DF3

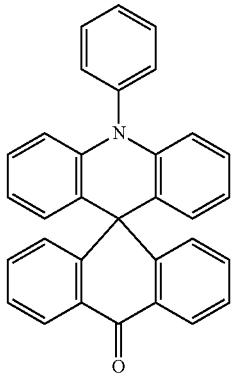

(ACRSA)

DF4

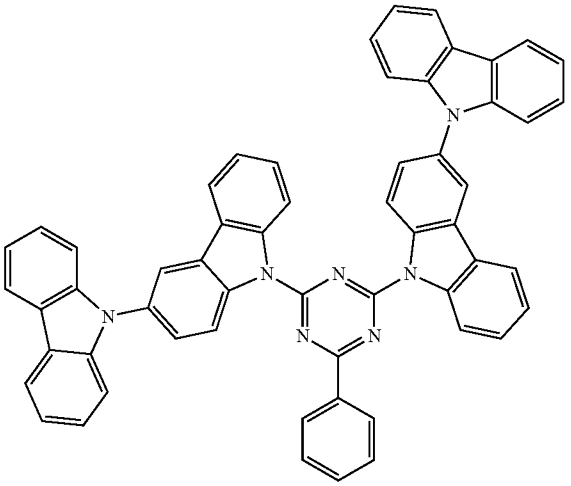

(CC2TA)

-continued
DF5
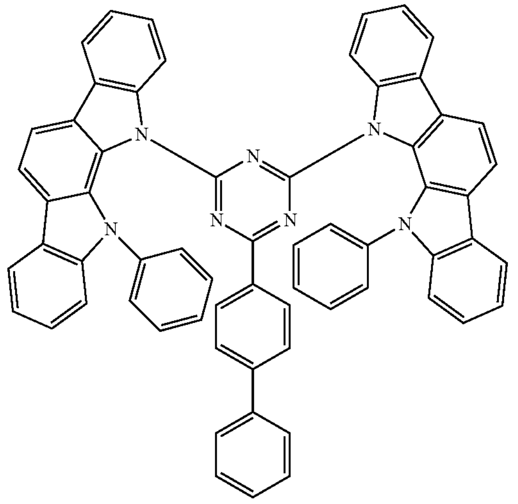
(PIC-TRZ)
DF6
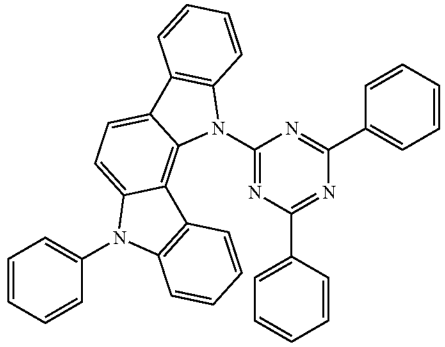
(PIC-TRZ2)
DF7
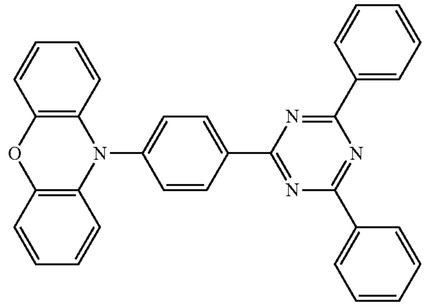
PXZ-TRZ
DF8
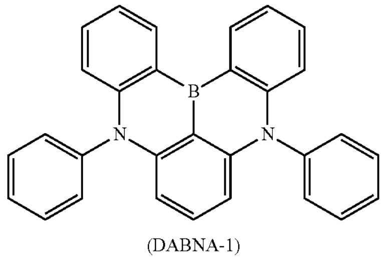
(DABNA-1)
-continued
DF9
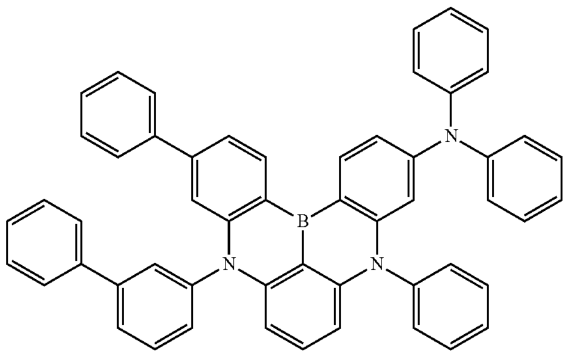
(DABNA-2)
DF10
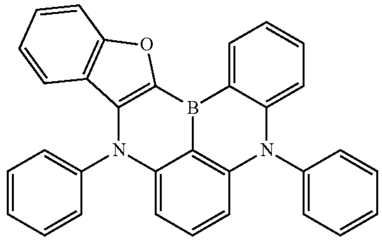
DF11
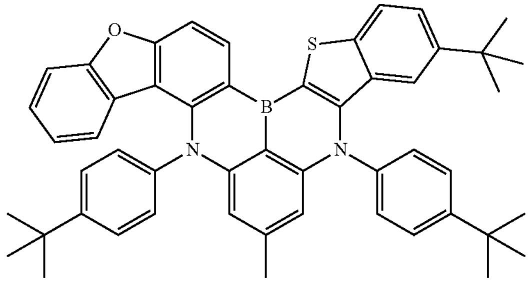
DF12
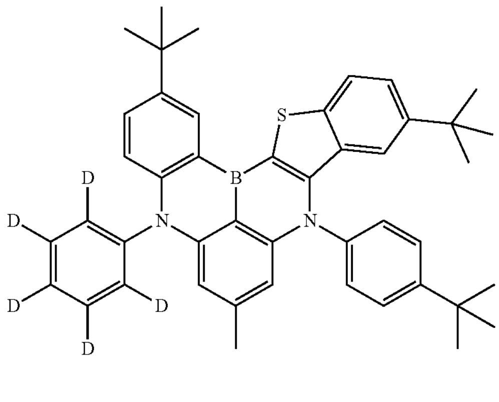

-continued

DF13

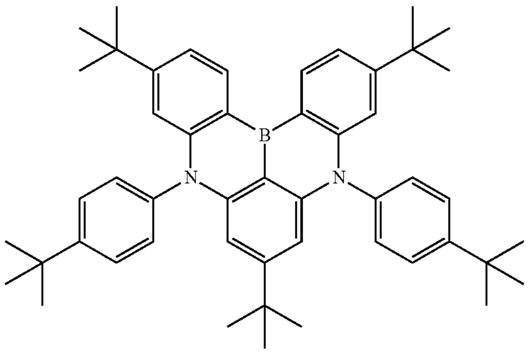

DF14

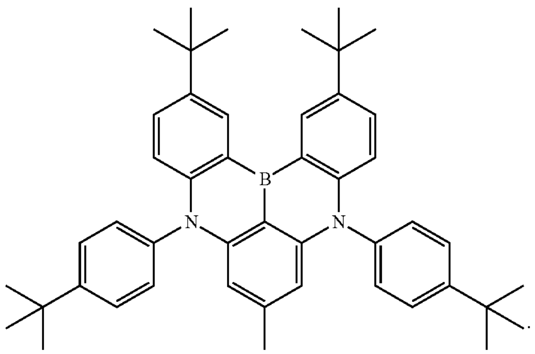

[Quantum Dot]

The emission layer may include a quantum dot.

The term "quantum dot" as used herein may be a crystal of a semiconductor compound, and may include any material capable of emitting light of various emission wavelengths according to a size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material with an organic solvent and growing quantum dot particle crystals. When the crystal grows, the organic solvent naturally acts as a dispersant coordinated on the surface of the quantum dot crystal and controls the growth of the crystal so that the growth of quantum dot particles can be controlled through a process which costs lower, and may be more readily performed than vapor deposition methods, such as metal organic chemical vapor deposition (MOCVD) or molecular beam epitaxy (MBE).

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, MgS, and the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the like; a quaternary compound, such as CdZnSeS, CdZnSeTe, CdZnSTe, CdHgSeS, CdHgSeTe, CdHgSTe, HgZnSeS, HgZnSeTe, HgZnSTe, and the like; or any combination thereof.

Examples of the Group III-V semiconductor compound may include: a binary compound, such as GaN, GaP, GaAs, GaSb, AlN, AlP, AlAs, AlSb, InN, InP, InAs, InSb, and the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like; or any combination thereof. In an embodiment, the Group III-V semiconductor compound may further include a Group II element. Examples of the Group III-V semiconductor compound further including a Group II element may include InZnP, InGaZnP, InAlZnP, and the like.

Examples of the Group III-VI semiconductor compound may include: a binary compound, such as GaS, GaSe, $Ga_2Se_3$, GaTe, InS, InSe, $In_2S_3$, $In_2Se_3$, InTe, and the like; a ternary compound, such as $InGaS_3$, $InGaSe_3$, and the like; or any combination thereof.

Examples of the Group I-III-VI semiconductor compound may include: a ternary compound, such as AgInS, $AgInS_2$, CuInS, $CuInS_2$, $CuGaO_2$, $AgGaO_2$, $AgAlO_2$, and the like; or any combination thereof.

Examples of the Group IV-VI semiconductor compound may include: a binary compound, such as SnS, SnSe, SnTe, PbS, PbSe, PbTe, and the like; a ternary compound, such as SnSeS, SnSeTe, SnSTe, PbSeS, PbSeTe, PbSTe, SnPbS, SnPbSe, SnPbTe, and the like; a quaternary compound, such as SnPbSSe, SnPbSeTe, SnPbSTe, and the like; or any combination thereof.

Examples of the Group IV element or compound may include: a single element material, such as Si, Ge, and the like; a binary compound, such as SiC, SiGe, and the like; or any combination thereof.

Each element included in a multi-element compound, such as a binary compound, a ternary compound, or a quaternary compound, may be present in a particle at a uniform concentration or at a non-uniform concentration.

In an embodiment, the quantum dot may have a single structure in which the concentration of each element in the quantum dot is uniform, or the quantum dot may have a core-shell structure. In an embodiment, in case that the quantum dot has a core-shell structure, a material included in the core and a material included in the shell may be different from each other.

The shell of the quantum dot may serve as a protective layer that prevents chemical denaturation of the core to maintain semiconductor characteristics, and/or may serve as a charging layer that imparts electrophoretic characteristics to the quantum dot. The shell may be a single layer or a multi-layer. An interface between the core and the shell may have a concentration gradient in which the concentration of a material in the shell decreases toward the core.

Examples of the shell of the quantum dot may include a metal oxide, a metalloid oxide, a non-metal oxide, a semiconductor compound, or any combination thereof. Examples of the metal oxide, the metalloid oxide, or the non-metal oxide may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like; a ternary compound, such as $MgAl_2O_4$, $CoFe_2O_4$, $NiFe_2O_4$, $CoMn_2O_4$, and the like; or any combination thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width at half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. When the FWHM of the quantum dot is within these ranges, the quantum dot may have improved color purity or color reproducibility. Light emitted through the quantum dot may be emitted in all directions, so that a wide viewing angle may be improved.

In embodiments, the quantum dot may be in the form of a spherical particle, a pyramidal particle, a multi-arm particle, a cubic nanoparticle, a nanotube particle, a nanowire particle, a nanofiber particle, or a nanoplate particle.

Since the energy band gap may be adjusted by controlling the size of the quantum dot, light having various wavelength bands may be obtained from the quantum dot emission layer. Accordingly, by using quantum dots of different sizes, a light-emitting device that emits light of various wavelengths may be implemented. In an embodiment, the size of the quantum dot may be selected to emit red light, green light, and/or blue light. For example, the size of the quantum dot may be configured to emit white light by the combination of light of various colors.

[Electron Transport Region in Interlayer 130]

The electron transport region may have a structure consisting of a layer consisting of a single material, a structure consisting of a layer including different materials, or a structure including multiple layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the layers of each structure may be stacked from the emission layer in its respective stated order, but the structure of the electron transport region is not limited thereto.

In an embodiment, the electron transport region (for example, the buffer layer, the hole blocking layer, the electron control layer, or the electron transport layer in the electron transport region) may include a metal-free compound including at least one n electron-deficient nitrogen-containing $C_1$-$C_{60}$ cyclic group.

For example, the electron transport region may include at least one of the third compound and the fourth compound.

In embodiments, the electron transport region may include a compound represented by Formula 601:

$$[Ar_{601}]_{xe11}\text{*}[(L_{601})_{xe1}\text{-}R_{601}]_{xe21}$$ [Formula 601]

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(═O)($Q_{601}$), —S(═O)$_2$($Q_{601}$), or —P(═O)($Q_{601}$)($Q_{602}$), $Q_{601}$ to $Q_{603}$ may each independently be the same as described in connection with $Q_1$, xe21 may be 1, 2, 3, 4, or 5, and at least one of $Ar_{601}$, $L_{601}$, and $R_{601}$ may each independently be air electron-deficient nitrogen-containing $C_1$-$C_{60}$ cyclic group unsubstituted or substituted with at least one $R_{10a}$.

In an embodiment, in Formula 601, when xe11 is 2 or more, two or more of $Ar_{601}$ may be bonded to each other via a single bond.

In an embodiment, in Formula 601, $Ar_{601}$ may be a substituted or unsubstituted anthracene group.

In embodiments, the electron transport region may include a compound represented by Formula 601-1:

[Formula 601-1]

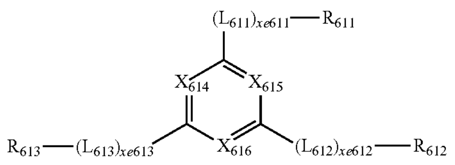

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, in Formulae 601 and 601-1, xe1 and xe611 to xe613 may each independently be 0, 1, or 2.
In embodiments, the electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:
ET1
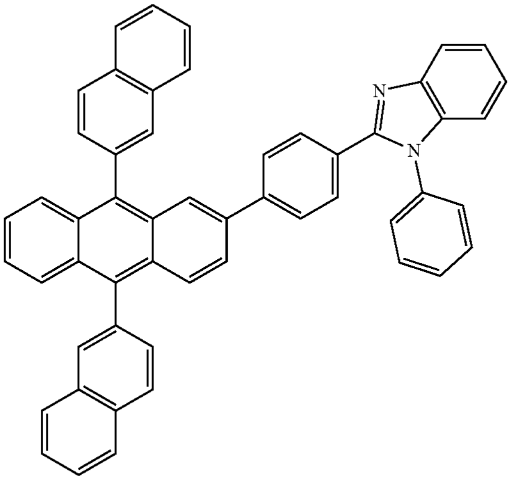
ET2
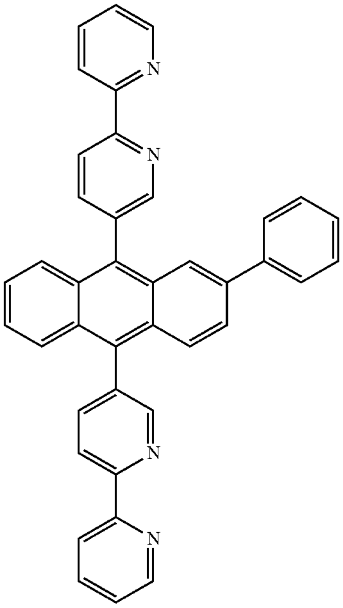
-continued
ET3
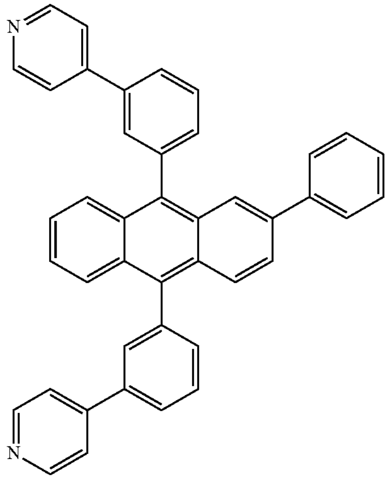
ET4
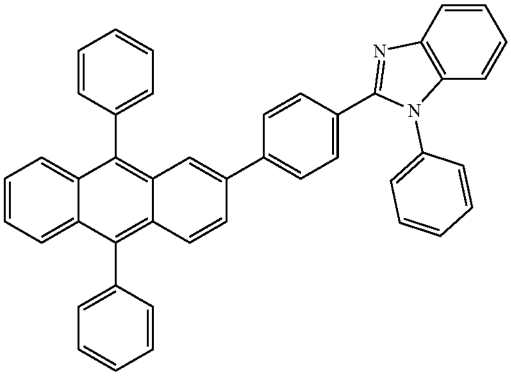
ET5
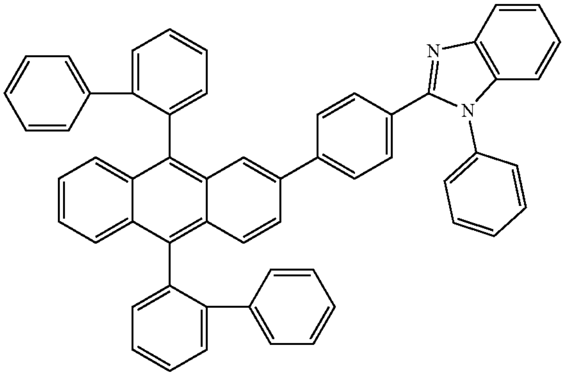

-continued
ET6
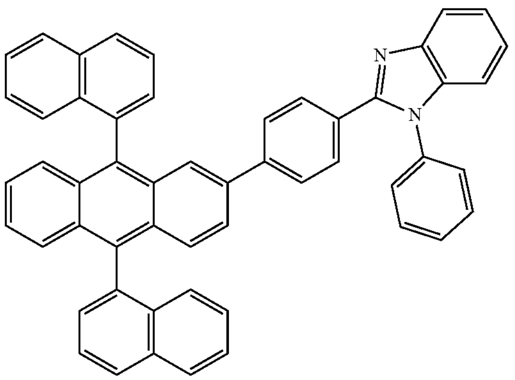
ET7
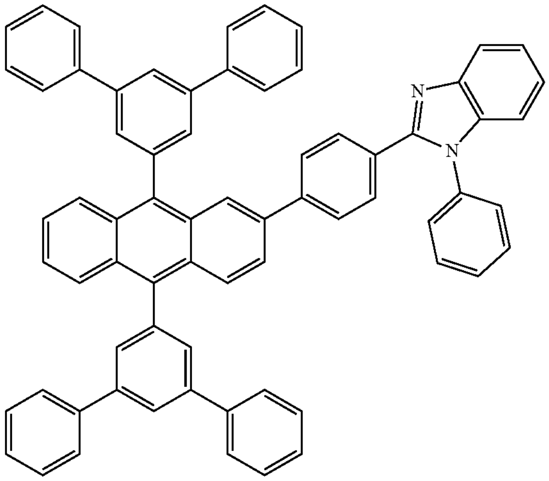
ET8
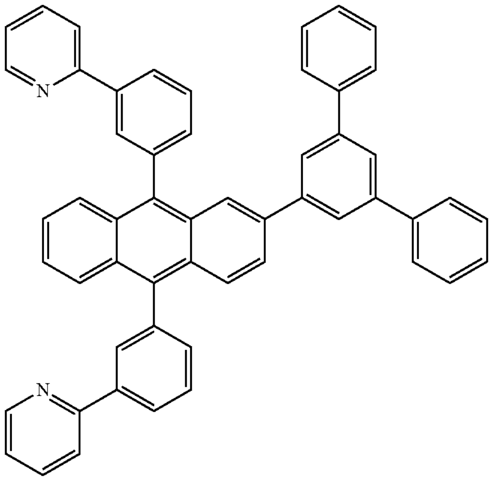
-continued
ET9
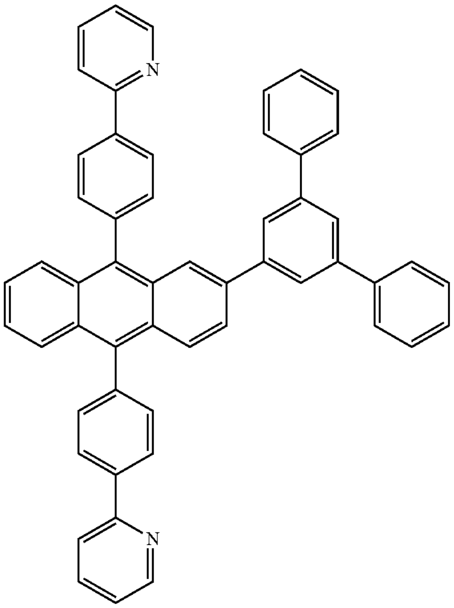
ET10
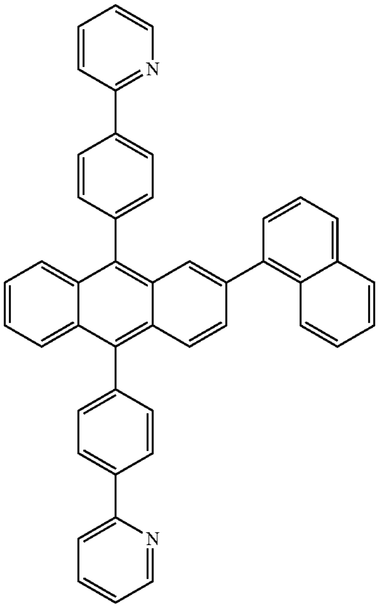

-continued
ET11
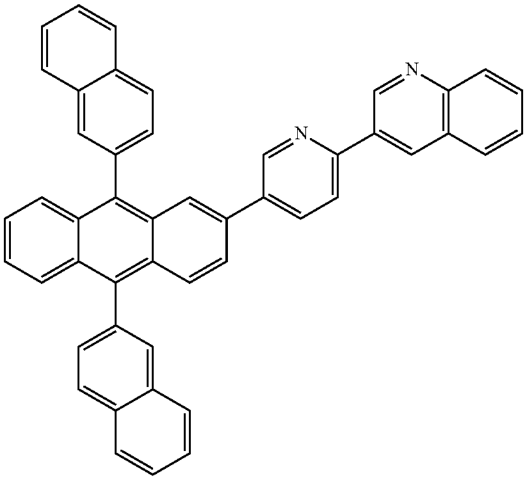
ET12
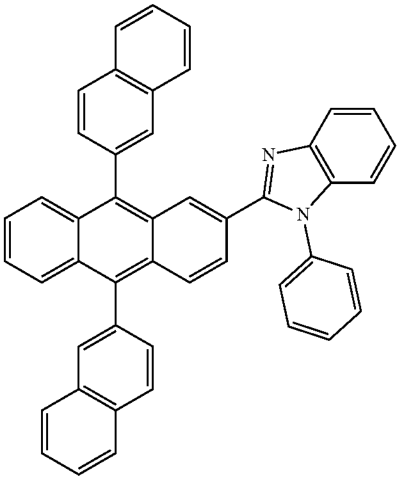
ET13
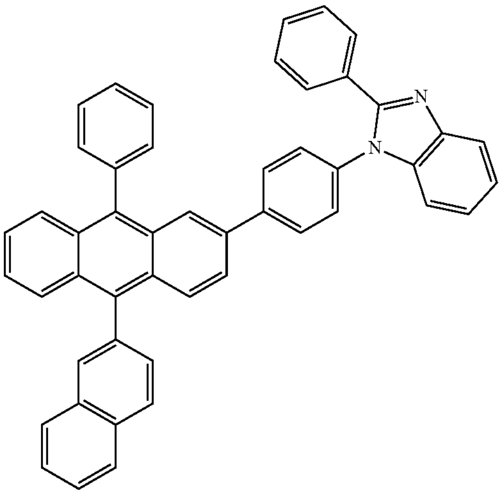
-continued
ET14
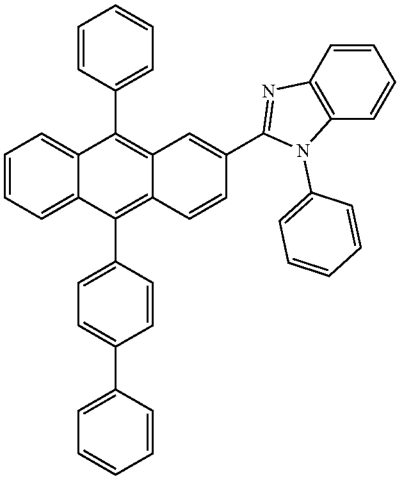
ET15
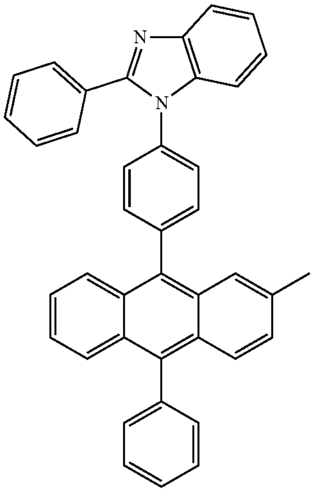
ET16
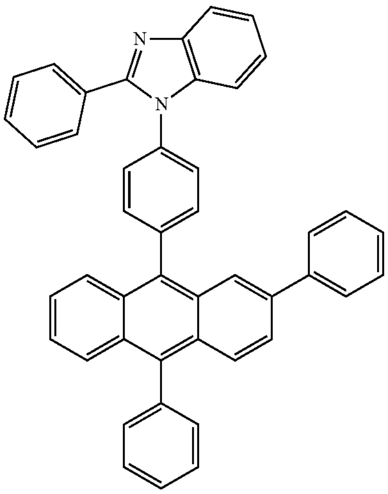

-continued
ET17
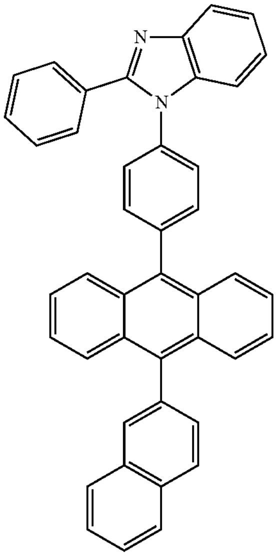
ET18
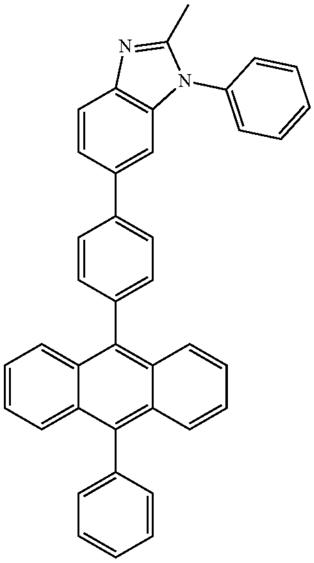
ET19
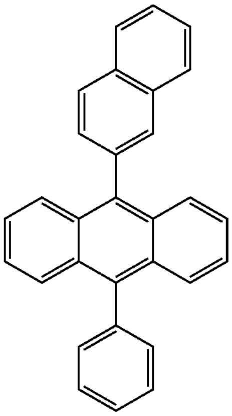
-continued
ET20
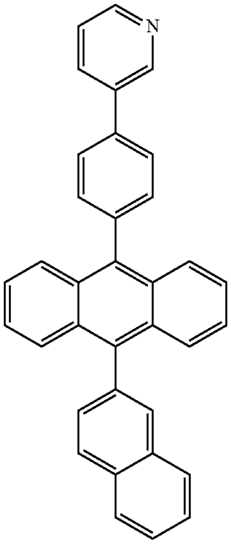
ET21
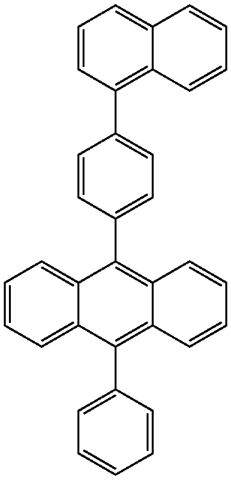
ET22
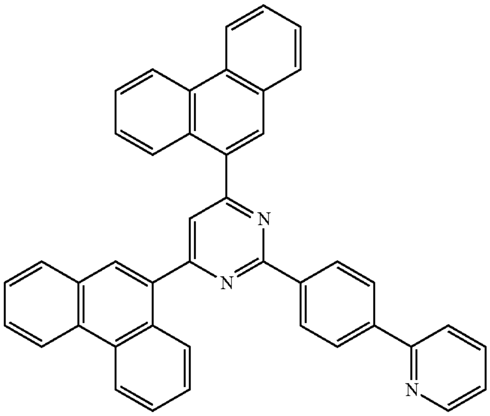

-continued
ET23
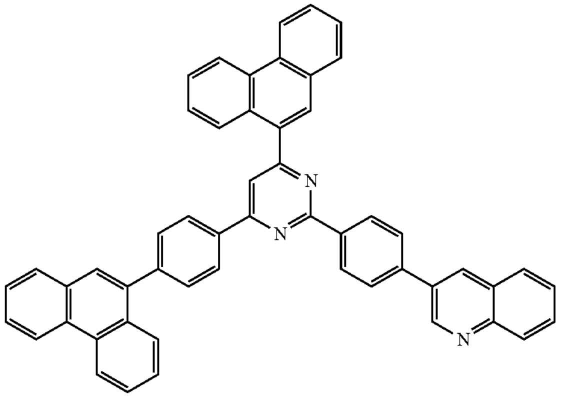
ET24
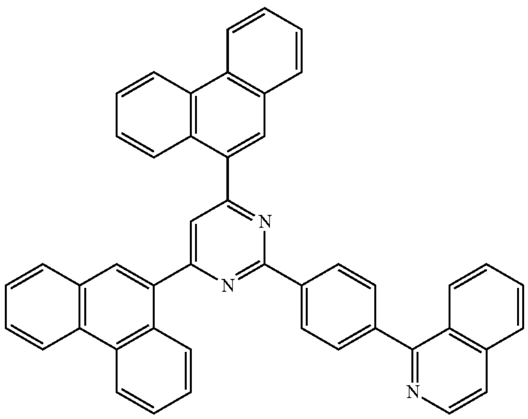
ET25
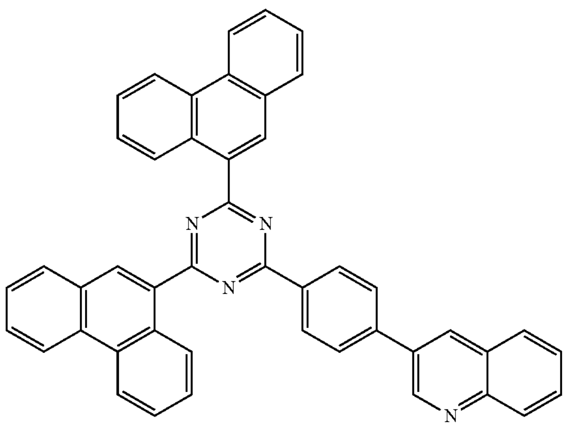
-continued
ET26
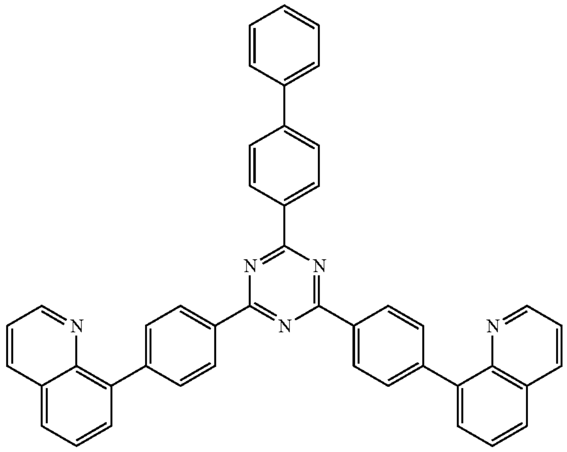
ET27
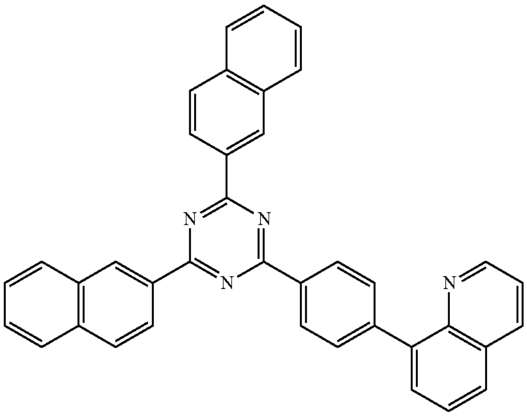
ET28
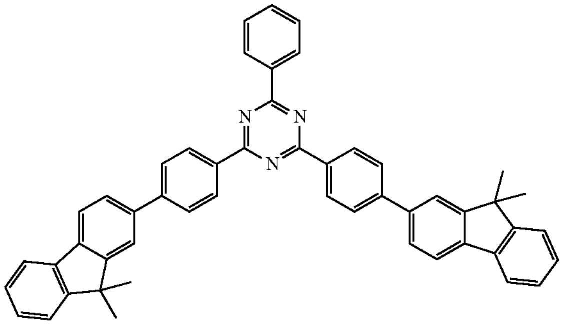

-continued
ET29
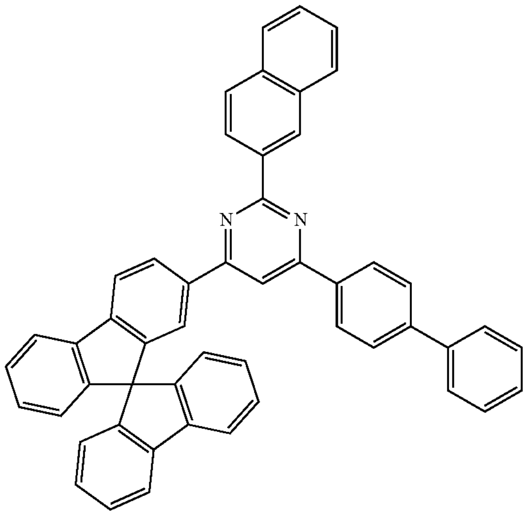
ET30
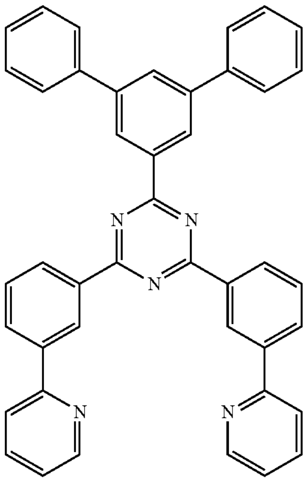
ET31
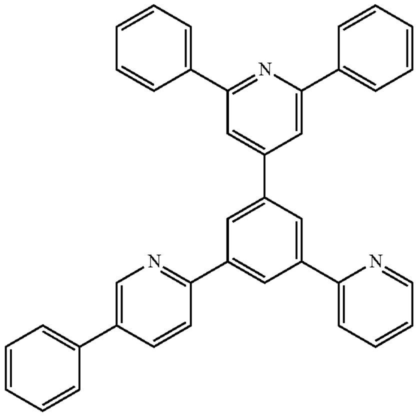
-continued
ET32
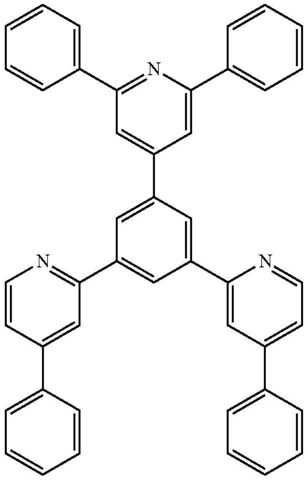
ET33
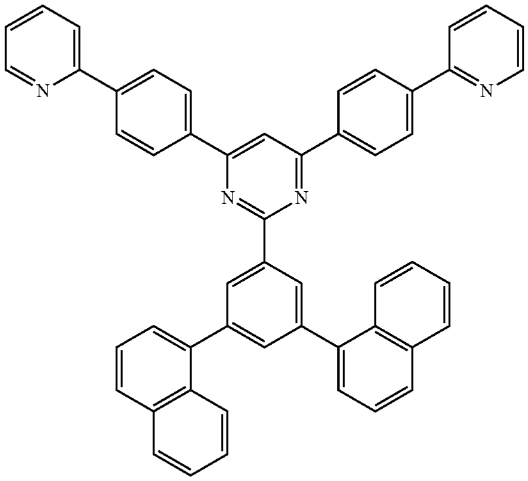
ET34
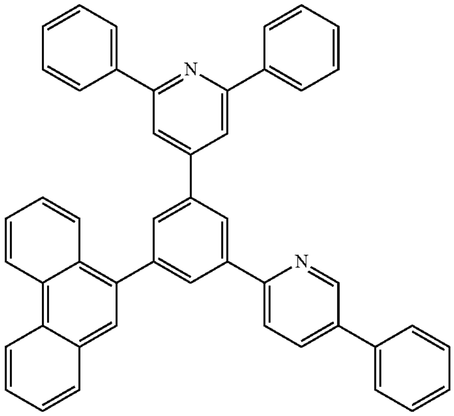

-continued
ET35
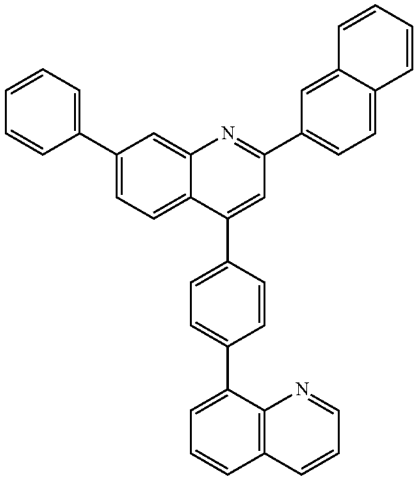
ET36
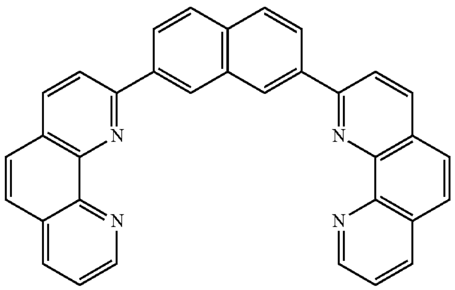
ET37
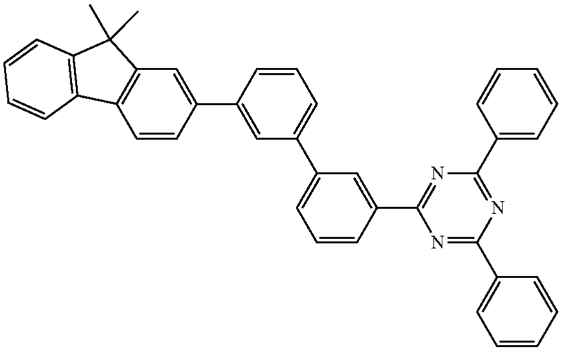
ET38
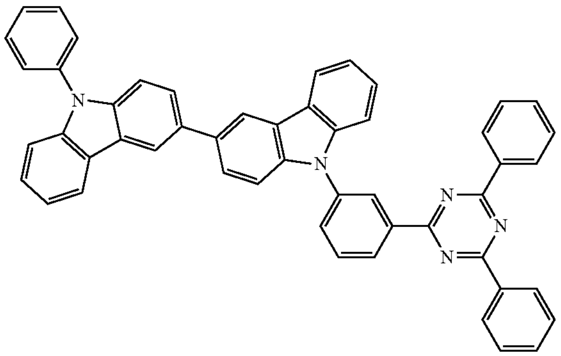
-continued
ET39
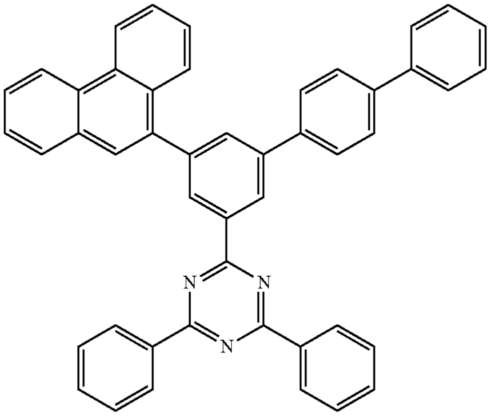
ET40
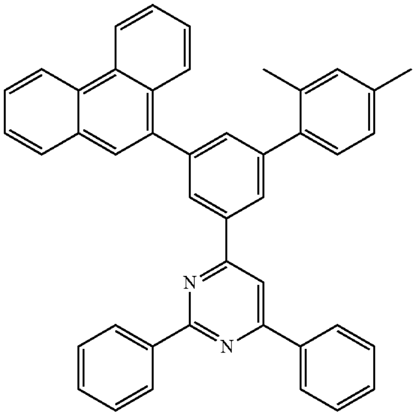
ET41
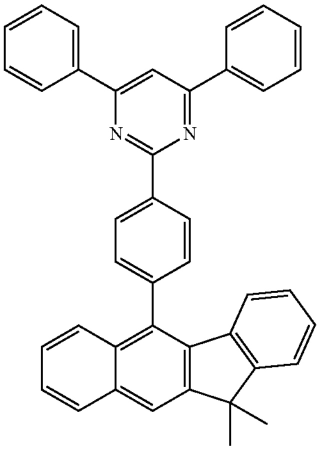

-continued

ET42

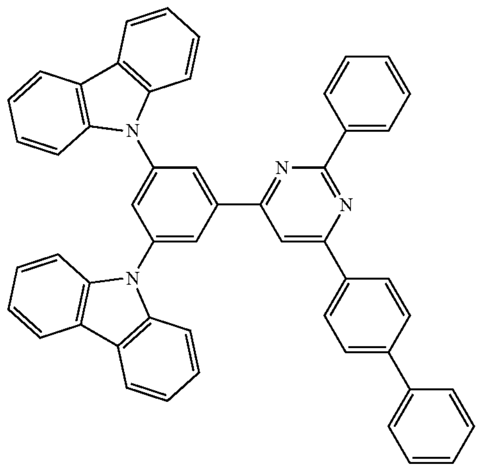

ET43

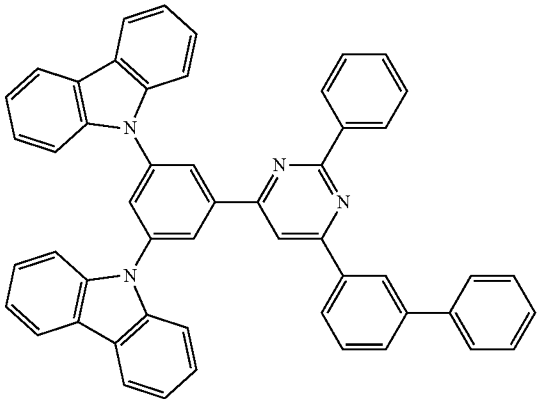

ET44

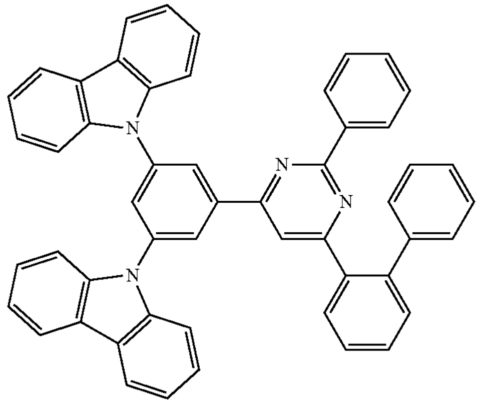

ET45

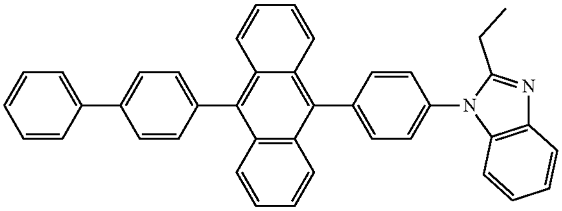

-continued

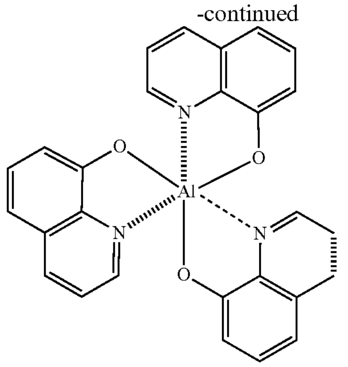

Alq3

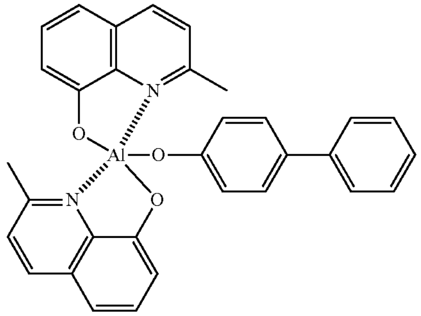

BAlq

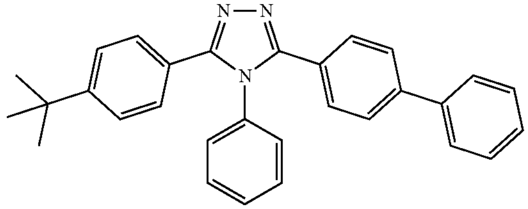

TAZ

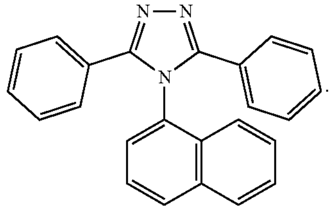

NTAZ

A thickness of the electron transport region may be in a range of about 100 Å to about 5,000 Å. For example, the thickness of the electron transport region may be in a range of about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thicknesses of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, an electron transport layer in the electron transport region) may further include, in addition to the materials described above, a metal-containing material.

The metal-containing material may include an alkali metal complex, an alkaline earth metal complex, or any combination thereof. A metal ion of an alkali metal complex may be a Li ion, a Na ion, a K ion, a Rb ion, or a Cs ion, and a metal ion of an alkaline earth metal complex may be a Be ion, a Mg ion, a Ca ion, a Sr ion, or a Ba ion.

A ligand coordinated with the metal ion of the alkali metal complex or with the metal ion of the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or Compound ET-D2:

ET-D1

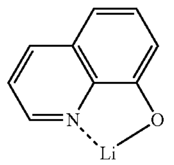

ET-D2

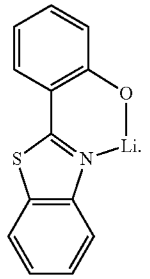

The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer including different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, iodides, etc.), or tellurides of the alkali metal, the alkaline earth metal, and the rare earth metal, or any combination thereof.

The alkali metal-containing compound may include: an alkali metal oxide, such as $Li_2O$, $Cs_2O$, $K_2O$, and the like; an alkali metal halide, such as LiF, NaF, CsF, KF, LiI, NaI, CsI, KI, and the like; or any combination thereof. The alkaline earth metal-containing compound may include an alkaline earth metal oxide, such as BaO, SrO, CaO, $Ba_xSr_{1-x}O$ (wherein x is a real number satisfying $0<x<1$), $Ba_xCa_{1-x}O$ (wherein x is a real number satisfying $0<x<1$), and the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth-metal complex, and the rare earth metal complex may include one of an alkali metal ion, an alkaline earth metal ion, and a rare earth metal ion, and a ligand bonded to the metal ion (for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof).

In an embodiment, the electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (for example, a compound represented by Formula 601).

In an embodiment, the electron injection layer may consist of an alkali metal-containing compound (for example, alkali metal halide); or the electron injection layer may consist of an alkali metal-containing compound (for example, an alkali metal halide), and an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, and the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the ranges above, satisfactory electron injection characteristics may be obtained without a substantial increase in driving voltage.

[Second Electrode 150]

The second electrode 150 may be arranged on the interlayer 130 having a structure as described above. The second electrode 150 may be a cathode, which is an electron injection electrode. A material for forming the second electrode 150 may be a material having a low work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single layer structure or a multi-layer structure.

[Capping Layer]

The light-emitting device 10 may include a first capping layer arranged outside the first electrode 110, and/or a second capping layer arranged outside the second electrode 150. For example, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer of the interlayer 130 of the light-emitting device 10 may be extracted toward the outside through the first electrode 110, which may be a semi-transmissive electrode or a transmissive electrode, and through the first capping layer. Light generated in an emission layer of the interlayer 130 of the light-emitting device 10 may be extracted toward the outside through the second electrode 150, which may be a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 10 is increased, so that the luminescence efficiency of the light-emitting device 10 may be improved.

The first capping layer and the second capping layer may each include a material having a refractive index greater than or equal to about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof.

In an embodiment, at least one of the first capping layer and the second capping layer may each independently include an amine group-containing compound.

In embodiments, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

CP1

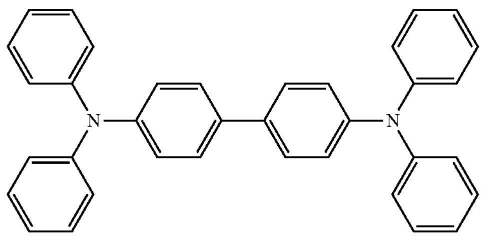

CP2

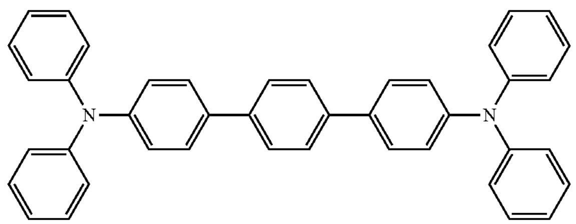

CP3

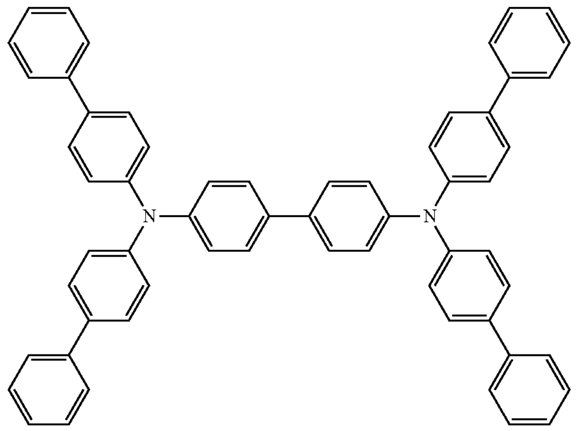

CP4

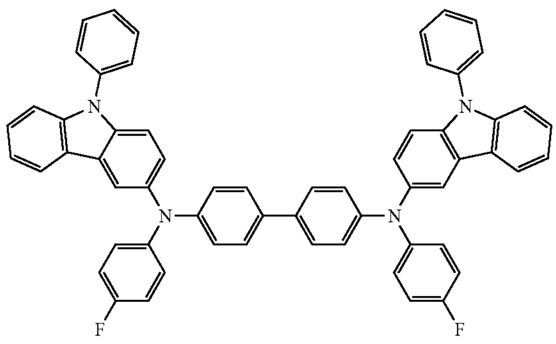

-continued

CP5

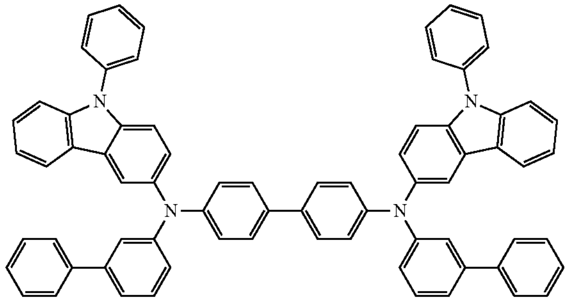

CP6

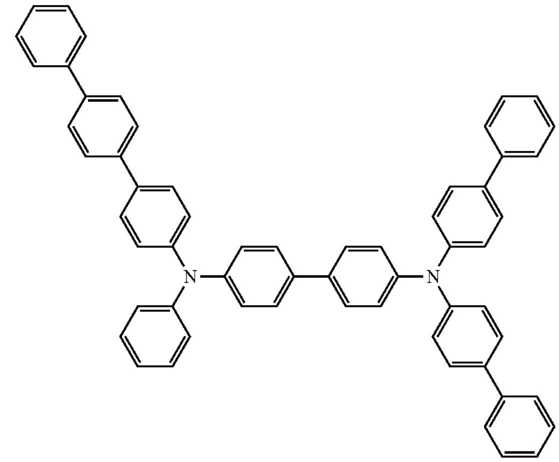

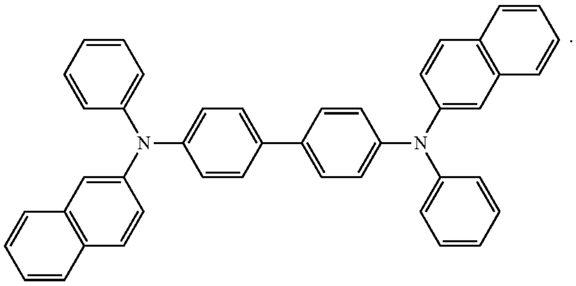

β-NPB

[Film]

The organometallic compound represented by Formula 1 may be included in various films. According to embodiments, a film including an organometallic compound represented by Formula 1 may be provided. The film may be, for example, an optical member (or a light control means) (for example, a color filter, a color conversion member, a capping layer, a light extraction efficiency enhancement layer, a selective light absorbing layer, a polarizing layer, a quantum dot-containing layer, or like), a light-blocking member (for example, a light reflective layer, a light absorbing layer, or the like), or a protective member (for example, an insulating layer, a dielectric layer, or the like).

[Electronic Apparatus]

The light-emitting device may be included in various electronic apparatuses. For example, the electronic apparatus including the light-emitting device may be a light-emitting apparatus, an authentication apparatus, and the like.

The electronic apparatus (for example, a light-emitting apparatus) may further include, in addition to the light-emitting device, a color filter, a color conversion layer, or a color filter and a color conversion layer. The color filter and/or the color conversion layer may be arranged in at least one traveling direction of light emitted from the light-emitting device. In embodiments, the light emitted from the light-emitting device may be blue light or white light. The light-emitting device may be the same as described herein. In an embodiment, the color conversion layer may include a quantum dot. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be arranged between the subpixels to define each subpixel.

The color filter may further include color filter areas and light-shielding patterns arranged between the color filter areas, and the color conversion layer may further include color conversion areas and light-shielding patterns arranged between the color conversion areas.

The color filter areas (or the color conversion areas) may include a first area emitting first color light, a second area emitting second color light, and/or a third area emitting third color light, wherein the first color light, the second color light, and/or the third color light may have different maximum emission wavelengths from one another. In an embodiment, the first color light may be red light, the second color light may be green light, and the third color light may be blue light. In embodiments, the color filter areas (or the color conversion areas) may include quantum dots. For example, the first area may include a red quantum dot, the second area may include a green quantum dot, and the third area may not include a quantum dot. The quantum dot may be the same as described herein. The first area, the second area, and/or the third area may each further include a scatterer.

In an embodiment, the light-emitting device may emit first light, the first area may absorb the first light to emit first-first color light, the second area may absorb the first light to emit second-first color light, and the third area may absorb the first light to emit third-first color light. The first-first color light, the second-first color light, and the third-first color light may have different maximum emission wavelengths. For example, the first light may be blue light, the first-first color light may be red light, the second-first color light may be green light, and the third-first color light may be blue light.

The electronic apparatus may further include a thin-film transistor, in addition to the light-emitting device as described herein. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, or the like.

The active layer may include crystalline silicon, amorphous silicon, an organic semiconductor, an oxide semiconductor, or the like.

The electronic apparatus may further include a sealing portion for sealing the light-emitting device. The sealing portion may be arranged between the color filter and/or the color conversion layer, and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin-film encapsulation layer, the electronic apparatus may be flexible.

Various functional layers may be further included on the sealing portion according to the use of the electronic apparatus, in addition to the color filter and/or the color conversion layer. Examples of the functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described above, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

[Electronic Equipment]

The light-emitting device may be included in various electronic equipment.

In embodiments, the electronic equipment including the light-emitting device may be a flat panel display, a curved display, a computer monitor, a medical monitor, a television, a billboard, an indoor lighting, an outdoor lighting, a signaling light, a head-up display, a fully transparent display, a partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro display, a 3D display, a virtual-reality display, an augmented-reality display, a vehicle, a video wall including multiple displays tiled together, a theater screen, a stadium screen, a phototherapy device, or a sign.

The light-emitting device may have excellent effects in terms of luminescence efficiency and a long lifespan, and thus the electronic equipment including the light-emitting device may have characteristics, such as high luminance, high resolution, and low power consumption.

Figure 2:
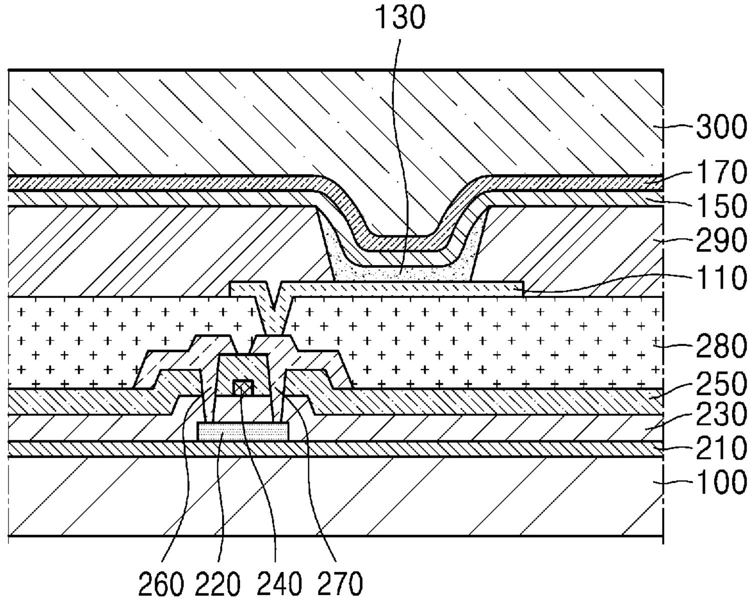
FIG. 2 is a schematic cross-sectional view of an electronic apparatus according to an embodiment.
Figure 3:
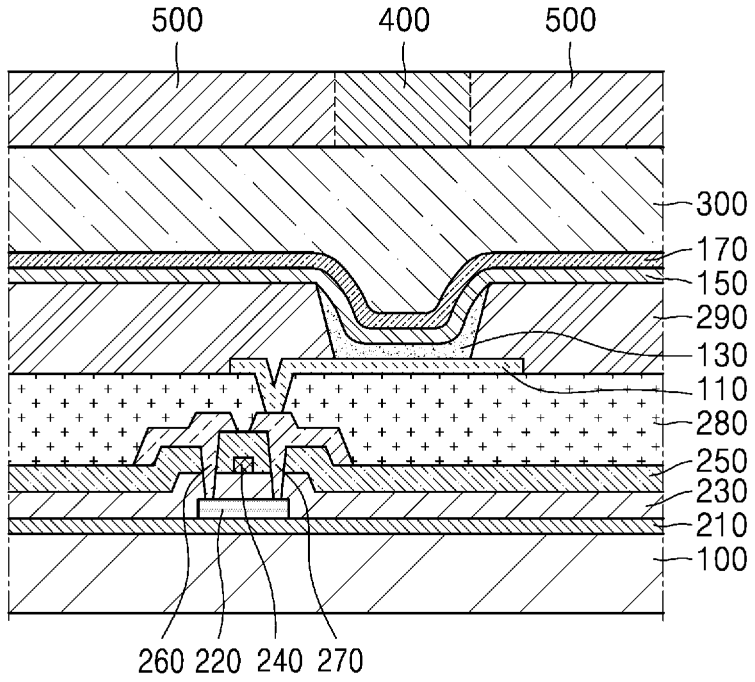
FIG. 3 is a schematic cross-sectional view of an electronic apparatus according to another embodiment.

[Description of FIGS. 2 and 3]

FIG. 2 is a schematic cross-sectional view of an electronic apparatus according to an embodiment.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be arranged on the substrate 100. The buffer layer 210 may prevent penetration of impurities through the substrate 100 and may provide a flat surface on the substrate 100.

A TFT may be arranged on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be arranged on the active layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be arranged on the interlayer insulating film 250. The interlayer insulating film 250 and the gate insulating film 230 may be formed to expose the source region and the drain region of the active layer 220, and the source electrode 260 and the drain electrode 270 may respectively contact the exposed portions of the source region and the drain region of the active layer 220.

The TFT may be electrically connected to a light-emitting device to drive the light-emitting device, and may be covered and protected by a passivation layer 280. The passivation layer 280 may include an inorganic insulating film, an organic insulating film, or any combination thereof. A light-emitting device may be provided on the passivation layer 280. The light-emitting device may include a first electrode 110, an interlayer 130, and a second electrode 150.

The first electrode 110 may be arranged on the passivation layer 280. The passivation layer 280 may not completely cover the drain electrode 270 and may expose a portion of the drain electrode 270, and the first electrode 110 may be electrically connected to the exposed portion of the drain electrode 270.

A pixel defining layer 290 including an insulating material may be arranged on the first electrode 110. The pixel defining layer 290 may expose a region of the first electrode 110, and an interlayer 130 may be formed in the exposed region of the first electrode 110. The pixel defining layer 290 may be a polyimide or polyacrylic organic film. Although not shown in FIG. 2, at least some layers of the interlayer 130 may extend beyond the upper portion of the pixel defining layer 290 to be provided in the form of a common layer.

The second electrode 150 may be arranged on the interlayer 130, and a capping layer 170 may be further included on the second electrode 150. The capping layer 170 may cover the second electrode 150.

The encapsulation portion 300 may be arranged on the capping layer 170. The encapsulation portion 300 may be arranged on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof; or any combination of the inorganic films and the organic films.

FIG. 3 is a schematic cross-sectional view of an electronic apparatus according to another embodiment.

The electronic apparatus of FIG. 3 may differ from the electronic apparatus of FIG. 2, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 3 may be a tandem light-emitting device.

Figure 4:
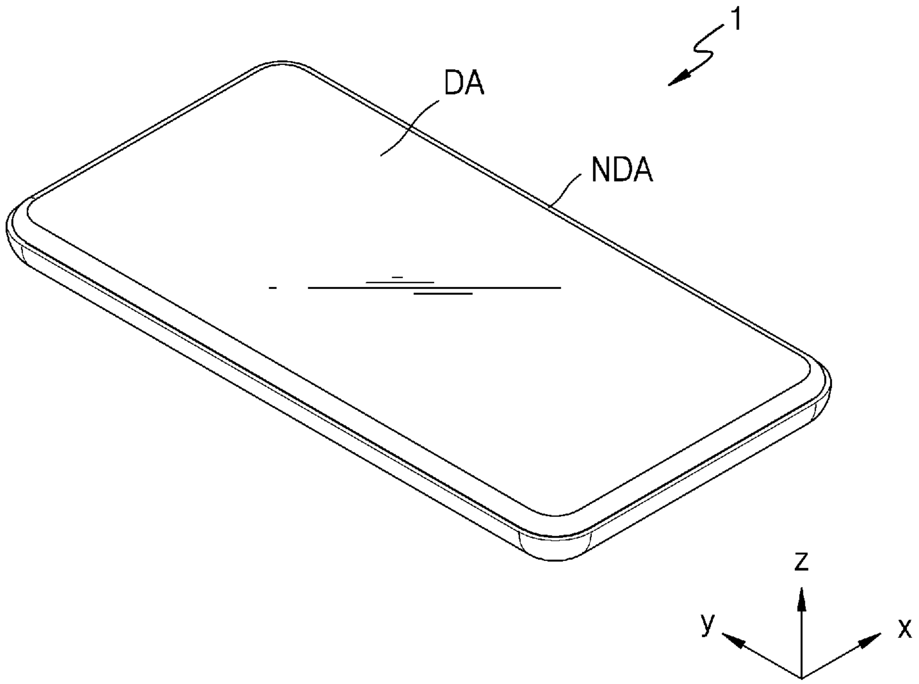
FIG. 4 is a schematic perspective view of an electronic equipment including a light-emitting device according to an embodiment.

[Description of FIG. 4]

FIG. 4 is a schematic perspective view of electronic equipment 1 including a light-emitting device according to an embodiment. The electronic equipment 1 may be a device that displays a moving image or still image, such as a mobile phone, a smart phone, a tablet personal computer (PC), a mobile communication terminal, an electronic notebook, an electronic book, a portable multimedia player (PMP), a navigation, or an ultra-mobile PC (UMPC) as well as various products, such as a television, a laptop, a monitor, a billboard, or an Internet of things (IOT). The electronic equipment 1 may be such a product as described above or a part thereof. In an embodiment, the electronic equipment 1 may be a wearable device, such as a smart watch, a watch phone, a glasses-type display, or a head mounted display (HMD), or a part of the wearable device. However, embodiments are not limited thereto. For example, the electron equipment 1 may include a dashboard of a vehicle, a center fascia of a vehicle, a center information display arranged on a dashboard of a vehicle, a room mirror display replacing a side mirror of a vehicle, an entertainment display for the rear seat of a vehicle, a display arranged on the back of the front seat, a head-up display (HUD) installed in the front of a vehicle or projected on a front window glass, or a computer-generated hologram augmented-reality head-up display (CGH AR HUD). FIG. 4 illustrates an embodiment in which the electronic equipment 1 is a smartphone for convenience of explanation.

The electronic equipment 1 may include a display area DA and a non-display area NDA outside the display area DA. A display device may implement an image through an array of pixels that are two-dimensionally arranged in the display area DA.

The non-display area NDA is an area that does not display an image, and may entirely surround the display area DA. A driver for providing electrical signals or power to display devices arranged on the display area DA may be arranged in the non-display area NDA. A pad, which is an area to which an electronic element or a printed circuit board may be electrically connected, may be arranged in the non-display area NDA.

In the electronic equipment 1, a length in the x-axis direction and a length in the y-axis direction may be different from each other. For example, as shown in FIG. 4, the length in the x-axis direction may be shorter than the length in the y-axis direction. In embodiments, the length in the x-axis direction may be the same as the length in the y-axis direction. In embodiments, the length in the x-axis direction may be longer than the length in the y-axis direction.

[Descriptions of FIGS. 5 and 6A to 6C]

Figure 5:
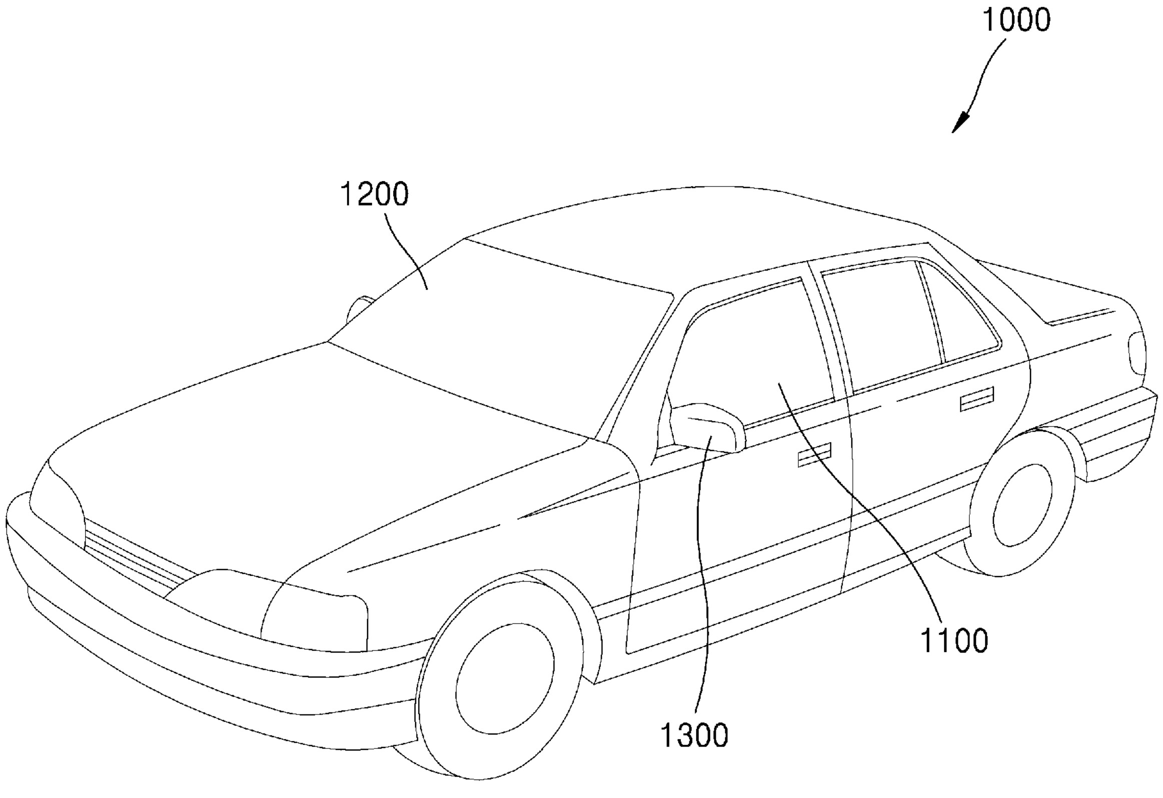
FIG. 5 is a schematic perspective view illustrating the exterior of a vehicle as an electronic equipment including a light-emitting device according to an embodiment.
Figure 6A:
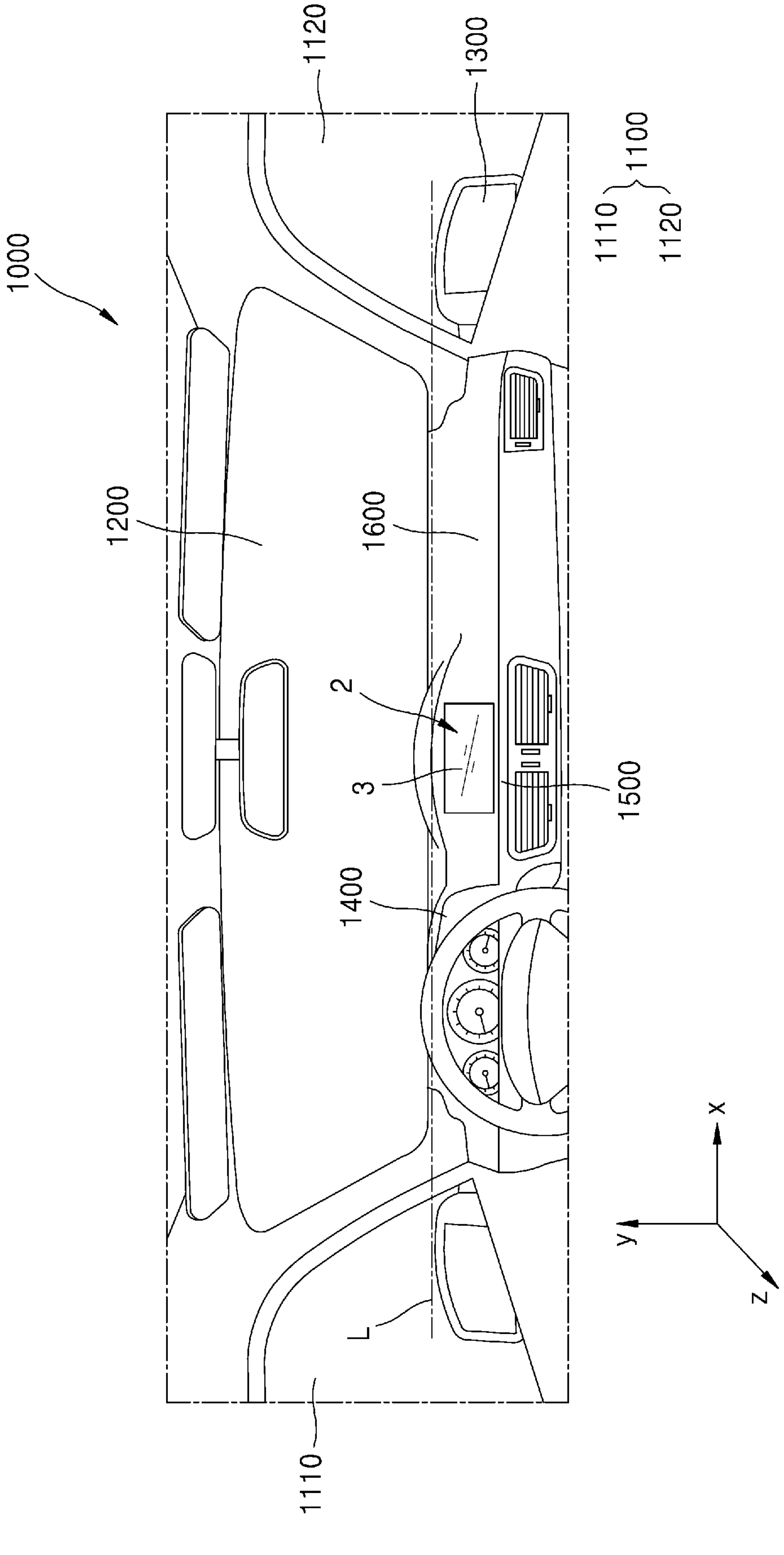
FIG. 6A to FIG. 6C are each a schematic diagram illustrating the interior of a vehicle according to an embodiment.
Figure 6B:
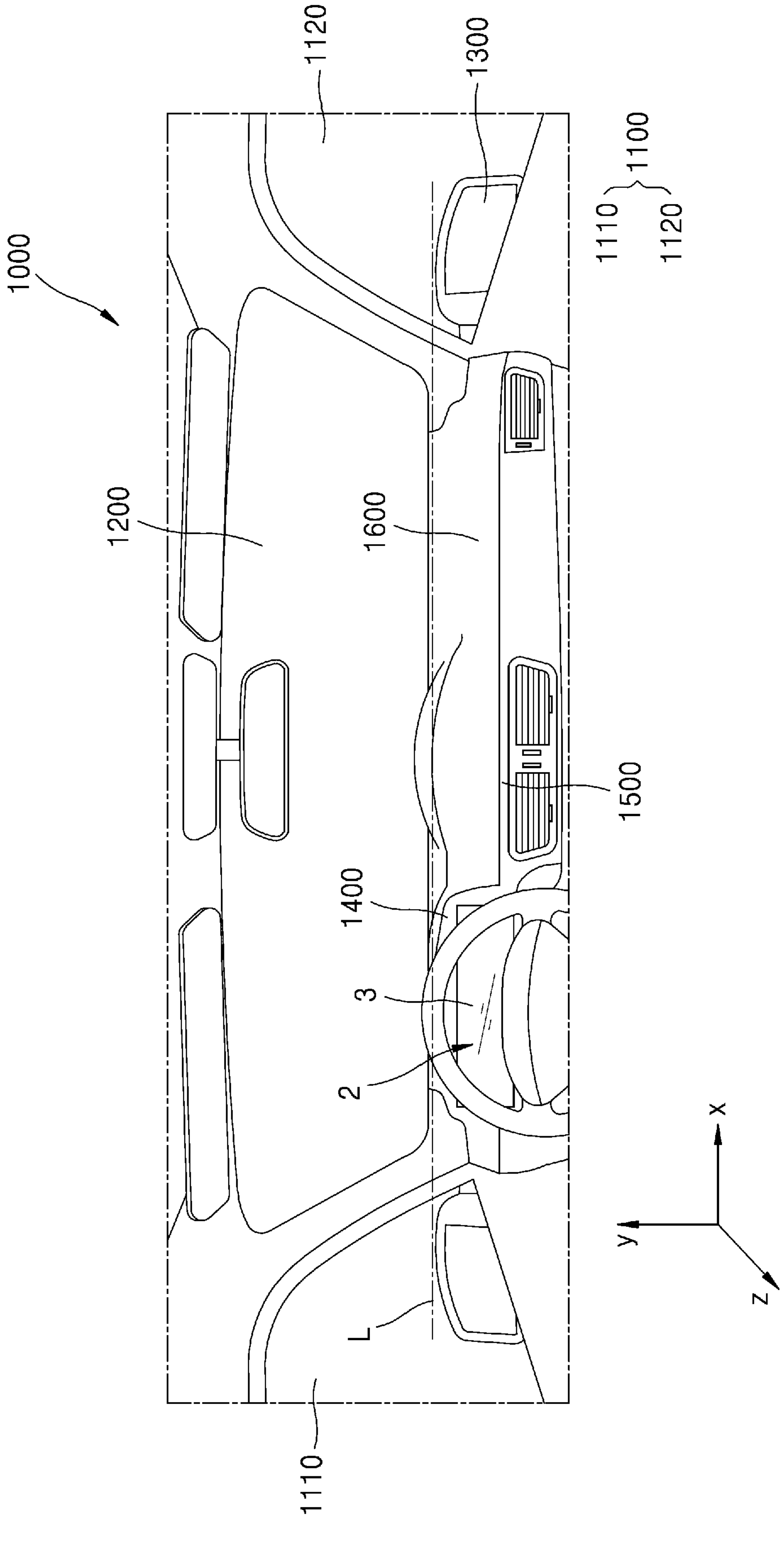
Figure 6C:
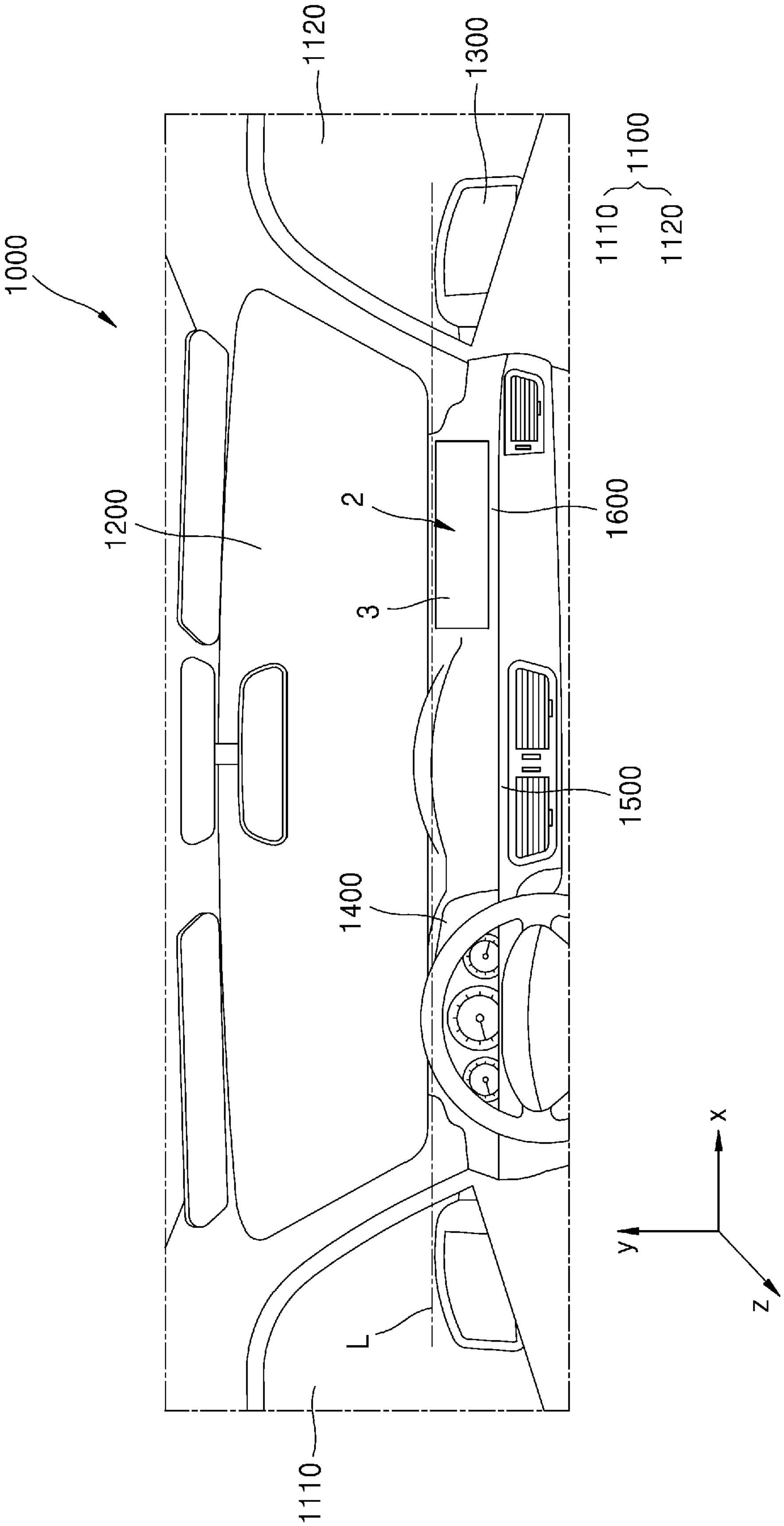

FIG. 5 is a schematic perspective view illustrating the exterior of a vehicle 1000 as an electronic equipment including a light-emitting device according to an embodiment. FIGS. 6A to 6C are each a schematic diagram illustrating the interior of a vehicle 1000 according to embodiments.

Referring to FIGS. 5, 6A, 6B, and 6C, the vehicle 1000 may refer to various apparatuses for moving a subject to be transported, such as a human, an object, or an animal, from a departure point to a destination. The vehicle 1000 may include a vehicle traveling on a road or track, a vessel moving over a sea or river, an airplane flying in the sky using the action of air, and the like.

The vehicle 1000 may travel on a road or a track. The vehicle 1000 may move in a direction according to the rotation of at least one wheel. For example, the vehicle 1000 may include a three-wheeled or four-wheeled vehicle, a construction machine, a two-wheeled vehicle, a prime mover device, a bicycle, and a train running on a track.

The vehicle 1000 may include a body having an interior and an exterior, and a chassis in which mechanical apparatuses necessary for driving are installed as other parts except for the body. The exterior of the vehicle body may include a front panel, a bonnet, a roof panel, a rear panel, a trunk, a filler provided at a boundary between doors, and the like. The chassis of the vehicle 1000 may include a power generating device, a power transmitting device, a driving device, a steering device, a braking device, a suspension device, a transmission device, a fuel device, front and rear wheels, left and right wheels, and the like.

The vehicle 1000 may include a side window glass 1100, a front window glass 1200, a side mirror 1300, a cluster 1400, a center fascia 1500, a passenger seat dashboard 1600, and a display device 2.

The side window glass 1100 and the front window glass 1200 may be partitioned by a filler arranged between the side window glass 1100 and the front window glass 1200.

The side window glass 1100 may be installed on the side of the vehicle 1000. In an embodiment, the side window glass 1100 may be installed on a door of the vehicle 1000. Multiple side window glasses 1100 may be provided and may face each other. In an embodiment, the side window glass 1100 may include a first side window glass 1110 and a second side window glass 1120. In an embodiment, the first side window glass 1110 may be arranged adjacent to the cluster 1400. The second side window glass 1120 may be arranged adjacent to the passenger seat dashboard 1600.

In an embodiment, the side window glasses 1100 may be spaced apart from each other in the x-direction or the −x-direction. For example, the first side window glass 1110 and the second side window glass 1120 may be spaced apart from each other in the x direction or the −x direction. An imaginary straight line L connecting the side window glasses 1100 may extend in the x-direction or the −x-direction. For example, an imaginary straight line L connecting the first side window glass 1110 and the second side window glass 1120 to each other may extend in the x direction or the −x direction.

The front window glass 1200 may be installed in the front of the vehicle 1000. The front window glass 1200 may be arranged between the side window glasses 1100 facing each other.

The side mirror 1300 may provide a rear view of the vehicle 1000. The side mirror 1300 may be installed on the exterior of the vehicle body. In an embodiment, multiple side mirrors 1300 may be provided. Any one of the side mirrors 1300 may be arranged outside the first side window glass 1110. Another one of the side mirrors 1300 may be arranged outside the second side window glass 1120.

The cluster 1400 may be arranged in front of the steering wheel. The cluster 1400 may include a tachometer, a speedometer, a coolant thermometer, a fuel gauge turn indicator, a high beam indicator, a warning lamp, a seat belt warning lamp, an odometer, a hodometer, an automatic shift selector indicator lamp, a door open warning lamp, an engine oil warning lamp, and/or a low fuel warning light.

The center fascia 1500 may include a control panel on which buttons for adjusting an audio device, an air conditioning device, and a seat heater are disposed. The center fascia 1500 may be arranged on one side of the cluster 1400.

A passenger seat dashboard 1600 may be spaced apart from the cluster 1400 with the center fascia 1500 arranged therebetween. In an embodiment, the cluster 1400 may be arranged to correspond to a driver seat (not shown), and the passenger seat dashboard 1600 may be disposed to correspond to a passenger seat (not shown). In an embodiment, the cluster 1400 may be adjacent to the first side window glass 1110, and the passenger seat dashboard 1600 may be adjacent to the second side window glass 1120.

In an embodiment, the display device 2 may include a display panel 3, and the display panel 3 may display an image. The display device 2 may be arranged inside the vehicle 1000. In an embodiment, the display device 2 may be arranged between the side window glasses 1100 facing each other. The display device 2 may be arranged on at least one of the cluster 1400, the center fascia 1500, and the passenger seat dashboard 1600.

The display device 2 may include an organic light-emitting display device, an inorganic electroluminescent (EL) display device, a quantum dot display device, and the like. Hereinafter, as the display device 2 according to an embodiment of the disclosure, an organic light-emitting display device display including the light-emitting device according to embodiments will be described as an example, but various types of display devices as described above may be used in embodiments of the disclosure.

Referring to FIG. 6A, the display device 2 may be arranged on the center fascia 1500. In an embodiment, the display device 2 may display navigation information. In an embodiment, the display device 2 may display audio, video, or information regarding vehicle settings.

Referring to FIG. 6B, the display device 2 may be arranged on the cluster 1400. When the display device 2 is arranged on the cluster 1400, the cluster 1400 may display driving information and the like through the display device 2. For example, the cluster 1400 may be implemented digitally. The digital cluster 1400 may display vehicle information and driving information as images. For example, a needle and a gauge of a tachometer and various warning light icons may be displayed by a digital signal.

Referring to FIG. 6C, the display device 2 may be arranged on the dashboard 1600 of the passenger seat. The display device 2 may be embedded in the passenger seat dashboard 1600 or arranged on the passenger seat dashboard 1600. In an embodiment, the display device 2 arranged on the dashboard 1600 for the passenger seat may display an image related to information displayed on the cluster 1400 and/or information displayed on the center fascia 1500. In embodiments, the display device 2 arranged on the passenger seat dashboard 1600 may display information different from information displayed on the cluster 1400 and/or information displayed on the center fascia 1500.

[Manufacturing Method]

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, laser-induced thermal imaging, and the like.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definitions of Terms

The term "$C_3$-$C_{60}$ carbocyclic group" as used herein may be a cyclic group consisting of carbon as the only ring-forming atoms and having three to sixty carbon atoms, and the term "$C_1$-$C_{60}$ heterocyclic group" as used herein may be a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the number of ring-forming atoms of the $C_1$-$C_{60}$ heterocyclic group may be from 3 to 61.

The term "cyclic group" as used herein may include the $C_3$-$C_{60}$ carbocyclic group or the $C_1$-$C_{60}$ heterocyclic group.

The term "π electron-rich $C_3$-$C_{60}$ cyclic group" as used herein may be a cyclic group that has three to sixty carbon atoms and may not include *—N=*' as a ring-forming moiety, and the term "π electron-deficient nitrogen-containing $C_1$-$C_{60}$ cyclic group" as used herein may be a heterocyclic group that has one to sixty carbon atoms and may include *—N=*' as a ring-forming moiety.

In embodiments, the $C_3$-$C_{60}$ carbocyclic group may be a T1 group, or a group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a group in which at least two T2 groups are condensed with each other, or a group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like), the π electron-rich $C_3$-$C_{60}$ cyclic group may be a T1 group, a group in which at least two T1 groups are condensed with each other, a T3 group, a group in which at least two T3 groups are condensed with each other, or a group in which at least one T3 group and at least one T1 group are condensed with each other (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, or the like), the π electron-deficient nitrogen-containing $C_1$-$C_{60}$ cyclic group may be a T4 group, a group in which at least two T4 groups are condensed with each other, a group in which at least one T4 group and at least one T1 group are condensed with each other, a group in which at least one T4 group and at least one T3 group are condensed with each other, or a group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, etc.) according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of a monovalent $C_3$-$C_{60}$ carbocyclic group and a monovalent $C_1$-$C_{60}$ heterocyclic group may include a $C_3$-$C_{10}$ cycloalkyl group, a $C_1$-$C_{10}$ heterocycloalkyl group, a $C_3$-$C_1$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of a divalent $C_3$-$C_{60}$ carbocyclic group and a divalent $C_1$-$C_{60}$ heterocyclic group may include a $C_3$-$C_1$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of a $C_2$-$C_{60}$ alkyl group, and examples thereof may include an ethenyl group, a propenyl group, a butenyl group, and the like. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of a $C_2$-$C_{60}$ alkyl group, and examples thereof may include an ethynyl group, a propynyl group, and the like. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —$O(A_{101})$ (wherein $A_{101}$ may be a $C_1$-$C_{60}$ alkyl group), and examples thereof may include a methoxy group, an ethoxy group, an isopropyloxy group, and the like.

The term "$C_3$-$C_1$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and the like. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group of 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, a tetrahydrothiophenyl group, and the like. The term "$C_1$-$C_{10}$ heterocycloalkylene group" as used herein may be a divalent group having a same structure as the $C_1$-$C_{10}$ heterocycloalkyl group.

The term "$C_3$-$C_1$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, a cycloheptenyl group, and the like. The term "$C_3$-$C_{10}$ cycloalkenylene group" as used herein may be a divalent group having a same structure as the $C_3$-$C_1$ cycloalkenyl group.

The term "$C_1$-$C_{10}$ heterocycloalkenyl group" as used herein may be a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. When the $C_6$-$C_{60}$ aryl group and the $C_6$-$C_{60}$ arylene group each independently include two or more rings, the respective rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, an indeno anthracenyl group, and the like. The term "divalent non-aromatic condensed polycyclic group" as used herein may be a divalent group having a same structure as the monovalent non-aromatic condensed polycyclic group described above.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as the monovalent non-aromatic condensed heteropolycyclic group described above.

The term "$C_6$-$C_{60}$ aryloxy group" as used herein may be a group represented by —O($A_{102}$) (wherein $A_{102}$ may be a $C_6$-$C_{60}$ aryl group), and the term "$C_6$-$C_{60}$ arylthio group" as used herein may be a group represented by —S($A_{103}$) (wherein $A_{103}$ may be a $C_6$-$C_{60}$ aryl group).

The term "$C_7$-$C_{60}$ arylalkyl group" as used herein may be a group represented by -($A_{104}$)($A_{105}$) (wherein $A_{104}$ may be a $C_1$-$C_{54}$ alkylene group, and $A_{105}$ may be a $C_6$-$C_{59}$ aryl group), and the term "$C_2$-$C_{60}$ heteroarylalkyl group" as used herein may be a group represented by -($A_{106}$)($A_{107}$) (wherein $A_{106}$ may be a $C_1$-$C_{59}$ alkylene group, and $A_{107}$ may be a $C_1$-$C_{59}$ heteroaryl group).

The group "$R_{10a}$" as used herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$).

In the specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as used herein may be any atom other than a carbon atom or a hydrogen atom. Examples of the heteroatom may include O, S, N, P, Si, B, Ge, Se, or any combination thereof.

The term "Ph" as used herein refers to a phenyl group, the term "Me" as used herein refers to a methyl group, the term "Et" as used herein refers to an ethyl group, the terms "tert-Bu" or "But" as used herein each refer to a tert-butyl group, and the term "OMe" as used herein refers to a methoxy group.

The term "biphenyl group" as used herein may be a "phenyl group substituted with a phenyl group." For example, the "biphenyl group" may be a substituted phenyl group having a $C_6$-$C_{60}$ aryl group as a substituent.

The term "terphenyl group" as used herein may be a "phenyl group substituted with a biphenyl group." For example, the "terphenyl group" may be a substituted phenyl group having, as a substituent, a $C_6$-$C_{60}$ aryl group substituted with a $C_6$-$C_{60}$ aryl group.

The symbols *, *', and *" as used herein, unless defined otherwise, each refer to a binding site to a neighboring atom in a corresponding formula or moiety.

Hereinafter, compounds according to embodiments and light-emitting devices according to embodiments will be described in detail with reference to the Synthesis Examples and Examples. The wording "B was used instead of A" used in describing Synthesis Examples means that an identical molar equivalent of B was used in place of A.

EXAMPLES

Synthesis Example 1: Synthesis of Compound 1

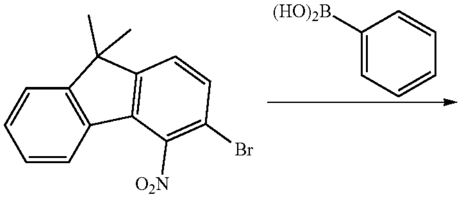

-continued

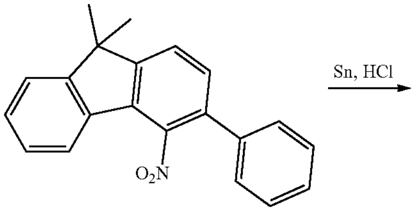

[1-A]

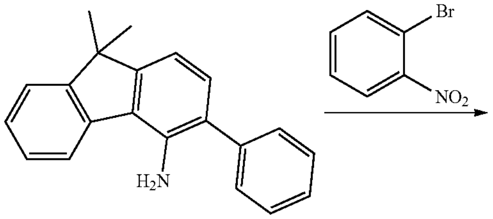

[1-B]

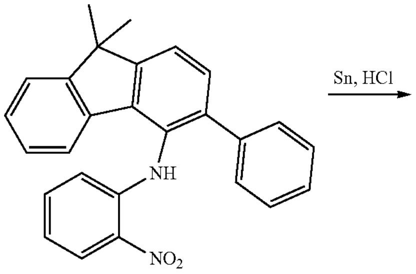

[1-C]

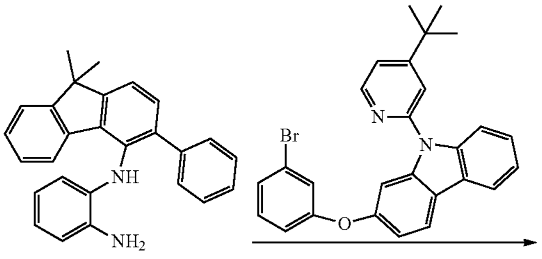

[1-D]

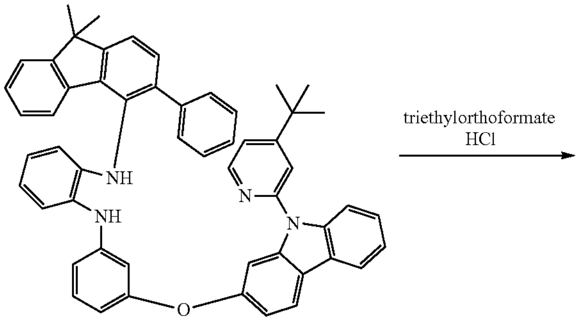

[1-E]

-continued

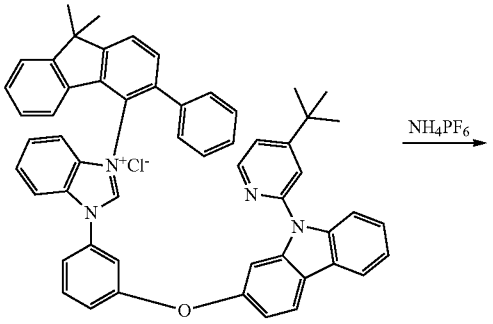

[1-F]

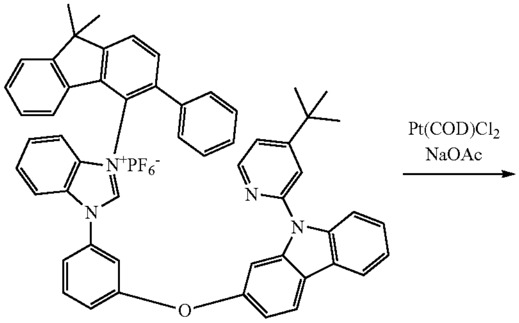

[1-G]

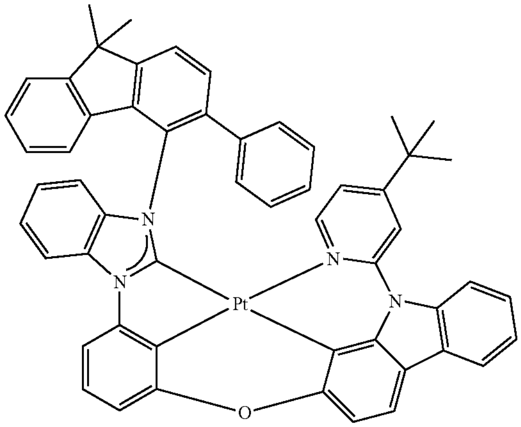

1

1) Synthesis of Intermediate [1-A]

11.1 g (35.0 mmol) of 3-bromo-9,9-dimethyl-4-nitro-9H-fluorene, 6.4 g (52.5 mmol) of phenyl boronic acid, 2.0 g (1.8 mmol) of tetrakis(triphenylphosphine)palladium, and 9.7 g (70.0 mmol) of potassium carbonate were added to a reaction vessel, and suspended in 350 mL of a mixed solution containing tetrahydrofuran and water at a volume ratio of 3:1. The reaction temperature was raised to 80° C., and the reaction mixture was stirred for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 9.0 g (28.4 mmol) of a target compound.

2) Synthesis of Intermediate [1-B]

9.0 g (28.4 mmol) of Intermediate [1-A], 11.7 g (99.4 mmol) of tin, and 13.6 mL (156.2 mmol) of HCl 35 wt % solution were added to a reaction vessel, and suspended in 280 mL of ethanol. The reaction temperature was raised to 80° C., and the reaction mixture was stirred for 12 hours. After completion of the reaction, the reaction mixture was cooled at room temperature, and a saturated aqueous sodium bicarbonate solution was used for neutralization. An organic layer was extracted with ethyl acetate, and the extracted organic layer was washed with a saturated aqueous sodium chloride solution and dried by using sodium sulfate. A residue obtained by removing the solvent therefrom was separated by column chromatography to obtain 6.3 g (22.2 mmol) of a target compound.

3) Synthesis of Intermediate [1-C]

6.3 g (22.2 mmol) of Intermediate [1-B], 6.7 g (33.3 mmol) of 1-bromo-2-nitrobenzene, 1.0 g (1.1 mmol) of tris(dibenzylideneacetone)dipalladium, 0.7 g (1.7 mmol) of SPhos, and 6.4 g (66.6 mmol) of sodium tert-butoxide were added to a reaction vessel, and suspended in 220 mL of toluene. The reaction temperature was raised to 110° C., and the reaction mixture was stirred for 3 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 7.0 g (17.3 mmol) of a target compound.

4) Synthesis of Intermediate [1-D]

7.0 g (17.3 mmol) of Intermediate [1-C], 7.1 g (60.6 mmol) of tin, and 8.3 mL (95.2 mmol) of HCl 35 wt % solution were added to a reaction vessel, and suspended in 170 mL of ethanol. The reaction temperature was raised to 80° C., and the reaction mixture was stirred for 12 hours. After completion of the reaction, the reaction mixture was cooled at room temperature, and a saturated aqueous sodium bicarbonate solution was used for neutralization. An organic layer was extracted with ethyl acetate, and the extracted organic layer was washed with a saturated aqueous sodium chloride solution and dried by using sodium sulfate. A residue obtained by removing the solvent therefrom was separated by column chromatography to obtain 5.5 g (14.7 mmol) of a target compound.

5) Synthesis of Intermediate [1-E]

5.5 g (14.7 mmol) of Intermediate [1-D], 7.6 g (16.2 mmol) of 2-(3-bromophenoxy)-9-(4-(tert-butyl)pyridin-2-yl)-9H-carbazole, 0.6 g (0.7 mmol) of tris(dibenzylideneacetone)dipalladium, 0.5 g (1.1 mmol) of SPhos, and 4.2 g (44.1 mmol) of sodium tert-butoxide were added to a reaction vessel, and suspended in 150 mL of toluene. The reaction temperature was raised to 110° C., and the reaction mixture was stirred for 3 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 7.4 g (9.6 mmol) of a target compound.

6) Synthesis of Intermediate [1-F]

7.4 g (9.6 mmol) of Intermediate [1-E], 64 mL (480 mmol) of triethyl orthoformate, and 4.5 mL (52.8 mmol) of HCl 35 wt % solution were added to a reaction vessel, heated, and stirred at 80° C. for 12 hours. After completion of the reaction, the reaction mixture was cooled to room temperature, and a residue obtained by removing the solvent therefrom was separated by column chromatography to obtain 6.4 g (7.9 mmol) of a target compound.

7) Synthesis of Intermediate [1-G]

6.4 g (7.9 mmol) of Intermediate [1-F] and 2.6 g (15.8 mmol) of ammonium hexafluorophosphate were added to a reaction vessel, and suspended in a mixed solution containing methanol and water at a volume ratio of 2:1. The reaction mixture was stirred at room temperature for 12 hours. The resulting solid was filtered and separated by column chromatography to obtain 6.6 g (7.1 mmol) of a target compound.

8) Synthesis of Compound 1

6.6 g (7.1 mmol) of Intermediate [1-G], 2.8 g (7.5 mmol) of dichloro(1,5-cyclooctadiene)platinum, and 1.2 g (14.2 mmol) of sodium acetate were added to a reaction vessel, and suspended in 280 m L of dioxane. The reaction mixture was heated, and stirred at 110° C. for 72 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 1.1 g (1.1 mmol) of a target compound.

Synthesis Example 2: Synthesis of Compound 2

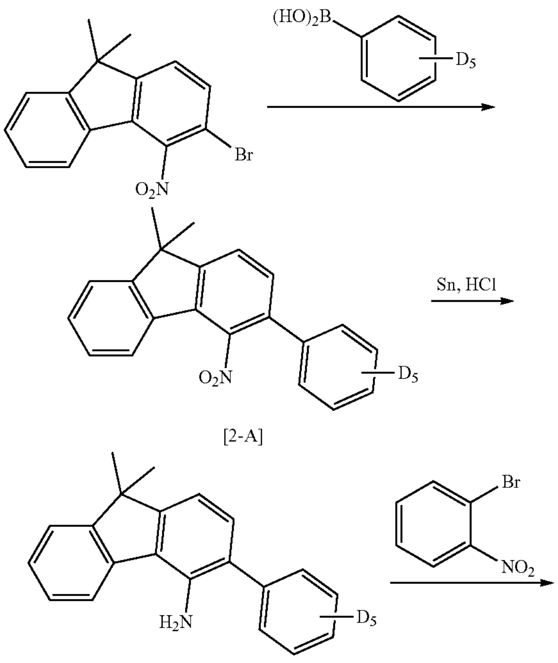

[2-A]

[2-B]

-continued
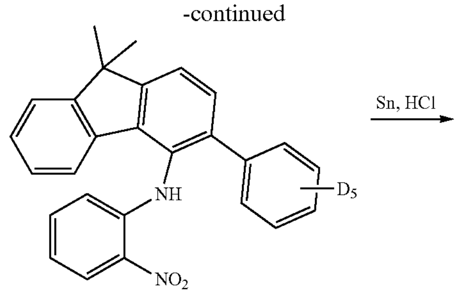
[2-C]
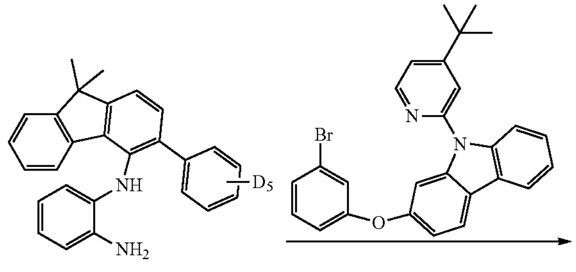
[2-D]
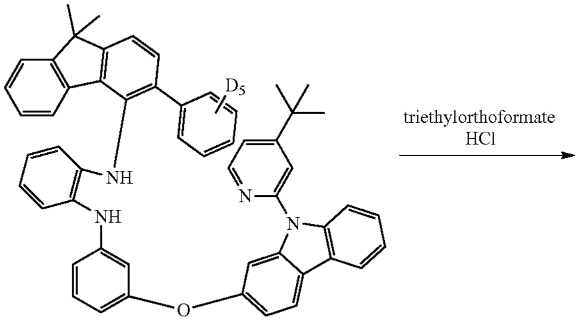
[2-E]
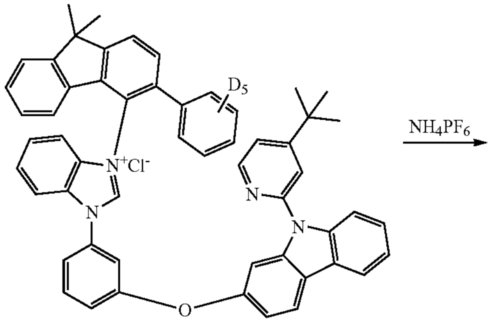
[2-F]
-continued
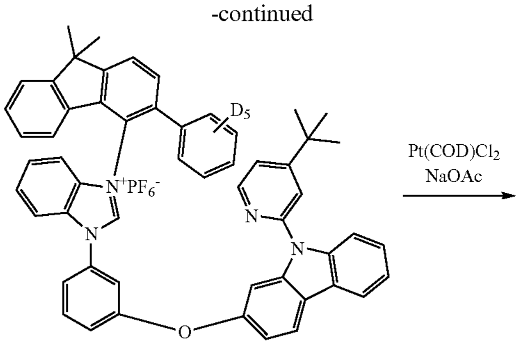
[2-G]
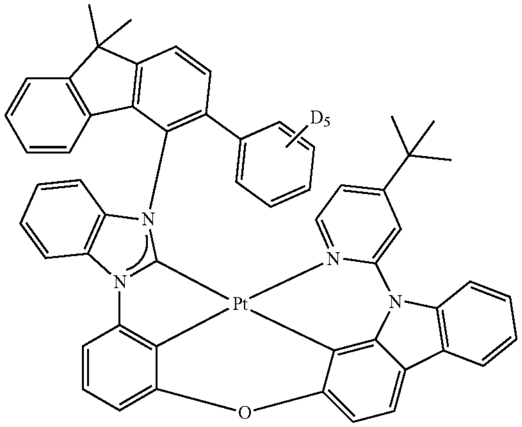
2
0.9 g (0.9 mmol) of Compound 2 was obtained in the same manner as in Synthesis Example 1, except that phenyl boronic acid-$D_5$ was used instead of phenyl boronic acid in synthesizing Intermediate [1-A] of Synthesis Example 1.
Synthesis Example 3: Synthesis of Compound 45
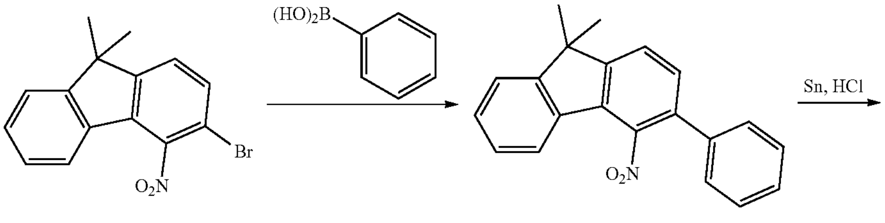
[1-A]

-continued
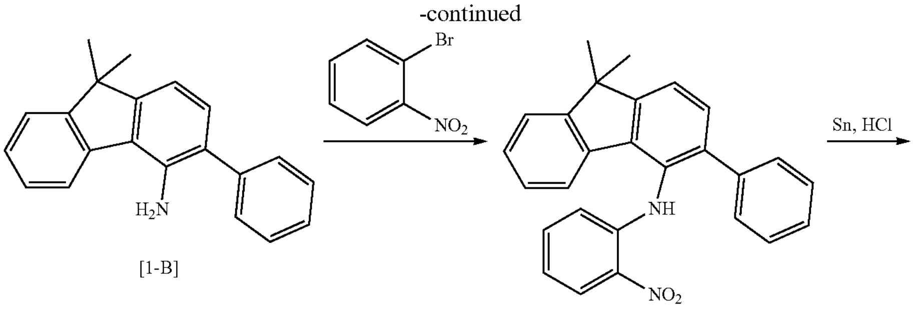
[1-B]
[1-C]
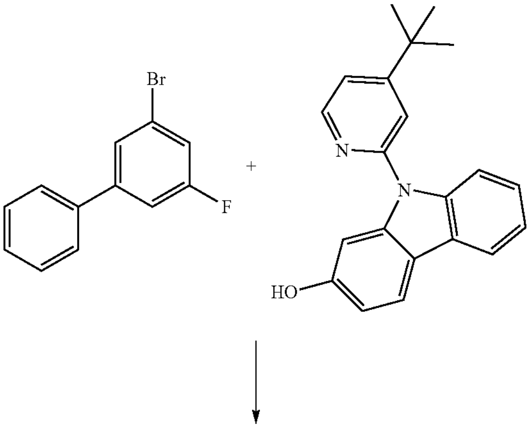
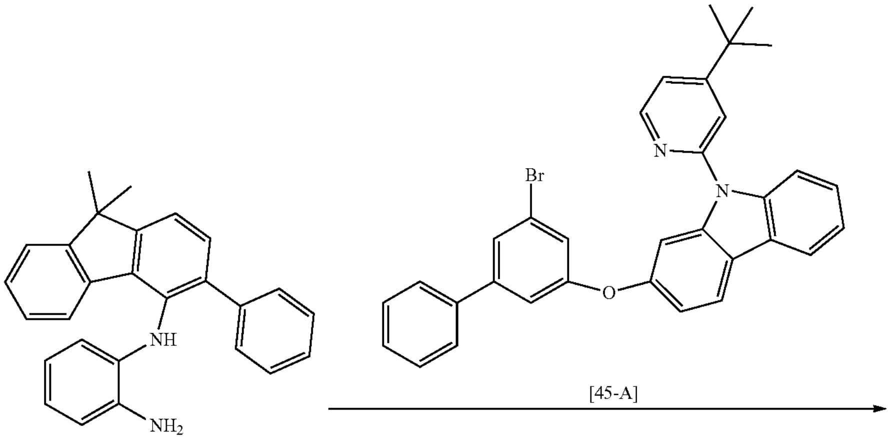
[45-A]
[1-D]

-continued
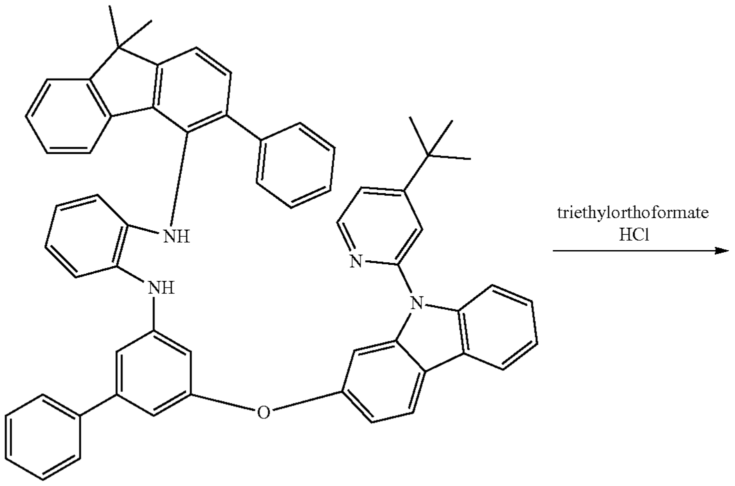
[45-B]
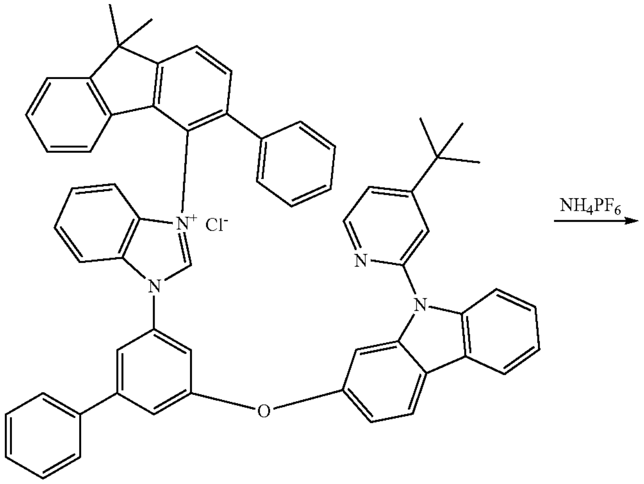
[45-C]
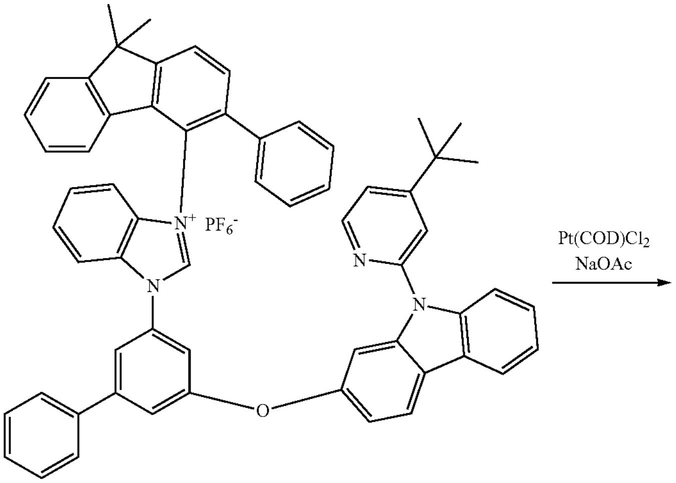
[45-D]

-continued

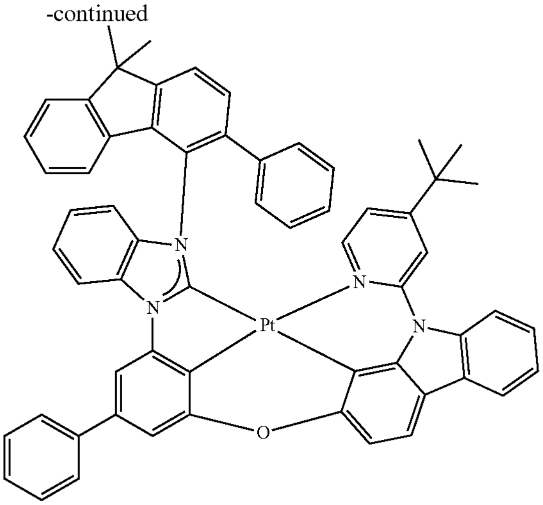

45

1) Synthesis of Intermediate [45-A]

6.3 g (20.0 mmol) of 9-(4-(tert-butyl)pyridin-2-yl)-9H-carbazol-2-ol, 10.0 g (40.0 mmol) of 3-bromo-5-fluoro-1,1'-biphenyl, and 12.7 g (60 mmol) of potassium phosphate tribasic were added to a reaction vessel, and suspended in 200 m L of dimethyl sulfoxide. The reaction mixture was heated, and stirred at 160° C. for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 9.3 g (17.0 mmol) of a target compound.

2) Synthesis of Compound 45

0.8 g (0.8 mmol) of Compound 45 was obtained in the same manner as in Synthesis Example 1, except that Intermediate [45-A] was used instead of 2-(3-bromophenoxy)-9-(4-(tert-butyl)pyridin-2-yl)-9H-carbazole in synthesizing Intermediate [1-E] of Synthesis Example 1.

Synthesis Example 4: Synthesis of Compound 51

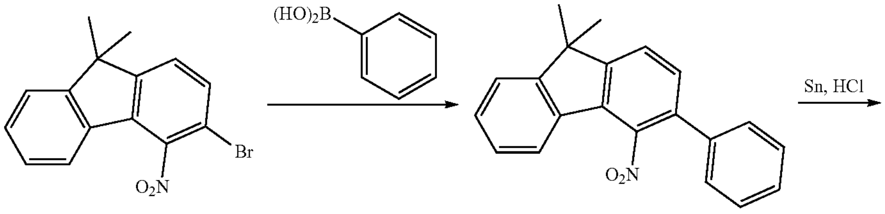

[1-A]

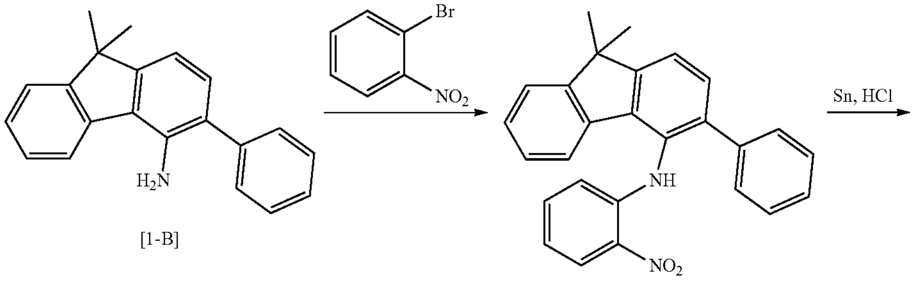

[1-B]

[1-C]

-continued
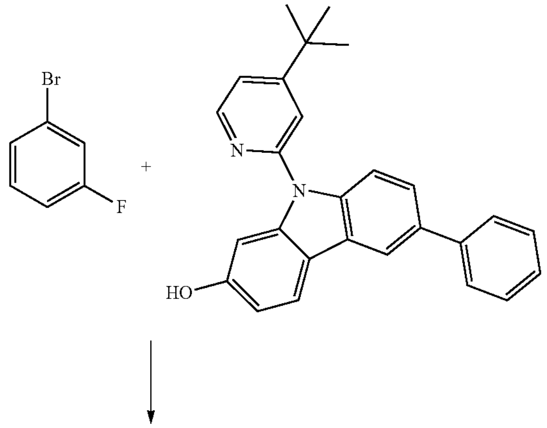
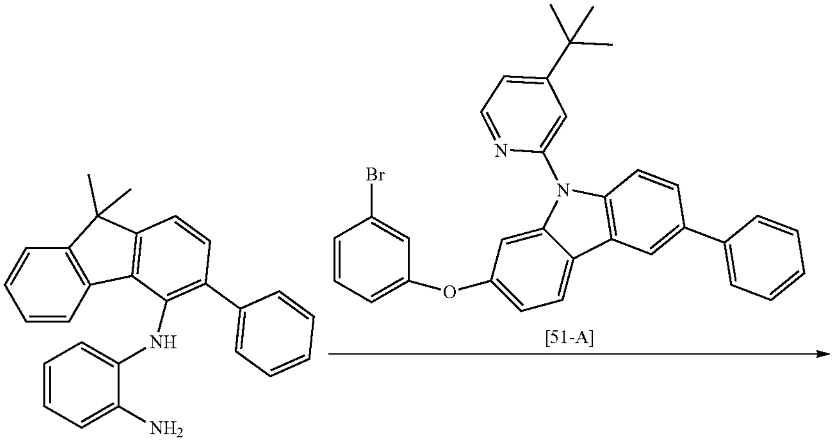
[1-D]
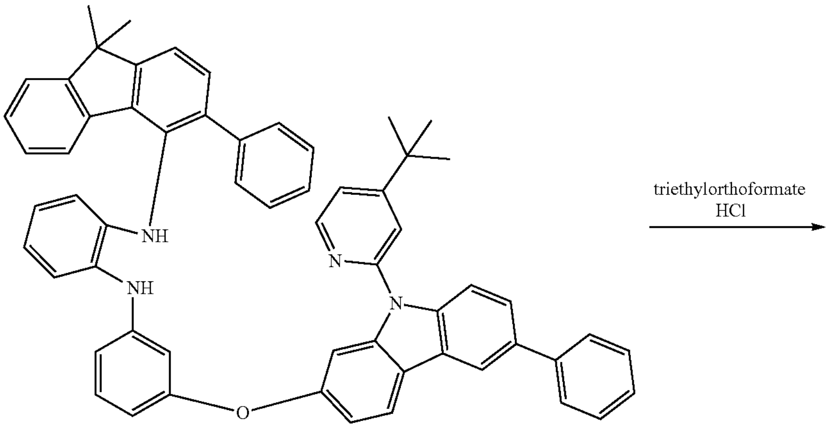
[51-B]

-continued

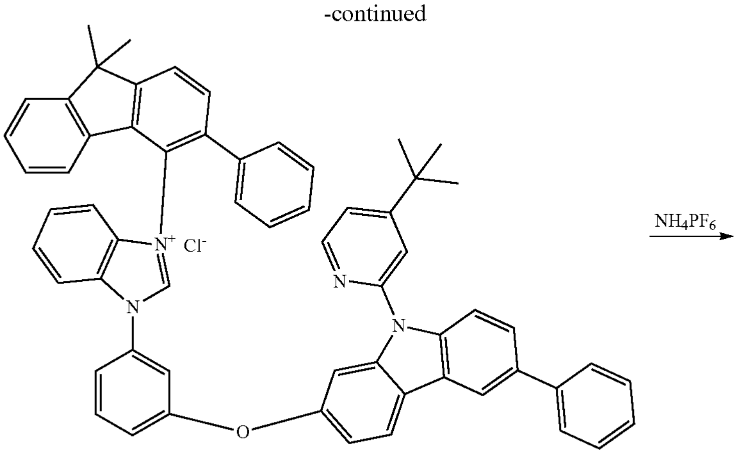

[51-C]

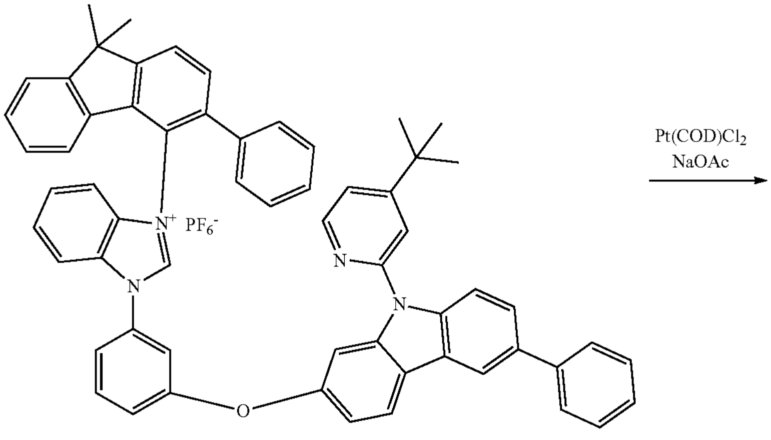

[51-D]

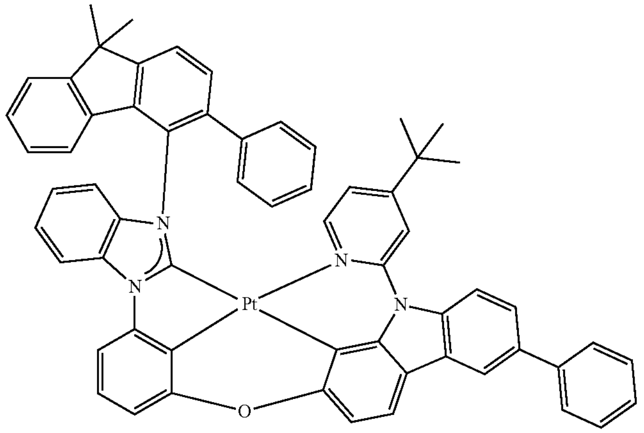

51

1) Synthesis of Intermediate [51-A]

7.9 g (20.0 mmol) of 9-(4-(tert-butyl)pyridin-2-yl)-6-phenyl-9H-carbazol-2-ol, 10.0 g (40.0 mmol) of 3-bromo-5-fluoro-1,1'-biphenyl, and 12.7 g (60.0 mmol) of potassium phosphate tribasic were added to a reaction vessel, and suspended in 200 mL of dimethyl sulfoxide. The reaction mixture was heated, and stirred at 160° C. for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 9.1 g (16.6 mmol) of a target compound.

2) Synthesis of Compound 51

0.9 g (0.9 mmol) of Compound 51 was obtained in the same manner as in Synthesis Example 1, except that Intermediate [51-A] was used instead of 2-(3-bromophenoxy)-

9-(4-(tert-butyl)pyridin-2-yl)-9H-carbazole in synthesizing Intermediate [1-E] of Synthesis Example 1.
Synthesis Example 5: Synthesis of Compound 70
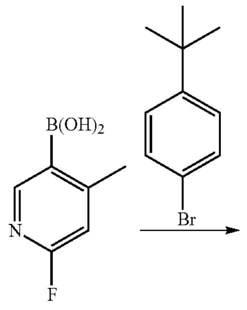
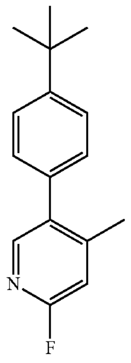
[70-A]
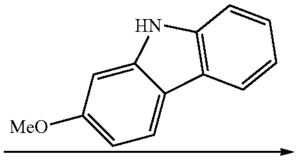
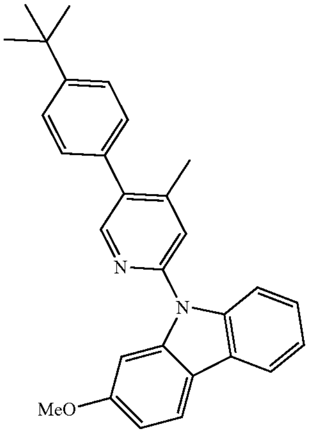
[70-B]
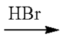
-continued
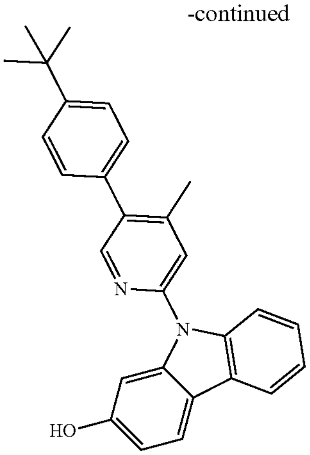
[70-C]
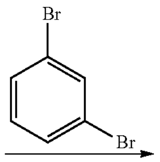
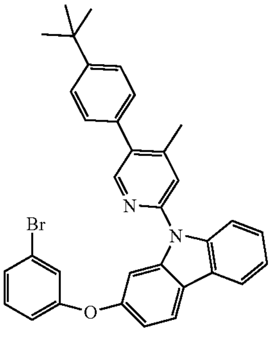
[70-D]
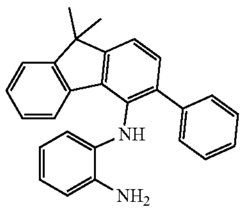
[1-D]
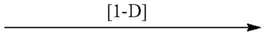
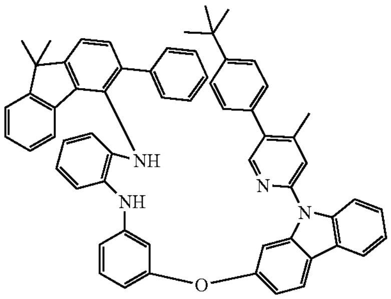
[70-E]
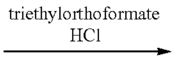
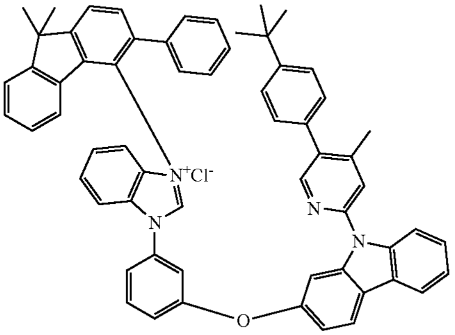
[70-F]
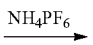

-continued

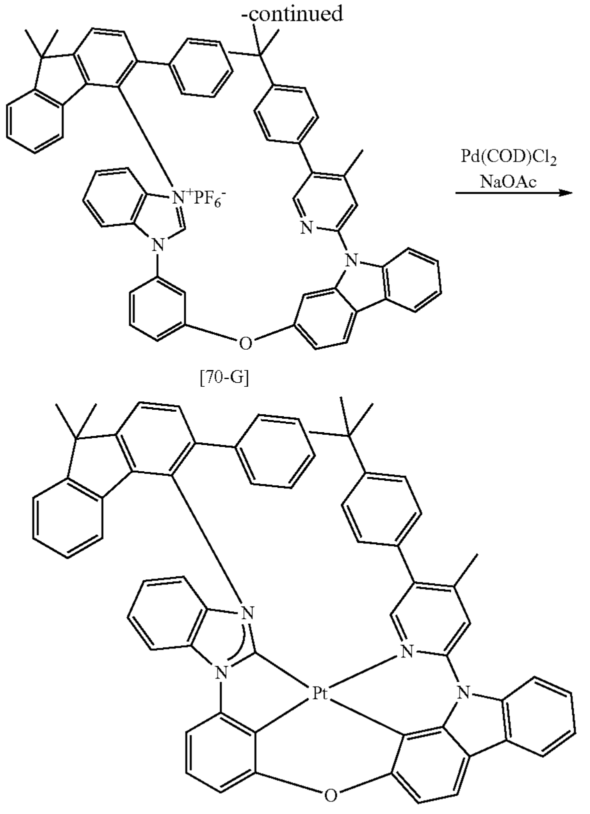

[70-G]

70

1) Synthesis of Intermediate [70-A]

7.7 g (50.0 mmol) of (6-fluoro-4-methylpyridin-3-yl) boronic acid, 16.0 g (75.0 mmol) of 1-bromo-4-(tert-butyl) benzene, 2.8 g (2.5 mmol) of tetrakis(triphenylphosphine) palladium, and 13.9 g (100.0 mmol) of potassium carbonate were added to a reaction vessel, and suspended in 500 mL of a mixed solution containing tetrahydrofuran and water at a volume ratio of 3:1. The reaction temperature was raised to 80° C., and the reaction mixture was stirred for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 10.0 g (41.0 mmol) of a target compound.

2) Synthesis of Intermediate [70-B]

10.0 g (41.0 mmol) of Intermediate [70-A], (49.2 mmol) of 2-methoxy-9H-carbazole, and 17.4 g (82.0 mmol) of potassium phosphate tribasic were added to a reaction vessel, and suspended in 410 mL of dimethyl sulfoxide. The reaction mixture was heated, and stirred at 160° C. for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 13.6 g (32.4 mmol) of a target compound.

3) Synthesis of Intermediate [70-C]

13.6 g (32.4 mmol) of Intermediate [70-B] was added to a reaction vessel, and suspended in an excess of bromic acid. The reaction temperature was raised to 80° C., and the reaction mixture was stirred for 12 hours. After completion of the reaction, the reaction mixture was cooled to room temperature, neutralized with an aqueous sodium bicarbonate solution, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 10.3 g (25.3 mmol) of a target compound.

4) Synthesis of Intermediate [70-D]

10.3 g (25.3 mmol) of Intermediate [70-C], 11.9 g (50.6 mmol) of 1,3-dibromobenzene, 480 mg (2.5 mmol) of copper(I) iodide, 920 mg (5.1 mmol) of phenanthroline, and 10.7 g (50.6 mmol) of potassium phosphate tribasic were added to a reaction vessel, and suspended in 250 mL of dimethyl sulfoxide. The reaction mixture was heated, and stirred at 160° C. for 12 hours. After completion of the reaction, the reaction mixture was cooled to room temperature, and extracted with ethyl acetate. An organic layer extracted therefrom was washed with a saturated aqueous sodium chloride solution, and dried using sodium sulfate. A residue obtained by removing the solvent therefrom was separated by column chromatography to obtain 8.6 g (15.4 mmol) of a target compound.

5) Synthesis of Compound 70

0.7 g (0.7 mmol) of Compound 70 was obtained in the same manner as in Synthesis Example 1, except that Intermediate [70-D] was used instead of 2-(3-bromophenoxy)-9-(4-(tert-butyl)pyridin-2-yl)-9H-carbazole in synthesizing Intermediate [1-E] of Synthesis Example 1.

$^1$H NMR and MS/FAB of the compounds synthesized according to Synthesis Examples 1 to 5 are shown in Table 1. Synthesis methods of compounds other than the compounds synthesized in Synthesis Examples 1 to 5 may be readily recognized by those skilled in the art by referring to the synthesis paths and source materials.

TABLE 1

| Compound | $^1$H NMR ($CDCl_3$, 400 MHz) | MS/FAB found | MS/FAB calc. |
|---|---|---|---|
| 1 | 8.77 (m, 1H), 8.45 (m, 1H), 8.21 (m, 1H), 7.95 (m, 1H), 7.63 (m, 1H), 7.55-7.54 (m, 2H), 7.47-7.41 (m, 9H), 7.18-7.15 (m, 4H), 7.05-7.03 (m, 2H), 6.93-6.90 (m, 3H), 6.69-6.67 (m, 2H), 1.71 (s, 3H), 1.68 (s, 3H), 1.39 (s, 9H) | 969.3010 | 969.3006 |
| 2 | 8.75 (m, 1H), 8.48 (m, 1H), 8.23 (m, 1H), 7.97 (m, 1H), 7.64 (m, 1H), 7.56-7.55 (m, 2H), 7.46-7.42 (m, 6H), 7.17-7.15 (m, 4H), 6.92-6.90 (m, 3H), 6.70-6.67 (m, 2H), 1.72 (s, 3H), 1.68 (s, 3H), 1.40 (s, 9H) | 974.3323 | 974.3320 |

TABLE 1-continued
| Compound | $^1$H NMR ($CDCl_3$, 400 MHz) | MS/FAB found | MS/FAB calc. |
|---|---|---|---|
| 45 | 8.81 (m, 1H), 8.40 (m, 1H), 8.22 (m, 1H), 7.91 (m, 1H), 7.75-7.73 (m, 2H), 7.70 (m, 1H), 7.55-7.50 (m, 5H), 7.41-7.37 (m, 8H), 7.25 (m, 1H), 7.19 (m, 1H), 7.15-7.13 (m, 2H), 7.05-7.03 (m, 2H), 6.99-6.95 (m, 4H), 6.71 (m, 1H), 1.69 (s, 6H), 1.33 (s, 9H) | 1045.3315 | 1045.3319 |
| 51 | 8.79 (m, 1H), 8.35 (m, 1H), 7.99 (m, 1H), 7.90-7.88 (m, 2H), 7.75-7.73 (m, 3H), 7.65 (m, 1H), 7.54 (m, 1H), 7.48-7.40 (m, 10H), 7.27 (m, 1H), 7.17-7.16 (m, 3H), 7.04-7.01 (m, 2H), 6.93-6.91 (m, 2H), 6.88 (m, 1H), 6.65-6.62 (m, 2H), 1.70 (s, 3H), 1.68 (s, 6H), 1.35 (s, 9H) | 1045.3321 | 1045.3319 |
| 70 | 9.11 (m, 1H), 8.41 (m, 1H), 8.19 (m, 1H), 7.95 (m, 1H), 7.65 (m, 1H), 7.55-7.54 (m, 3H), 7.51-7.38 (m, 8H), 7.31-7.27 (m, 3H), 7.19-7.15 (m, 4H), 7.11-7.09 (m, 2H), 6.99-6.97 (m, 2H), 6.85 (m, 1H), 6.66-6.63 (m, 2H), 1.69 (s, 3H), 2.67 (s, 3H), 1.67 (s, 3H), 1.36 (s, 9H) | 1059.3480 | 1059.3476 |
1
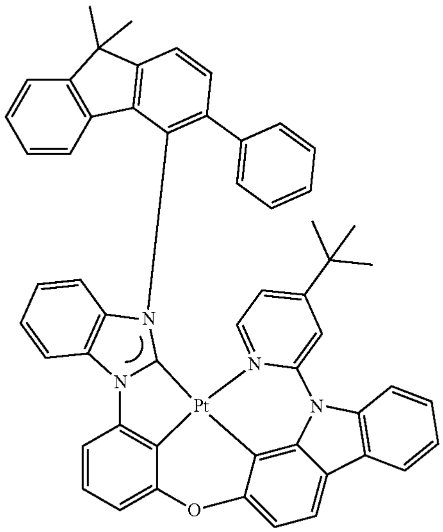
2
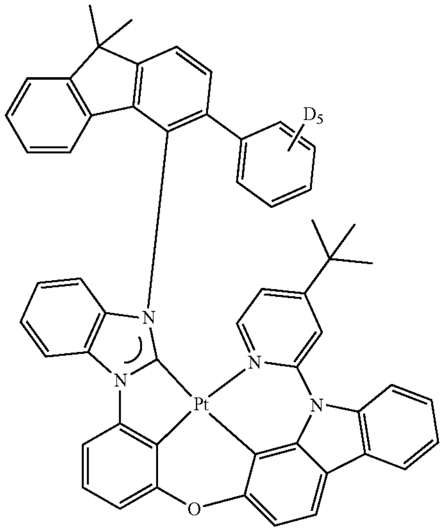
-continued
45
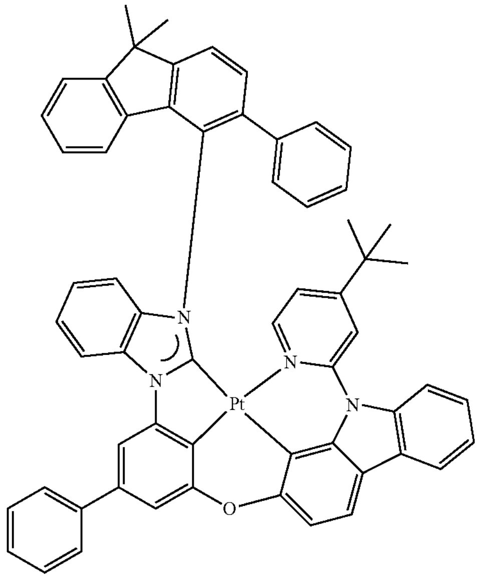
51
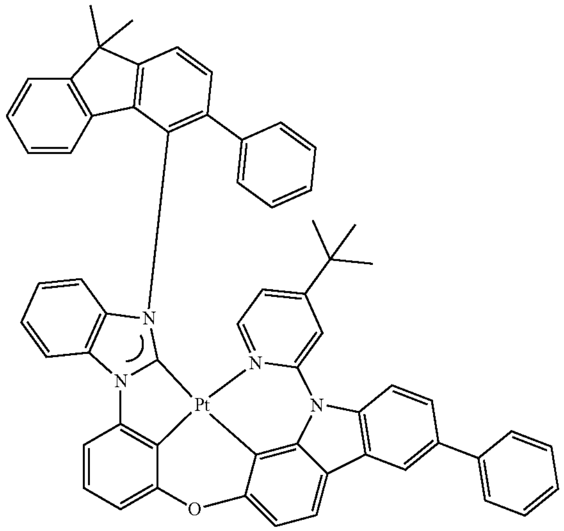

-continued

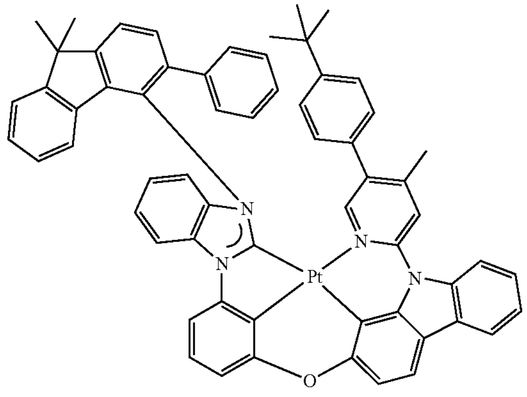

Example 1

As an anode, a glass substrate with 15 Ω/cm$^2$ (1,200 Å) ITO (manufactured by Corning. Inc.) formed thereon was cut to a size of 50 mm×50 mm×0.7 mm, and sonicated with isopropyl alcohol and pure water, each for 5 minutes. Ultraviolet light was irradiated for 30 minutes thereto, and ozone was exposed thereto for cleaning. The resultant glass substrate was mounted on a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (hereinafter, referred as NPB) was vacuum-deposited on the hole injection layer to form a hole transport layer having a thickness of 300 Å.

Compound 1, Compound H1-1, and Compound E2 were vacuum-deposited on the hole transport layer to form an emission layer having a thickness of 300 Å. In this regard, an amount of Compound 1 is 10 wt % based on a total weight (100 wt %) of the emission layer, and a weight ratio of Compound H1-1 to Compound E2 was adjusted to 5:5.

Compound E1 was vacuum-deposited on the emission layer to form a hole blocking layer having a thickness of 50 Å, and $Alq_3$ was vacuum-deposited on the hole blocking layer to form an electron transport layer having a thickness of 300 Å. LiF was vacuum-deposited on the electron transport layer to form an electron injection layer having a thickness of 10 Å, and Al was vacuum-deposited on the electron injection layer to form a cathode having a thickness of 3,000 Å, thereby completing the manufacture of an organic light-emitting device.

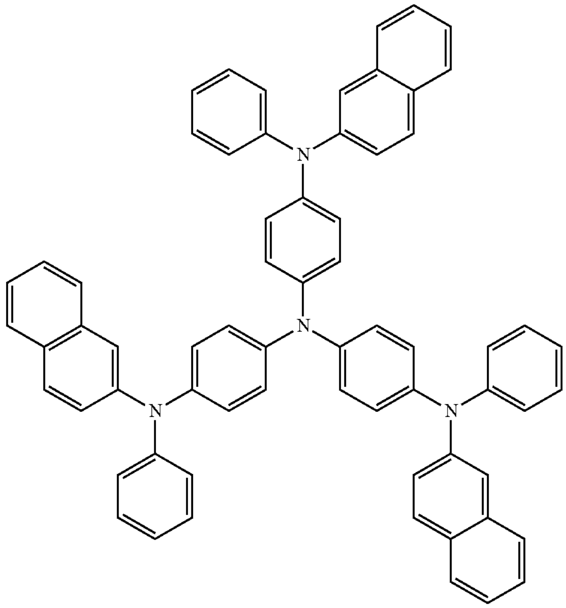

2-TNATA

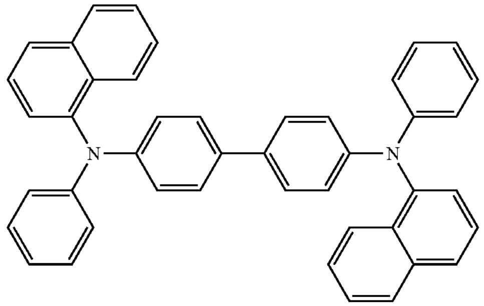

NPB

H1-1

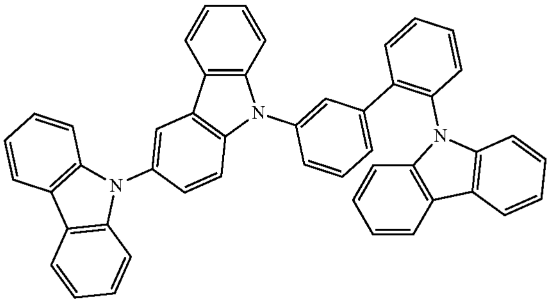

-continued

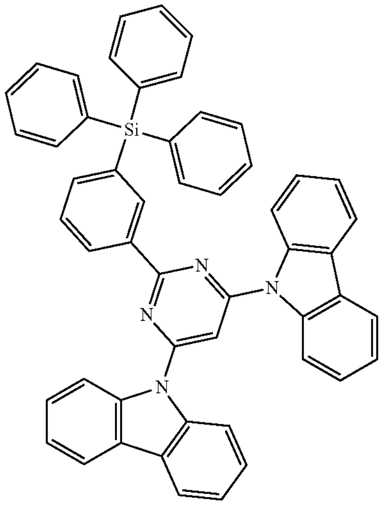

E2

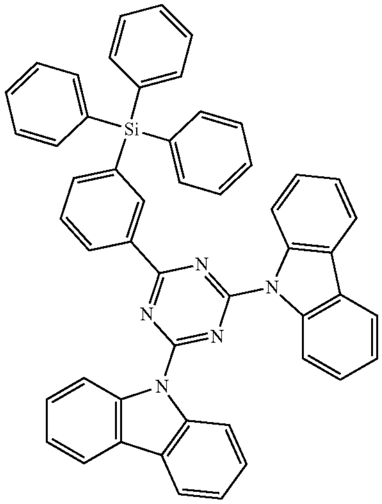

E1

Examples 2 to 5 and Comparative Examples 1 to 6

Organic light-emitting devices were manufactured in the same manner as in Example 1, except that the compounds of Table 2 were used to form emission layers.

Evaluation Example 1

The driving voltage (V), luminescence efficiency (cd/A), color coordinates (CIE_y), maximum emission wavelength (nm), and lifespan ($LT_{95}$) of the organic light-emitting devices of Examples 1 to 5 and Comparative Examples 1 to 6 at 1,000 cd/$m^2$ were measured by using Keithley SMU 236 and a luminance meter PR650. The results thereof are shown in Table 3. In Table 3, the lifespan ($T_{95}$) is a measure of the time (hr) taken until the luminance declines to 95% of the initial luminance, and is expressed as a relative value with respect to Comparative Example 1.

TABLE 2

| | Dopant | Host (weight ratio) |
|---|---|---|
| Example 1 | Compound 1 | H1-1:E2(5:5) |
| Example 2 | Compound 2 | H1-1:E2(5:5) |
| Example 3 | Compound 45 | H1-1:E2(5:5) |
| Example 4 | Compound 51 | H1-1:E2(5:5) |
| Example 5 | Compound 70 | H1-1:E2(5:5) |
| Comparative Example 1 | Compound CE1 | H1-1:E2(5:5) |
| Comparative Example 2 | Compound CE2 | H1-1:E2(5:5) |
| Comparative Example 3 | Compound CE3 | H1-1:E2(5:5) |
| Comparative Example 4 | Compound CE4 | H1-1:E2(5:5) |
| Comparative Example 5 | Compound CE5 | H1-1:E2(5:5) |
| Comparative Example 6 | Compound CE6 | H1-1:E2(5:5) |

TABLE 3

| | Dopant | Luminance (cd/$m^2$) | Driving voltage (V) | Luminescence efficiency (cd/A) (relative value) | CIE-y | Maximum emission wavelength (nm) | Device lifespan ($T_{95}$, h) (at 1,000 cd/$m^2$) (relative value) |
|---|---|---|---|---|---|---|---|
| Example 1 | Compound 1 | 1000 | 4.4 | 130 | 0.177 | 463 | 131 |
| Example 2 | Compound 2 | 1000 | 4.4 | 131 | 0.179 | 463 | 140 |
| Example 3 | Compound 45 | 1000 | 4.3 | 145 | 0.199 | 468 | 180 |
| Example 4 | Compound 51 | 1000 | 4.3 | 137 | 0.180 | 464 | 149 |
| Example 5 | Compound 70 | 1000 | 4.4 | 155 | 0.175 | 462 | 118 |
| Comparative Example 1 | Compound CE1 | 1000 | 4.9 | 100 | 0.213 | 460 | 100 |
| Comparative Example 2 | Compound CE2 | 1000 | 4.5 | 121 | 0.201 | 464 | 115 |
| Comparative Example 3 | Compound CE3 | 1000 | 4.6 | 105 | 0.222 | 467 | 88 |
| Comparative Example 4 | Compound CE4 | 1000 | 4.4 | 97 | 0.235 | 469 | 92 |
| Comparative Example 5 | Compound CE5 | 1000 | 4.7 | 108 | 0.215 | 466 | 90 |
| Comparative Example 6 | Compound CE6 | 1000 | 4.6 | 101 | 0.228 | 468 | 95 |

-continued
1
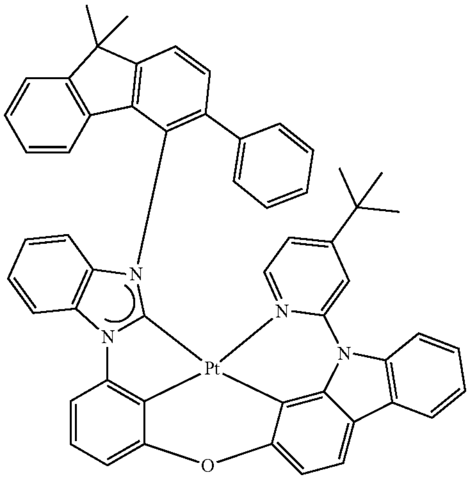
2
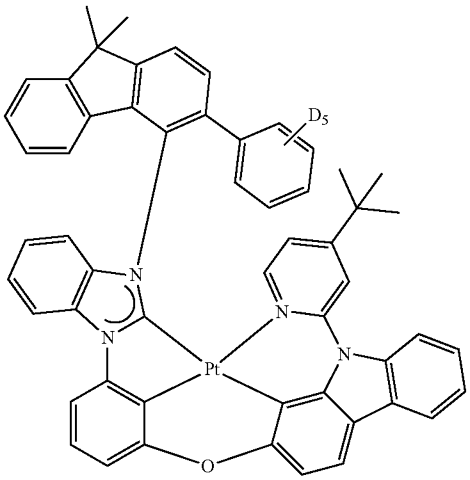
45
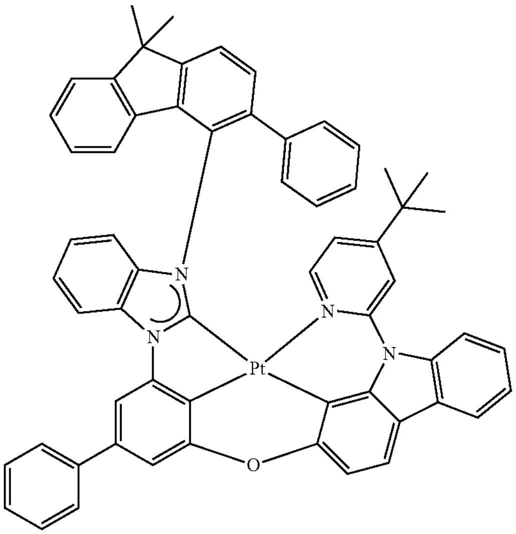
51
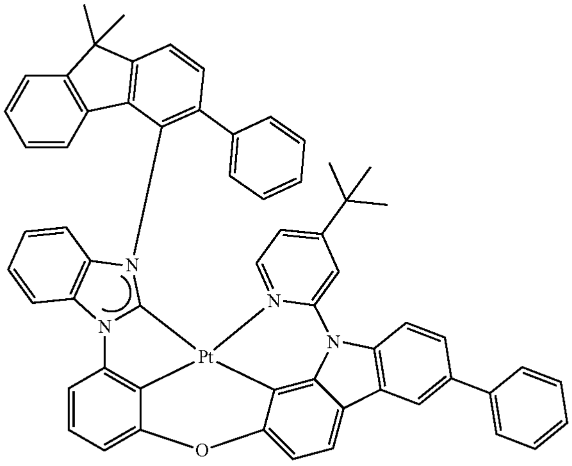
70
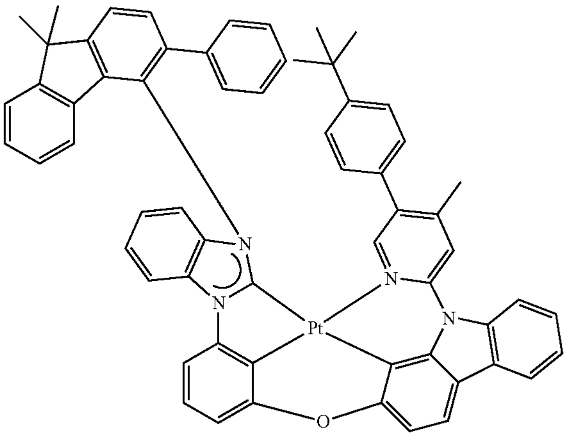
CE1
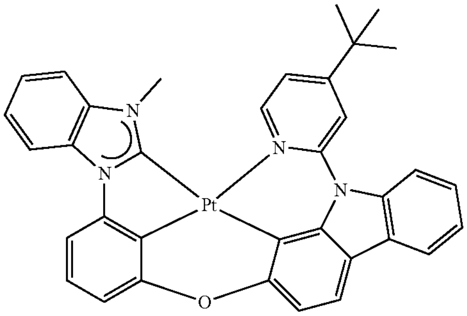

-continued

EC2

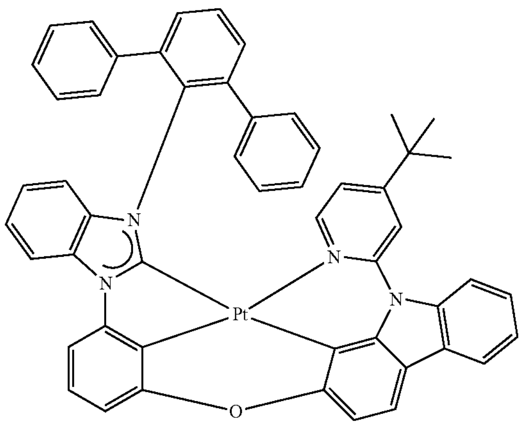

CE3

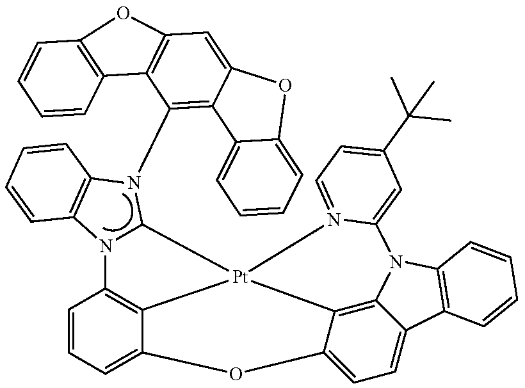

CE4

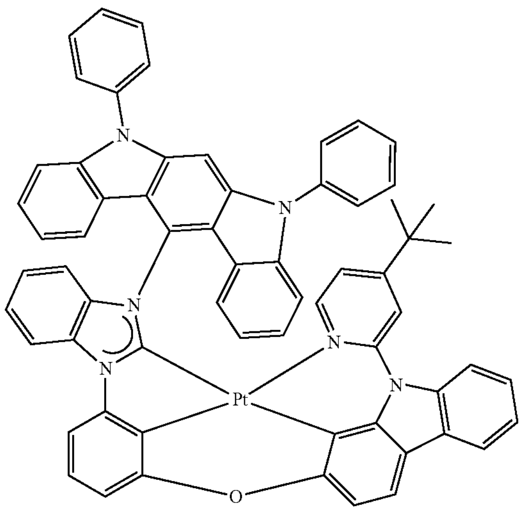

-continued

CE5

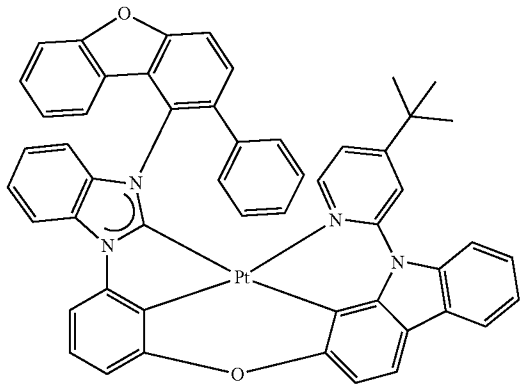

CE6

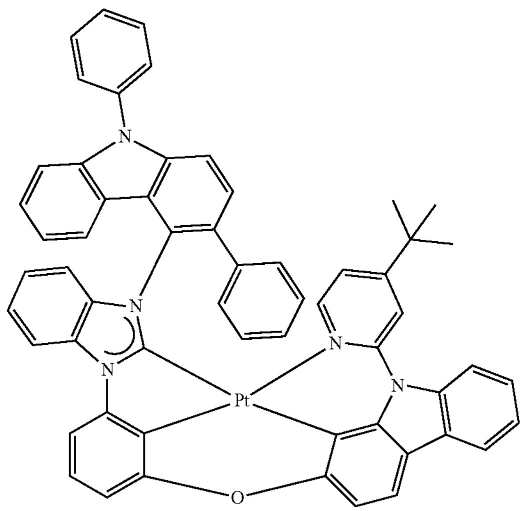

Referring to Table 3, it was confirmed that the organic light-emitting devices of Examples 1 to 5 emitted deep blue light and had low driving voltage, excellent luminescence efficiency, and/or long lifespan characteristics compared to the organic light-emitting devices of Comparative Examples 1 to 6.

According to embodiments, a light-emitting device including an organometallic compound may have low driving voltage, high efficiency, and a long lifespan, and thus, may be used to manufacture a high-quality electronic apparatus having excellent light efficiency and a long lifespan.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising:

a first electrode;

a second electrode facing the first electrode;

an interlayer between the first electrode and the second electrode and comprising an emission layer; and an organometallic compound represented by Formula 1:

[Formula 1]

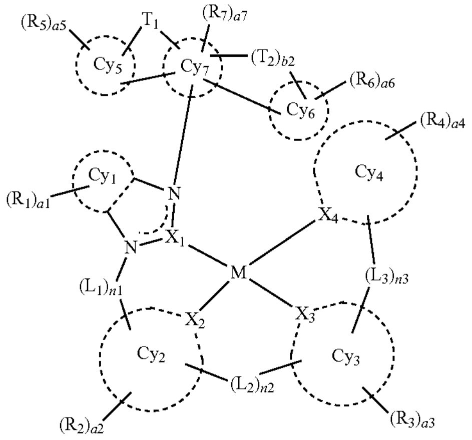

wherein in Formula 1,

M is platinum (Pt), palladium (Pd), copper (Cu), silver (Ag), gold (Au), rhodium (Rh), ruthenium (Ru), iridium (Ir), or osmium (Os), $X_1$ to $X_4$ are each independently C or N, a bond between $X_1$ and M is a coordinate bond, one of a bond between $X_2$ and M, a bond between $X_3$ and M, and a bond between $X_4$ and M is a coordinate bond, the remainder of a bond between $X_2$ and M, a bond between $X_3$ and M, and a bond between $X_4$ and M are each a covalent bond, ring $CY_1$ to ring $CY_7$ are each independently a $C_3$-$C_{60}$ carbocyclic group or a $C_1$-$C_{60}$ heterocyclic group, $L_1$ to $L_3$ are each independently a single bond, *—C($R_8$)($R_9$)—*', *—C($R_8$)=*', *=C($R_8$)—*', *—C($R_8$)=C($R_9$)—*', *—C(=O)—*', *—C(=S)—*', *—C≡C—*', *—B($R_8$)—*', *—N($R_8$)—*', *—O—*', *—P($R_8$)—*', *—Si($R_8$)($R_9$)—*', *—P(=O)($R_8$)—*', *—S—*', *—S(=O)—*', *—S(=O)$_2$—*' or *—Ge($R_8$)($R_9$)—*', n1 to n3 are each independently an integer from 1 to 3, $T_1$ is *—C($Z_{11}$)($Z_{12}$)—*' or *—Si($Z_{11}$)($Z_{12}$)—*', $T_2$ is *—N($Z_{13}$)—*', *—O—*', *—S—*', *—C($Z_{13}$)($Z_{14}$)—*', or *—Si($Z_{13}$)($Z_{14}$)—*', b2 is 0, 1, or 2, wherein $T_2$ is not present when b2 is 0,

* and *' each indicate a binding site to a neighboring atom, $R_1$ to $R_9$ and $Z_{11}$ to $Z_{14}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —P($Q_1$)($Q_2$), —C(=O)($Q_1$), —S(=O)($Q_1$), —S(=O)$_2$ ($Q_1$), —P(=O)($Q_1$)($Q_2$), or —P(=S)($Q_1$)($Q_2$), a1 to a7 are each independently an integer from 0 to 20, each of two or more of $R_1$ in the number of a1; two or more of $R_2$ in the number of a2; two or more of $R_3$ in the number of a3; two or more of $R_4$ in the number of a4; two or more of $R_5$ in the number of a5; two or more of $R_6$ in the number of a6; two or more of $R_7$ in the number of a7; $R_8$ and $R_9$; $Z_{11}$ and $Z_{12}$; and $Z_{13}$ and $Z_{14}$, are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_1$ to $R_4$, $R_8$, and $R_9$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(=O)($Q_{11}$), —S(=O)($Q_{11}$), —S(=O)$_2$($Q_{11}$), —P(=O)($Q_{11}$)($Q_{12}$), —P(=S)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(=O)($Q_{21}$), —S(=O)($Q_{21}$), —S(=O)$_2$($Q_{21}$), —P(=O)($Q_{21}$)($Q_{22}$), —P(=S)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)($Q_{31}$), —S(=O)$_2$($Q_{31}$), —P(=O)($Q_{31}$)($Q_{32}$), or —P(=S)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

2. The light-emitting device of claim 1, wherein the interlayer further comprises:

a hole transport region between the first electrode and the emission layer; and an electron transport region between the emission layer and the second electrode, the hole transport region includes a hole injection layer, a hole transport layer, an emission auxiliary layer, an electron blocking layer, or a combination thereof, and the electron transport region includes a buffer layer, a hole blocking layer, an electron control layer, an electron transport layer, an electron injection layer, or a combination thereof.

3. The light-emitting device of claim 1, wherein the emission layer includes the organometallic compound represented by Formula 1.

4. The light-emitting device of claim 1, wherein the emission layer emits blue light having a maximum emission wavelength in a range of about 410 nm to about 500 nm.

5. The light-emitting device of claim 1, wherein the interlayer comprises:

a first compound which is the organometallic compound represented by Formula 1; and a second compound including a group represented by Formula 2, a third compound represented by Formula 3, a fourth compound including a group represented by Formula 4, or a combination thereof, the first compound, the second compound, and the third compound are different from one another, the first compound, the second compound, and the fourth compound are different from one another, and the third compound and the fourth compound are identical to or different from each other:

[Formula 2]

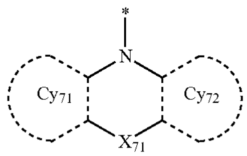

wherein in Formula 2, ring $CY_{71}$ and ring $CY_{72}$ are each independently a π electron-rich $C_3$-$C_{60}$ cyclic group or a pyridine group, $X_{71}$ is:

a single bond; or a linking group including O, S, N, B, C, Si, or a combination thereof,

* indicates a binding site to a neighboring atom in the second compound,

[Formula 3]

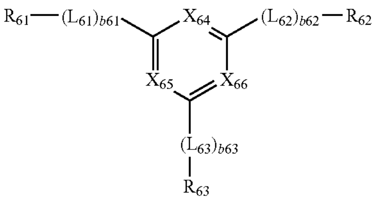

wherein in Formula 3, $L_{61}$ to $L_{63}$ are each independently a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b61 to b63 are each independently an integer from 1 to 5, $X_{64}$ is N or $C(R_{64})$, $X_{65}$ is N or $C(R_{65})$, $X_{66}$ is N or $C(R_{66})$, at least one of $X_{64}$ to $X_{66}$ is N, $R_{61}$ to $R_{66}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, $R_{10a}$ and $Q_1$ to $Q_3$ are each as defined in Formula 1,

[Formula 4]

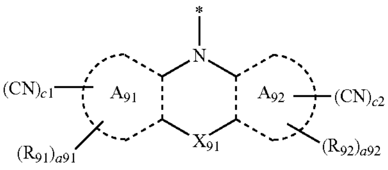

wherein in Formula 4, ring $A_{91}$ and ring $A_{92}$ are each independently a π electron-rich $C_3$-$C_{60}$ cyclic group or a pyridine group, $X_{91}$ is:

a single bond; or a linking group including O, S, N, B, C, Si, or a combination thereof, $R_{91}$ and $R_{92}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, a91 and a92 are each independently an integer from 0 to 10, c1 and c2 are each independently an integer from 0 to 10, a sum of c1 and c2 is 1 or more, $R_{10a}$ and $Q_1$ to $Q_3$ are each as defined in Formula 1, and

* indicates a binding site to a neighboring atom in the fourth compound.

6. The light-emitting device of claim 5, wherein the emission layer includes a dopant and a host, the dopant includes the first compound, and the host includes the second compound, the third compound, the fourth compound, or a combination thereof.

7. An electronic apparatus comprising:

the light-emitting device of claim 1; and a thin-film transistor, wherein the thin-film transistor includes a source electrode and a drain electrode, and the first electrode of the light-emitting device is electrically connected to at least one of the source electrode and the drain electrode.

8. The electronic apparatus of claim 7, further comprising a color filter, a color conversion layer, a touch screen layer, a polarizing layer, or a combination thereof.

9. An electronic equipment comprising the light-emitting device of claim 1, wherein the electronic equipment is a flat panel display, a curved display, a computer monitor, a medical monitor, a television, an advertisement board, an indoor lighting, an outdoor lighting, a signaling light, a head-up display, a fully transparent display, a partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, a micro-display, a 3D display, a virtual-reality display, an augmented-reality display, a vehicle, a video wall including multiple displays tiled together, a theater screen, a stadium screen, a phototherapy device, or a sign.

10. An organometallic compound represented by Formula 1:

[Formula 1]

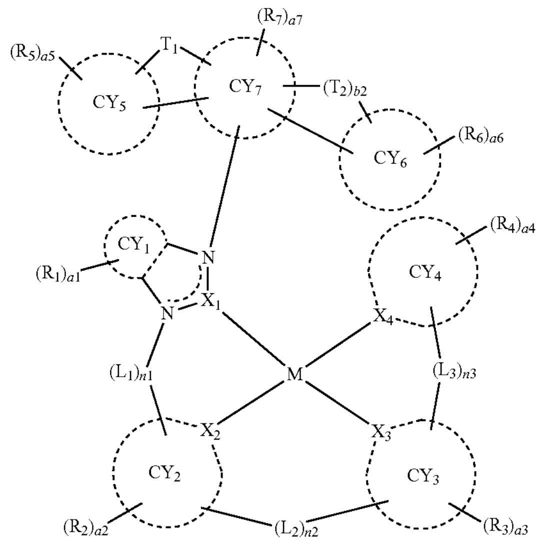

wherein in Formula 1,

M is platinum (Pt), palladium (Pd), copper (Cu), silver (Ag), gold (Au), rhodium (Rh), ruthenium (Ru), iridium (Ir), or osmium (Os), $X_1$ to $X_4$ are each independently C or N, a bond between $X_1$ and M is a coordinate bond, one of a bond between $X_2$ and M, a bond between $X_3$ and M, and a bond between $X_4$ and M is a coordinate bond, the remainder of a bond between $X_2$ and M, a bond between $X_3$ and M, and a bond between $X_4$ and M are each a covalent bond, ring $CY_1$ to ring $CY_7$ are each independently a $C_3$-$C_{60}$ carbocyclic group or a $C_1$-$C_{60}$ heterocyclic group, $L_1$ to $L_3$ are each independently a single bond, *—C($R_8$)($R_9$)—*', *—C($R_8$)═*', *═C($R_8$)—*', *—C($R_8$)═C($R_9$)—*', *—C(═O)—*', *—C(═S)—*', *—C≡C—*', *—B($R_8$)—*', *—N($R_8$)—*', *—O—*', *—P($R_8$)—*', *—Si($R_8$)($R_9$)—*', *—P(═O)($R_8$)—*', *—S—*', *—S(═O)—*', *—S(═O)$_2$—*' or *—Ge($R_8$)($R_9$)—*', n1 to n3 are each independently an integer from 1 to 3, $T_1$ is *—C($Z_{11}$)($Z_{12}$)—*' or *—Si($Z_{11}$)($Z_{12}$)—*', $T_2$ is *—N($Z_{13}$)—*', *—O—*', *—S—*', *—C($Z_{13}$)($Z_{14}$)—*', or *—Si($Z_{13}$)($Z_{14}$)—*', b2 is 0, 1, or 2, wherein $T_2$ is not present when b2 is 0,

* and *' each indicate a binding site to a neighboring atom, $R_1$ to $R_9$ and $Z_{11}$ to $Z_{14}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —P($Q_1$)($Q_2$), —C(═O)($Q_1$), —S(═O)($Q_1$), —S(═O)$_2$ ($Q_1$), —P(═O)($Q_1$)($Q_2$), or —P(═S)($Q_1$)($Q_2$), a1 to a7 are each independently an integer from 0 to 20, each of two or more of $R_1$ in the number of a1; two or more of $R_2$ in the number of a2; two or more of $R_3$ in the number of a3; two or more of $R_4$ in the number of a4; two or more of $R_5$ in the number of a5; two or more of $R_6$ in the number of a6; two or more of $R_7$ in the number of a7; $R_8$ and $R_9$; $Z_{11}$ and $Z_{12}$; and $Z_{13}$ and $Z_{14}$, are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, two or more of $R_1$ to $R_4$, $R_8$, and $R_9$ are optionally bonded to each other to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(═O)($Q_{11}$), —S(═O)($Q_{11}$), —S(═O)$_2$($Q_{11}$), —P(═O)($Q_{11}$)($Q_{12}$), —P(═S)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(═O)($Q_{21}$), —S(═O)($Q_{21}$), —S(═O)$_2$($Q_{21}$), —P(═O)($Q_{21}$)($Q_{22}$), —P(═S)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(═O)($Q_{31}$), —S(═O)($Q_{31}$), —S(═O)$_2$($Q_{31}$), —P(═O)($Q_{31}$)($Q_{32}$), or —P(═S)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

11. The organometallic compound of claim 10, wherein each of $X_1$ to $X_3$ is C.

12. The organometallic compound of claim 10, wherein ring $CY_1$ to ring $CY_7$ are each independently a benzene group, a naphthalene group, a fluorene group, a benzofluorene group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isooxazole group, an oxadiazole group, a thiazole group, an isothiazole group, a thiadiazole group, a benzopyrazole group, a benzimidazole group, a benzooxazole group, a benzoisooxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, an azanaphthobenzofuran group, an azanaphthobenzothiophene group, an azabenzocarbazole group, an azabenzofluorene group, an azanaphthobenzosilole group, an azadinaphthofuran group, an azadinaphthothiophene group, an azadibenzocarbazole group, an azadibenzofluorene group, an azadinaphthosilole group, a pyrido[2,3-b]indole group, a pyrido[3,4-b]indole group, a pyrido[4,3-b]indole group, a pyrido[3,2-b]indole group, or a pyrrolo[2,3-b]pyridine group.

13. The organometallic compound of claim 10, wherein ring $CY_1$ is a benzene group, a pyridine group, a pyridazine group, a pyrimidine group, a pyrazine group, a naphthalene group, a quinoline group, or an isoquinoline group, ring $CY_2$ and ring $CY_3$ are each independently a benzene group, a pyridine group, a pyrimidine group, a naphthalene group, a quinoline group, an isoquinoline group, a dibenzofuran group, a dibenzothiophene group, a carbazole group, an azacarbazole group, a fluorene group, or a dibenzosilole group, ring $CY_4$ is:

an $X_4$-containing 5-membered ring; or an $X_4$-containing 6-membered ring; or an $X_4$-containing 5-membered ring in which at least one 6-membered ring is condensed, the $X_4$-containing 5-membered ring is a pyrrole group, a pyrazole group, an imidazole group, a triazole group, an oxazole group, an isooxazole group, a thiazole group, an isothiazole group, an oxadiazole group, or a thiadiazole group, and the $X_4$-containing 6-membered ring and the at least one 6-membered ring that is optionally condensed with the $X_4$-containing 5-membered ring are each independently a benzene group, a pyridine group, or a pyrimidine group.

14. The organometallic compound of claim 10, wherein at least one of Condition 1 to Condition 4 is satisfied:

[Condition 1]

a moiety represented by

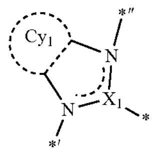

in Formula 1 is a moiety represented by one of Formulae CY1-1 to CY1-25:

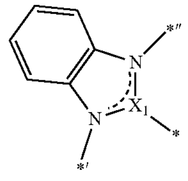

CY1-1

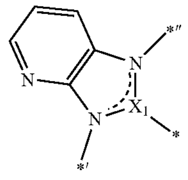

CY1-2

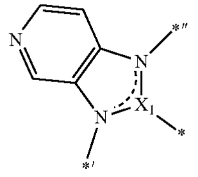

CY1-3

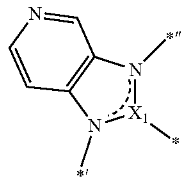

CY1-4

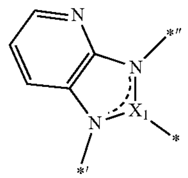

CY1-5

-continued
CY1-6
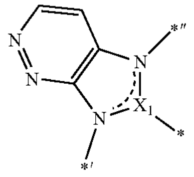
CY1-7
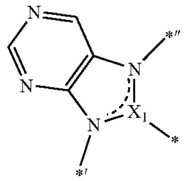
CY1-8
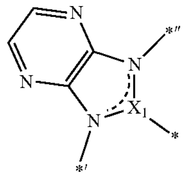
CY1-9
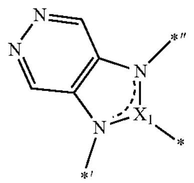
CY1-10
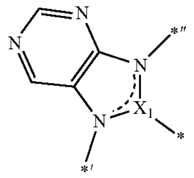
CY1-11
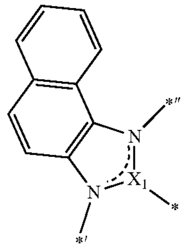
CY1-12
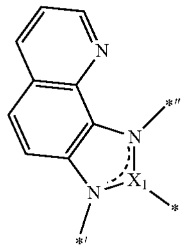
-continued
CY1-13
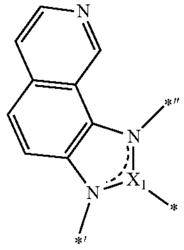
CY1-14
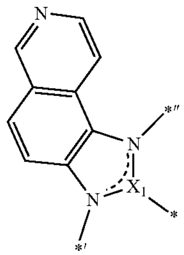
CY1-15
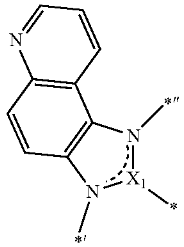
CY1-16
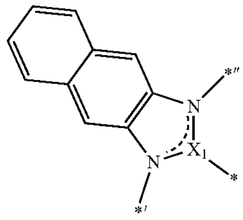
CY1-17
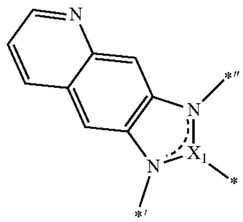
CY1-18
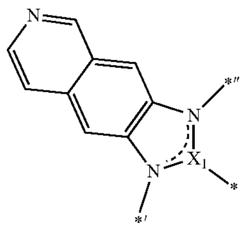

-continued
CY1-19
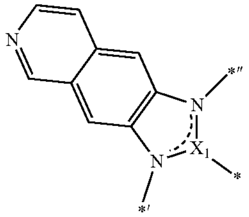
CY1-20
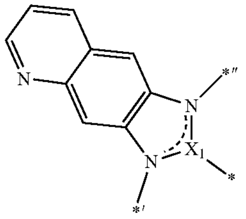
CY1-21
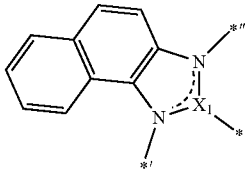
CY1-22
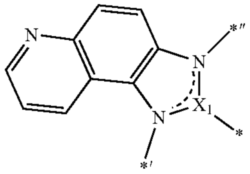
CY1-23
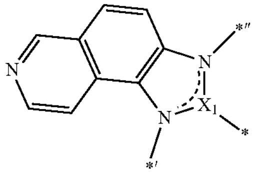
CY1-24
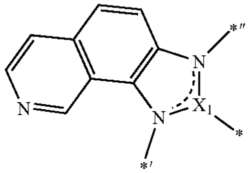
CY1-25
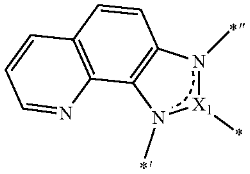
wherein in Formulae CY1-1 to CY1-25,
$X_1$ is as defined in Formula 1,
* indicates a binding site to M in Formula 1,
*' indicates a binding site to $(L_1)_{n1}$ in Formula 1, and
*" indicates a binding site to ring $CY_7$ in Formula 1;
[Condition 2]
a moiety represented by
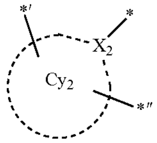
in Formula 1 is a moiety represented by one of Formulae CY2-1 to CY2-11:
CY2-1
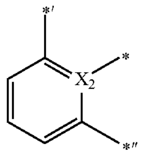
CY2-2
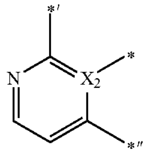
CY2-3
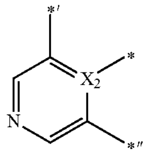
CY2-4
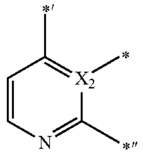
CY2-5
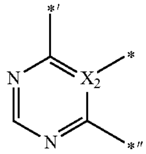
CY2-6
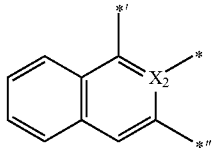

-continued
CY2-7
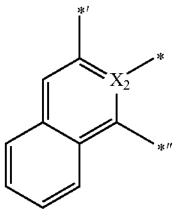
CY2-8
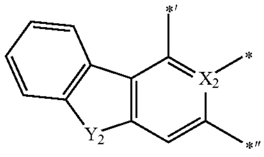
CY2-9
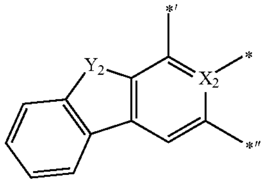
CY2-10
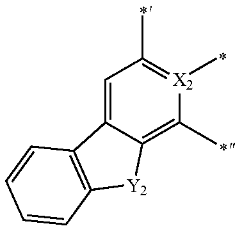
CY2-11
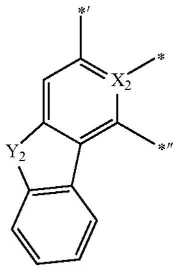
wherein in Formulae CY2-1 to CY2-11,
$X_2$ is as defined in Formula 1,
$Y_2$ comprises O, S, N, C, or Si,
* indicates a binding site to M in Formula 1,
*' indicates a binding site to $(L_1)_{n1}$ in Formula 1, and
*" indicates a binding site to $(L_2)_{n2}$ in Formula 1;
[Condition 3]
a moiety represented by
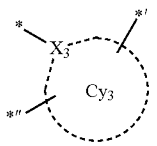
in Formula 1 is a moiety represented by one of Formulae CY3-1 to CY3-23:
CY3-1
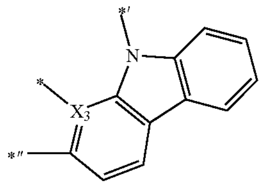
CY3-2
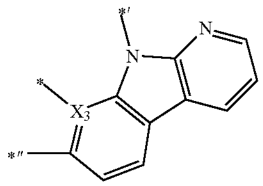
CY3-3
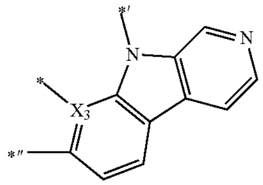
CY3-4
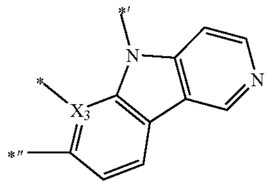
CY3-5
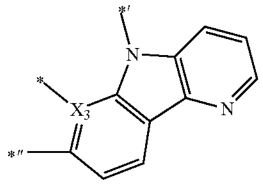
CY3-6
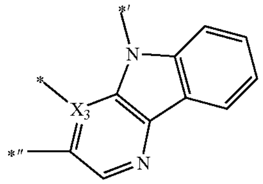
CY3-7
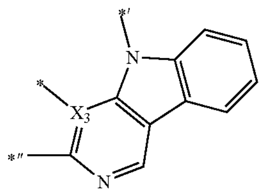
CY3-8
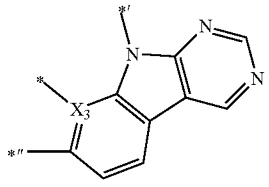

-continued
CY3-9
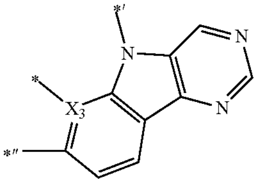
CY3-10
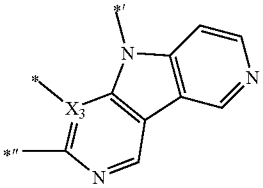
CY3-11
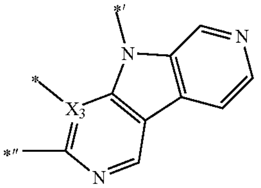
CY3-12
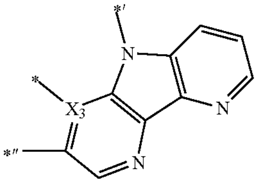
CY3-13
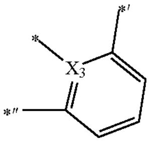
CY3-14
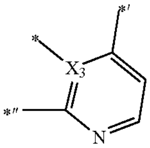
CY3-15
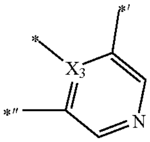
CY3-16
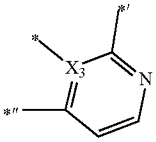
CY3-17
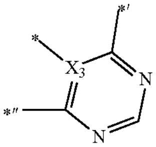
-continued
CY3-18
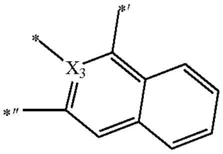
CY3-19
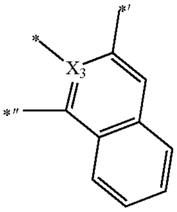
CY3-20
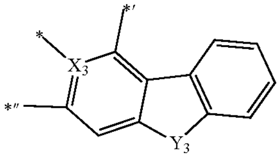
CY3-21
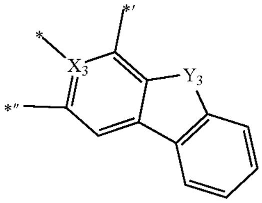
CY3-22
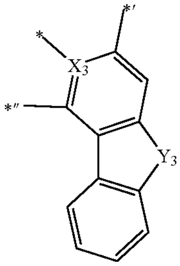
CY3-23
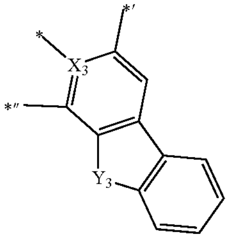
wherein in Formulae CY3-1 to CY3-23,
$X_3$ is as defined in Formula 1,
$Y_3$ comprises O, S, N, C, or Si,
* indicates a binding site to M in Formula 1,
*' indicates a binding site to $(L_3)_{n3}$ in Formula 1, and
*" indicates a binding site to $(L_2)_{n2}$ in Formula 1; and

[Condition 4]
a moiety represented by
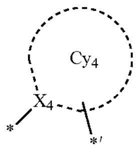
in Formula 1 is a moiety represented by one of Formulae CY4-1 to CY4-48:
CY4-1
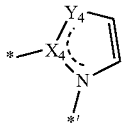
CY4-2
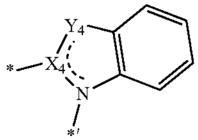
CY4-3
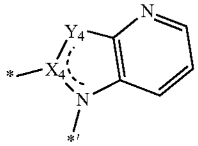
CY4-4
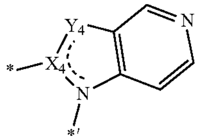
CY4-5
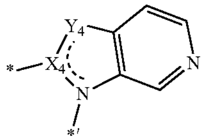
CY4-6
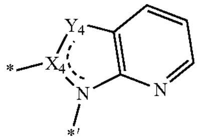
CY4-7
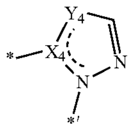
CY4-8
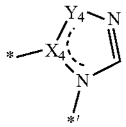
-continued
CY4-9
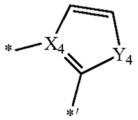
CY4-10
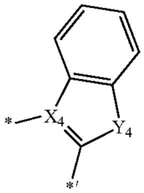
CY4-11
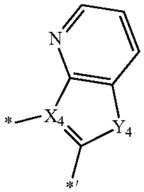
CY4-12
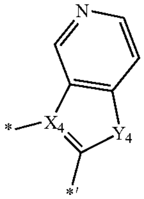
CY4-13
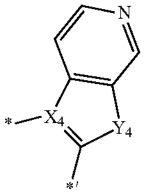
CY4-14
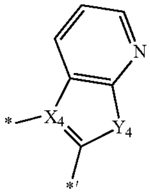
CY4-15
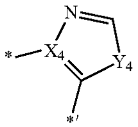
CY4-16
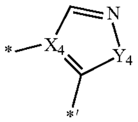
CY4-17
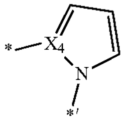

-continued
CY4-18
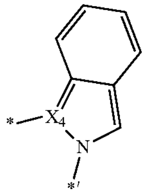
CY4-19
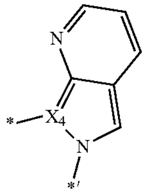
CY4-20
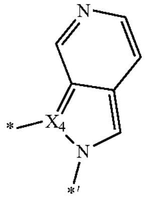
CY4-21
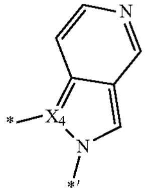
CY4-22
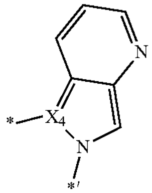
CY4-23
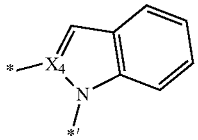
CY4-24
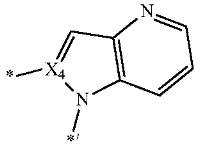
CY4-25
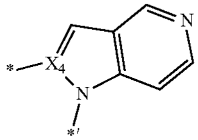
CY4-26
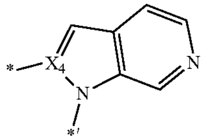
-continued
CY4-27
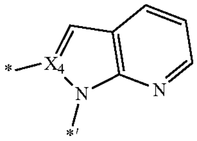
CY4-28
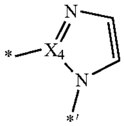
CY4-29
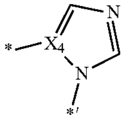
CY4-30
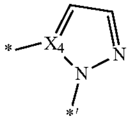
CY4-31
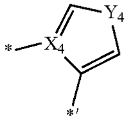
CY4-32
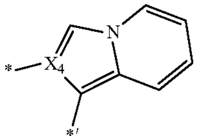
CY4-33
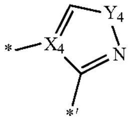
CY4-34
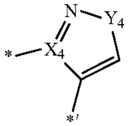
CY4-35
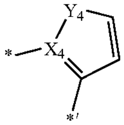
CY4-36
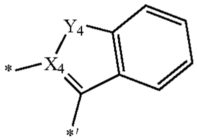
CY4-37
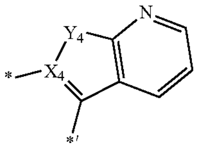

-continued

CY4-38

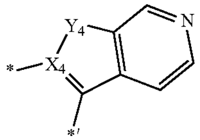

CY4-39

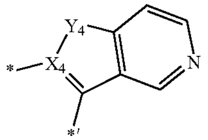

CY4-40

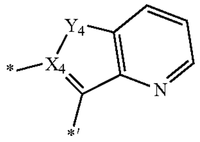

CY4-41

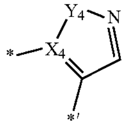

CY4-42

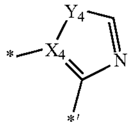

CY4-43

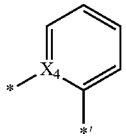

CY4-44

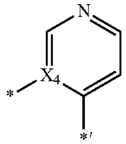

CY4-45

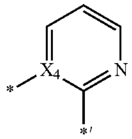

CY4-46

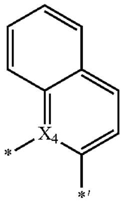

CY4-47

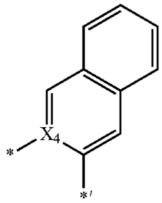

-continued

CY4-48

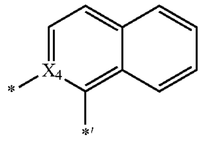

wherein in Formulae CY4-1 to CY4-48, $X_4$ is as defined in Formula 1, $Y_4$ comprises O, S, N, C, or Si,

* indicates a binding site to M in Formula 1, and

*' indicates a binding site to $(L_3)_{n3}$ in Formula 1.

15. The organometallic compound of claim 10, wherein ring $CY_5$ to ring $CY_7$ are each independently a benzene group, a naphthalene group, a pyridine group, a pyridazine group, a pyrimidine group, a pyrazine group, a triazine group, a fluorene group, a carbazole group, a dibenzofuran group, a dibenzothiophene group, an azacarbazole group, an azadibenzofuran group, or an azadibenzothiophene group.

16. The organometallic compound of claim 10, wherein $L_1$ is a single bond; or $L_2$ is *—$C(R_8)(R_9)$—*', *—$B(R_8)$—*', *—$N(R_8)$—*', *—O—*', *—$P(R_8)$—*', *—$Si(R_8)(R_9)$—*', or *—S—*', or $L_3$ is a single bond, *—$N(R_8)$—*', or *—O—*'; or a combination thereof.

17. The organometallic compound of claim 10, wherein the organometallic compound satisfies Condition L-1 or Condition L-2:

[Condition L-1]

$L_3$ is a single bond, and ring $CY_3$ is a benzene group, a carbazole group, or an azacarbazole group;

[Condition L-2]

$L_3$ is *—O*', and ring $CY_3$ is a benzene group, a pyridine group, or a pyrimidine group.

18. The organometallic compound of claim 10, wherein a moiety represented by

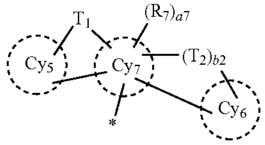

in Formula 1 is a moiety represented by one of Formulae B1-1 to B1-12:

B1-1

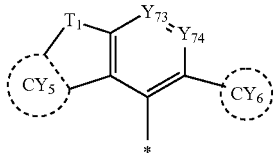

B1-2

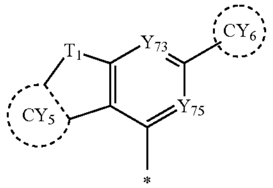

-continued

B1-3

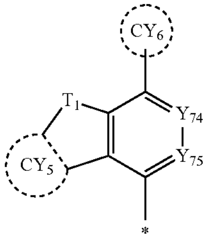

B1-4

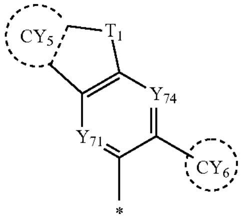

B1-5

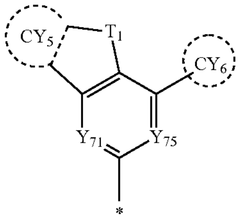

B1-6

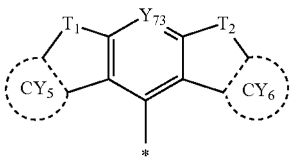

B1-7

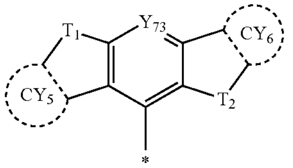

B1-8

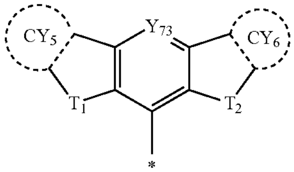

B1-9

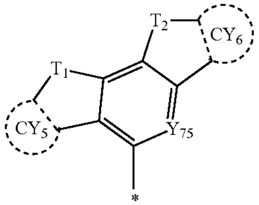

-continued

B1-10

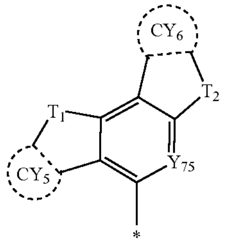

B1-11

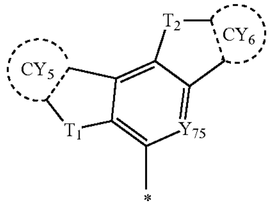

B1-12

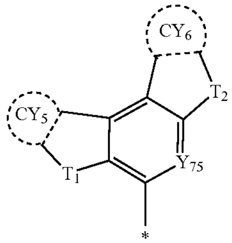

wherein in Formulae B1-1 to B1-12, $T_1$, $T_2$, ring $CY_5$, and ring $CY_6$ are each as defined in Formula 1, $Y_{71}$ is N or $C(R_{7a})$, $Y_{73}$ is N or $C(R_{7c})$, $Y_{74}$ is N or $C(R_{7d})$, $Y_{75}$ is N or $C(R_{7e})$, $R_{7a}$ and $R_{7c}$ to $R_{7e}$ are each independently as defined in connection with $R_7$ in Formula 1, and

* indicates a binding site to a nitrogen atom in Formula 1.

19. The organometallic compound of claim 10, wherein $Z_{11}$ to $Z_{14}$ are each independently:

hydrogen, deuterium, —F, or a cyano group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a phenyl group, a naphthyl group, a pyridinyl group, a pyrimidinyl group, or a combination thereof; or a cyclopentyl group, a cyclohexyl group, a cycloheptyl group, a cyclooctyl group, an adamantanyl group, a norbornanyl group, a phenyl group, a naphthyl group, a pyridinyl group, a pyrazinyl group, a pyrimidinyl group, a pyridazinyl group, a carbazolyl group, a triazinyl group, a dibenzofuranyl group, a dibenzothiophenyl group, a dibenzocarbazolyl group, an imidazopyridinyl group, or an imidazopyrim idinyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a phenyl group, a naphthyl group, a pyridinyl group, a pyrazinyl group, a pyrimidinyl group, a pyridazinyl group, a carbazolyl group, a triazinyl group, a dibenzofuranyl group, a dibenzothiophenyl group, a dibenzocarbazolyl group, an imidazopyridinyl group, an imidazopyrim idinyl group, or a combination thereof.

20. The organometallic compound of claim 10, wherein the organometallic compound is selected from Compounds 1 to 100:

1

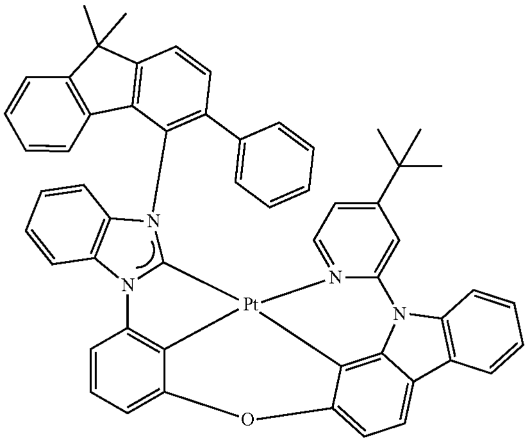

2

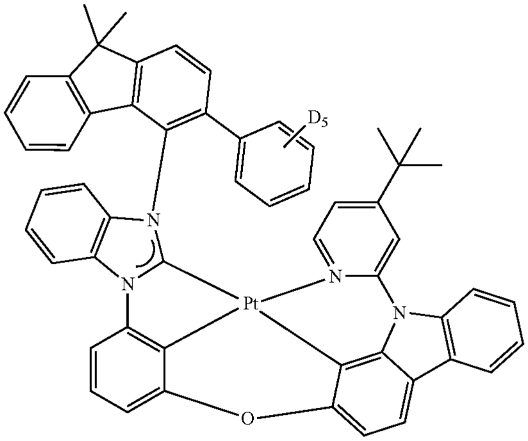

3

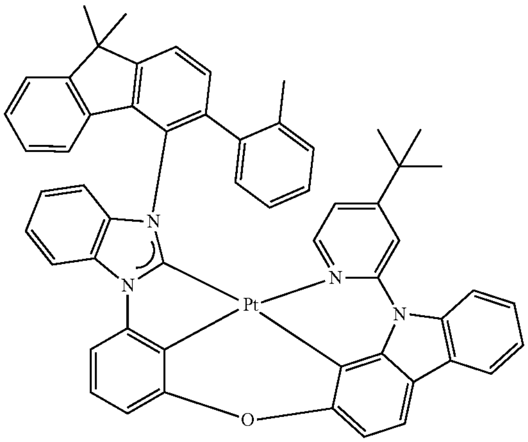

-continued

4

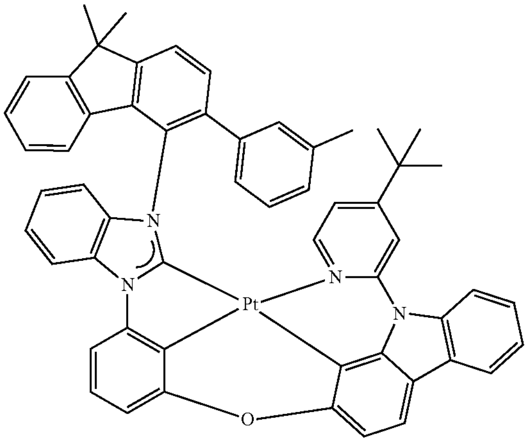

5

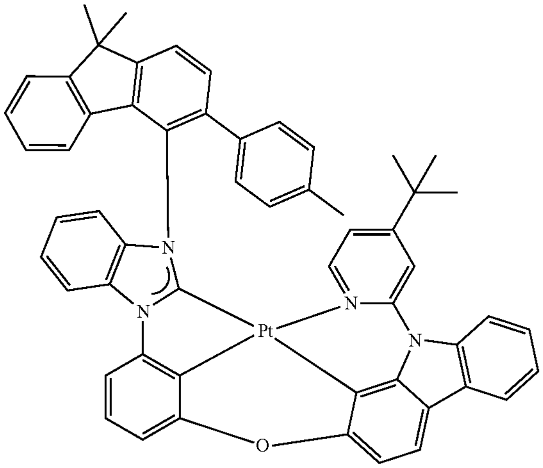

6

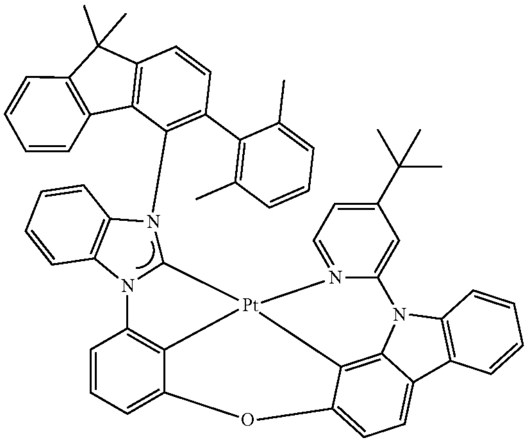

-continued
7
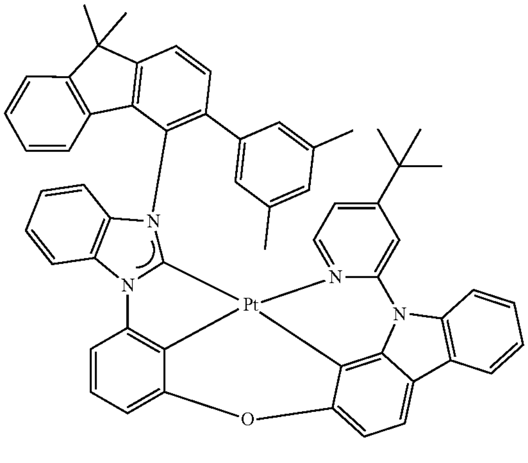
8
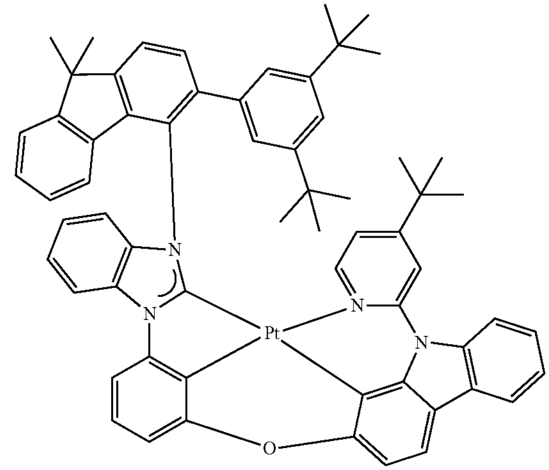
9
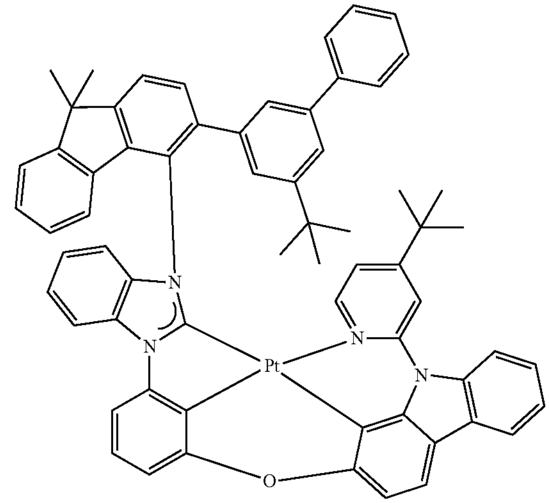
-continued
10
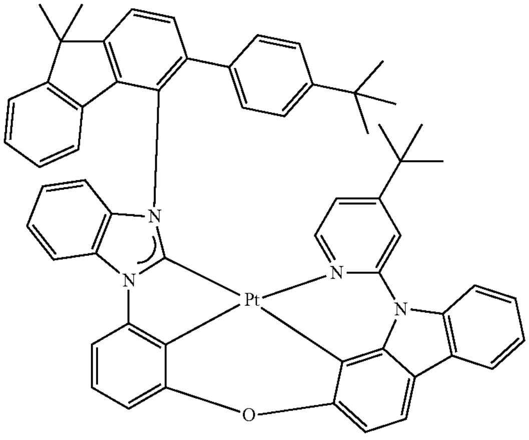
11
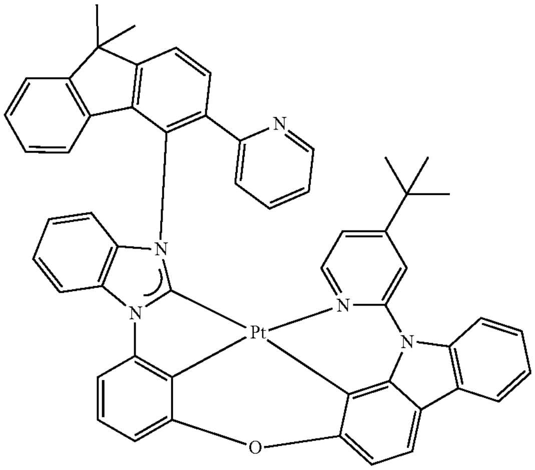
12
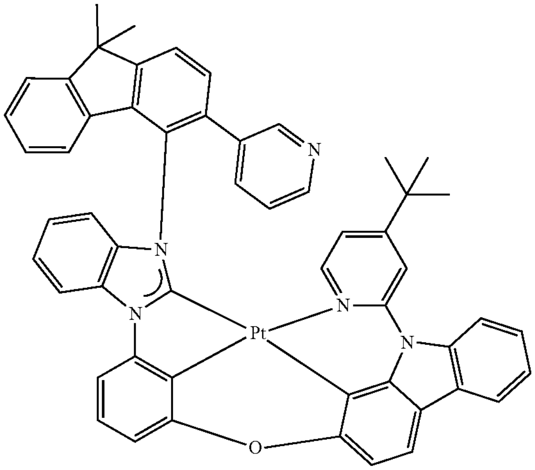

-continued
13
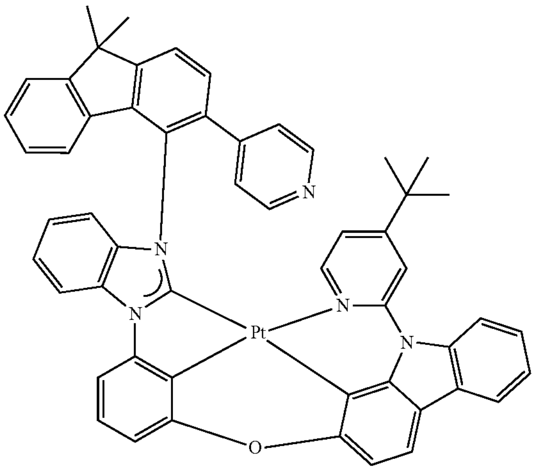
14
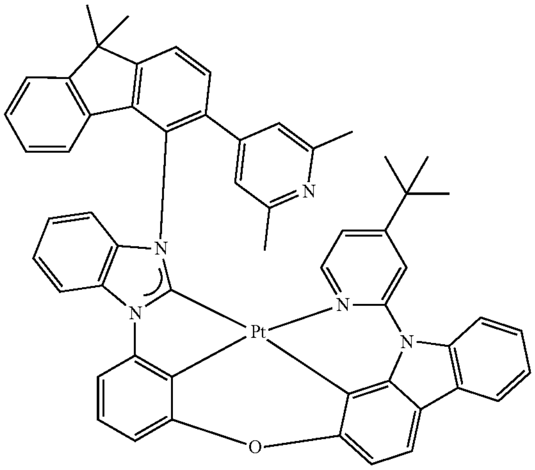
15
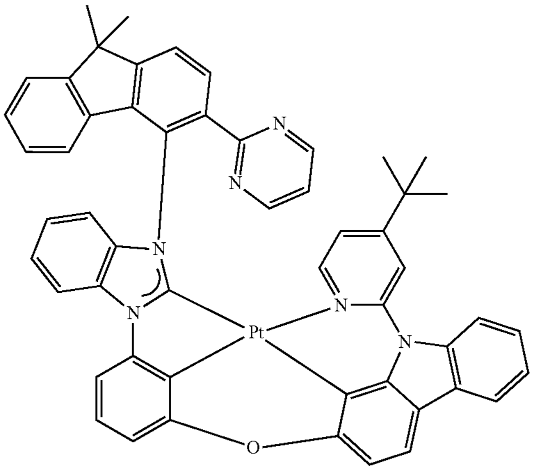
-continued
16
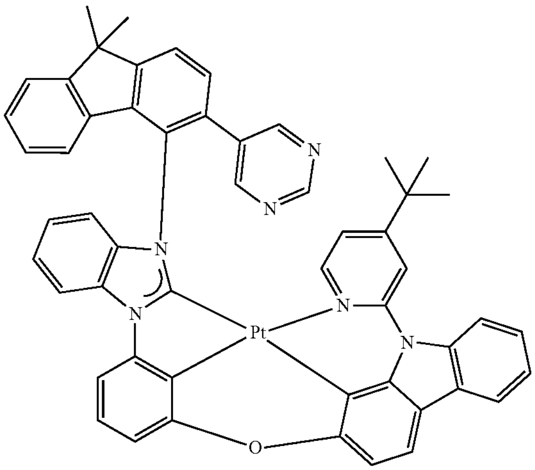
17
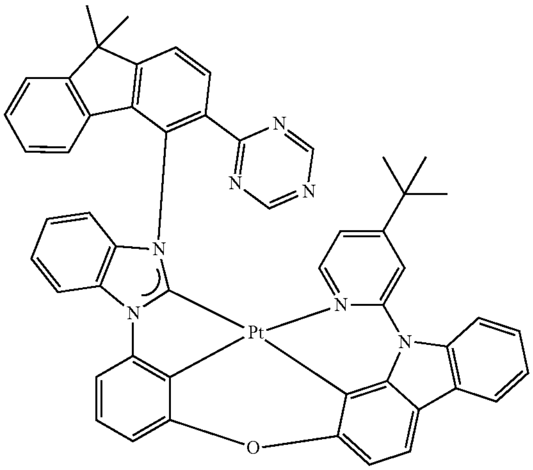
18
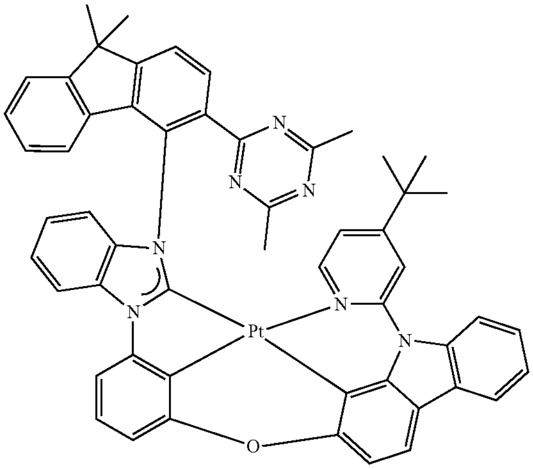

-continued
19
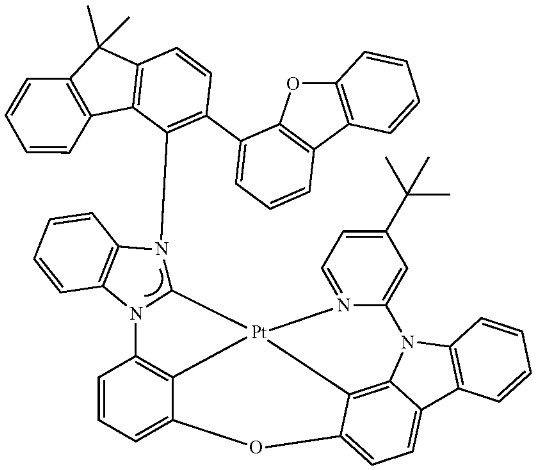
20
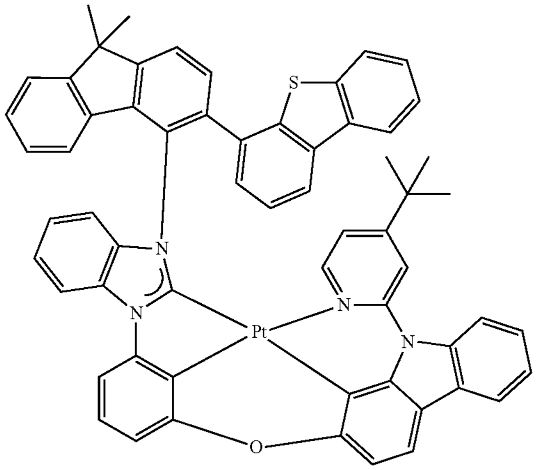
21
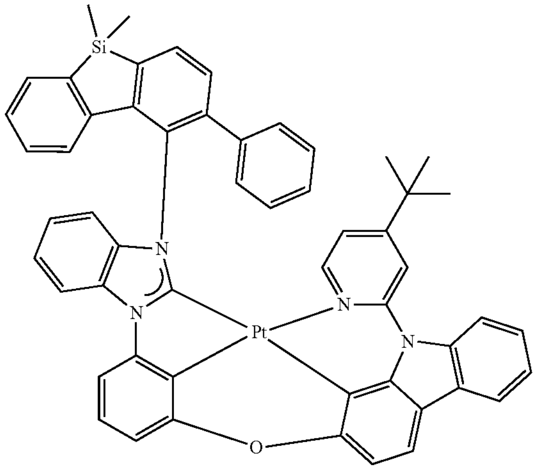
-continued
22
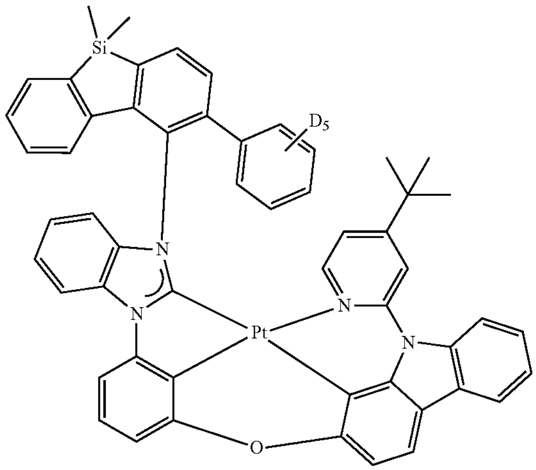
23
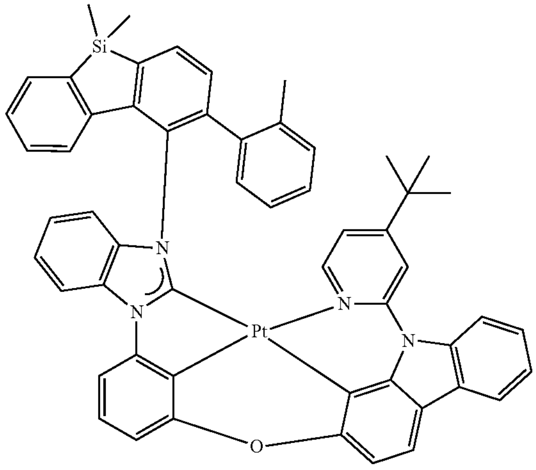
24
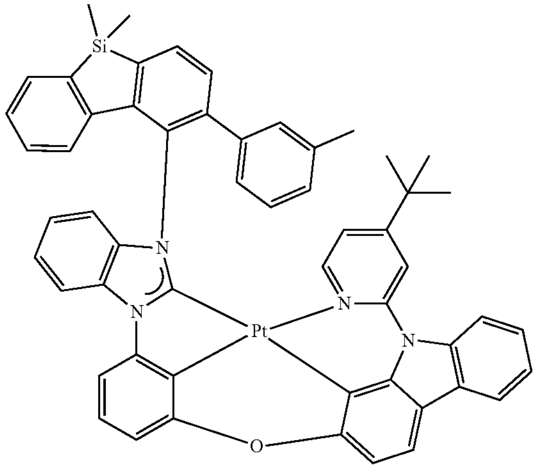

-continued
25
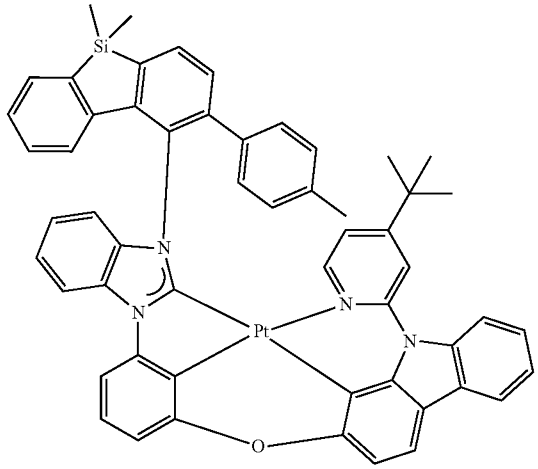
26
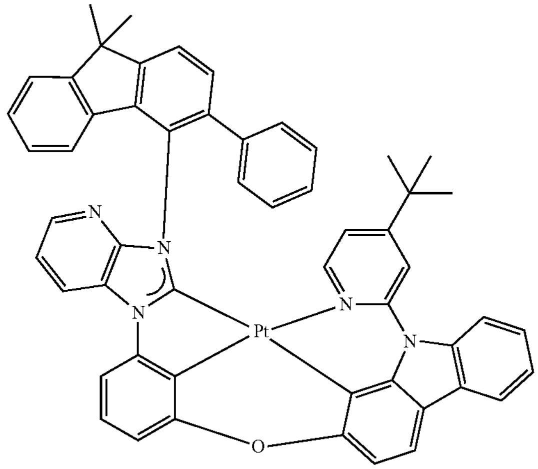
27
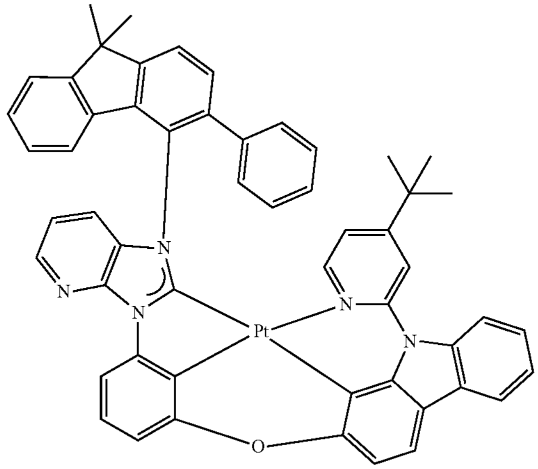
-continued
28
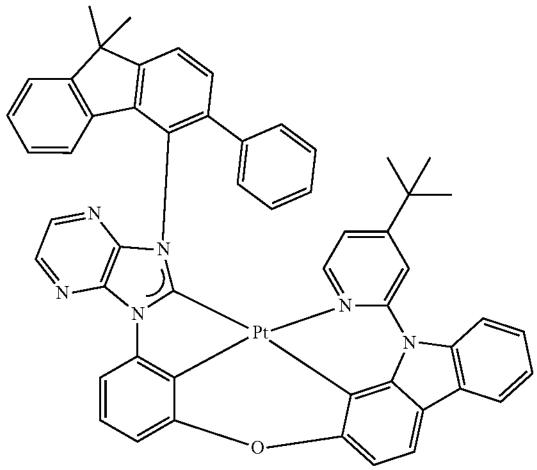
29
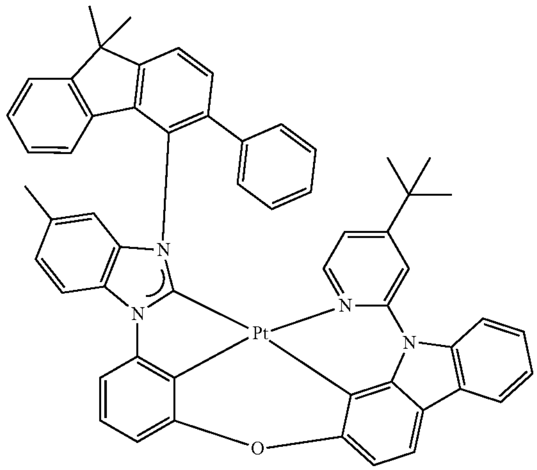
30
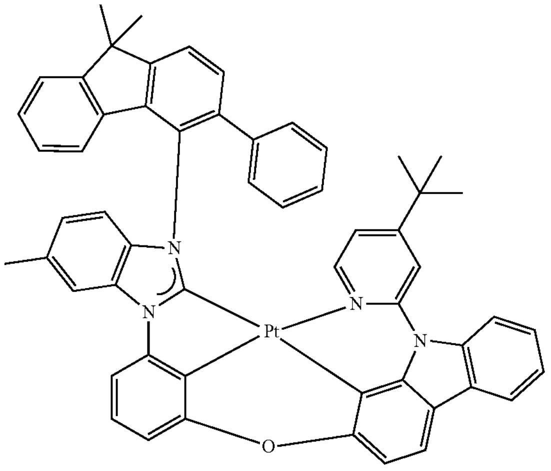

-continued
31
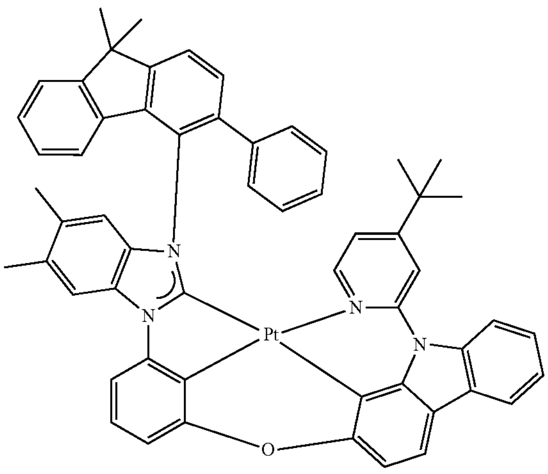
32
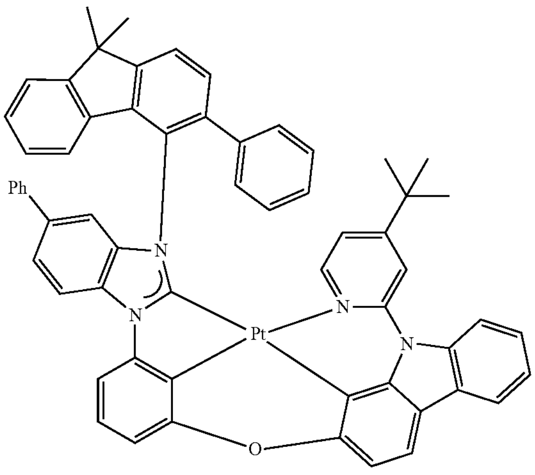
33
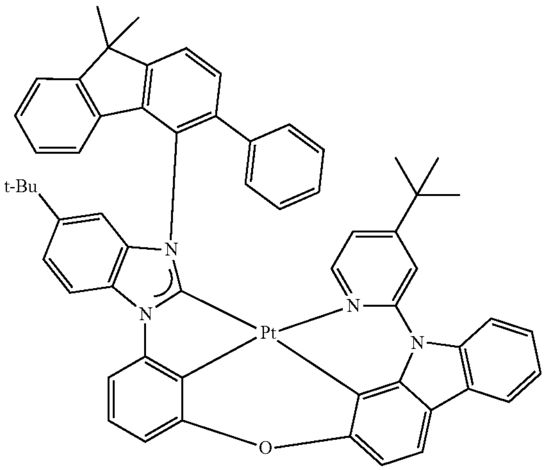
-continued
34
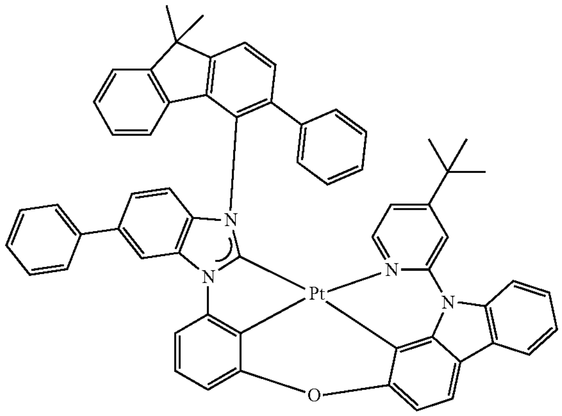
35
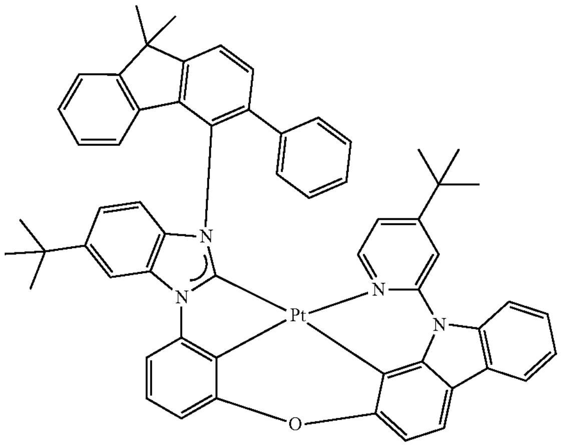
36
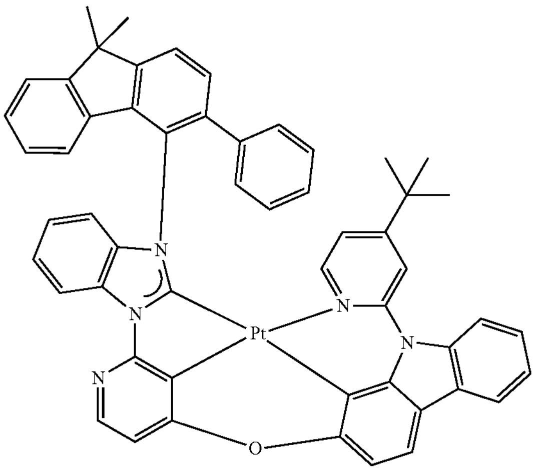

-continued
37
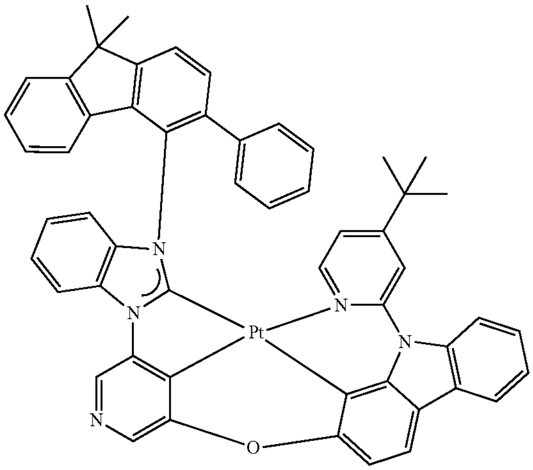
38
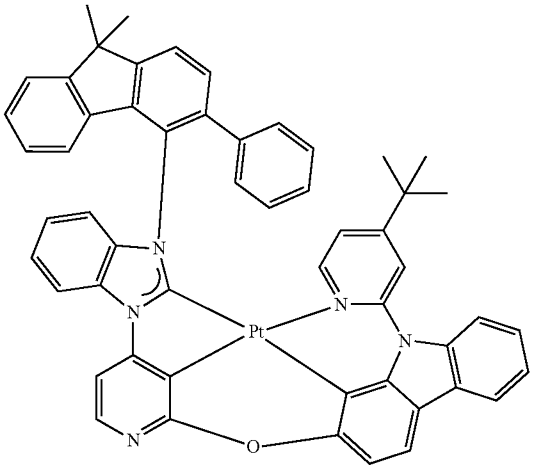
39
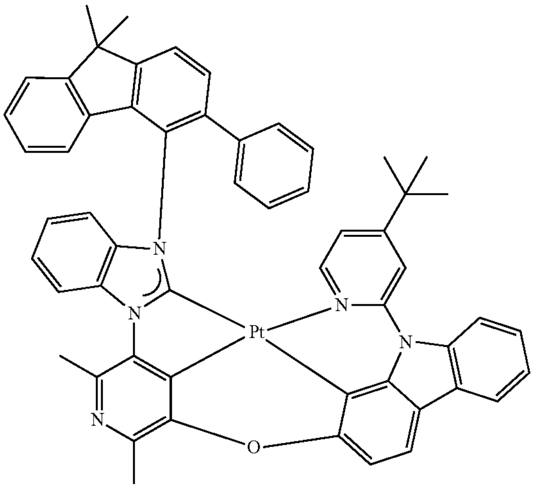
-continued
40
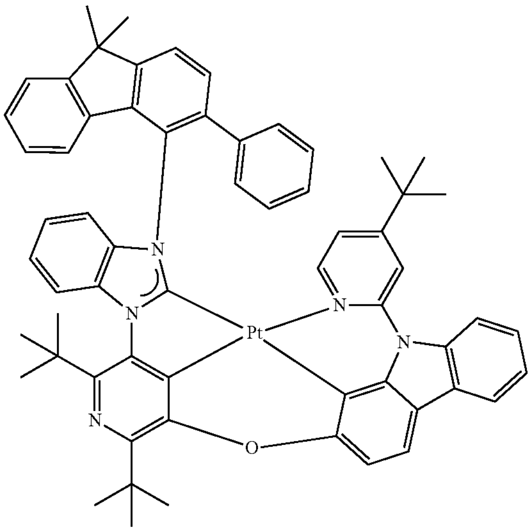
41
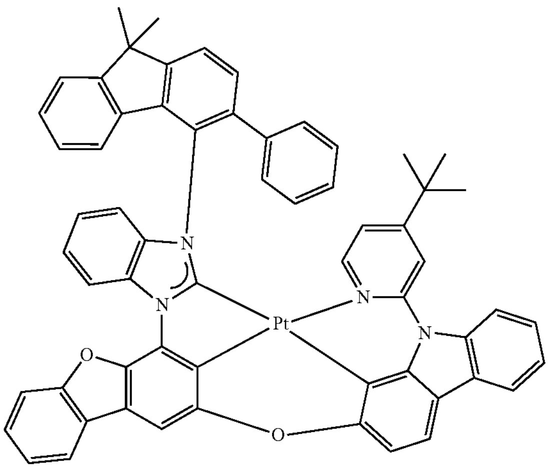
42
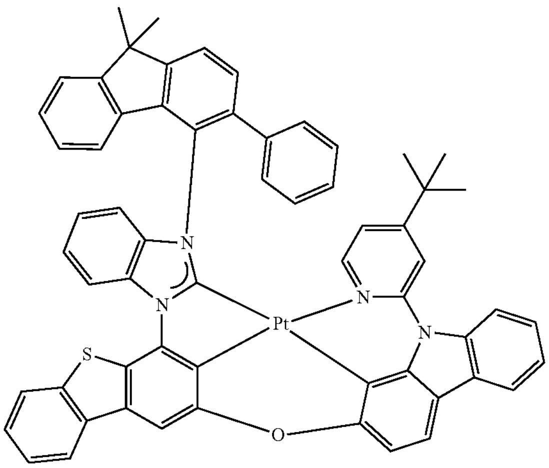

-continued
43
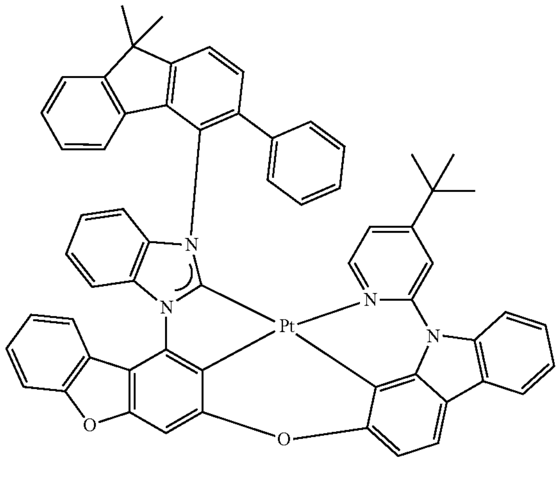
44
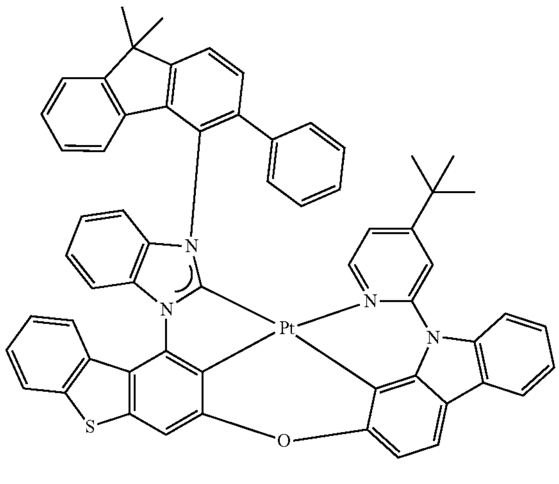
45
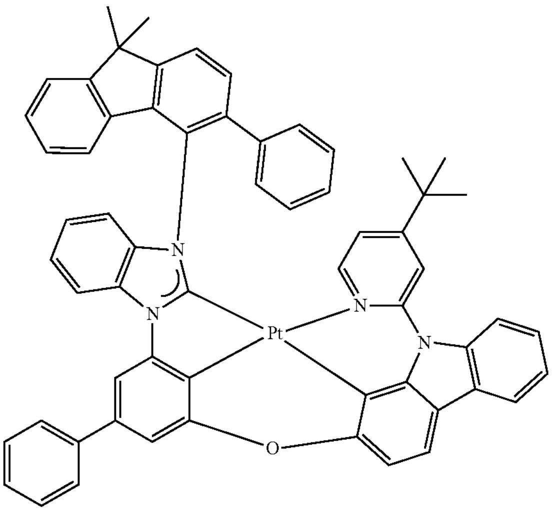
-continued
46
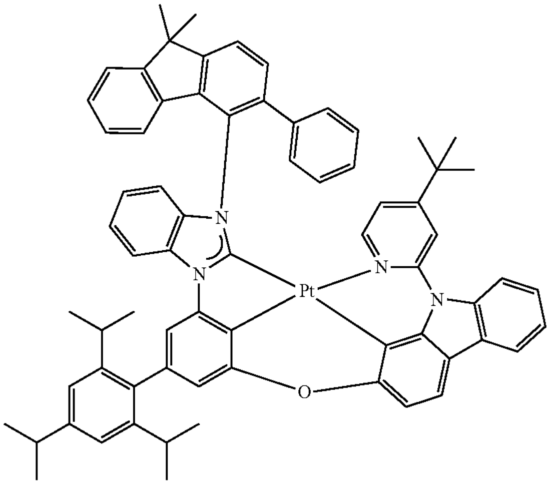
47
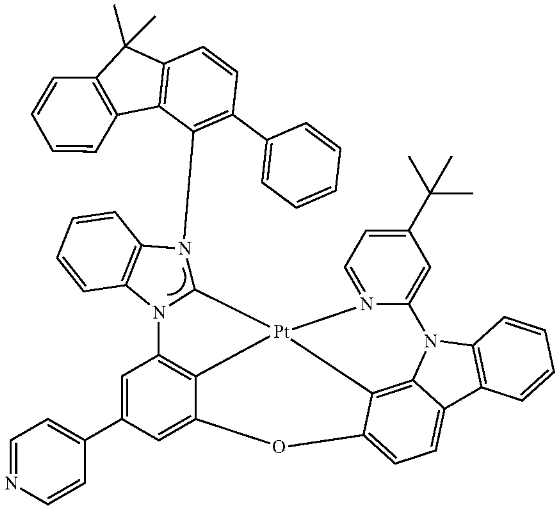
48
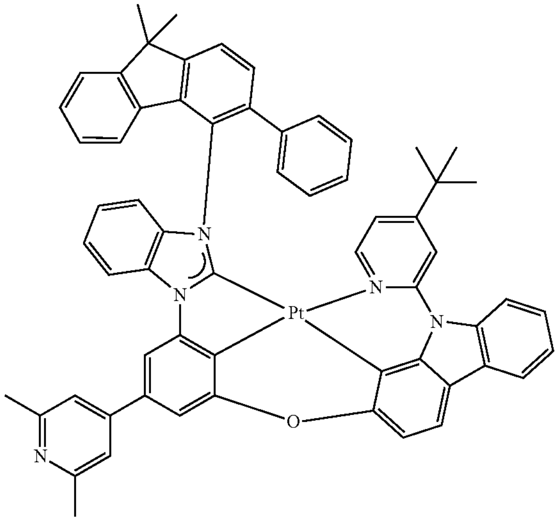

-continued
49
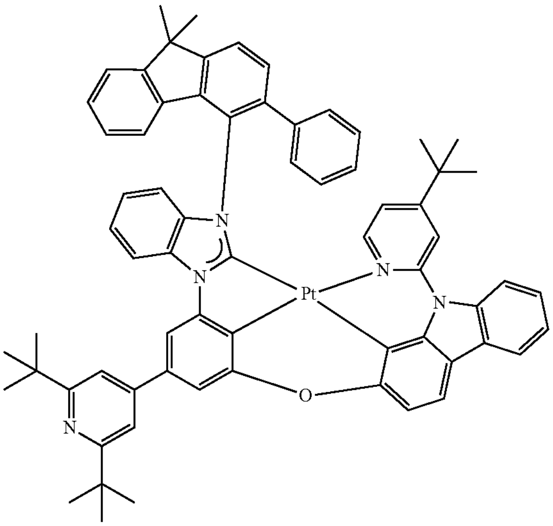
50
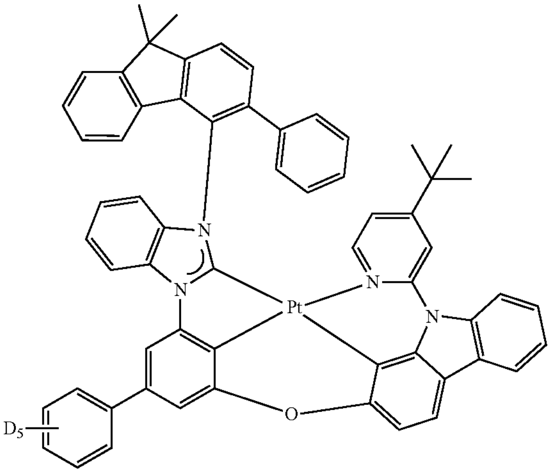
51
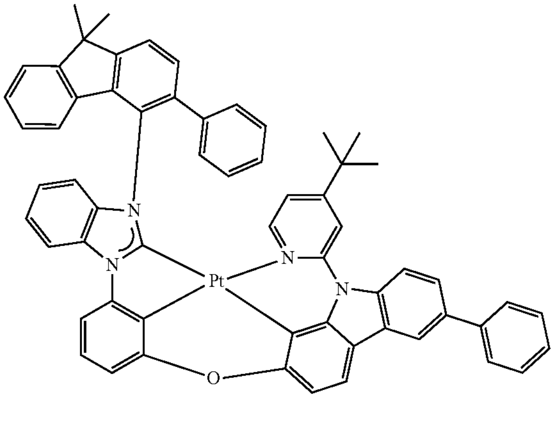
-continued
52
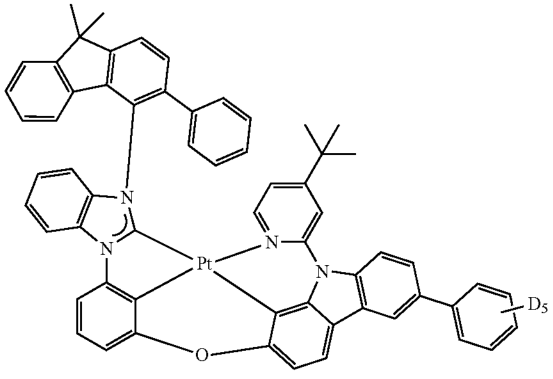
53
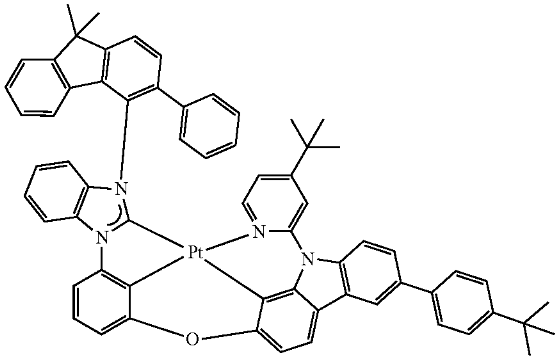
54
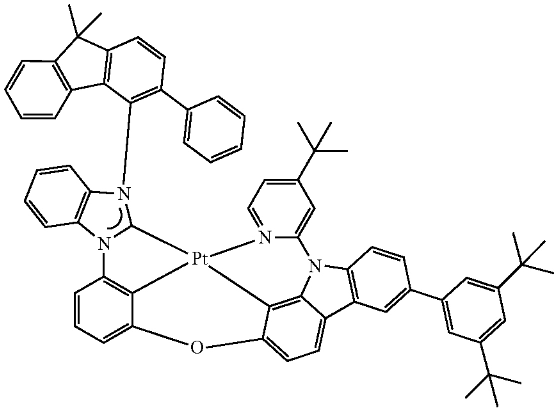
55
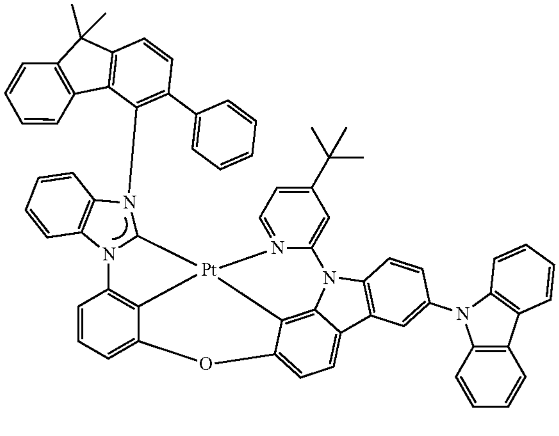

-continued
56
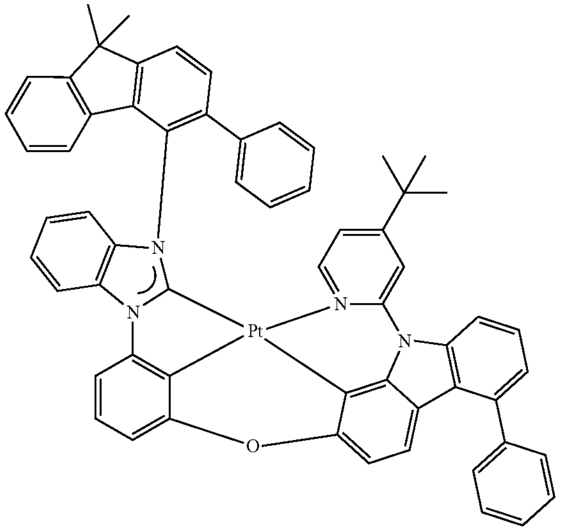
57
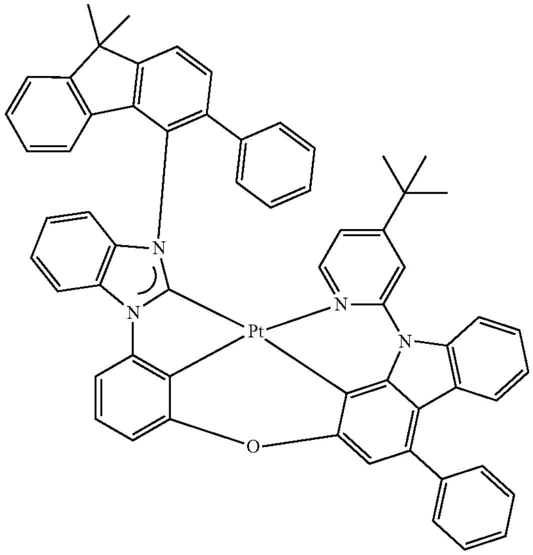
-continued
58
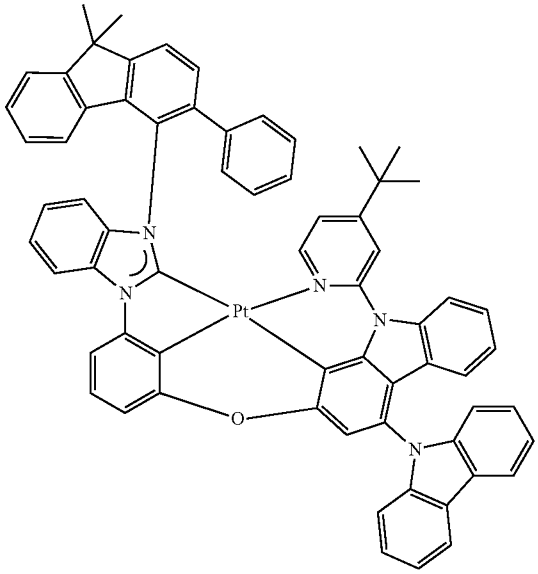
59
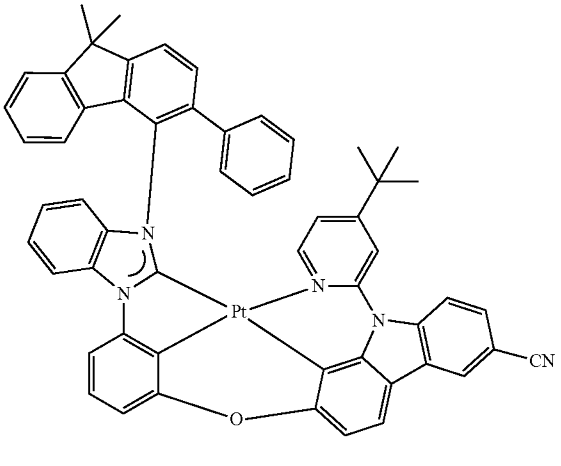
60
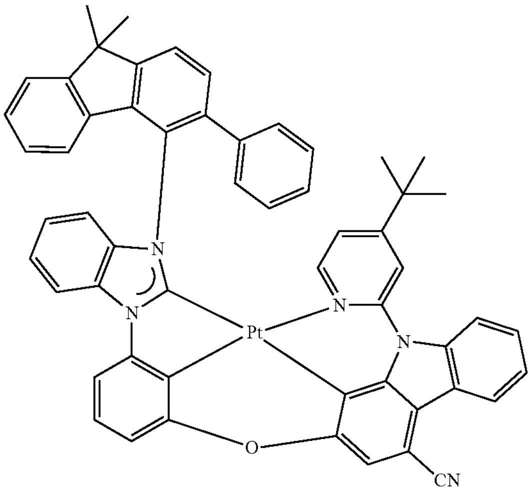

-continued
61
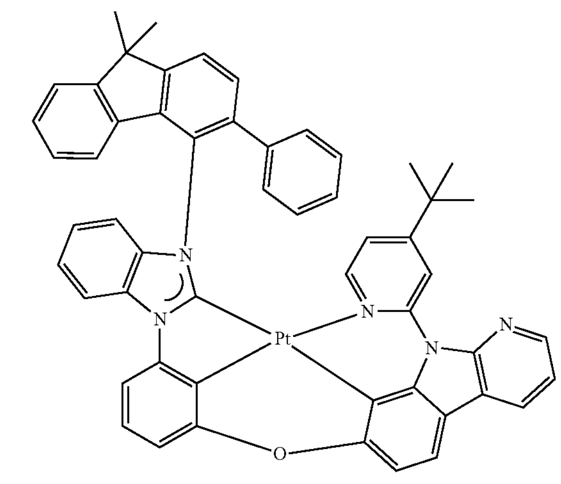
62
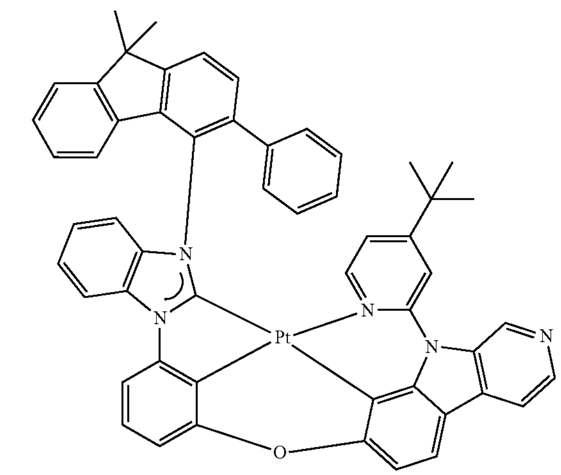
63
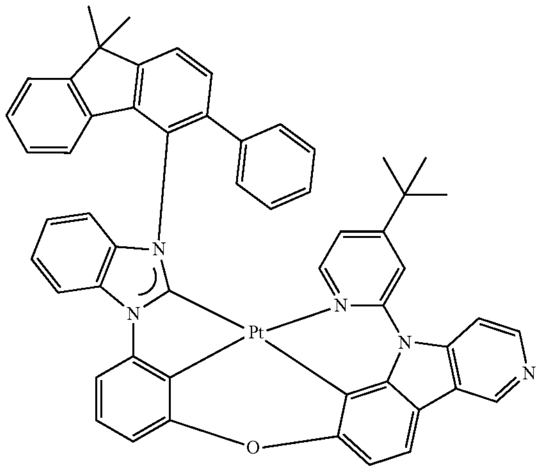
-continued
64
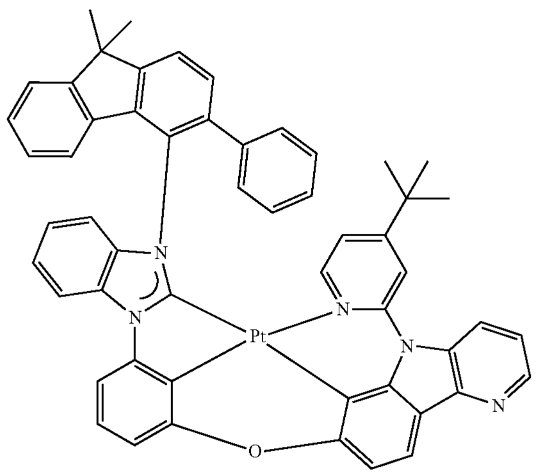
65
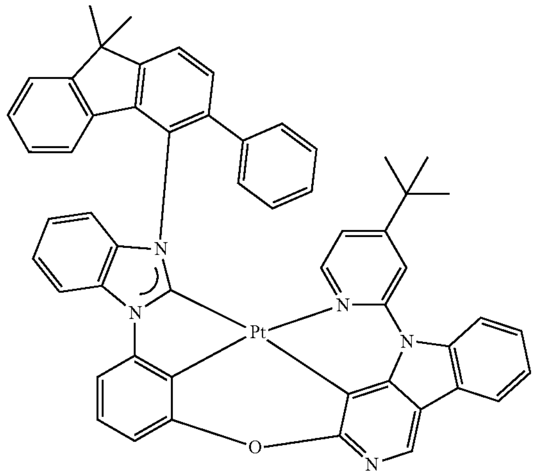
66
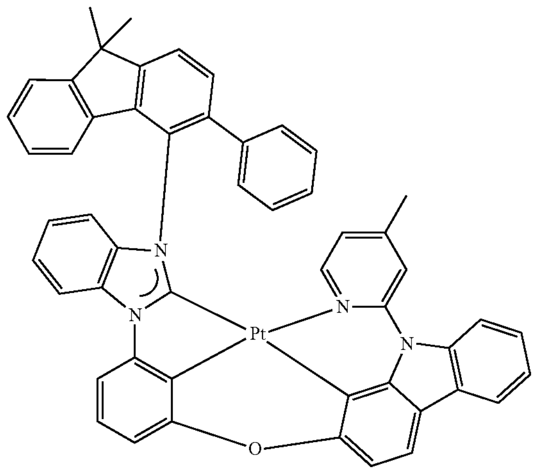

67
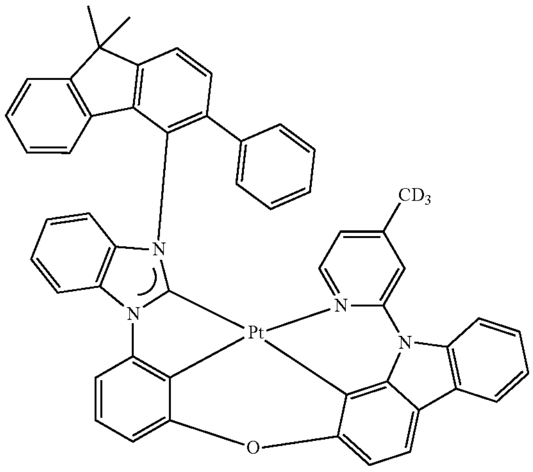
68
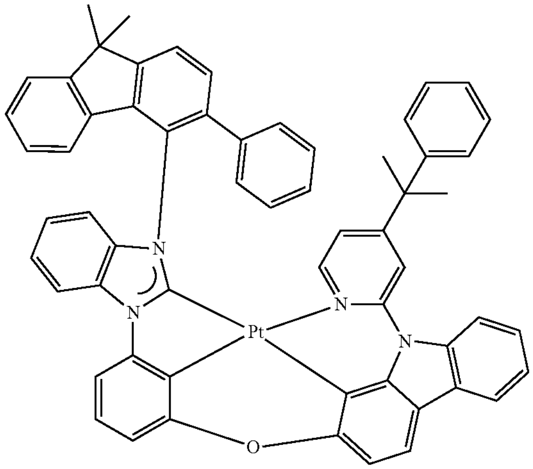
69
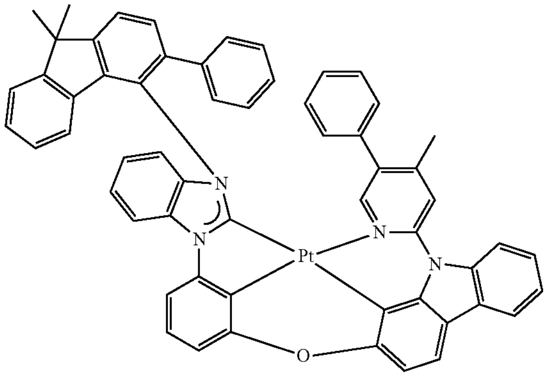
70
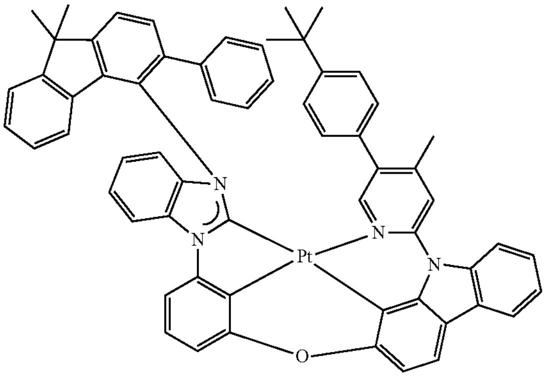
71
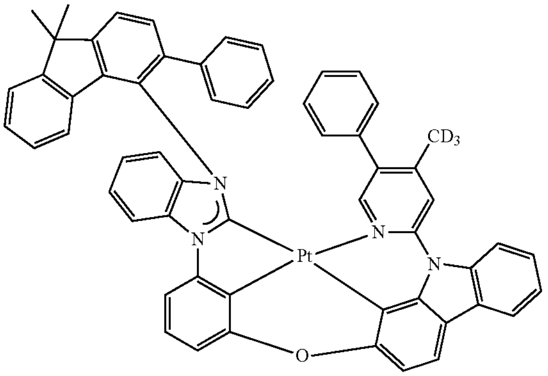
72
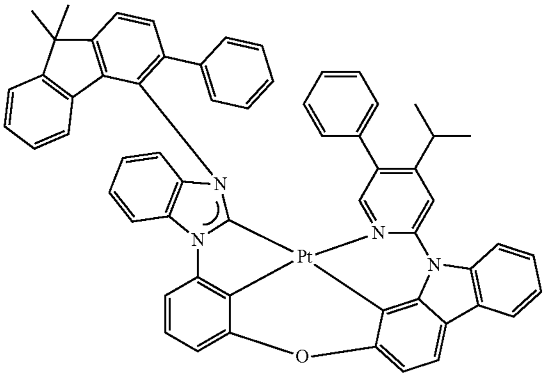
73
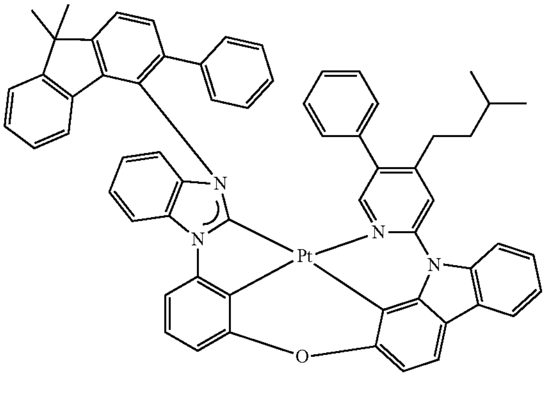

-continued
74
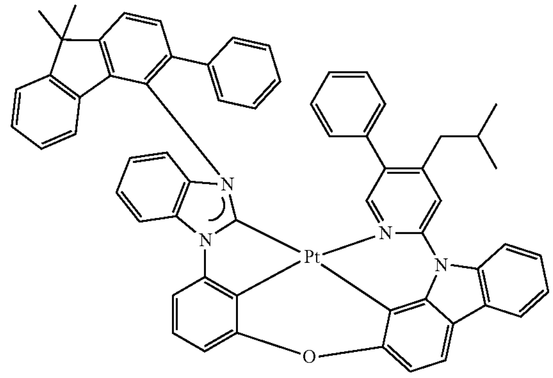
75
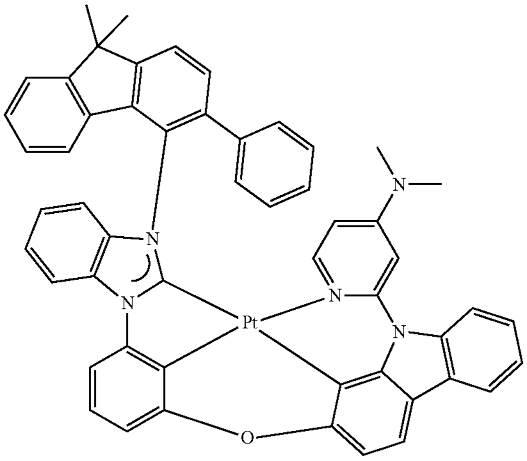
76
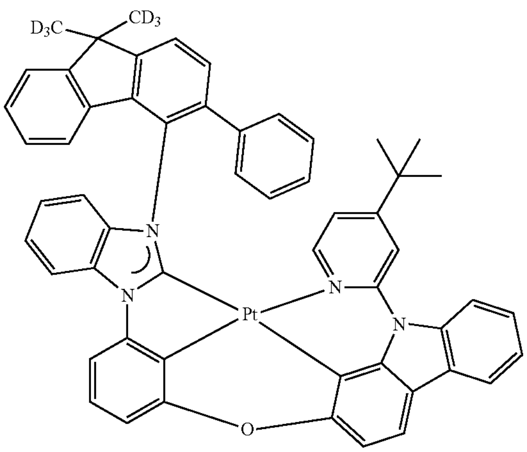
-continued
77
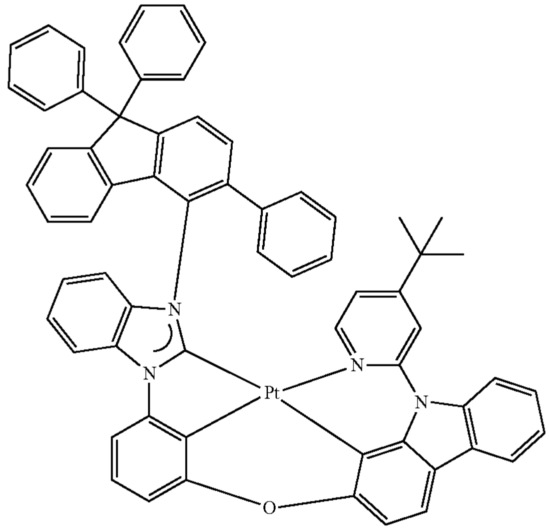
78
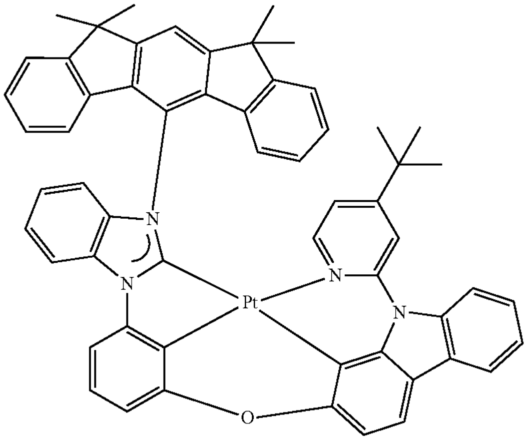
79
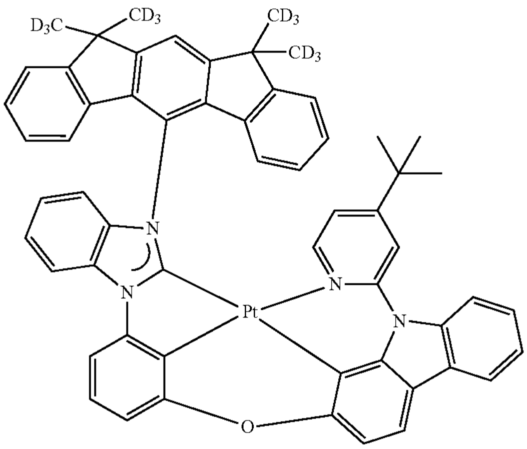

-continued
80
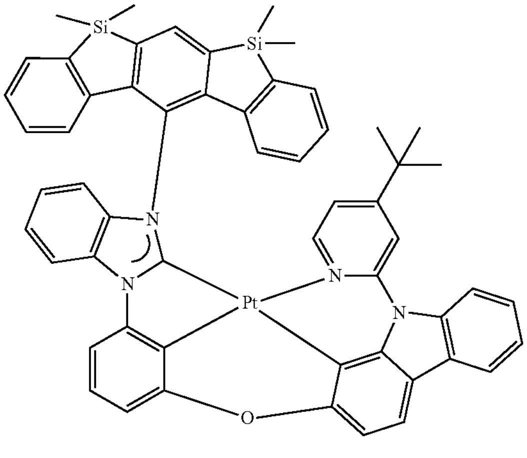
81
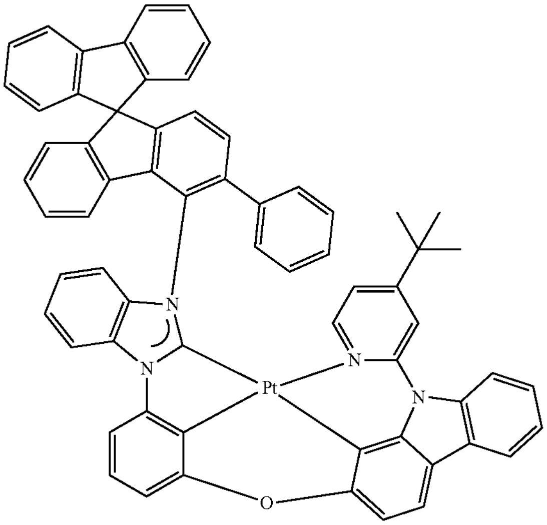
82
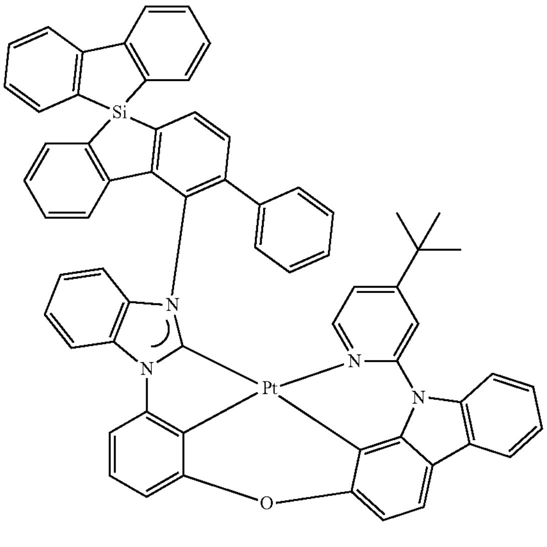
-continued
83
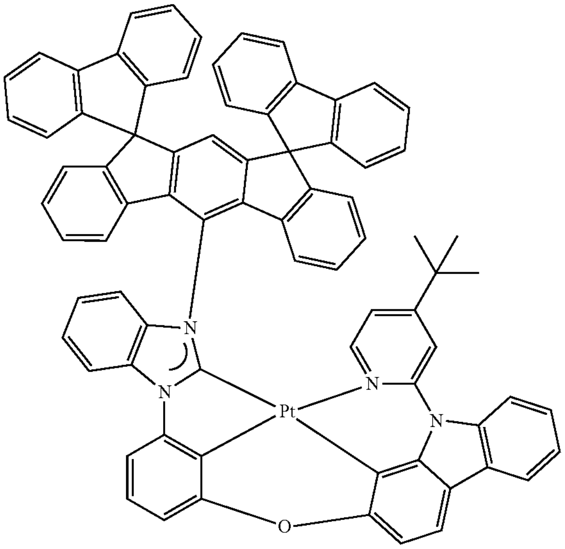
84
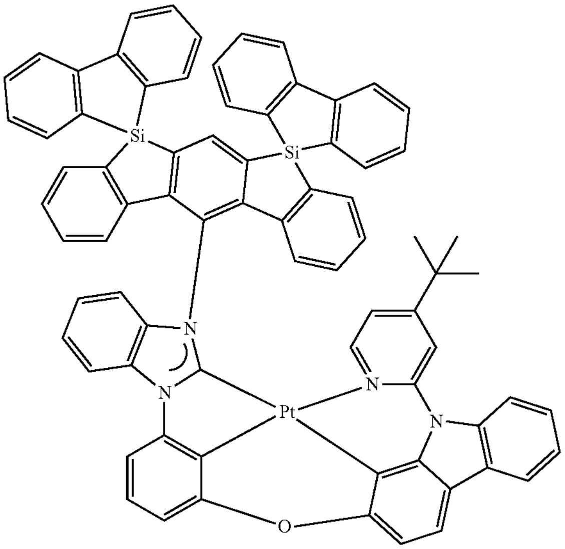
85
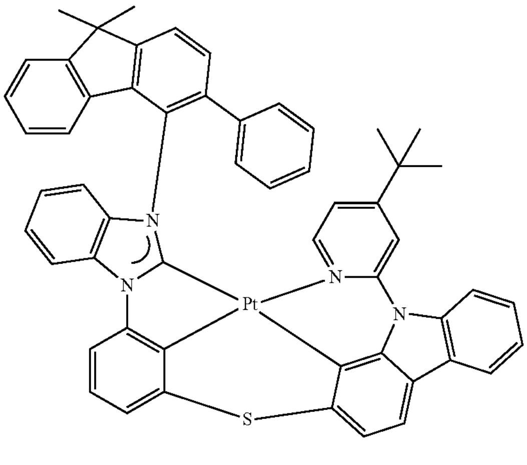

-continued
86
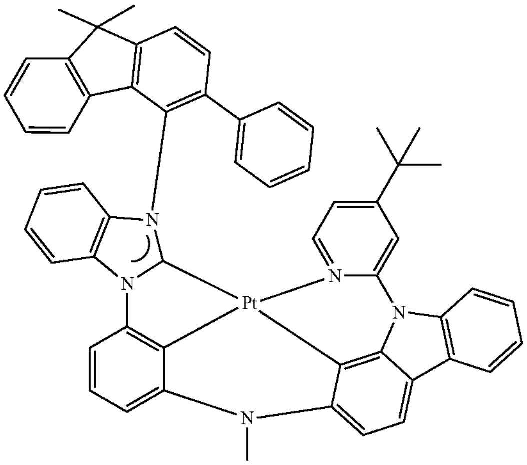
87
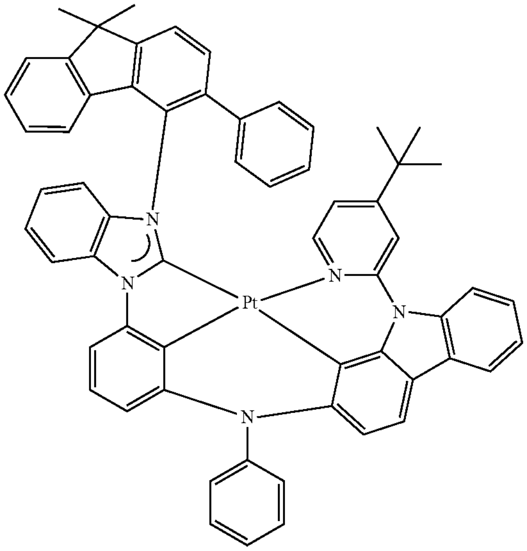
88
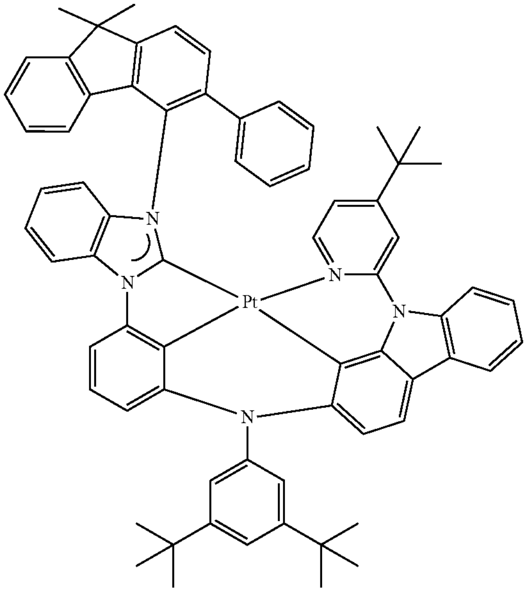
-continued
89
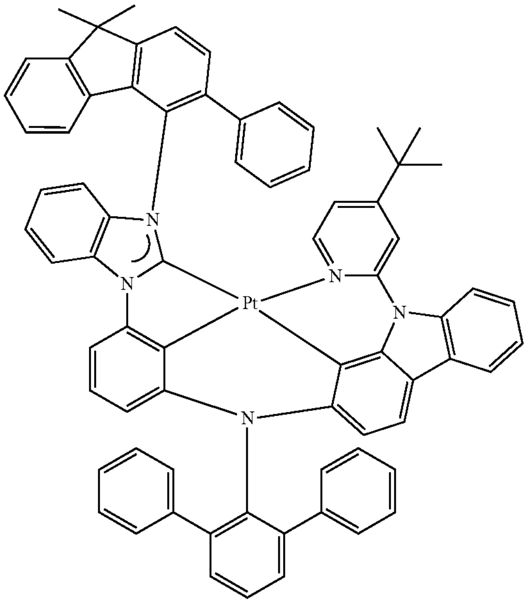
90
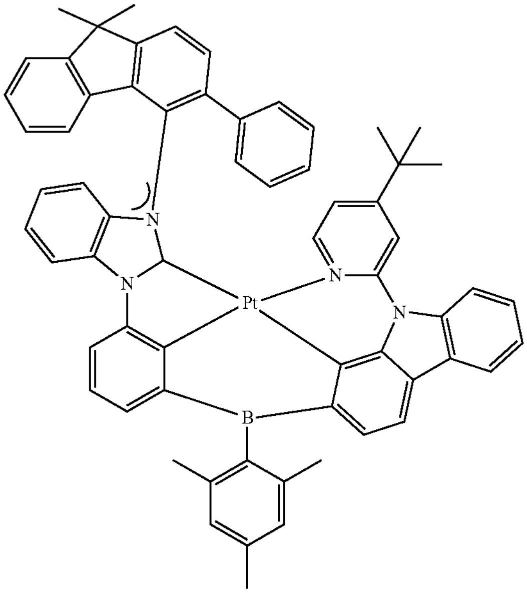

-continued
91
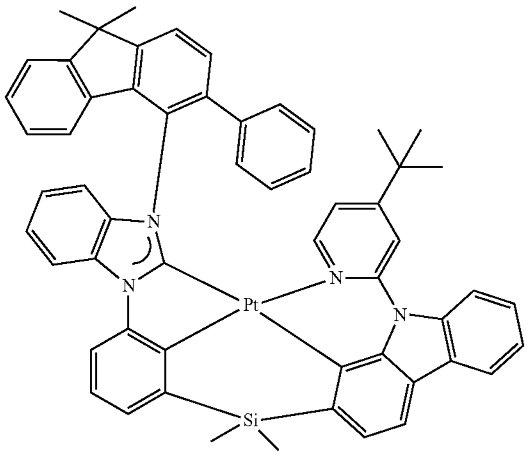
92
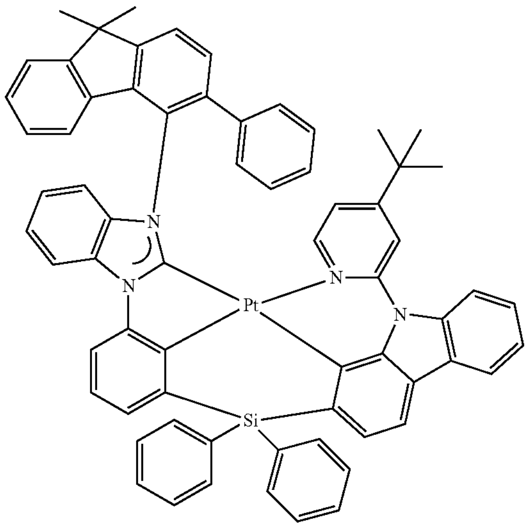
93
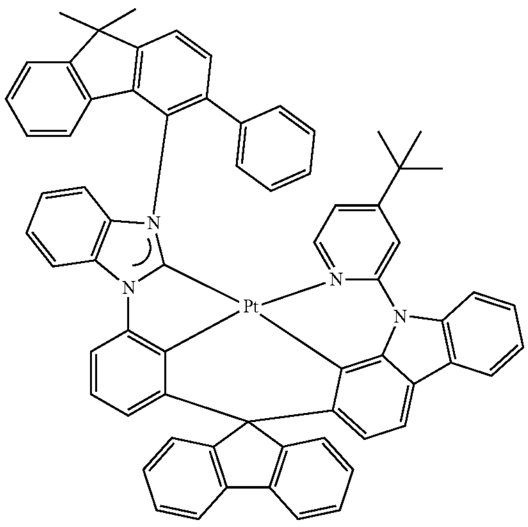
-continued
94
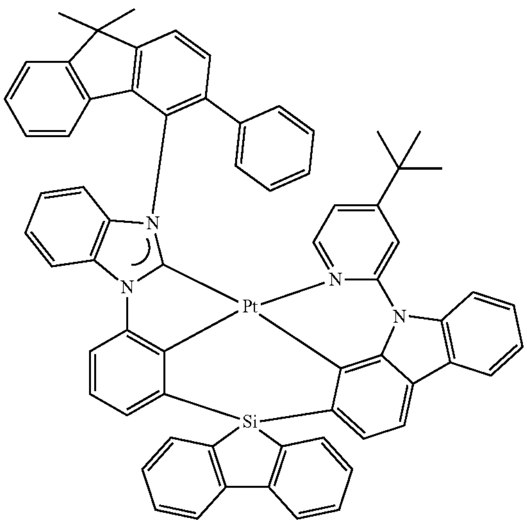
95
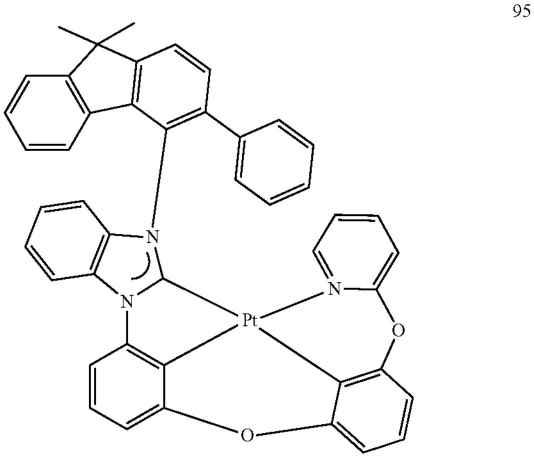
96
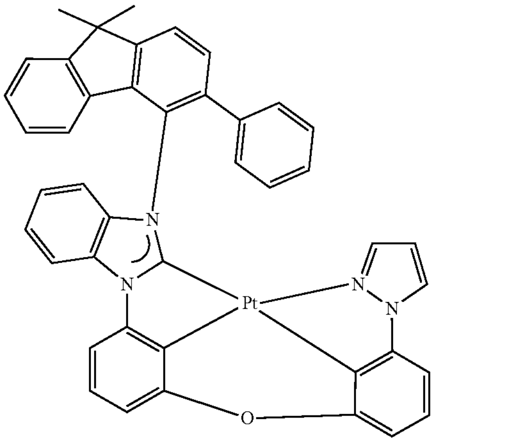

-continued
97
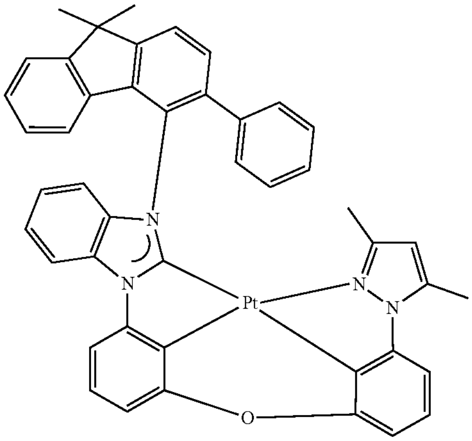
98
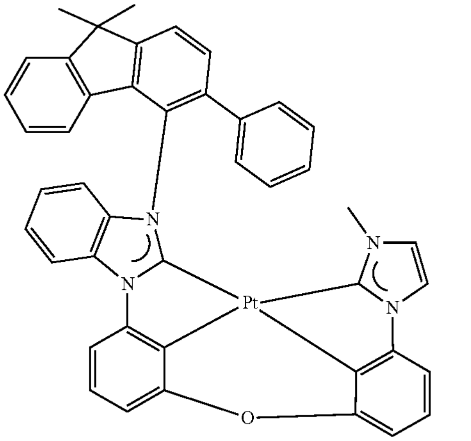
-continued
99
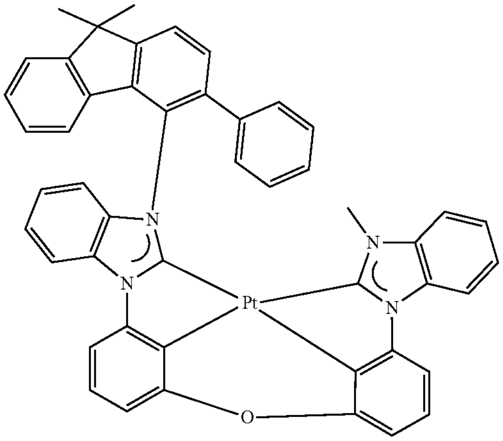
100
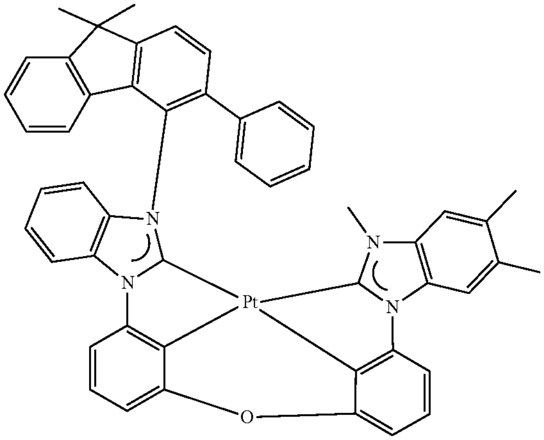
wherein in Compounds 1 to 100,
$D_5$ indicates substitution with five deuterium atoms, and Ph indicates a phenyl group.
* * * * *